US011252826B2

(12) United States Patent
Park et al.

(10) Patent No.: US 11,252,826 B2
(45) Date of Patent: Feb. 15, 2022

(54) ELECTRONIC DEVICE INCLUDING FLEXIBLE DISPLAY AND METHOD FOR CONTROLLING SAME

(71) Applicant: Samsung Electronics Co., Ltd., Gyeonggi-do (KR)

(72) Inventors: Jungsik Park, Gyeonggi-do (KR); Youngsoo Chun, Gyeonggi-do (KR); Woongeun Kwak, Gyeonggi-do (KR); Seunghui Sunwoo, Gyeonggi-do (KR); Dohun Cha, Gyeonggi-do (KR); Gidae Kim, Gyeonggi-do (KR); Junyun Kim, Gyeonggi-do (KR); Jooho Seo, Gyeonggi-do (KR); Hyoseok Na, Gyeonggi-do (KR); Jongchul Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/281,853

(22) Filed: Feb. 21, 2019

(65) Prior Publication Data
US 2019/0261519 A1 Aug. 22, 2019

(30) Foreign Application Priority Data
Feb. 22, 2018 (KR) ........................ 10-2018-0021216

(51) Int. Cl.
*G06F 1/16* (2006.01)
*H05K 5/00* (2006.01)
(Continued)

(52) U.S. Cl.
CPC ..... *H05K 5/0017* (2013.01); *G02F 1/133305* (2013.01); *G06F 1/1652* (2013.01);
(Continued)

(58) Field of Classification Search
CPC ............ G02F 1/133305; G06F 1/1652; G06F 1/1677; G06F 2200/1614;
(Continued)

(56) References Cited

U.S. PATENT DOCUMENTS 5,999,191 A   12/1999   Frank et al.
7,558,057 B1   7/2009   Naksen et al.
(Continued)

FOREIGN PATENT DOCUMENTS

CA   2 356 232 A1   3/2002
DE   103 24 143 A1   12/2004
(Continued)

OTHER PUBLICATIONS

Gyllstrom, et al.; "Techniques for Improving the Visibility and "Sharability" of Semi-transparent Video in Shared Workspaces"; Mar. 23, 2007; XP058263149.
(Continued)

*Primary Examiner* — Ram A Mistry
(74) *Attorney, Agent, or Firm* — Cha & Reiter, LLC

(57) ABSTRACT

An electronic device and method are disclosed. The electronic device includes a first and second housing movable relative to each other. The second housing supports a flexible display which may be at least partially exposed to an exterior, and at least partially stowed within the first housing based on the movement of the housings. A processor implements the method including detecting movement of the housings such that a visible display area of the display is changed, detecting whether the resizing meets a predetermined condition, and if resizing does not meet the predetermined condition, executing image processing on a portion of the resized visible display area.

9 Claims, 92 Drawing Sheets

(51) Int. Cl.
  *G02F 1/1333* (2006.01)
  *H04M 1/02* (2006.01)
  *H04N 9/31* (2006.01)
  *H05K 1/02* (2006.01)
  *H05K 1/11* (2006.01)
(52) U.S. Cl.
  CPC ........ *G06F 1/1677* (2013.01); *H04M 1/0268* (2013.01); *H04N 9/3188* (2013.01); *H05K 1/028* (2013.01); *H05K 1/118* (2013.01); *G06F 2200/1614* (2013.01); *G09G 2340/0492* (2013.01)
(58) Field of Classification Search
  CPC ........ G09G 2340/0492; H04M 1/0268; H04N 9/3188; H05K 1/028; H05K 1/118; H05K 5/0017
  See application file for complete search history.

(56) References Cited

U.S. PATENT DOCUMENTS

| | | | |
|---|---|---|---|
| 7,724,508 B2 | 5/2010 | Bemelmans et al. | |
| 8,275,420 B2* | 9/2012 | Lim | H04M 1/0235 455/566 |
| 2009/0051830 A1* | 2/2009 | Matsushita | G06F 1/1647 348/836 |
| 2010/0060548 A1 | 3/2010 | Choi et al. | |
| 2010/0167791 A1 | 7/2010 | Lim | |
| 2010/0325576 A1 | 12/2010 | Olsen | |
| 2013/0021377 A1* | 1/2013 | Doll | G09G 5/14 345/649 |
| 2013/0241575 A1 | 9/2013 | Finkler | |
| 2014/0380186 A1 | 5/2014 | Kim et al. | |
| 2015/0220119 A1 | 8/2015 | Seo et al. | |
| 2015/0334142 A1 | 11/2015 | Gottlieb | |
| 2016/0014403 A1 | 1/2016 | Stroetmann | |
| 2016/0202781 A1 | 7/2016 | Kim et al. | |
| 2017/0011714 A1 | 1/2017 | Eim et al. | |
| 2017/0061932 A1 | 3/2017 | Kwon et al. | |
| 2017/0117336 A1 | 4/2017 | Rappoport et al. | |
| 2017/0329368 A1 | 11/2017 | Rho et al. | |
| 2018/0364827 A1 | 12/2018 | Chung | |

FOREIGN PATENT DOCUMENTS

| | | |
|---|---|---|
| JP | WO2007077649 A1 | 6/2009 |
| KR | 10-2014-0147497 A | 12/2014 |
| KR | 10-1562582 B1 | 10/2015 |
| KR | 10-2016-0087460 A | 7/2016 |
| KR | 10-2017-0005557 A | 1/2017 |
| KR | 10-2017-0024942 A | 3/2017 |
| KR | 10-2017-0079897 A | 7/2017 |
| KR | 10-2017-0080017 A | 7/2017 |
| KR | 10-1769941 B1 | 8/2017 |
| WO | 2017/104860 A1 | 6/2017 |

OTHER PUBLICATIONS

European Search Report dated Jan. 7, 2020.
International Search Report dated Jun. 12, 2019.
European Search Report dated Jul. 18, 2019.
Korean Search Report dated Jan. 26, 2021.

* cited by examiner

ELECTRONIC DEVICE INCLUDING FLEXIBLE DISPLAY AND METHOD FOR CONTROLLING SAME

CROSS-REFERENCE TO RELATED APPLICATION(S)

This application is based on and claims priority under 35 U.S.C. § 119 to Korean Patent Application No. 10-2018-0021216, filed on Feb. 22, 2018, in the Korean Intellectual Property Office, the disclosure of which is incorporated by reference herein in its entirety.

BACKGROUND

1. Field

Various embodiments of the disclosure relate to electronic devices including a flexible display with a resizable display area and methods for controlling the same.

2. Description of Related Art

Electronic devices, such as mobile phones may output information stored therein in the form of a sound or image. As electronic devices become more highly integrated and high-speed, high-volume wireless communication has become more commonplace, and mobile communication terminals have been equipped with an increasing diversity of functionality. For example, electronic devices often include integrated functionality, including entertainment functions (e.g., video games), multimedia functions (e.g., music/videos), communication and security functions (e.g., for mobile banking), and scheduling or e-wallet functions.

Electronic devices, such as electronic schedulers, portable multimedia players, mobile communication terminals, tablet personal computers (PCs), etc., are generally equipped with a flat display device and a battery, and their shape may then be limited to a bar, clamshell, or slidable shape due to the physical requirements of the displays and/or batteries. Recently released electronic devices have adopted larger displays, ensuring more convenient viewing of the display.

Flexible displays or transformable displays that have made large-screen electronic devices easier to carry have also been introduced to the market. Electronic devices with flexible displays may visually provide various screens through the flexible display. The flexible display may include a display panel and display driving circuit (e.g., a display driver integrated circuit or "DDI") to operate the panel. The display driving circuit equipped in the electronic device may receive display data from a processor and drive the display panel.

An electronic device with a flexible display may output an executing application on the flexible display. The flexible display may be disposed on the front and rear surface of the electronic device while at least partially forming a curved surface.

The above information is presented as background information only to assist with an understanding of the disclosure. No determination has been made, and no assertion is made, as to whether any of the above might be applicable as prior art with regard to the disclosure.

SUMMARY

According to an embodiment, the screen of the application may be displayed on the flexible display in a resolution that changes as the housing of the electronic device moves, for example. For example, when a fixed application applies to the running application or depending on the properties or settings of the operation system (OS) installed on the electronic device, the application screen might not normally be displayed corresponding to the resized screen of the flexible display. When the flexible display screen resizes, the running screen of the application might be partially undisplayed on the flexible display.

According to an embodiment, an electronic device with a flexible display and a method for controlling the display on the electronic device may provide various user interfaces (UIs) or user experiences (UXs) in various circumstances when the flexible display screen resizes.

According to an embodiment, an electronic device includes a first housing, a second housing that is movable relative to and over the first housing and at least partially overlapping the first housing, a flexible display at least partially mounted on the second housing and at least partially visually exposed to an exterior of the electronic device, wherein the flexible display is insertable into an interior of the first housing when the second housing moves relative to the first housing in a first direction, and removable from the interior when the second housing moves relative to the first housing in a second direction, a memory configured to store instructions; and at least one processor coupled to the flexible display, and the memory, wherein the stored instructions are executable by the at least one processor to cause the electronic device to: detect movement of the second housing relative to the first housing in one of a first direction or a second direction such that a display area of the flexible display is resized, determine whether the resizing of the display area satisfies a predetermined condition, and when the resizing of the display area does not satisfy the predetermined condition, execute image processing on at least a portion of the resized display area.

According to an embodiment, an electronic device includes a first housing forming at least a bottom portion and at least a side portion of the portable communication device, a second housing that is movable relative to and over the first housing and at least partially overlapping the first housing, a flexible display mounted on one surface of the second housing and at least partially visually exposed to an exterior of the portable communication device, wherein the flexible display is retractable into an interior of the first housing when the second housing moves relative to the first housing in a first direction so that a display area of the flexible display is reduced, and removable from the interior when the second housing moves relative to the first housing in a second direction so that the display area is enlarged, a first antenna formed in the first housing, and a second antenna formed in the second housing, wherein the first antenna and the second antenna do not overlap.

In certain embodiments, the first antenna and the second antenna are disposed such that they do not to overlap one other when considered from a top edge of the device (e.g., a terminal edge disposed at the top of the device) and/or a front of the device (e.g., when viewing the screen).

According to an embodiment, an electronic device includes a first structure including a first flat plate, the first flat plate including a first surface and a second surface which faces away from the first surface, a second structure including a second flat plate, the second flat plate facing the second surface of the first flat plate to define a hollow between enclosed by the first structure and the second structure, wherein at least a portion of the first flat plate is at least partially disposed within the hollow, and a flexible touchscreen display mounted on the first surface of the first flat plate, the flexible touchscreen display at least partially receivable in the hollow, wherein the first flat plate is moveable between a closed position in which the first flat plate moves over the second structure in a first direction to close in relation to the second structure, and an open position in which the first flat plate moves over the second structure in a second direction opposite to the first direction to open in relation to the second structure, wherein the flexible touchscreen display includes a first flat portion that remains flat while extending across at least a portion of the first surface, and a bent portion that curls around a roller and as the flexible touchscreen display extends from an end of the first flat portion into the hollow, and wherein as the first flat plate moves from the closed position to the open position, the flexible touchscreen display is pulled from the hollow such that the bent portion of the flexible touchscreen display is uncurled to become a second flat portion of the flexible touchscreen display.

According to an embodiment, an electronic device includes a first housing, a second housing at least partially overlapping the first housing, the second housing movable relative to the first housing, a flexible display at least partially mounted on a surface of the second housing, the flexible display at least partially receivable into an interior of the first housing, wherein a visible screen area of the flexible display is expandable by movement in a first direction of the second housing over the first housing that pulls additional portions of the flexible display out of the interior, and the visible screen area of the flexible display is reducible by moving in a second direction of the second housing over the first housing that retracts visible portions of the flexible display into the interior, at least one processor, and a memory, wherein the memory stores instructions executable by the at least one processor to: display user interface in a first position of the flexible display, when a visible screen area of the flexible display if expanded by movement of the second housing, detect an amount of expansion of the visible screen area, and when movement of the second housing has terminated for a predetermined time, display the user interface in a second position based on the detected amount.

According to an embodiment, an electronic device includes a first housing, a second housing at least partially overlapping the first housing, the second housing movable relative to the first housing, a flexible display at least partially mounted on a surface of the second housing, the flexible display at least partially receivable into an interior of the first housing, wherein a visible screen area of the flexible display is expandable by movement in a first direction of the second housing over the first housing that pulls additional portions of the flexible display out of the interior, and the visible screen area of the flexible display is reducible by moving in a second direction of the second housing over the first housing that retracts visible portions of the flexible display into the interior, at least one processor, and a memory, wherein the memory stores instructions executable by the at least one processor to: display a first execution screen of a first application on a first area of the flexible display, display a second execution screen of a second application on a second area of the flexible display, in response to detecting a change in orientation of the electronic device, change a display arrangement of the first application and the second application, wherein at least one of the first application and the second application are displayed using a new aspect ratio in response to the detected change in orientation.

Other aspects, advantages, and salient features of the disclosure will become apparent to those skilled in the art from the following detailed description, which, taken in conjunction with the annexed drawings, discloses example embodiments of the disclosure.

BRIEF DESCRIPTION OF THE DRAWINGS

A more complete appreciation of the disclosure and many of the attendant aspects thereof will be readily obtained as the same becomes better understood by reference to the following detailed description when considered in connection with the accompanying drawings, such that.

Throughout the drawings, like reference numerals will be understood to refer to like parts, components, and structures.

DETAILED DESCRIPTION

Figure 1:
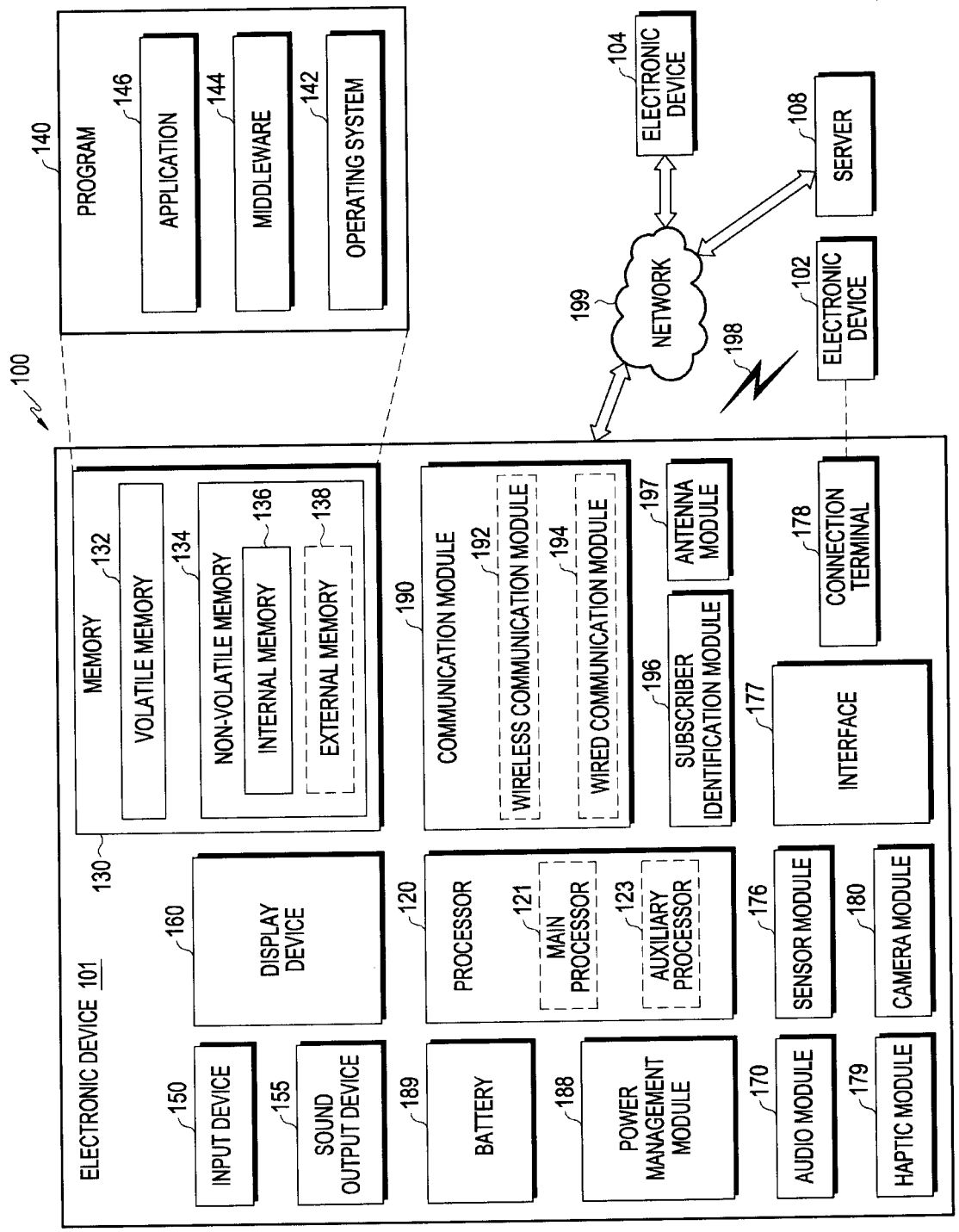
FIG. 1 is a view illustrating an example of a network environment according to an embodiment.

Hereinafter, embodiments of the disclosure are described with reference to the accompanying drawings. However, it should be appreciated that the disclosure is not limited to the embodiments and the terminology used herein, and all changes and/or equivalents or replacements thereto also belong to the disclosure. The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

For example, examples of the electronic device according to embodiments of the disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™, a gaming console (Xbox™, PlayStation™), an electronic dictionary, an electronic key, a camcorder, or an electronic picture frame.

According to an embodiment of the disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to certain embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

Hereinafter, an electronic device and a method for controlling a display on a flexible display of the electronic device are described according to an embodiment. As used herein, the term "user" may denote a human or another device (e.g., an artificial intelligent electronic device) using the electronic device.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. In some embodiments, the electronic device 101 may exclude at least one (e.g., the display device 160 or the camera module 180) of the components or add other components. In some embodiments, some components may be implemented to be integrated together, e.g., as if the sensor module 176 (e.g., a fingerprint sensor, an iris sensor, or an illuminance sensor) is embedded in the display device (160) (e.g., a display).

The processor 120 may drive, e.g., software (e.g., a program 140) to control at least one other component (e.g., a hardware or software component) of the electronic device 101 connected with the processor 120 and may process or compute various data. The processor 120 may load and process a command or data received from another component (e.g., the sensor module 176 or the communication module 190) on a volatile memory 132, and the processor 120 may store resultant data in a non-volatile memory 134, including internal memory 136 and external memory 138. According to an embodiment, the processor 120 may include a main processor 121 (e.g., a central processing unit (CPU) or an application processor), and additionally or alternatively, an auxiliary processor 123 (e.g., a graphics processing unit (GPU), an image signal processor, a sensor hub processor, or a communication processor) that is operated independently from the main processor 121 and that consumes less power than the main processor 121 or is specified for a designated function. Here, the auxiliary processor 123 may be operated separately from or embedded in the main processor 121.

In such case, the auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., performing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120) of the electronic device 101, e.g., software (e.g., the program 140) and input data or output data for a command related to the software. The memory 130 may include the volatile memory 132 or the non-volatile memory 134.

The program 140, as software stored in the memory 130, may include, e.g., an operating system (OS) 142, middleware 144, or an application 146.

The input device 150 may be a device for receiving a command or data, which is to be used for a component (e.g., the processor 120) of the electronic device 101, from an outside (e.g., a user) of the electronic device 101. The input device 150 may include, e.g., a microphone, a mouse, or a keyboard.

The sound output device 155 may be a device for outputting sound signals to the outside of the electronic device 101. The sound output device 155 may include, e.g., a speaker which is used for general purposes, such as playing multimedia or recording and playing, and a receiver used for call receiving purposes only. According to an embodiment, the receiver may be formed integrally or separately from the speaker.

The display 160 may be a device for visually providing information to a user of the electronic device 101. The display device 160 may include, e.g., a display, a hologram device, or a projector and a control circuit for controlling the display, hologram device, or projector. According to an embodiment, the display device 160 may include touch circuitry or a pressure sensor capable of measuring the strength of a pressure for a touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) wiredly or wirelessly connected with the electronic device 101.

The sensor module 176 may generate an electrical signal or data value corresponding to an internal operating state (e.g., power or temperature) or external environmental state of the electronic device 101. The sensor module 176 may include, e.g., a gesture sensor, a gyro sensor, an atmospheric pressure sensor, a magnetic sensor, an acceleration sensor, a grip sensor, a proximity sensor, a color sensor, an infrared (IR) sensor, a bio sensor, a temperature sensor, a humidity sensor, or an illuminance sensor.

The interface 177 may support a designated protocol enabling a wired or wireless connection with an external electronic device (e.g., the electronic device 102). According to an embodiment, the interface 177 may include, for example, a high definition multimedia interface (HDMI), a universal serial bus (USB) interface, a secure digital (SD) card interface, or an audio interface.

A connecting terminal 178 may include a connector, e.g., an HDMI connector, a USB connector, an SD card connector, or an audio connector (e.g., a headphone connector), which is able to physically connect the electronic device 101 with an external electronic device (e.g., the electronic device 102).

The haptic module 179 may convert an electrical signal into a mechanical stimulus (e.g., a vibration or motion) or electrical stimulus which may be recognized by a user via his tactile sensation or kinesthetic sensation. The haptic module 179 may include, e.g., a motor, a piezoelectric element, or an electric stimulator.

The camera module 180 may capture a still image or moving images. According to an embodiment, the camera module 180 may include one or more lenses, an image sensor, an image signal processor, or a flash.

The power management module 188 may be a module for managing power supplied to the electronic device 101. The power management module 188 may be configured as at least part of, e.g., a power management integrated circuit (PMIC).

The battery 189 may be a device for supplying power to at least one component of the electronic device 101. The battery 189 may include, e.g., a primary cell which is not rechargeable, a secondary cell which is rechargeable, or a fuel cell.

The communication module 190 may support establishing a wired or wireless communication channel between the electronic device 101 and an external electronic device (e.g., the electronic device 102, the electronic device 104, or the server 108) and performing communication through the established communication channel. The communication module 190 may include one or more communication processors that are operated independently from the processor 120 (e.g., an application processor) and supports wired or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of the wireless communication module 192 and the wired communication module 194 may be used to communicate with an external electronic device through a first network 198 (e.g., a short-range communication network, such as Bluetooth, wireless-fidelity (Wi-Fi) direct, or infrared data association (IrDA)) or a second network 199 (e.g., a long-range communication network, such as a cellular network, the Internet, or a communication network (e.g., LAN or wide area network (WAN)). The above-enumerated types of communication modules 190 may be implemented in a single chip or individually in separate chips.

According to an embodiment, the wireless communication module 192 may differentiate and authenticate the electronic device 101 in the communication network using user information stored in the subscriber identification module 196.

The antenna module 197 may include one or more antennas for transmitting or receiving a signal or power to/from an outside. According to an embodiment, the communication module 190 (e.g., the wireless communication module 192) may transmit or receive a signal to/from an external electronic device through an antenna appropriate for a communication scheme.

Some of the above-described components may be connected together through an inter-peripheral communication scheme (e.g., a bus, general purpose input/output (GPIO), serial peripheral interface (SPI), or mobile industry processor interface (MIPI)), communicating signals (e.g., commands or data) therebetween.

According to an embodiment, instructions or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations executed on the electronic device 101 may be run on one or more other external electronic devices. According to an embodiment, when the electronic device 101 should perform a certain function or service automatically or at a request, the electronic device 101, instead of, or in addition to, executing the function or service on its own, may request an external electronic device to perform at least some functions associated therewith. The external electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
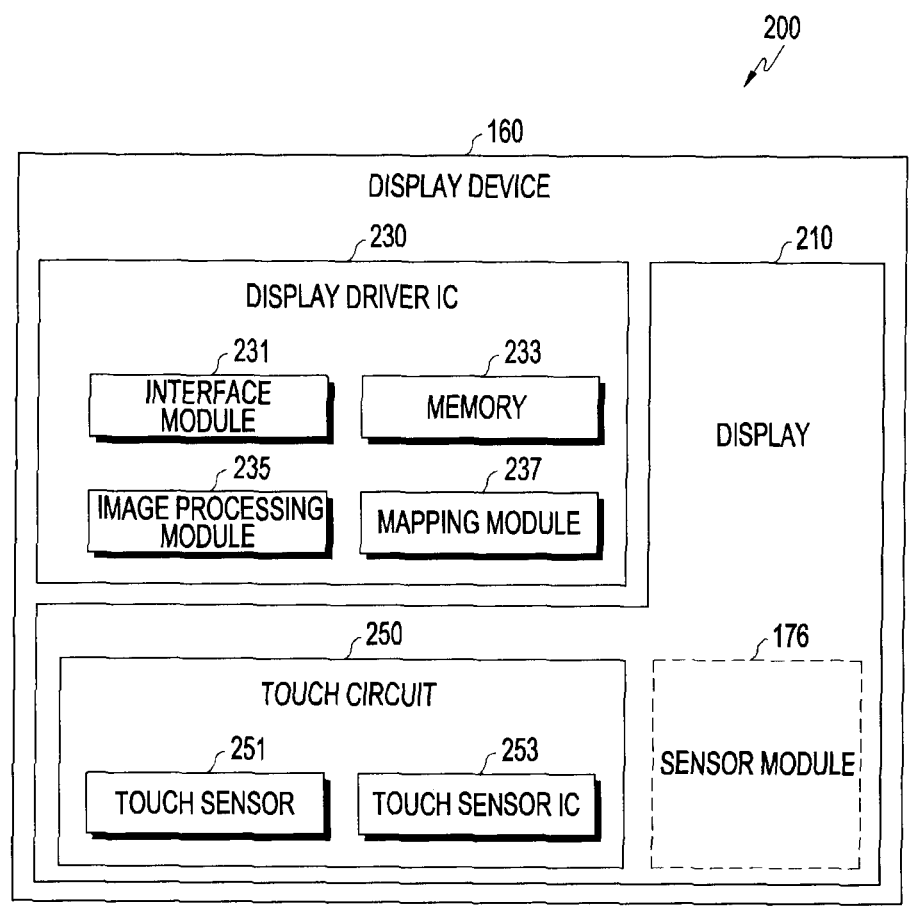
FIG. 2 is a block diagram illustrating an example of a display device according to an embodiment.

FIG. 2 is a block diagram 200 illustrating an example of a display device according to an embodiment. Referring to FIG. 2, a display device 160 (e.g., the display device 160 of FIG. 1) may include a display 210 and a display driver integrated circuit (DDI) 230 to control the display 210. The DDI 230 may include an interface module 231, memory 233 (e.g., a buffer memory), an image processing module 235, or a mapping module 237. The DDI 230 may receive image information that contains image data or an image control signal corresponding to a command for controlling the image data from the processor 120 (e.g., the main processor 121 (e.g., an application processor) or the auxiliary processor 123 operated independently from the function of the main processor 121) through, e.g., the interface module 231. The DDI 230 may communicate, for example, with touch circuitry 250 or the sensor module 276 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210. The mapping module 237 may convert the image data pre- or post-processed by the image processing module 235 into a voltage value or current value at which pixels of the display 210 may be driven, based on, at least, at least part of attributes of the pixels (e.g., the array (RGB stripe or pentile) of the pixels or the size of each subpixel). At least some pixels of the display 210 may be driven based on, e.g., the voltage value or current value so that visual information (e.g., text, image, or icon) corresponding to the image data may be displayed on the display 210.

According to an embodiment, the display 210 (e.g., the display device 160 of FIG. 1) may further include the touch circuitry 250. The touch circuitry 250 may include a touch sensor 251 and a touch sensor IC 253 to control the touch sensor 151. The touch sensor IC 253 may control the touch sensor 251, sense a touch input or hovering input at a particular position of the display 210, e.g., by measuring a variation in a signal (e.g., a voltage, quantity of light, resistance, or quantity of electric charge) for the particular position of the display 210, and provide information (e.g., the position, area, pressure, or time) regarding the sensed touch input or hovering input to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 160. According to an embodiment, the touch sensor 251 or the sensor module 276 may be disposed between pixels in a pixel layer of the display 210, or over or under the pixel layer.

The electronic device according to certain embodiments may be one of various types of electronic devices. The electronic devices may include at least one of, e.g., a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the techniques set forth herein to particular embodiments and that various changes, equivalents, and/or replacements therefor also fall within the scope of the disclosure. The same or similar reference denotations may be used to refer to the same or similar elements throughout the specification and the drawings. It is to be understood that the singular forms "a," "an," and "the" include plural references unless the context clearly dictates otherwise. As used herein, the term "A or B," "at least one of A and/or B," "A, B, or C," or "at least one of A, B, and/or C" may include all possible combinations of the enumerated items. As used herein, the terms "first" and "second" may modify various components regardless of importance or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

Figure 3A:
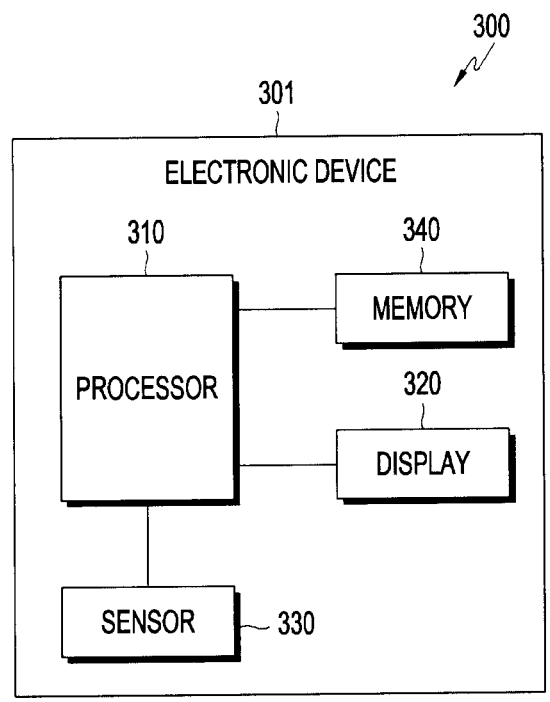
FIG. 3A is a block diagram illustrating an example of an electronic device according to an embodiment.

FIG. 3A is a block diagram 300 illustrating an example of an electronic device according to an embodiment. Referring to FIG. 3A, according to an embodiment, an electronic device 301 (e.g., the electronic device 101, 102, or 104 of FIG. 1) may include a processor 310 (e.g., the processor 120 of FIG. 1), a display 320 (e.g., the display 210 of FIG. 2), a sensor 330 (e.g., the sensor module 176 of FIG. 1 or the sensor module 276 of FIG. 2), a memory 340 (e.g., the memory 130 of FIG. 1), and a housing (not shown) to receive them. The housing may include a first housing forming at least a portion of a lower part of the electronic device 301 and at least a portion of a side part and a second housing at least partially overlapping with the first housing and coupled with the first housing to move (e.g., slide or roll) on the first housing. The display 320 may at least partially be mounted on the second housing and include a flexible display with a bendable display area.

According to an embodiment, as one (e.g., the second housing) of the first housing and the second housing moves (e.g., slides out, rolls out, slides in, or rolls in) on the other housing (e.g., the first housing) in a first direction (e.g., the lengthwise direction), a display area visually exposed to the outside of the electronic device 301 among areas of the display 320 mounted on the moving housing (e.g., the second housing) may be resized (e.g., enlarged or shrunken). According to an embodiment, when the display area visually exposed shrinks, at least a portion of the bendable display area may slide or roll in, and thus be retracted in, the space formed by the first housing. When the display area visually exposed is enlarged, the portion of the bendable display area which has been retracted in the space formed by the first housing may slide or roll out of the first housing and thus be visually exposed to the outside. The portion of the display area visually exposed to the outside may be retracted to at least partially be received by the first housing, e.g., as the second housing moves (e.g., slides in or rolls in). According to an embodiment, the resizing of the display area of the display 320 may be performed in response to, e.g., the user's direct touch input to the first housing, which is at least partially connected with the display 320, or an input to another structure (e.g., a home button or other dedicated button) (not shown) disposed on the electronic device 301.

The memory 340 may store instructions to enable the processor 310 to perform various operations when executed. For example, the processor 310 may determine that the screen is resized while being exposed in a first direction from a first surface of the display 320 as the first housing and the second housing slide over each other. The processor 310 may determine the screen resizing and determine whether the screen resizing meets a designated condition for changing the resolution. When the resizing is determined to not meet the designated condition for changing resolution, the processor 310 may control performing a designated image process on the screen area enlarged or shrunken as per the resizing of the screen exposed in the first direction. The designated image process may be performed by an image signal processor included in the processor 310 or an ISP configured in a separate device from the processor 310.

According to an embodiment, the electronic device 301 may further include a driver (not shown) electrically coupled with the first housing or the second housing to move (e.g., slide in or out) the housing. In this case, when a designated condition (e.g., a designated application, a designated time, a designated place, a designated motion, or a designated voice) is met even without the user's direct touch input to the display 320 or other structure, the display area of the display 320 may automatically be resized using the driver. For example, according to an embodiment, when a first designated application (e.g., a message application or a default home screen) is determined to be run, the designated application may be run on the display area shrunken. When there is determined to be a request for running a second designated application (e.g., a media (e.g., video) application), the display area of the display 320 may automatically be enlarged (e.g., slid out), and the second designated application may be run on the enlarged display area. Similarly, additionally, or alternatively, upon identifying a first designated time (e.g., a morning time), a first designated place (e.g., an office), a first designated motion (e.g., sifting or lying), or a first designated voice (e.g., a first user's voice command), the display area of the display, which is visually exposed to the outside, may be shrunken. Upon identifying a second designated time (e.g., a nighttime), a second designated place (e.g., home), a second designated motion (e.g., walking or running), or a second designated voice (e.g., a second user's voice command), the display area of the display 320, which is visually exposed to the outside, may be enlarged. According to an embodiment, the determination as to whether the designated is met or the operation of the driver may be performed under the control of the processor 310 or another processor (e.g., a DDI (e.g., the DDI 230 of FIG. 2) for the display 320).

Figure 3B:
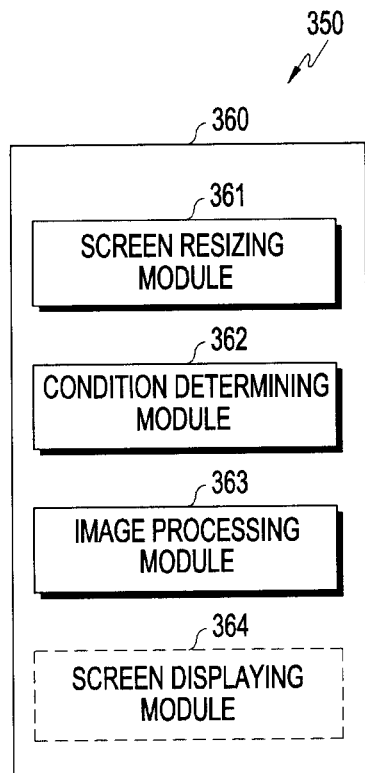
FIG. 3B is a block diagram illustrating an example of a flexible display control module of an electronic device according to an embodiment.

FIG. 3B is a block diagram 350 illustrating a flexible display control module 360 corresponding to corresponding control operations by instructions stored in the memory 340 and executed by, e.g., the processor 310. Referring to FIG. 3B, the flexible display control module 360 may include a screen resizing module 361, a condition determining module 362, and an image processing module 363. According to an embodiment, the flexible display control module 360 may further include a screen displaying module 364 (or submodules corresponding to the other control operations). Operations of the flexible display control module 360 are described below in detail with reference to, e.g., FIG. 4B.

According to an embodiment, an electronic device (e.g., the electronic device 101 of FIG. 1 or the electronic device 301 of FIG. 3) may comprise a first housing (e.g., the first housing 1850 of FIG. 18), a second housing (e.g., the second housing 1810 of FIG. 18) at least partially overlapping with the first housing, the second housing being movable, a flexible display (e.g., the flexible display 320 of FIG. 3 or the flexible display 1830 of FIG. 18) at least partially mounted on a surface of the second housing and including a flexible area at least partially received in an inner space of the first housing, such that at least a portion of the flexible area is configured to be visually exposed to the outside of the electronic device as the second housing moves over the first housing in a first direction and be retracted into the inner space of the first housing as the second housing moves over the first housing in a second direction (which is opposite to the first direction), a processor (e.g., the processor 310 of FIG. 3), and a memory (e.g., the memory 340 of FIG. 3), such that the memory may store instructions executed to enable the processor to control identifying the resizing of a screen visually exposed to the outside of the flexible display when the second housing moves over the first housing in the first direction or the second direction, determine whether the screen resizing meets a designated condition, and when the screen resizing does not meet the designated condition, perform a designated image process on the at least a portion corresponding to the resizing of the flexible display.

According to an embodiment, the memory may store instructions executed to enable the processor to, when the resizing meets the designated condition, control the change of the resolution of the screen visually exposed to the outside into a designated resolution.

According to an embodiment, the electronic device may further comprise a roller configured to bend the flexible display around a designated radius to allow the at least a portion of the flexible area retracted into the inner space of the first housing as the second housing moves over the first housing in the second direction to be disposed in parallel with the area visually exposed to the outside of the flexible display.

According to an embodiment, the memory may store instructions executed to enable the processor to control performing an image process including overlapping with a designated masking layer on an area of the screen increased or decreased corresponding to the resizing.

According to an embodiment, the memory may store instructions executed to enable the processor to control applying a first designated alpha blending value to a first area virtually exposed to the outside of the flexible display and a second designated alpha blending value to a second area retracted into the inner space of the first housing of the flexible display to generate the masking layer.

According to an embodiment, the memory may store instructions executed to enable the processor to control determining the size of an expanded area exceeding the resolution designated for the screen visually exposed to the outside according to the resizing, determine a type of information to be displayed on the expanded area at least partially based on the result of the determination, and display the information on the expanded area at least partially based on the determined type.

According to an embodiment, the type of information may include at least one of text, an icon, or a combination of text and an icon.

According to an embodiment, the memory may store instructions executed to enable the processor to control displaying an execution screen for a first application on the screen visually exposed to the outside of the flexible display, as an event related to a second application occurs, display information related to the event to overlap with at least a portion of the execution screen of the first application, determine an aspect ratio of the area of the increased or decreased screen of the flexible display according to the resizing, and adjust the information related to the event or the execution screen of the first application at least partially based on the determined aspect ratio.

According to an embodiment, the memory may store instructions executed to enable the processor to control determining an aspect ratio based on whether a mode of a screen displayed on the electronic device is a landscape view mode or a portrait view mode.

According to an embodiment, the electronic device may further comprise a dielectric disposed in the inner space of the first housing to face the second housing and having a second permittivity different from a first permittivity of an adjacent part, such that the memory may store instructions executed to enable the processor to control determining the position detected by the dielectric on the screen of the flexible display and determine the size of the screen visually exposed to the outside of the flexible display based on the determined position.

According to an embodiment, a portable communication device (e.g., the electronic device 101 of FIG. 1 or the electronic device 301 of FIG. 3) may comprise a first housing (e.g., the first housing 1850 of FIG. 18) forming at least a bottom portion and at least a side portion of the portable communication device, a second housing (e.g., the second housing 1810 of FIG. 18) at least partially overlapping with the first housing in a height direction of the portable communication device and movably coupled with the first housing, a flexible display (e.g., the flexible display 320 of FIG. 3 or the flexible display 1830 of FIG. 18) mounted on one surface of the second housing, when at least a display area of the flexible display is retracted into an inner space of the portable communication device when the second housing moves over the first housing in a first direction and is visually exposed to the outside when the second housing moves in a second direction opposite to the first direction, a first antenna formed in the first housing, and a second antenna formed in the second housing, such that the first antenna and the second antenna may be configured not to overlap with each other in a height direction.

According to an embodiment, at least the display area may be bendable when retracted into the inner space of the first housing.

According to an embodiment, at least an area of the second housing corresponding to at least the bendable display area (e.g., positioned under the display area) may be bendable.

According to an embodiment, the flexible display may further include another resizable display area visually exposed to the outside towards a rear surface of the portable communication device.

According to an embodiment, the other display area may be connected with at least the display area. According to an embodiment, the other display area may be physically connected with at least the display area. For example, the other display area may be expanded from at least the display area, allowing for display on the full area. According to an embodiment, at least the display area may be connected to a side, and the other display area may be connected to the opposite side, with a flexible printed circuit board (FPCB) disposed therebetween. According to an embodiment, some area corresponding to the FPCB is undisplayable, and at least the display area and the other display area connected with both the sides with the FPCB disposed therebetween are displayable.

According to an embodiment, the other display area may be configured to be visually exposed to the outside towards the rear surface when the second housing moves in the first direction and be retracted into the inner space when the second housing moves in the second direction.

According to an embodiment, the second housing may be configured to be slid in the first direction or the second direction by a force applied from the outside.

According to an embodiment, the portable communication device may further comprise a memory configured to store first context information indicating a first designated condition and second context information indicating a second designated condition; a driver configured to drive the first housing or the second housing; and a processor configured to obtain a designated condition in relation to executing the portable communication device, move the first housing in the first direction using the driver when the designated condition corresponds to the first designated condition, and move the second housing in the second direction using the driver when the designated condition corresponds to the second designated condition.

According to an embodiment, the processor may be configured to determine an application executed on the portable communication device or a place, a movement, a time, or a voice command for the portable communication device as at least part of the designated condition.

According to an embodiment, the processor may be configured to determine that the designated condition corresponds to the first designated condition when the application is a first designated application and determine that the designated condition corresponds to the second designated condition when the application is a second designated application.

According to an embodiment, an electronic device (e.g., the electronic device 101 of FIG. 1 or the electronic device 301 of FIG. 3) may comprise a first structure (e.g., the main bracket 7620 of FIG. 76) including a first flat plate (e.g., the first flat plate 7621 of FIG. 76) including a first surface and a second surface facing away from the first surface, a second structure (e.g., the back bracket 7670 of FIG. 76) including a second flat plate (e.g., the second flat plate 7671 of FIG. 76) facing the second surface of the first flat plate and forming a space towards the second surface, at least a portion of the first flat plate (an ending part) at least partially received in the space, and a flexible touchscreen display (e.g., the flexible display 7610 of FIG. 76) mounted on the first surface of the first flat plate and including a flexible area at least partially received in the space, such that the first flat plate is configured to move between a closed position in which the first flat plate moves over the second structure in a first direction to close in relation to the second structure and an open position in which the first flat plate moves over the second structure in a second direction opposite to the first direction to open in relation to the second structure, such that the flexible touchscreen display may include a flat part (e.g., the first surface 7611 of FIG. 76) expanding across at least a portion of the first surface and a bend (e.g., the second surface 7612 of FIG. 76) expanding from the flat part to the space in the closed position, and such that when the first flat plate moves from the closed position to the open state, at least a portion of the bend may be pulled from the space to form a substantially flat surface between the flat part and the second structure as viewed from above the first flat plate.

According to an embodiment, the second structure may further include a first side wall perpendicular to the second flat plate, a second side wall perpendicular to the first side wall and the second flat plate, and a third side wall perpendicular to the first side wall and the second flat plate and parallel with the second side wall, such that the second flat plate, the first side wall, the second side wall, and the third side wall may together form a trough with a side opening to receive at least a portion of the first structure, such that the first structure may be movable between the closed position and the open position in relation to the second structure in a first direction parallel to the second flat plate and the second side wall, and such that the first structure may be a first distance away from the first side wall in the closed position and be a second distance away from the first side wall in the open position, the second distance being larger than the first distance.

According to an embodiment, the electronic device may further comprise a shaft (e.g., the roller 1321 of FIG. 13) positioned in the trough, coupled with the second structure, and expanding away from the first side wall by a gap in a second direction perpendicular to the first direction and an expandable supporting structure (e.g., the supporting structure 1322a and 1322b of FIG. 13) positioned adjacent the first side wall, coupled with a surrounding of the first side wall, and bendingly expanded to the space around the shaft in the closed position, when the first structure moves from the closed position to the open state, at least a portion of the supporting structure may be pulled from the space to form a substantially flat surface between the first structure and the first side wall as viewed from above the first flat plate, and such that the bend of the flexible touchscreen display may be coupled with the supporting structure.

According to an embodiment, the supporting structure may include a plurality of bars (e.g., the multi-hinge structure 1840 of FIG. 18) coupled together in parallel with each other and expanding in the second direction.

According to an embodiment, the electronic device may further comprise a guiding structure attached to the second flat plate in the trough and configured to guide at least one guiding component coupled with the supporting structure.

According to an embodiment, the electronic device may further comprise a printed circuit board (PCB) (e.g., the PCB 7630 of FIG. 76) coupled with the first structure, a processor (e.g., the processor 310 of FIG. 3) affixed to the PCB and operatively connected with the flexible touchscreen display, and a memory (e.g., the memory 340 of FIG. 3) affixed to the PCB and operatively connected with the processor.

According to an embodiment, the first flat plate may include a first area, and the second flat plate may include a second area smaller than the first area According to an embodiment, the electronic device may further comprise a third flat plate coupled with the first structure to position the PCB between the second surface and the third flat plate.

According to an embodiment, the electronic device may further comprise a piezoelectric speaker (e.g., the sound output device 155 of FIG. 1) between the third flat plate and the second surface of the first structure.

According to an embodiment, the electronic device may further comprise a member (e.g., the dielectric 1870 of FIG. 18) coupled with the second structure in the trough and having a selected capacitance, such that the memory may store instructions executed to enable the processor to receive coordinates on the flexible touchscreen display, which are closest to the member from a display layer and determine the position of the first structure between the closed position and the open position at least partially based on the coordinates.

According to an embodiment, in the closed position, the bend of the flexible touchscreen display may be further expanded to a space between the second surface of the first structure and the second flat plate of the second structure.

According to an embodiment, the electronic device may further comprise a display drive integrated circuit (DDI) (e.g., the DDI 230 of FIG. 2) affixed to the bend of the flexible touchscreen display to be positioned between the first structure and the bend in the closed position.

According to an embodiment, an electronic device (e.g., the electronic device 101 of FIG. 1 or the electronic device 301 of FIG. 3) may comprise a first housing (e.g., the first housing 1850 of FIG. 18), a second housing (e.g., the second housing 1810 of FIG. 18) at least partially overlapping with the first housing, the second housing being movable, a flexible display (e.g., the flexible display 1830 of FIG. 18) at least partially mounted on a surface of the second housing and including a flexible area at least partially received in an inner space of the first housing, such that at least a portion of the flexible area is configured to be visually exposed to the outside of the electronic device as the second housing moves over the first housing in a first direction and be retracted into the inner space of the first housing as the second housing moves over the first housing in a second direction, a processor (e.g., the processor 310 of FIG. 3), and a memory (e.g., the memory 340 of FIG. 3), such that the memory may store instructions executed to enable the processor to control displaying an image for key entry in a first position on a first surface of the flexible display, determine the resizing of a screen visually exposed to the outside on a first surface of the flexible display as the first housing and the second housing move in a first direction, update the exposed screen except for the image for key entry as per the screen resizing, and when the movement stops within a designated time, display the image for key entry in a second position changed given a distance of the movement.

According to an embodiment, an electronic device (e.g., the electronic device 101 of FIG. 1 or the electronic device 301 of FIG. 3) may comprise a first housing (e.g., the first housing 1850 of FIG. 18), a second housing (e.g., the second housing 1810 of FIG. 18) at least partially overlapping with the first housing, the second housing being movable, a flexible display (e.g., the flexible display 1830 of FIG. 18) at least partially mounted on a surface of the second housing and including a flexible area at least partially received in an inner space of the first housing, such that at least a portion of the flexible area is configured to be visually exposed to the outside of the electronic device as the second housing moves over the first housing in a first direction and be retracted into the inner space of the first housing as the second housing moves over the first housing in a second direction, a processor (e.g., the processor 310 of FIG. 3), and a memory (e.g., the memory 340 of FIG. 3), such that the memory may store instructions executed to enable the processor to control to displaying an execution screen of a first application on a first area of a first surface of the flexible display, display an execution screen of a second application on a second area of the first surface of the flexible display, determine a reorientation of the electronic device, and change display layouts of the first application and the second application given an aspect ratio of the first application or an aspect ratio of the second application and corresponding to the reorientation.

Figure 4A:
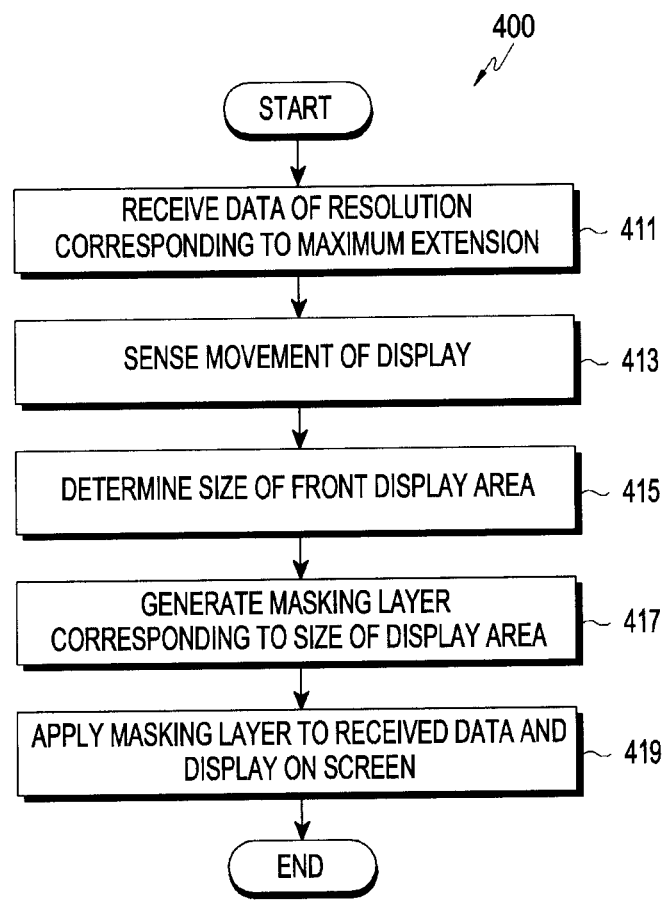
FIG. 4A is a flowchart illustrating an example of identifying a resizing of a display of an electronic device according to an embodiment.

FIG. 4A is a flowchart 400 illustrating an example of identifying the resizing of a display of an electronic device according to an embodiment. Referring to FIG. 4A, in operation 411, an electronic device (e.g., the electronic device 101 of FIG. 1 or the electronic device 301 of FIG. 3) (e.g., the processor 120 or 310 of the electronic device) may receive data of a screen resolution corresponding to when the display (e.g., a flexible display) of the electronic device has been maximally expanded.

In operation 413, the electronic device may detect the resizing of a display area (e.g., a screen area exposed in the first direction) of a front surface (e.g., a first surface) of the display as the display (e.g., a flexible display) moves.

In operation 415, the electronic device may determine the changed size of the display area.

In operation 417, the electronic device may generate a masking layer corresponding to the determined size of the display area. In operation 419, the electronic device may apply the generated masking layer to the data of screen resolution corresponding to the maximum expansion received and display the same on the screen. Various embodiments of applying a masking layer and displaying on the screen by the electronic device are described later.

Figure 4B:
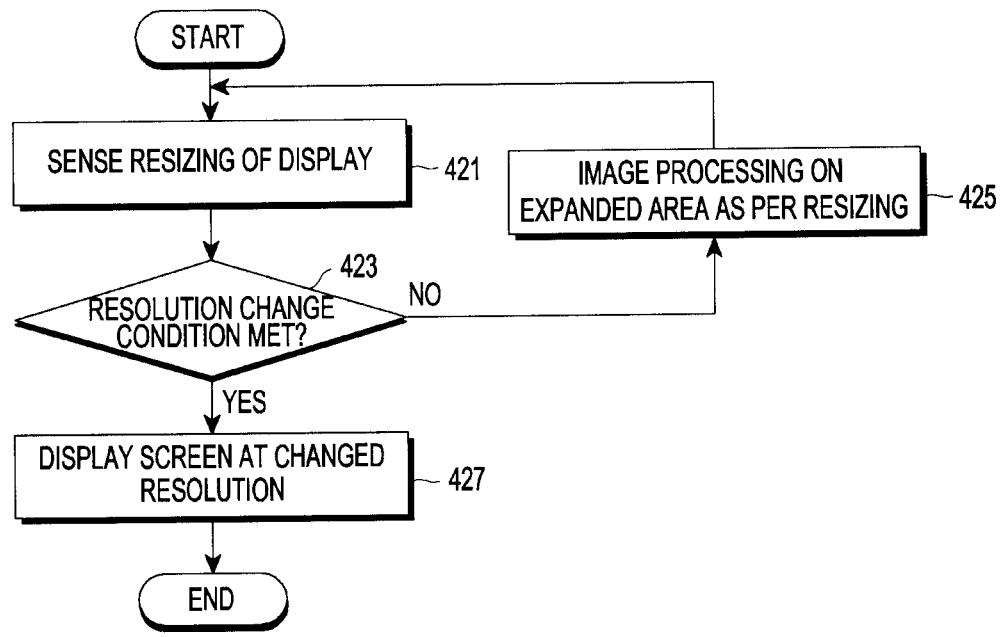
FIG. 4B is a flowchart illustrating an example of identifying a resizing of a display of an electronic device according to an embodiment.

FIG. 4B is a flowchart illustrating an example of identifying the resizing of a display of an electronic device according to an embodiment. Referring to FIG. 4B, in operation 421, an electronic device (e.g., the electronic device 101 of FIG. 1 or the electronic device 301 of FIG. 3) (e.g., the processor 120 or 310 of the electronic device) or the flexible display control module 360 of FIG. 3B) may detect the resizing of the display (e.g., a flexible display) of the electronic device using, e.g., at least one sensor (e.g., a hall sensor, touch sensor, force sensor, or dielectric). For example, the electronic device may detect the resizing of a display area (e.g., a screen area exposed in the first direction) of a front surface (e.g., a first surface) of the display as the display (e.g., a flexible display) moves. According to an embodiment, detecting the resizing may be performed by, e.g., the screen resizing module 361.

In operation 423, the electronic device may determine whether a designated resolution change condition is met as the display is resized. When the resolution change condition is determined to not be met, in operation 425, the electronic device may perform a designated image process (e.g., alpha blending using the masking layer or displaying brief information or an icon of application associated with the current screen) on the area enlarged or shrunken by the resizing (e.g., enlarging or shrinking). Various embodiments of applying a masking layer and displaying on the screen by the electronic device are described later. The image process may be performed by, e.g., the image processing module 363.

When the resolution change condition is determined to be met, in operation 427, the electronic device may apply the changed resolution and display the resized screen. According to an embodiment, displaying the resized screen may be performed by, e.g., the screen displaying module 364.

According to an embodiment, a method for controlling an electronic device including a first housing, a second housing at least partially overlapping with the first housing, the second housing being movable, a flexible display at least partially mounted on a surface of the second housing and including a flexible area at least partially received in an inner space of the first housing, such that at least a portion of the flexible area is configured to be visually exposed to the outside of the electronic device as the second housing moves over the first housing in a first direction and be retracted into the inner space of the first housing as the second housing moves over the first housing in a second direction opposite to the first direction, a processor, and a memory may comprise identifying the resizing of a screen visually exposed to the outside of the flexible display when the second housing moves over the first housing in the first direction or the second direction, determining whether the screen resizing meets a designated condition, and when the screen resizing does not meet the designated condition, performing a designated image process on the at least a portion corresponding to the resizing of the flexible display.

According to an embodiment, the method may further comprise, when the resizing meets the designated condition, changing the resolution of the screen that is visually exposed to the outside into a designated resolution.

According to an embodiment, the method may further comprise performing an image process including overlapping with a designated masking layer on an area of the screen increased or decreased corresponding to the resizing.

According to an embodiment, the method may further comprise applying a first designated alpha blending value to a first area virtually exposed to the outside of the flexible display and a second designated alpha blending value to a second area retracted into the inner space of the first housing of the flexible display to generate the masking layer.

According to an embodiment, the method may further comprise determining the size of an expanded area exceeding the resolution designated for the screen visually exposed to the outside according to the resizing, determining a type of information to be displayed on the expanded area at least partially based on the result of the determination, and displaying the information on the expanded area at least partially based on the determined type.

According to an embodiment, the type of information may include at least one of text, an icon, or a combination of text and an icon.

According to an embodiment, the method may further comprise displaying an execution screen for a first application on the screen visually exposed to the outside of the flexible display, as an event related to a second application occurs, displaying information related to the event to overlap with at least a portion of the execution screen of the first application, determining an aspect ratio of the area of the increased or decreased screen of the flexible display according to the resizing, and adjusting the information related to the event or the execution screen of the first application at least partially based on the determined aspect ratio.

According to an embodiment, the method may further comprise determining an aspect ratio based on whether a mode of a screen displayed on the electronic device is a landscape view mode or a portrait view mode.

According to an embodiment, the method may further comprise displaying an image for key entry in a first position on a first surface of the flexible display, determining the resizing of a screen visually exposed to the outside on a first surface of the flexible display as the first housing and the second housing slide-move in a first direction, update the exposed screen except for the image for key entry as per the screen resizing, and when the movement stops within a designated time, display the image for key entry in a second position changed given a distance of the movement.

According to an embodiment, the method may further comprise displaying an execution screen of a first application on a first area of a first surface of the flexible display, displaying an execution screen of a second application on a second area of the first surface of the flexible display, determining a reorientation of the electronic device, and changing display layouts of the first application and the second application given an aspect ratio of the first application or an aspect ratio of the second application and corresponding to the reorientation.

Figure 5:
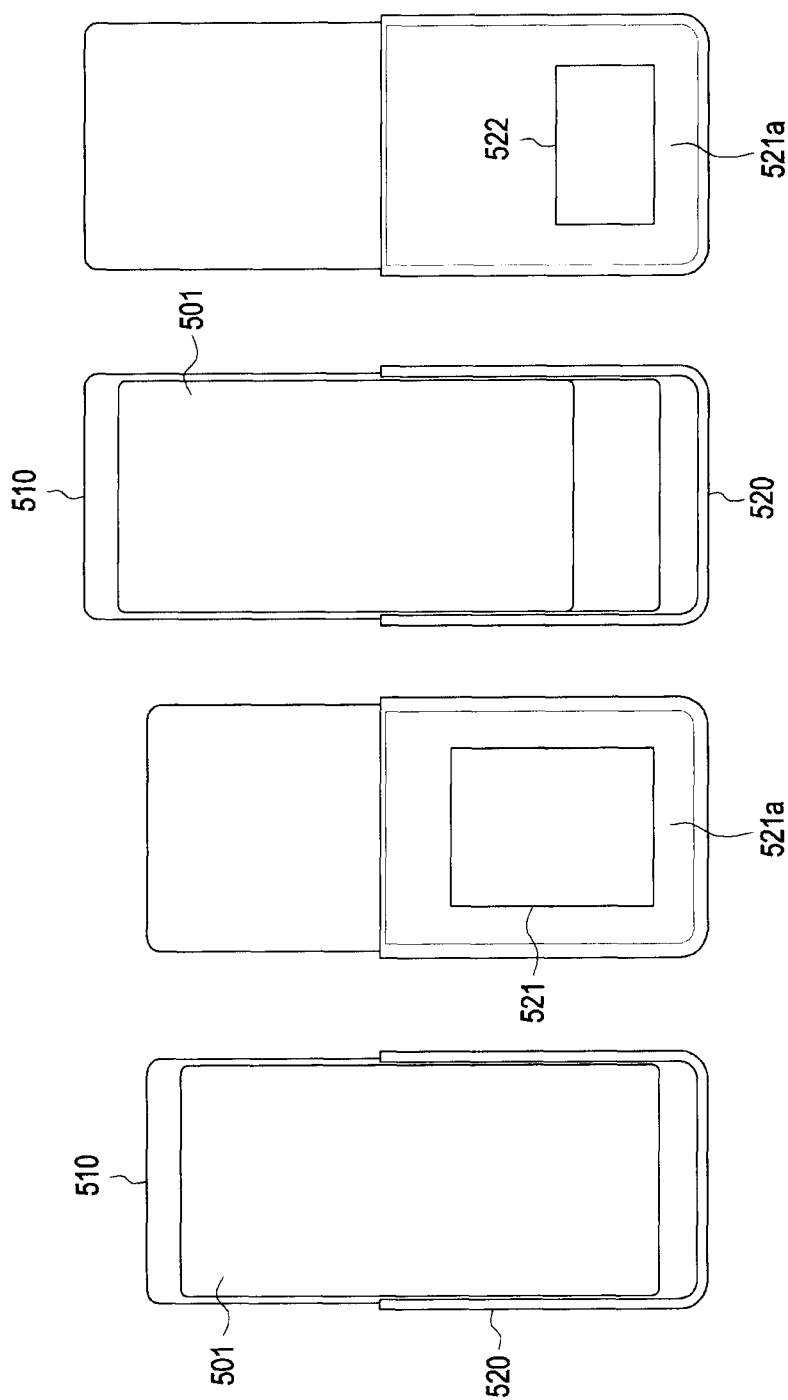
FIG. 5 is a view illustrating various examples of expansion of a flexible display of an electronic device according to an embodiment.

FIG. 5 is a view illustrating various examples of expansion of a flexible display of an electronic device according to an embodiment. Referring to FIG. 5, an electronic device (e.g., the electronic device 101 or 301) may include a first housing 520, a second housing 510, and a flexible display 501.

According to an embodiment, at least part of the flexible display 501 may be affixed or coupled to the second housing 510. At least part of the second housing 510 may overlap with the first housing 520 and be slide-engaged with the first housing 520.

The flexible display 501 may be configured such that the portion of the flexible display 501 actually exposed for viewing and display can be adjusted in size. That is, the display area of the flexible display 501 can in some cases be "shrunken" by at least partial insertion into the second housing 510, as the second housing 510 and the first housing 520 slide relative to one other. According to an embodiment, the flexible display 501 may be stowed inside the second housing 510 by curving into a "U-shape."

For example, as shown in FIG. 5, when the flexible display 501 expands from the second housing 510, the display area of the flexible display 501 may be reduced in size, as seen from 521 to 522, as disposed on the rear surface of the electronic device 500.

According to an embodiment, one side surface of the second housing 510 may be formed as a curved surface, to connect the front and rear surfaces of the electronic device 500. For example, the flexible display 501 may at least partially slide in or out along the curved surface within the second housing 510

According to an embodiment, as the first housing 520 and the second housing 510 slide relative to one other, the flexible display 501 may slide into or out of the first housing 520 (depending on the direction of motion) while being physically supported by the second housing 510. As the second housing 510 moves, at least part of the flexible display 501 may be received into the interior of the first housing 520, or be expanded towards the other side surface of the first housing 520.

According to an embodiment, at least part of the second housing 510 or the first housing 520 may include a transparent window 521a. The rear display area 521 of the flexible display 501 received inside the first housing 520 may be exposed through the transparent window 521a. For example, as the second housing 510 and the first housing 520 slide relative to one other, the area of the rear display area 521 exposed to the outside of the first housing 520 through the transparent window 521a by change, as illustrated in FIG. 5.

According to an embodiment, the flexible display 501 may at least partially be received in an inner space formed by the bottom surface and two or more side surfaces of the first housing 520.

Figure 6:
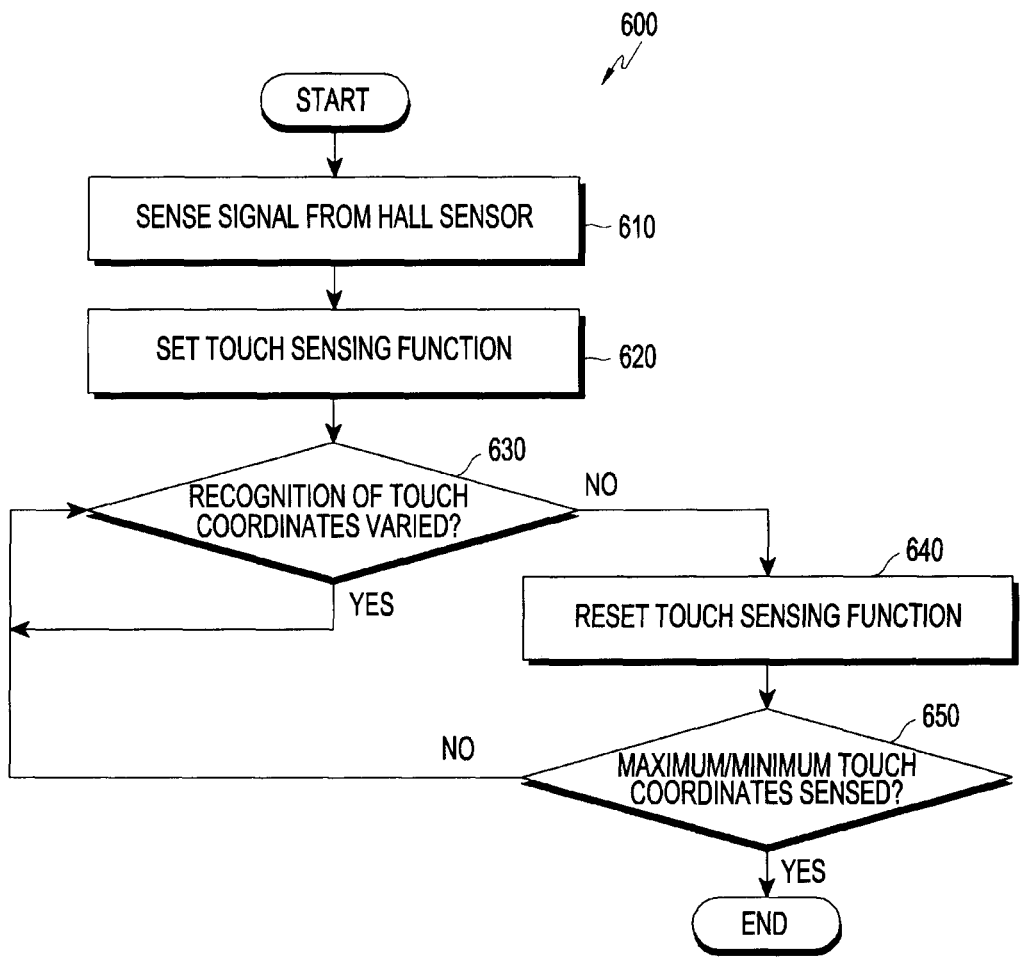
FIG. 6 is a flowchart illustrating an example of identifying a resizing of a display of an electronic device according to an embodiment.

FIG. 6 is a flowchart 600 illustrating an example of identifying the resizing of a display of an electronic device according to an embodiment.

Referring to FIG. 6, in operation 610, an electronic device (e.g., the electronic device 101 of FIG. 1 or the electronic device 301 of FIG. 3) (e.g., the processor 120 or 310 of the electronic device) may detect a signal from a hall sensor.

According to an embodiment, the electronic device may include the hall sensor (e.g., the hall sensor may be mounted on a printed circuit board (PCB) inside the electronic device). The electronic device may determine a repositioning of the second housing from a signal sensed by the hall sensor and determine, e.g., the position or movement of the flexible display based on the repositioning of the second housing. According to an embodiment, the electronic device may grasp the moved position of the flexible display and determine whether the flexible display has expanded or shrunken by the hall sensor, and the electronic device may determine, e.g., the start and end of movement of the flexible display through a variation in value sensed by the hall sensor.

In operation 620, the electronic device may set a touch sensing function. According to an embodiment, when the function for sensing touch inputs is currently off (e.g., when there is no image displayed on the screen), the electronic device may activate the touch sensing function, and upon identifying a touch input made within a pre-designated time, disregard, or disable the function of, the touch input and initialize the touch sensing function. For example, according to an embodiment, the electronic device may reset the reference point for determining touch input.

In operation 630, the electronic device may identify whether recognition of coordinates of a touch at a particular position is varied. When the recognition of coordinates of a touch at the particular position is identified to be varied, the electronic device may perform operation 630.

Unless the recognition of coordinates of a touch is identified to be varied, the electronic device may reset the touch sensing function or the coordinates of a touch in operation 640. For example, the electronic device may identify the resizing of the flexible display based on the sensed signal from the hall sensor and reset the coordinates of a touch on the flexible display according to the resizing. For example, the electronic device may reset the reference point for touch input determination and initialize the touch sensing function.

In operation 650, the resetting of the touch sensing function may be performed within a range from maximum touch coordinates and minimum touch coordinates.

Figure 7:
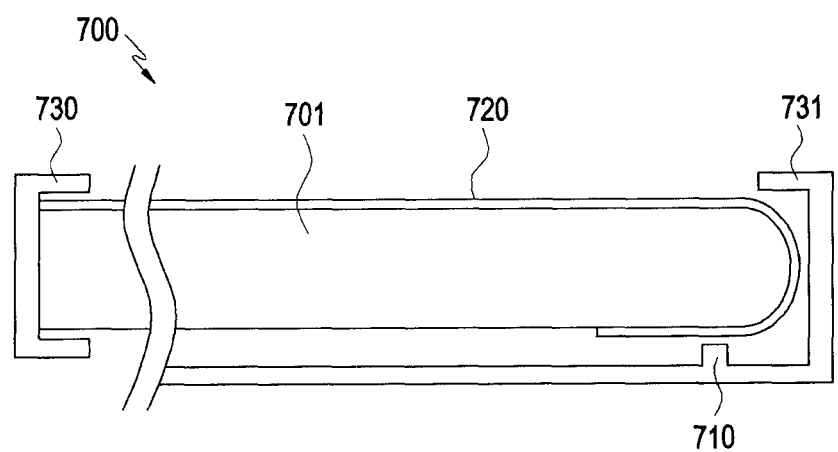
FIG. 7 is a view illustrating an example of an electronic device according to an embodiment.

FIG. 7 is a view illustrating an example of a configuration of an electronic device according to an embodiment. Referring to FIG. 7, an electronic device 700 may include a main body 701, a dielectric 710, a flexible display 720, a first housing 731, or a second housing 730.

According to an embodiment, at least a side surface of the main body 701 may be a curved surface to facilitate sliding of the flexible display 720 along the curved surface. For example, various pieces of information may be displayed on the flexible display 720 according the state of at least part of the flexible display 720, while the flexible display 720 is exposed on the main body 701 through the front surface of the electronic device 700.

According to an embodiment, the dielectric 710 may contain a material with a permittivity different from that of surrounding components. The flexible display 720 may interact with the dielectric 710 in consideration of the coordinates of at least one touch or a pixel positioned in a particular area contacting or approaching the dielectric 710, which may be used to determine whether the flexible display 720 moves. The position or size of the screen display area may be based on the coordinates of the at least one touch or pixel, as sensed by the dielectric 710. According to an embodiment, the dielectric 710 may be affixed to at least a partial surface inside the first housing 731 not to come in contact with the flexible display 720.

According to an embodiment, as the second housing 730 and the first housing 731 slide over each other, the flexible display 720 may be at least partially moved along the curved surface from the rear to front surface or from the front to rear surface.

Figure 8:
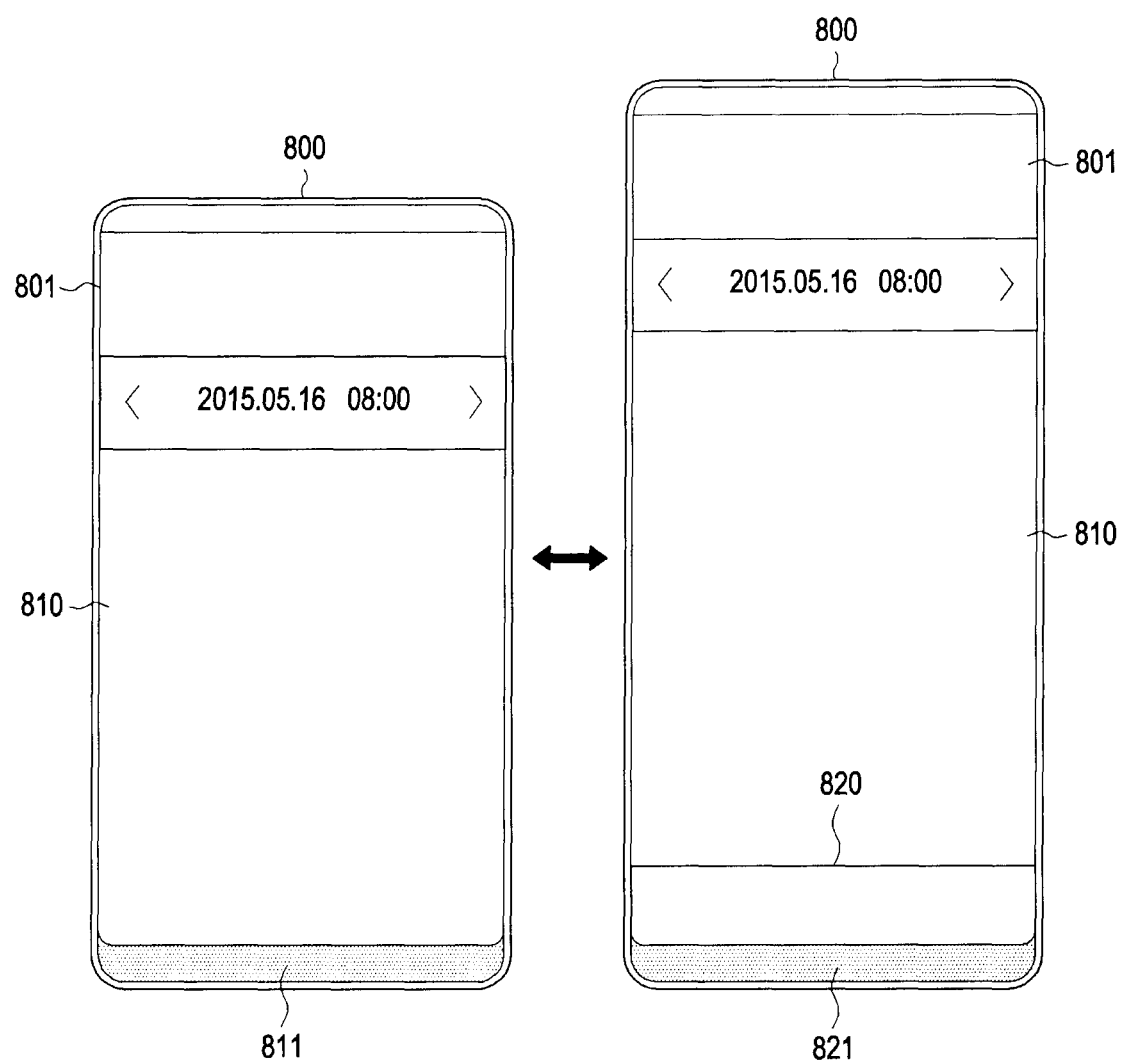
FIG. 8 is a view illustrating an example of a screen displayed as a flexible display of an electronic device resizes according to an embodiment.

FIG. 8 is a view illustrating an example of a screen configuration displayed as a flexible display of an electronic device resizes according to an embodiment.

According to an embodiment, an electronic device 800 may include a flexible display 801. As a sliding part (e.g., the second housing) of the electronic device 800 moves, a portion of the flexible display 801 may come into the inside of the electronic device 800 to shrink or expand to the outside.

Referring to FIG. 8, the flexible display 801 may display screen 810 corresponding to an application running on the electronic device 800. The size of the screen display area 810 of the application may correspond to the resolution of the flexible display 801. The electronic device 800 may process and display at least part of the application screen 810 depending on the size of the portion exposed through the front surface of the electronic device 800 of the overall area of the flexible display 801.

According to an embodiment, the user may move a sliding portion (e.g., the sliding part) downwards in order to expand the screen display area 810 of the flexible display 801 exposed. For example, the electronic device 800 may perform image processing on the screen area 820 corresponding to the expanded portion of the whole screen of the application, according to a designated scheme.

According to an embodiment, the flexible display 801 may at least partially include a curved surface according to the shape of the main body of the electronic device 800. The electronic device 800 may set the display of screen areas 811 and 821 displayed on the curved surface. For example, the electronic device 800 may apply, for example various image effects, colors, or filters to the screen areas displayed on the curved surface. Various relevant embodiments are described below.

Figure 9:
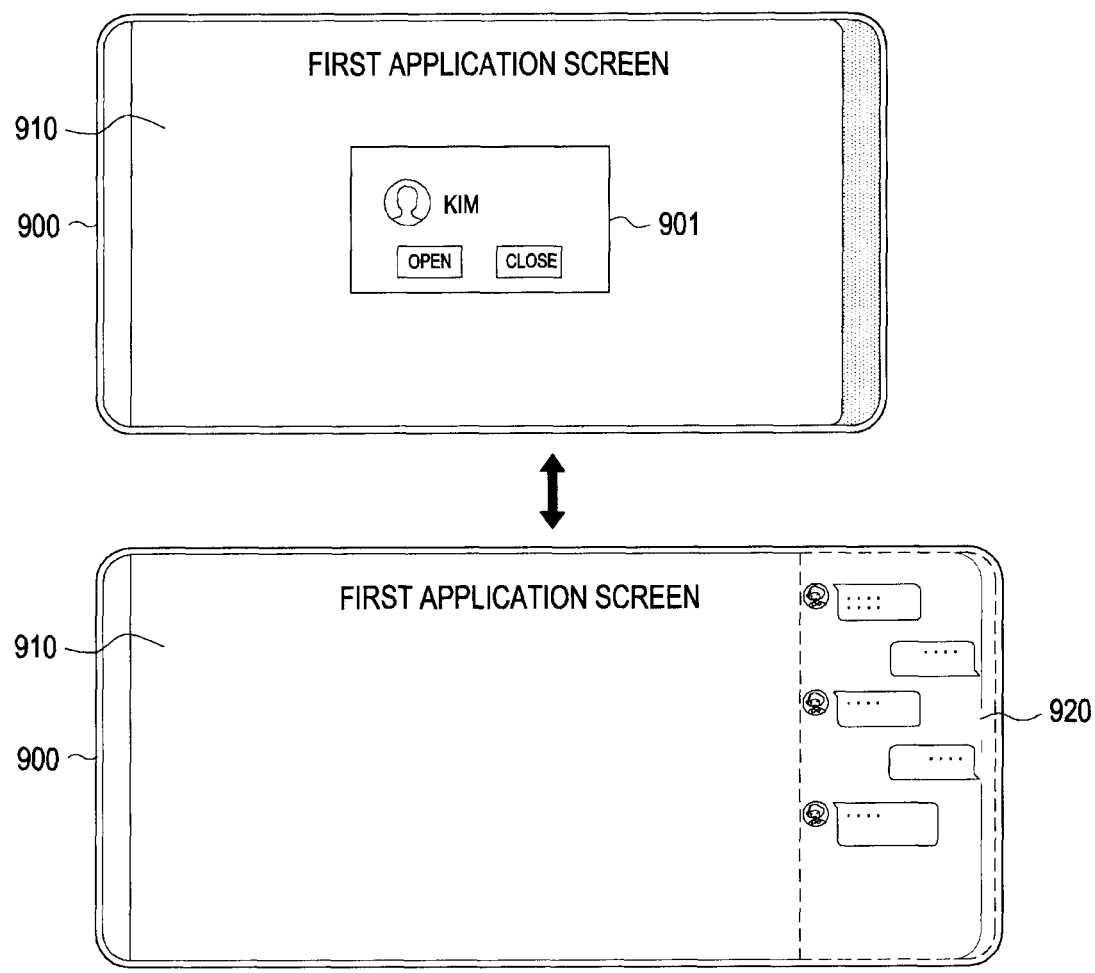
FIG. 9 is a view illustrating an example of a screen displayed as a flexible display of an electronic device resizes according to an embodiment.

FIG. 9 is a view illustrating an example of a screen configuration displayed as a flexible display of an electronic device resizes according to an embodiment.

According to an embodiment, an electronic device 900 (e.g., the electronic device 101 of FIG. 1 or the electronic device 301 of FIG. 3) may include a flexible display. As a second housing (e.g., a sliding part) of the electronic device 900 moves, a portion of the flexible display may selectively be inserted into the inside of the electronic device, or may expand to an exterior.

Referring to FIG. 9, the electronic device 900 may display a screen 910 of a first application being executed through the flexible display. For example, the first application may provide a resolution-fixed screen. The electronic device 900 may display the screen according to the designated resolution and considering the orientation (e.g., the landscape orientation) of the electronic device 900.

According to an embodiment, while the screen 910 of the first application is displayed, an event related to a second application may occur in the electronic device 900. For example, the electronic device 900 may overlay and display a notification message 901 to indicate the occurrence of the second application-related event on at least a portion of the screen 910 of the first application.

According to an embodiment, the electronic device 900 may identify whether the area of the flexible display expands within a designated time of the display of the notification message 901. For example, when the area of the flexible display expands within the designated time, the electronic device 900 may display the execution screen 920 of the second application on the expanded portion 920 of the flexible display.

According to an embodiment, when the area of the flexible display shrinks, the execution screen 920 of the second application may be undisplayed, an image (e.g., an icon) related with the second application may be displayed, or the execution screen 920 may be relocated in another portion while overlapping with the execution screen 910 of the first application or be transformed and relocated in another portion.

According to an embodiment, an event related to the second application may arise while the execution screen 910 of the first application is being displayed with the area of the flexible display of the electronic device 900 expanded. When a second application-related event occurs with the flexible display of the electronic device 900 already expanded, the electronic device 900 may display the execution screen 920 of the second application on the expanded portion of the flexible display even without an extra manipulation or user input to the flexible display.

According to an embodiment, when a second application-related event occurs, the electronic device 900 may determine whether the screen of the flexible display is in the expanded or shrunken state, and when an operation (e.g., an execution operation preset by the user or a real-time execution operation) corresponding to the occurrence of the event is performed, rearrange the screen 910 of the first application and the screen 920 of the first application based on the aspect ratio of the screen area of the flexible display.

According to an embodiment, after the rearrangement of the screen 910 of the first application and the screen 920 of the second application, when the area of the flexible display shrinks, information related to the event corresponding to the second application may be displayed using a reduced size, reconfigured or rearranged, minimized or otherwise removed from display to accommodate the shrunken screen size.

Figure 10:
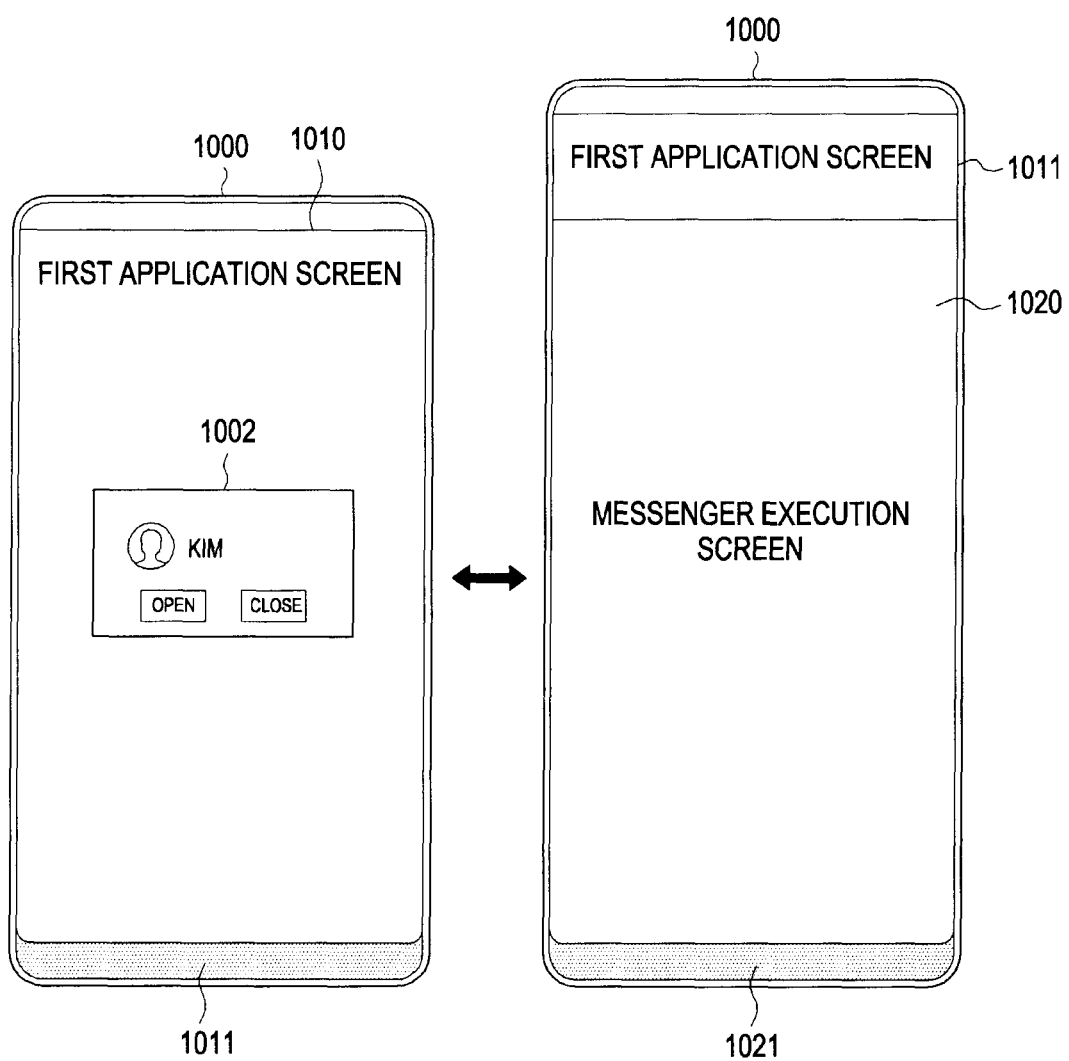
FIG. 10 is a view illustrating an example of a screen displayed according to an orientation of an electronic device as a flexible display of the electronic device resizes according to an embodiment.

FIG. 10 is a view illustrating an example of a screen configuration displayed according to an orientation of an electronic device as a flexible display of the electronic device resizes according to an embodiment.

Referring to FIG. 10, the electronic device 1000 may display a screen 1010 of a first application being executed through the flexible display. For example, the first application may provide a resolution-fixed screen. The electronic device 1000 may display the screen according to the designated resolution and considering the orientation (e.g., the portrait orientation) of the electronic device 1000.

According to an embodiment, while the screen 1010 of the first application is displayed, an event related to a second application may occur in the electronic device 1000. For example, the electronic device 1000 may display a notification message 1002 to indicate the occurrence of the second application-related event on the screen 1010 of the first application.

According to an embodiment, the electronic device 1000 may identify whether the area of the flexible display expands within a pre-designated time of the display of the notification message 1002. For example, when the area of the flexible display expands within the designated time, the electronic device 1000 may reconfigure and display the execution screen 1010 of the first application on the expanded portion 1011 of the flexible display and display the execution screen 1020 of the second application on the portion on which the execution screen 1010 of the first application has previously been displayed.

According to an embodiment, when the area of the flexible display shrinks, the execution screen 1020 of the second application may be undisplayed, an image (e.g., an icon) related with the second application may be displayed, or the execution screen 1020 may be relocated in another portion while overlapping with the execution screen 1010 of the first application or be transformed and relocated.

According to an embodiment, the flexible display may at least partially a curved surface depending on the shape of the main body of the electronic device 1000. For example, the electronic device 101 may set and display the portion 1011 of the screen 1010 of the first application and the portion 1021 of the screen 1020 of the second application which are displayed on the curved surface, differently from their surroundings. For example, the electronic device 1000 may apply, e.g., various image effects, colors, or filters to the screen areas displayed on the curved surface.

Figure 11:
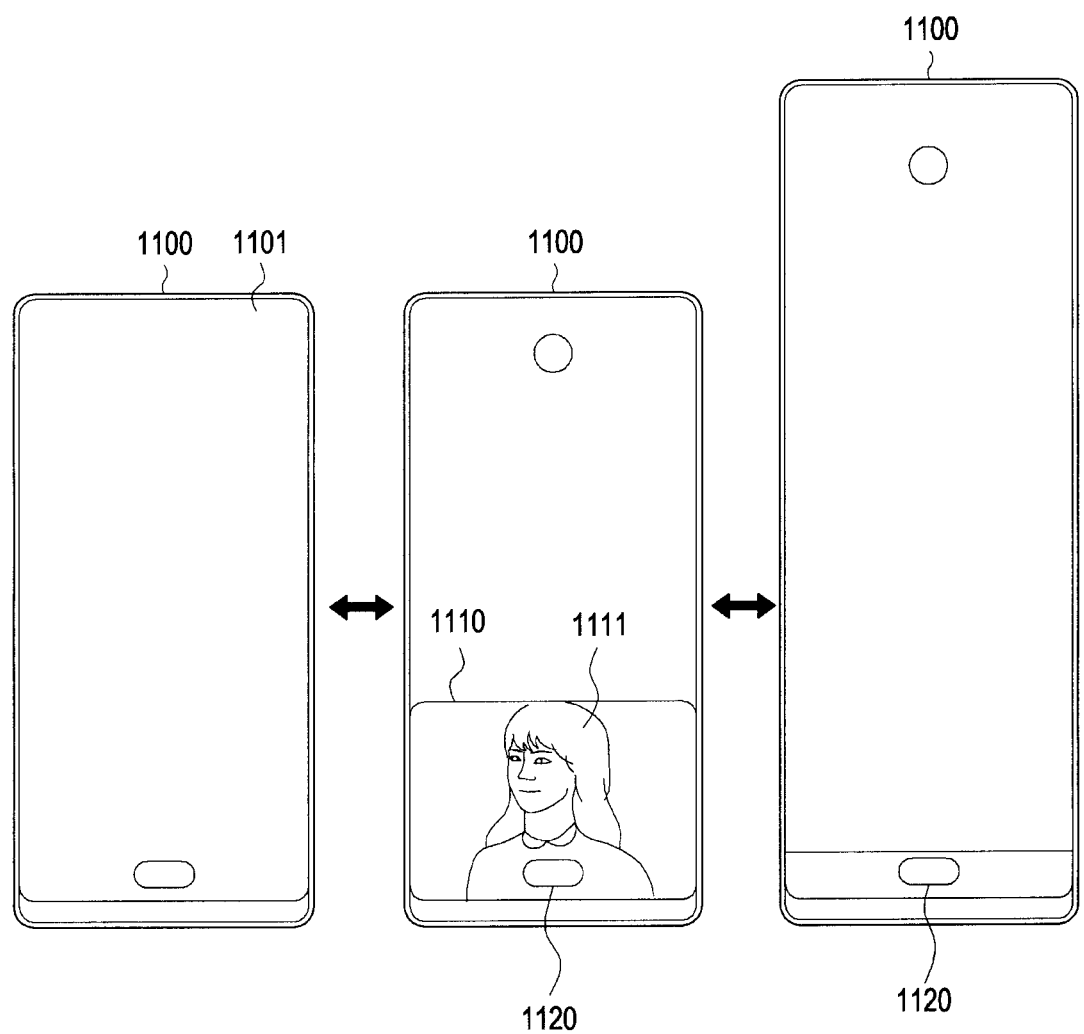
FIG. 11 is a view illustrating an example of a screen displayed on a rear surface of an electronic device as a flexible display of the electronic device resizes according to an embodiment.

FIG. 11 is a view illustrating an example of a screen configuration displayed on a rear surface of an electronic device as a flexible display of the electronic device resizes according to an embodiment.

According to an embodiment, an electronic device 1100 may include a flexible display 1101. For example, the electronic device 1100 may set screens to be displayed on the rear surface portion of the screen of the flexible display 1101 depending on running applications.

Referring to FIG. 11, as the flexible display 1101 moves so that the display area expands or shrinks, the electronic device 1100 may identify the screen portion 1110 displayed on the rear surface of the flexible display 1101. For example, the electronic device 1100 may reconfigure and display the screen 1111 of the running application depending on the size of the screen portion 1110 displayed on the rear surface. According to an embodiment, an image (e.g., a button 1120 for taking photos) for key entry or a multi-window screen may be displayed on the screen portion 1110 displayed on the rear surface.

According to an embodiment, the application may be a camera application, and a button 1120 for taking photos may be displayed on the screen 1111 of the running application.

According to an embodiment, when the area of the flexible display, which has been exposed on the rear surface of the electronic device 1100 as it expands, shrinks while the screen 1111 of the application is being displayed, the electronic device 1100 may display at least part (e.g., the button 1120) of the screen (1111) configuration of the application on the shrunken area of the flexible display, configure a screen related to the application (e.g., changes the color of the screen into white to play a role as a flashlight), or change the screen resolution.

Figure 12:
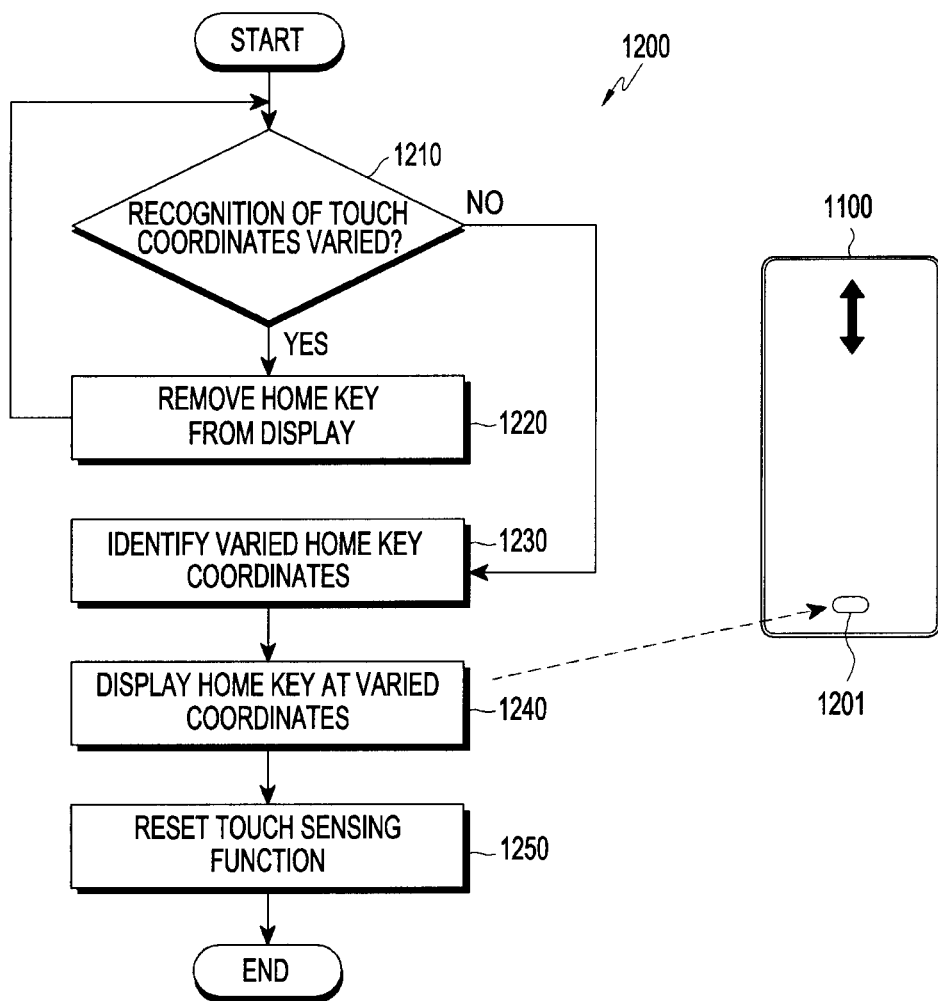
FIG. 12 is a flowchart illustrating an example of displaying an object as a flexible display of an electronic device resizes according to an embodiment.

FIG. 12 is a flowchart 1200 illustrating an example of displaying an object as a flexible display of an electronic device resizes according to an embodiment. Referring to FIG. 12, a home key 1201 may be displayed on at least a portion of the screen area of the flexible display of the electronic device 1100. According to an embodiment, when the flexible display expands or shrinks, a change may be made to the screen displayed on the front surface of the flexible display. According to an embodiment, the home key 1201 may be implemented to be positioned within a constant distance from the bottom of the electronic device despite the screen resizing of the flexible display.

In operation 1210, the electronic device (e.g., the electronic device 101 of FIG. 1 or the electronic device 301 of FIG. 3) may determine whether the coordinates of a touch shift using a hall sensor or dielectric as the flexible display slides to expand or shrink its area.

According to an embodiment, in operation 1210, the electronic device may determine whether the screen is resized by the slide and resultant expansion (or shrinkage) of the flexible display, using, e.g., the coordinates of a touch sensed by a hall sensor or dielectric.

Upon identifying a change in the touch coordinates by a hall sensor, the electronic device 1100 may, e.g., temporarily stop displaying the home key 1201 being displayed in the designated position on the flexible display in operation 1220.

When a predetermined time elapses and the flexible display stops moving, the electronic device may determine the coordinates for the current display on the flexible display in operation 1230. In other words, when the flexible display moves, the electronic device 1100 may determine the change coordinates for the display, which has been made by the movement.

In operation 1240, the electronic device may display the home key at the change coordinates. The change coordinates may reflect the movement of the flexible display and be yielded by adding or subtracting the moved distance of the flexible display to/from the pre-change coordinates.

In operation 1250, the electronic device may update the touch reference position for the flexible display, resetting the touch sensing function. For example, the electronic device may update the touch input coordinates for the home key and reset the reference point for touch input determination.

Figure 13:
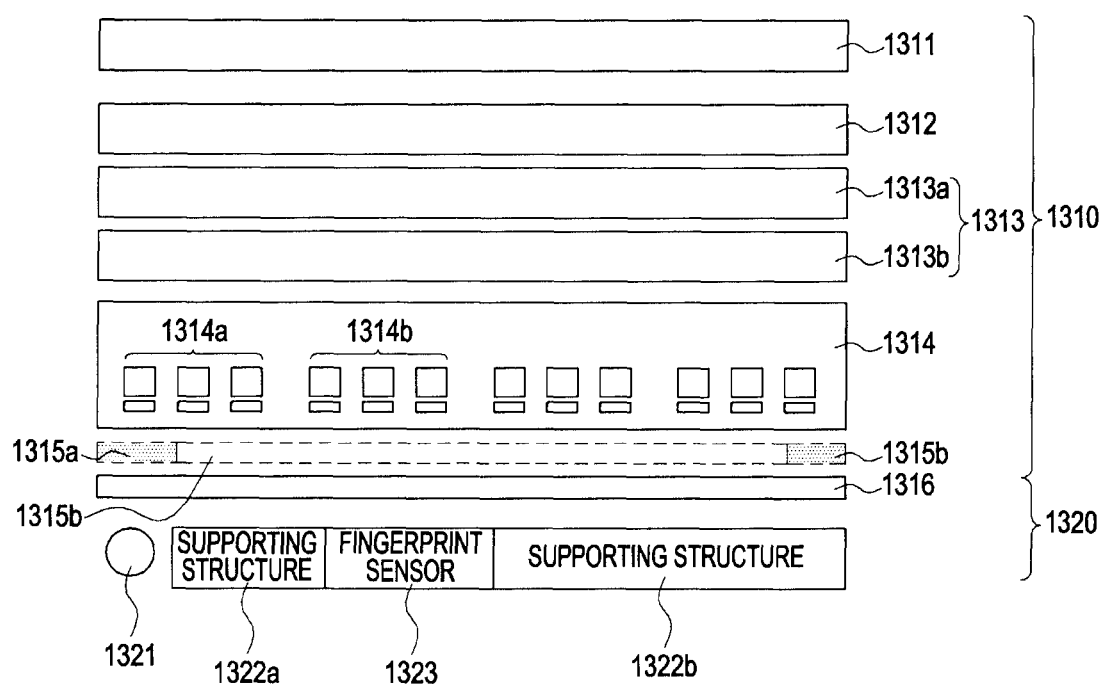
FIG. 13 is a cross-sectional view illustrating an example of a display of an electronic device according to an embodiment.

FIG. 13 is a cross-sectional view illustrating an example of a display of an electronic device according to an embodiment. Referring to FIG. 13, an electronic device may include a sliding part 1310 and a fixture 1320. For example, the fixture 1320 may be affixed to the main body of the electronic device, and the sliding part 1310 may be configured to slide along the curved surface of the main body.

The sliding part 1310 may include, e.g., a transparent cover 1311, at least one retarder (e.g., a first retarder 1312, a second retarder 1313*b*, or a third retarder 1316), polarizers 1313, and a display panel 1314. The retarder may also be referred to as a retardation layer, phase retarder, phase retardation plate, or waveplate.

The cover 1311 may be disposed on the front surface of the electronic device or housing or may be disposed to form at least a portion of the front surface. The cover 1311 may also be referred to hereinafter as a transparent member, window, or cover glass. According to an embodiment, the cover 131 may contain, e.g., a polyimide (PI) film. According to an embodiment, another cover with a similar material to the cover 1311 may be formed on the cover 1311 to protect the cover 1311.

The first retarder 1312 may convert linear polarization into circular polarization or vice versa. The first retarder 1312 may maintain non-polarization. For example, the first retarder 1312 may be disposed between the cover 1311 and the display panel 1314 or between the cover 1311 and the polarizers 1313.

According to an embodiment, the first retarder 1312 may be configured to change the polarization of incident light between linear polarization and non-linear polarization. For example, the first retarder 1312 may be configured to change the polarization of incident light between linear polarization, circular polarization, and elliptical polarization. For example, the first retarder 1312 may include a $\lambda/4$ waveplate or a $(2n+1))\lambda/4$ waveplate (where n is a positive integer)

The polarizers 1313 may include a first polarizer 1313*a* and a second retarder 1313*b* and be disposed between the cover 1311 and the display panel 1314 or between the retarder 1312 and the display panel 1314. For example, the polarizers 1313 may be configured to linearly polarize incident light.

According to an embodiment, the polarizer 1313 may be configured to change the polarization of incident light from non-polarization to linear polarization. The polarizer 1313 may be configured to transmit a first polarization component (e.g., a parallel polarization (P-polarization) component) of incident light while at least partially blocking a second polarization component (e.g., a perpendicular polarization (S-polarization) component) of the incident light. The polarization direction of the first polarization component may be perpendicular to the polarization direction of the second polarization component.

According to an embodiment, the second retarder 1313*b* may be disposed between the cover 1311 and the display panel 1314 or between the first polarizer 1313*a* and the display panel 1314. For example, the second retarder 1313*b* may be configured to change the polarization of incident light between linear polarization and non-linear polarization.

According to an embodiment, the second retarder 1313*b* may be configured to change the polarization of incident light from linear polarization to circular polarization or elliptical polarization. For example, the second retarder 1313*b* may include a $\lambda/4$ waveplate or a $(2n+1)\lambda/4$ waveplate (where n is a positive integer) According to an embodiment, the second retarder 1313*b* may change the phase of incident light to substantially 90 degrees. The phase change may turn linear polarization into circular polarization or elliptical polarization. For example, when parallel-polarized (P-polarized) light enters the $\lambda/4$ waveplate at 45 degrees with respect to the fast axis of the $\lambda/4$ waveplate, the $\lambda/4$ waveplate may cause a phase difference of 90 degrees between the polarization component as per the fast axis and the polarization component as per the axis perpendicular to the fast axis, converting the parallel polarization into right-handed circular polarization. Conversely, when left-handed circular-polarized light comes into the $\lambda/4$ waveplate, the $\lambda/4$ waveplate may convert the left-handed circular polarization into perpendicular polarization (S-polarization).

The fixture 1320 may include a roller 1321 (or a shaft), at least one supporting structure (e.g., a first supporting structure 1322*a* or a second supporting structure 1322*b*), or a finger sensor 1323.

At least part of the roller 1321 may contact the display panel 1314, and as the sliding part 1310 moves, the display panel 1314 may slide along the surface of the roller 1321.

The at least one supporting structure (e.g., the first supporting structure 1322*a*) may be disposed around the finger sensor 1323 to prevent the finger sensor 1323 and the third retarder 1316 from contacting each other.

The finger print sensor 1323 may include an image sensor configured to detect at least a portion of light. For example, the fingerprint sensor or the image sensor may be formed on the rear surface of the display panel 1314 or on a layer of pixels in the display panel 1314.

According to an embodiment, the electronic device 1301 or a processor (e.g., the processor 120) of the electronic device 1301 may control the display panel 1314 to emit first light to the cover 1311. The electronic device 1301 may block second light reflected from the user's skin/fingerprint 1303 or the cover 1311 using the first retarder 1312, the first polarizer 1313, and the second retarder 1313*b*. The electronic device 1301 or the processor of the electronic device 1301 may detect at least a portion of the light coming from the user's skin using the finger print sensor 1323. At least a portion of the detected light may represent a fingerprint image.

According to an embodiment, the display panel 1314 may include a plurality of pixels 1314*a* and 1314*b* arrayed in a matrix structure of M rows and N columns. Each pixel 1314*a* and 1314*b* may include a red (R) sub-pixel, a green (G) sub-pixel, and a blue (B) sub-pixel. For example, the display panel 1314 may be configured to allow each pixel to emit first light forward of the front surface of the electronic device (e.g., in a first direction) according to a selected combination of the RGB sub-pixels.

According to an embodiment, embossing members (or buffer member) 1315 provided between the display panel 1314 and the third retarder 1316 may be omitted. For example, when the sliding part 1310 including the display panel 1314 slides in order to allow the embossing members 1315 to overlap with the finger sensor 1323, with the result of the deterioration of the fingerprint scanning capability of the finger sensor 1323. According to an embodiment, the embossing members 1315*a* and 1315*b* may be omitted, or a plurality of embossing members 1315*a* and 1315*b* each having a relatively small width may be spaced apart from each other at a predetermined distance or more. According to an embodiment, an optical clear adhesive (OCA) film may further be provided between the plurality of embossing members 1315*a* and 1315*b*.

Figure 14A:
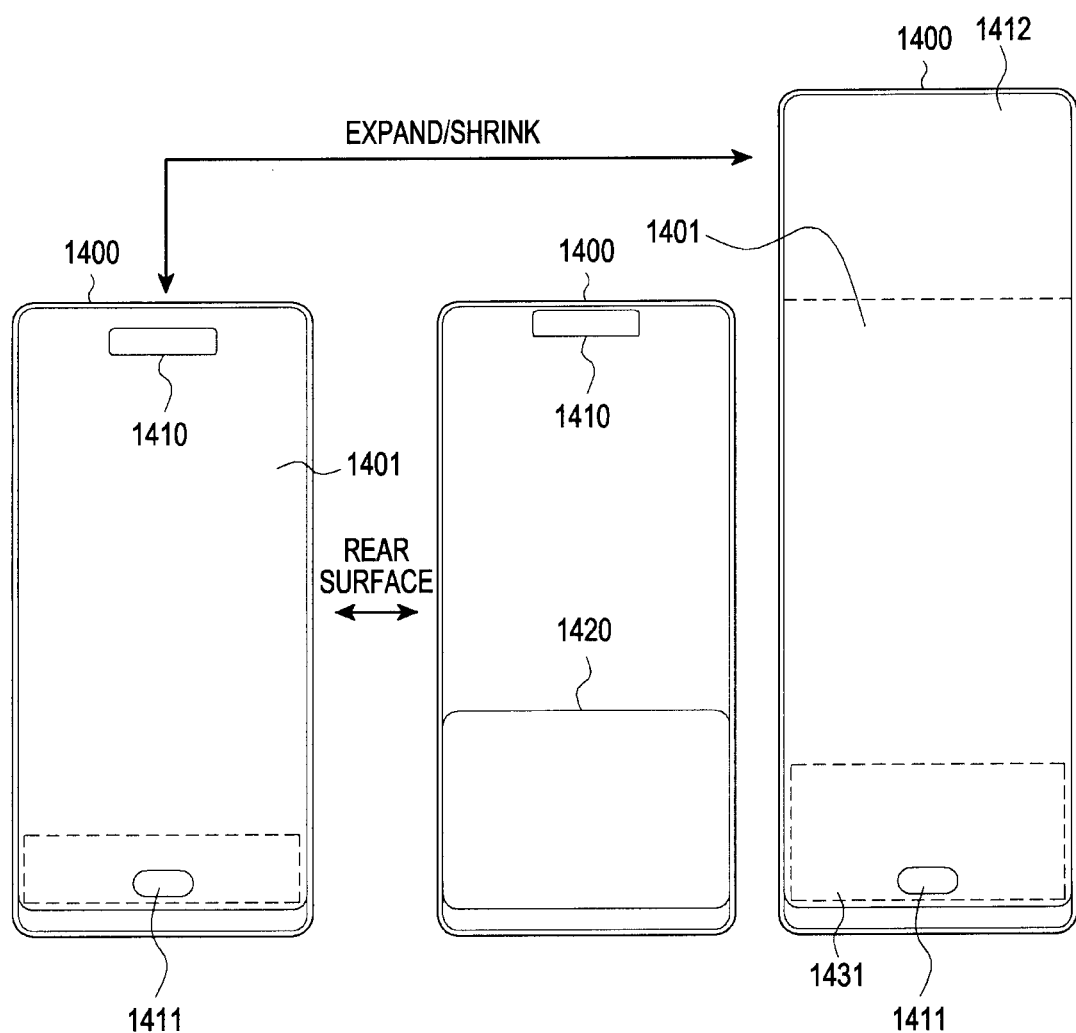
FIG. 14A is a view illustrating an outer appearance of an electronic device with a flexible display according to an embodiment.
Figure 14B:
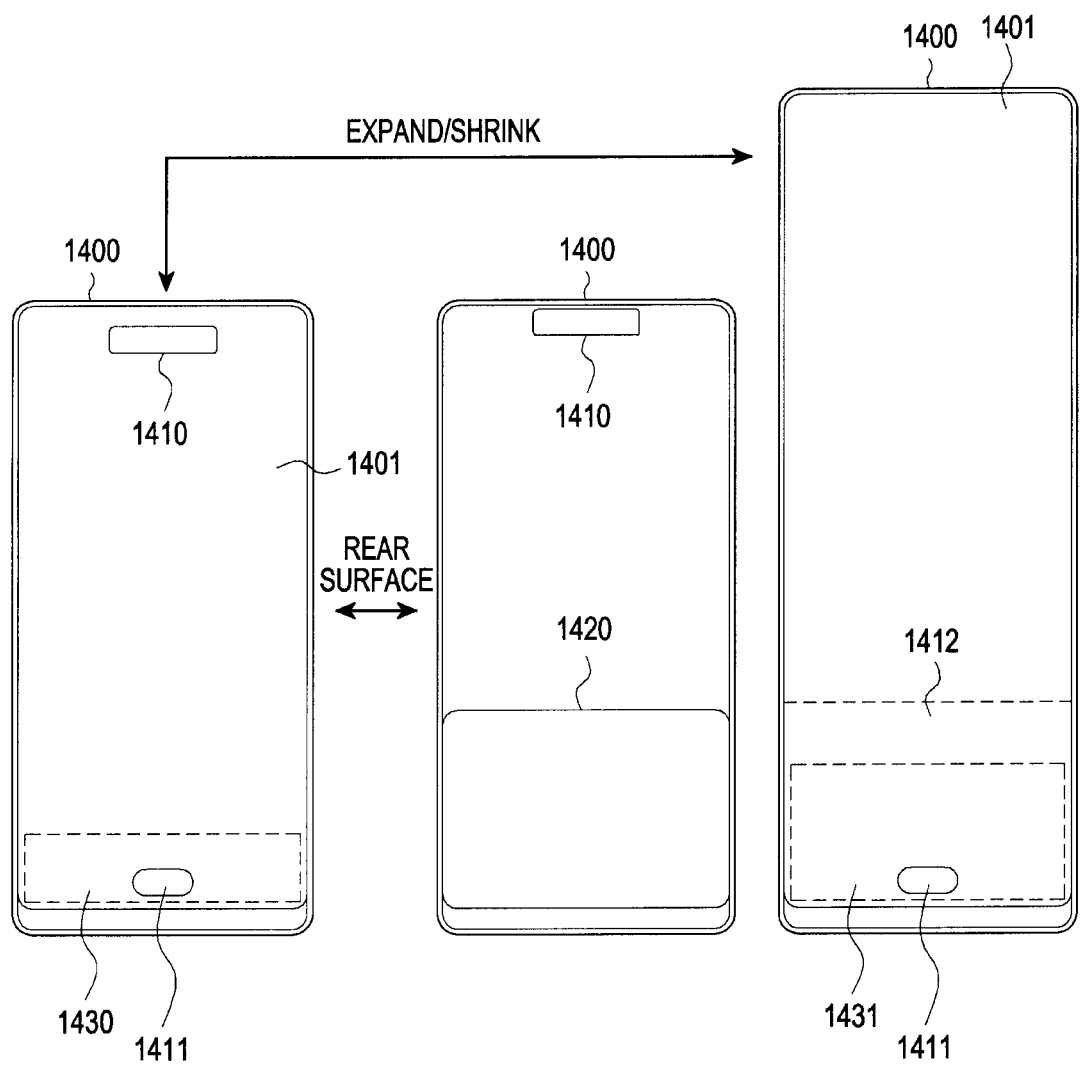
FIG. 14B is a view illustrating an outer appearance of an electronic device with a flexible display according to an embodiment.

FIGS. 14A and 14B are views illustrating an outer appearance of an electronic device with a flexible display according to an embodiment.

Referring to FIG. 14A, an electronic device 1400 may include a flexible display 1401 and a receiver 1410.

According to an embodiment, the electronic device 1400 may include the flexible display 1401 in various forms or shapes. For example, the flexible display 1401 may be bent in a U shape, and at least a portion of the flexible display 1401 which is bent on the top or bottom of the electronic device 1400 from the front surface of the electronic device 1400 may be disposed on the rear surface of the electronic device 1400. A home button 1411 may be displayed on the front surface of the flexible display 1401, and a screen may be displayed on the rear portion 1420 of the flexible display 1401.

According to an embodiment, as shown in FIG. 14A, a receiver 1410 may be disposed in the front surface of the electronic device 1400, be disposed in the rear surface to implement the front surface as a full screen, or be omitted to reduce the usage of holes from a design perspective. According to an embodiment, although FIG. 14A illustrates an example in which the flexible display 1401 expands upwards (thus producing, e.g., an upper expanded portion 1412), the flexible display 1401 may be implemented to expand downwards (thus producing, e.g., a lower expanded portion 1412) as shown in FIG. 14B. FIGS. 14A and 14B regard portrait mode operations of the electronic device 1400, and an application operating in the portrait mode may be rotated 90 degrees to be displayed in the landscape mode by turning the electronic device 1400 by 90 degrees. When biometric sensors (e.g., finger sensors), pressure (or force) sensors, or other sensors capable of receiving the user's inputs from the outside are disposed in a particular position as shown in FIG. 13, its structure may be complicated by the expansion or shrinkage of the flexible display. According to an embodiment, biometric sensors or pressure sensors may be attached over the entire flexible display or, when the flexible display shrinks, to be expanded up to a portion of the front surface or curved surface of the flexible display to be moved along with the flexible display. By so doing, although the flexible display expands or shrinks, biometric or pressure recognition may be achieved in the same position or area 1430 and 1431. According to an embodiment, the size of the expansion 1413 may be determined depending on the current state of the electronic device 1400 (e.g., the screen-expanded or shrunken state, landscape mode or portrait mode, or running applications) and the characteristics (e.g., aspect ratio) of the application running on the expansion or portion 1412. For example, in a scenario case where the screen of the electronic device 1400 expands to the right in the landscape mode, and a message reception event occurs to display a popup window while the user views a video, if the user takes an execution action to the message reception event, a message window may be displayed overlaid on the video on the right expanded portion 1412 of the flexible display 1401. According to an embodiment, the video may be shrunken and displayed in the rest of the screen except for the expanded portion 1412 to avoid important information from being hidden by the overlay. According to an embodiment, the message window may be further expanded and displayed beyond the expanded portion 1412 for additional display of several functions (e.g., emoticons) associated with the message window. According to an embodiment, the message window may be shrunken and displayed in a size smaller than the expanded portion 1412 to display the state alone.

Figure 15:
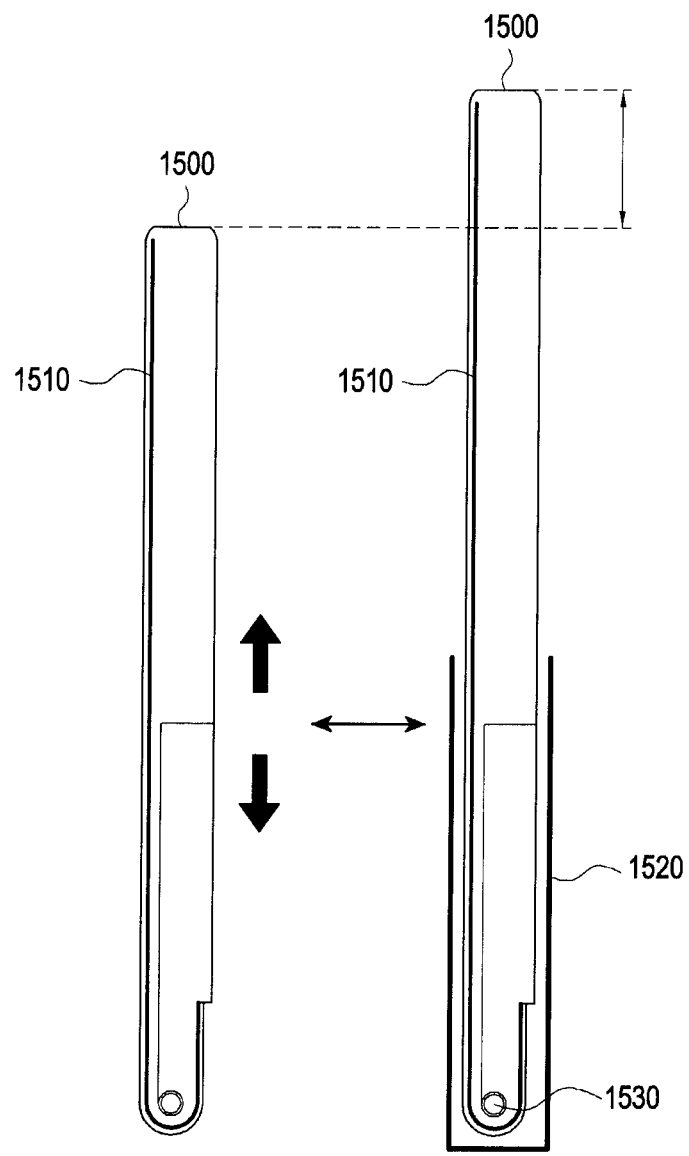
FIG. 15 is a view illustrating a side surface of an electronic device with a flexible display according to an embodiment.

FIG. 15 is a view illustrating a side surface of an electronic device with a flexible display according to an embodiment.

Referring to FIG. 15, an electronic device 1500 may include a housing with a curved surface and a flexible display 1510 disposed on the front surface and at least a portion of the rear surface of the electronic device 1500. For example, the flexible display 1510 may be configured to slide on the housing. According to an embodiment, as the flexible display 1510 slides along a roller 1530 inside, e.g., a first housing 1520, the display area visually exposed to the outside may be resized (e.g., shrunken or expanded).

Figure 16:
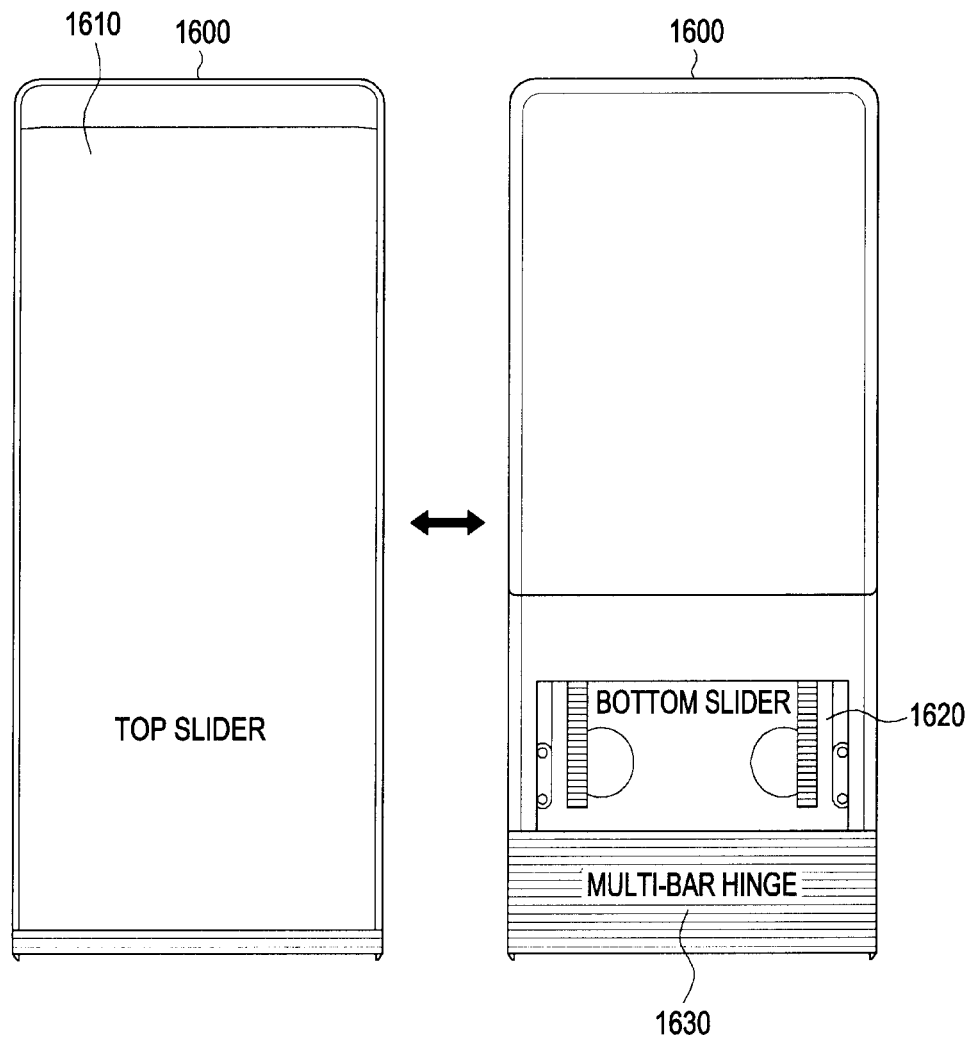
FIG. 16 is a view illustrating an example of a sliding part of an electronic device according to an embodiment.

FIG. 16 is a view illustrating an example of a configuration of a sliding part of an electronic device according to an embodiment.

Referring to FIG. 16, an electronic device 1600 may include a top slider 1610, a bottom slider 1620, or a multi-bar hinge 1630. According to an embodiment, the display area of the flexible display may be expanded or shrunken as the top slider 1610 supporting the flexible display is moved.

The top slider 1610 supporting the flexible display, the multi-bar hinge 1630, or the bottom slider 1620 may be disposed under the flexible display, and this structure may continuously support the flexible display while sliding in or out.

Figure 17A:
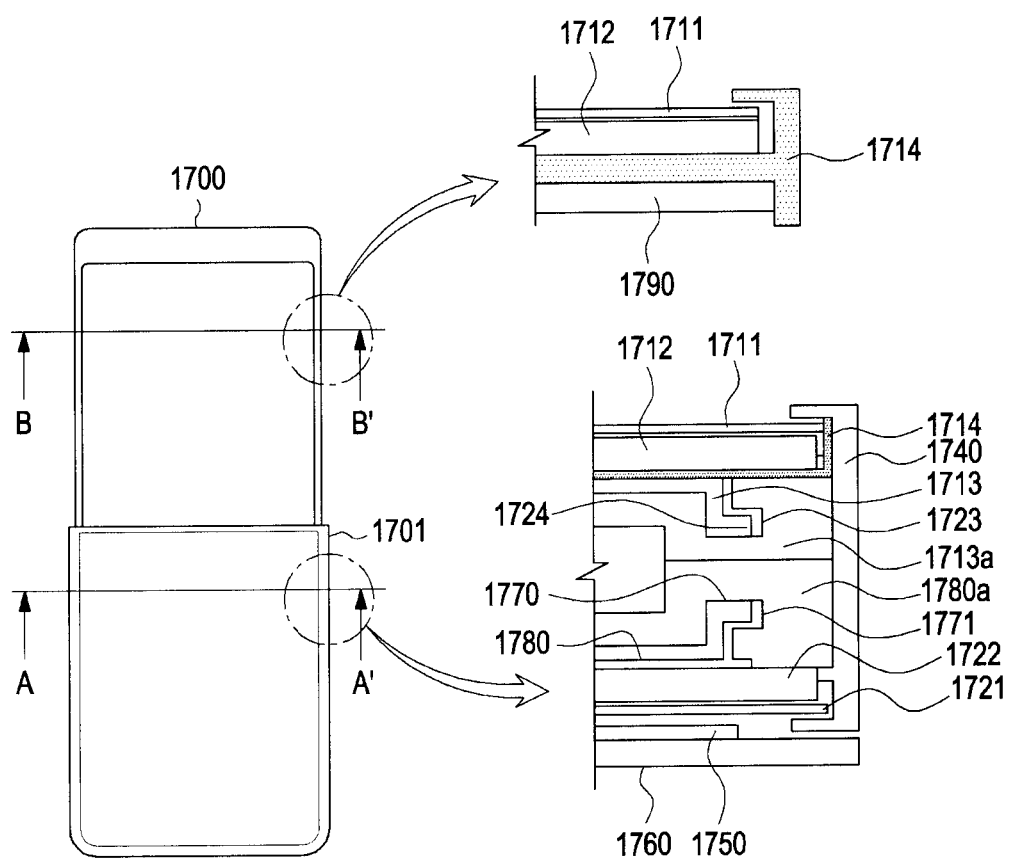
FIG. 17A is a view illustrating an example of an electronic device with a flexible display vertically expanding, as viewed from above a side thereof, according to an embodiment.

FIG. 17A is a view illustrating an example of an electronic device with a flexible display vertically expanding, as viewed from above a side thereof, according to an embodiment.

Referring to FIG. 17A, an electronic device 1700 may include a first housing 1701. The electronic device 1700 may be shown in a partial cross-sectional view as shown on the right side when taken along line A-A' when the electronic device 1700 shrinks or expands as a bracket (e.g., the first housing) 1740 and a main bracket (e.g., a second housing) 1714 slide over each other.

When viewed in the cross-section view taken along A-A', the electronic device 1700 may include an upper flexible display window 1711, an upper display panel 1712, the main bracket 1714 (e.g., the second housing), an upper supporting rail 1713, the bracket (e.g., the first housing) 1740, an upper guide slot 1723, an upper guide protrusion 1724, a lower display panel 1722, a lower flexible display window 1721, a piezoelectric element 1750, a rigid glass 1760, a lower guide slot 1771, a lower guide protrusion 1770, and a lower supporting rail 1780.

The upper flexible display window 1711 and the upper display panel 1712 positioned at the top may be supported by the main bracket 1714, and the main bracket 1714 may be connected with an upper supporting rail fixing part 1713*a* to be slidable. The upper guide protrusion 1724 formed on the upper supporting rail 1713 may rest on and couple with the upper guide slot 1723 inside the upper supporting rail fixing part 1713*a*. The upper supporting rail fixing part 1713*a* may be affixed to, or integrated with, the main bracket 1714.

The flexible display window 1721 and the lower display panel 1722 at the bottom may be supported by the lower supporting rail 1780, and the lower supporting rail 1780 may be slid by a lower rail fixing part 1780*a*. The lower guide protrusion 1770 formed on the lower supporting rail 1780 may rest on and couple with the lower guide slot 1771 inside the lower rail fixing part 1780*a*. The lower supporting rail fixing part 1780*a* may be affixed to, or integrated with, the bracket 1740.

According to an embodiment, when no receiver is included in the electronic device 1700, the piezoelectric element 1750 may be directly attached onto the rear glass (e.g., the rigid glass 1760) of the electronic device and be spaced apart in a gap from other electric parts or structures.

The electronic device 1700 may be shown in a partial cross-sectional view as shown on the right side when taken along line B-B' such that the electronic device 1700, the bracket (e.g., the first housing) 1740 does not overlap with the main bracket (e.g., the second housing) 1714 (e.g., no slide between the first housing and the second housing). In the cross section taken along line B-B', the upper and lower supporting rails 1713 and 1780, the lower display panel 1722, and the lower flexible display window 1721 might not be shown, and the main bracket 1714 be structured to surround and protect the upper flexible display window 1711 and the upper display panel 1712, and the rear window 1790 may be included.

A hardware mount, a rear bracket, and a rear window described below with reference to FIG. 76 may be configured inside the main bracket 1714.

Figure 17B:
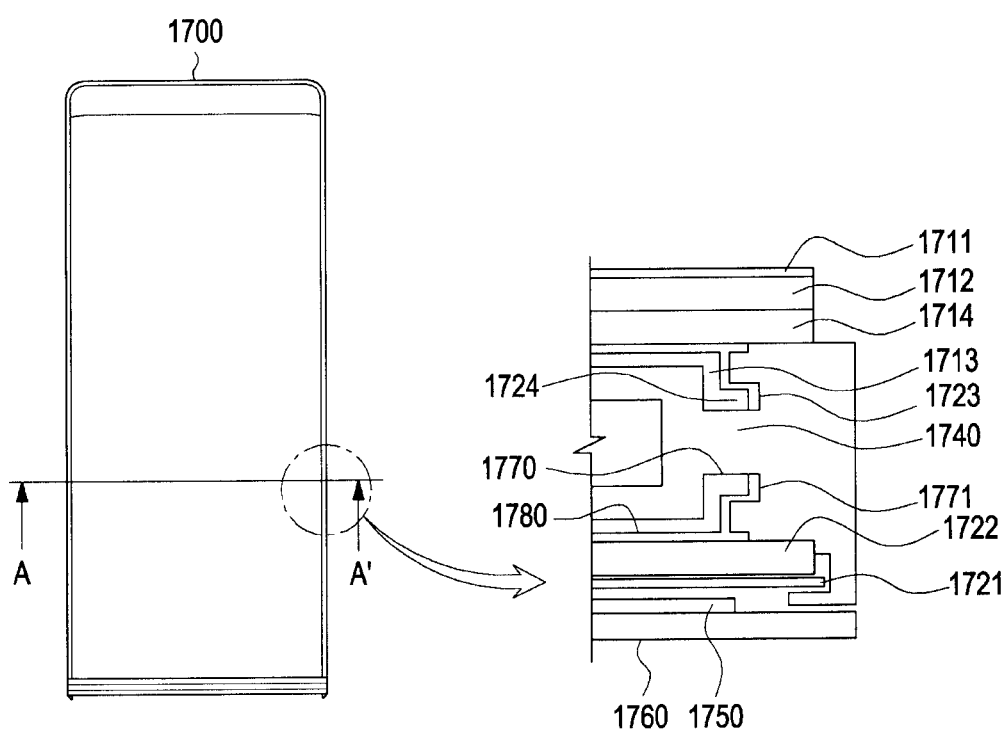
FIG. 17B is a view illustrating an example of an electronic device with a flexible display vertically expanding, as viewed from above a side thereof, according to an embodiment.

FIG. 17B is a view illustrating an example of an electronic device with a flexible display vertically expanding, as viewed from above a side thereof, according to an embodiment.

Referring to FIG. 17B, in the electronic device 1700, the main bracket 1714 may be slidable on the bracket (e.g., the first housing) to reduce the side space of the electronic device 1700 and maximally expand the flexible display sideways. The cross section taken along line A-A' of the electronic device 1700 is shown on the right side.

When viewed in the cross-section view taken along A-A', the electronic device 1700 may include an upper flexible display window 1711, an upper display panel 1712, the main bracket 1714 (e.g., the second housing), an upper supporting rail 1713, the bracket (e.g., the first housing) 1740, an upper guide slot 1723, an upper guide protrusion 1724, a lower display panel 1722, a lower flexible display window 1721, a piezoelectric element 1750, a rigid glass 1760, a lower guide slot 1771, a lower guide protrusion 1770, and a lower supporting rail 1780.

The upper flexible display window 1711 and the upper display panel 1712 positioned at the top may be attached to the main bracket 1714, and the main bracket 1714 may be supported by the upper supporting rail 1713 to be slidable on the bracket 1740. The upper guide protrusion 1724 formed on the upper supporting rail 1713 may rest on and couple with the upper guide slot 1723 inside the bracket 1740.

The flexible display window 1721 and the lower display panel 1722 positioned at the bottom may be supported by the lower supporting rail 1780 and be slid into the inside of the bracket 1740. A hardware mount, a rear bracket, and a rear window described below with reference to FIG. 76 may be configured inside the main bracket 1714.

The piezoelectric element 1750 may be provided to replace the speaker to remove the speaker hole to deliver a better look and be directly attached to the rigid glass 1760 while being spaced apart in a predetermined space from the other structures than the rigid glass 1760 to secure a space for resonance. For example, when the piezoelectric element 1750 is attached to the flexible window, which is thin, noise may be created due to tiny vibrations, and the rigid glass 1760 and other adjacent structures may be too hard to make trembles and sounds by vibrations of the piezoelectric element 1750.

Figure 18A:
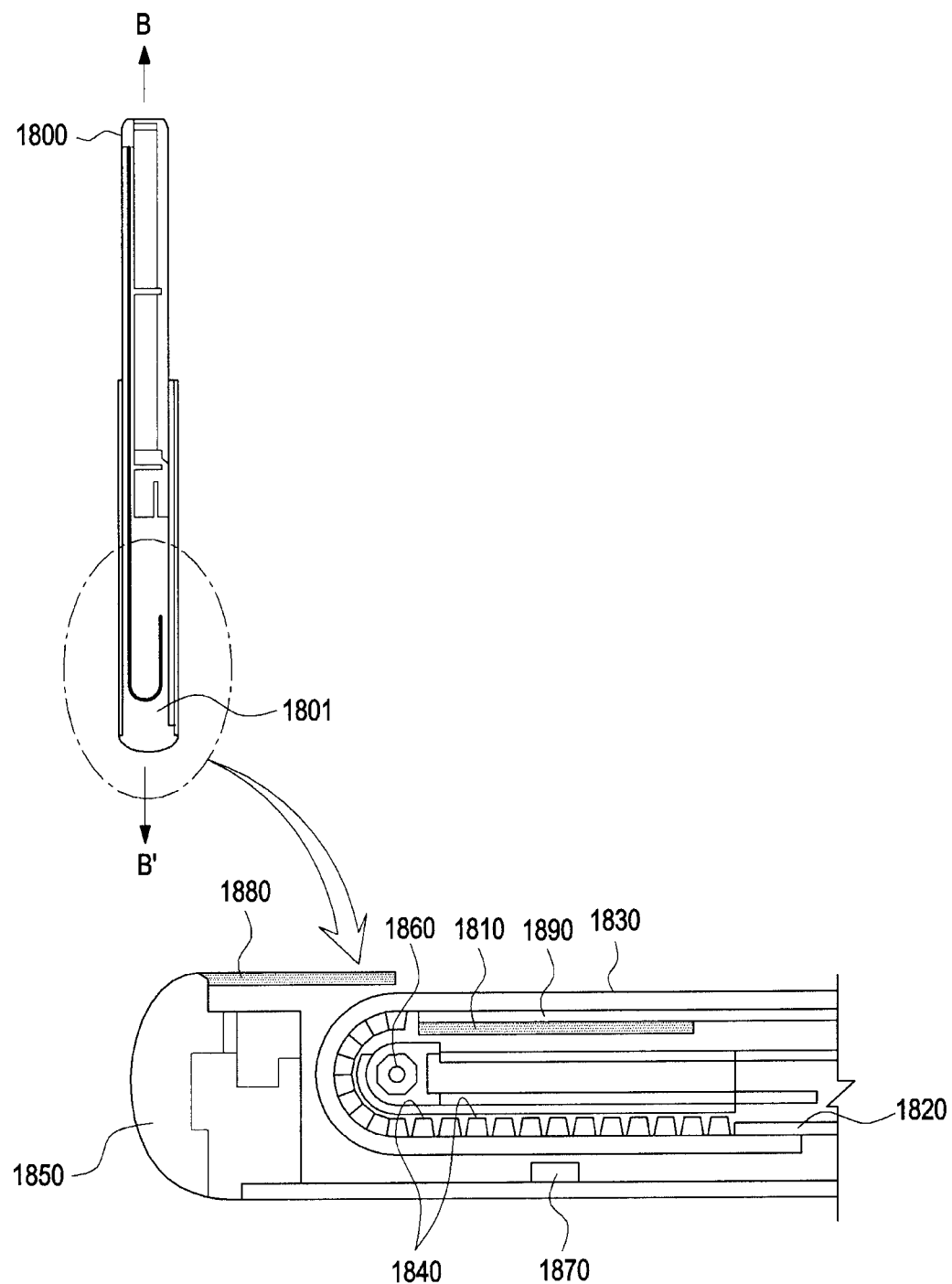
FIG. 18A is a view illustrating an example of a hinge structure of an electronic device with a flexible display according to an embodiment.
Figure 18B:
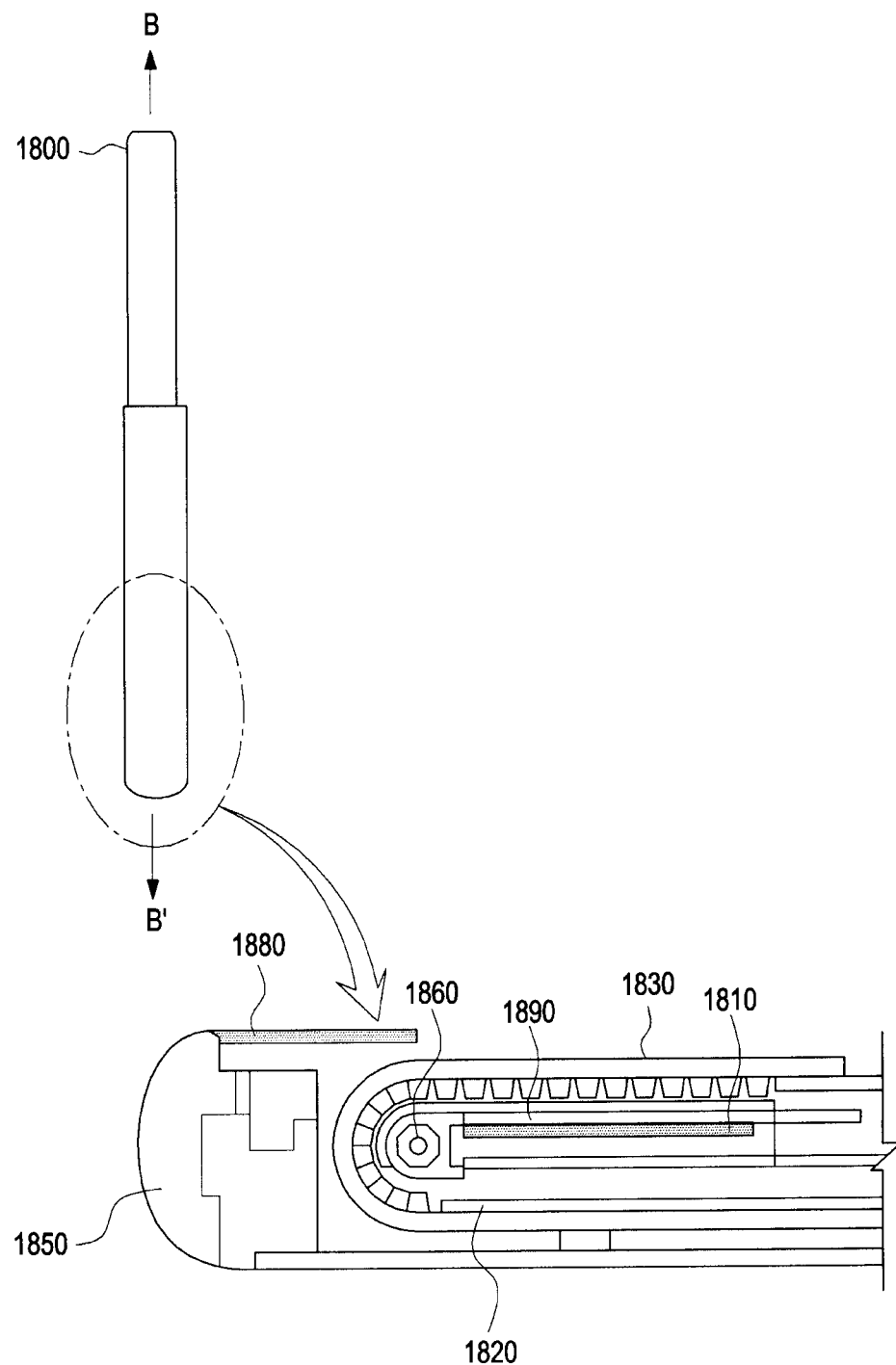
FIG. 18B is a view illustrating an outer appearance of a hinge structure of an electronic device with a flexible display according to an embodiment.

FIGS. 18A and 18B are views illustrating an outer appearance of a hinge structure of an electronic device with a flexible display according to an embodiment.

Referring to FIGS. 18A and 18B, a main body 1801 of an electronic device 1800 may include a structure to guide the movement of a flexible display 1830. For example, the main body 1801 may include a second housing (or a main bracket) 1810, an upper rail 1890, a lower rail 1820, a flexible display 1830 surrounding the main body 1801, a multi-hinge structure (or multi-bar structure) 1840, a first housing (or a pocket) 1850, a dielectric 1870, a roller 1860, or a lower glass 1880.

The upper rail 1890 in the electronic device 1800 is mounted under the second housing (or main bracket) on the front surface of the main body 1801. The flexible display 1830 supported by the second housing 1810 may slide in directions B and B' (e.g., the lengthwise direction) along the upper rail 1890. The lower rail 1820 may be disposed on the rear surface of the main body 1801, and the flexible display 1830 may slide along the lower rail 1820 in the directions B and B'.

The main body 1801 may support the flexible display 1830 (e.g., the curved part of the flexible display 1830) by the placement of at least one multi-hinge structure 1840. For example, the at least one multi-hinge structure 1840 may be arrayed perpendicular to, and adjacent to each other along, the moving direction of the flexible display 1830.

According to an embodiment, a guide protrusion may be formed at each of both sides of the at least one multi-hinge structure 1840. For example, a side of the array of at least one multi-hinge structure 1840 may be connected to the second housing 1810.

According to an embodiment, the at least one multi-hinge structure 1840 may be disposed corresponding to a portion (e.g., the first area) of the flexible display 1830 and be coupled to the inner surface of the flexible display 1830. For example, the at least one multi-hinge structure 1840 may be attached to the inner surface of the flexible display 1830.

According to an embodiment, the flexible display 1830 may be received inside the main body 1801 on the rear surface side of the main body 1801 and be moved to wrap around the roller 1860 to be positioned on the front surface of the main body 1801.

According to an embodiment, the dielectric 1870 may be disposed in at least a portion (e.g., between the first housing 1850 and the lower rail 1820) of the first housing 1850. Whether the flexible display 1830 has been moved or the position of the movement may be determined by detecting the dielectric 1870 in the portion of the flexible display 1830. According to an embodiment, the dielectric 1870 may be formed of a material having a different permittivity from its surrounding structures (e.g., the first housing 1850, the lower rail 1820, or at least one multi-hinge structure 1840).

According to an embodiment, as shown in FIG. 18B, as the flexible display 1830 slides in the direction B', the display area of the front surface visually exposed to the outside of the flexible display 1830 may be shrunken. For example, at least a portion of the flexible display 1830 which is positioned on the front surface may be retracted to the rear surface corresponding to the distance of the movement of the at least portion of the flexible display 1830 positioned on the front surface. At this time, the second housing (main bracket) 1810 may be positioned under the upper rail 1890, receiving the retracted portion of the flexible display 1830.

According to an embodiment, when the flexible display 1830 is slid in the direction B as shown in FIG. 18A, at least one multi-hinge structure 1840 may be moved to the rear surface of the main body 1801, and the portion of the flexible display 1830 surrounding the at least one multi-hinge structure 1840 may be moved to the front surface, allowing the front display area of the flexible display 1830 to expand. At this time, the second housing (main bracket) 1810 may be expanded upwards, and the multi-hinge structure 1840 may be positioned in the corresponding space and be supported by the upper rail 1890.

The lower glass 1880 may be attached to a top portion of the first housing 1850 to fully or partially cover, and thus protect, the curved part of the flexible display 1830 and be processed to be opaque to fully or partially hide the curved portion of the flexible display 1830.

Figure 19:
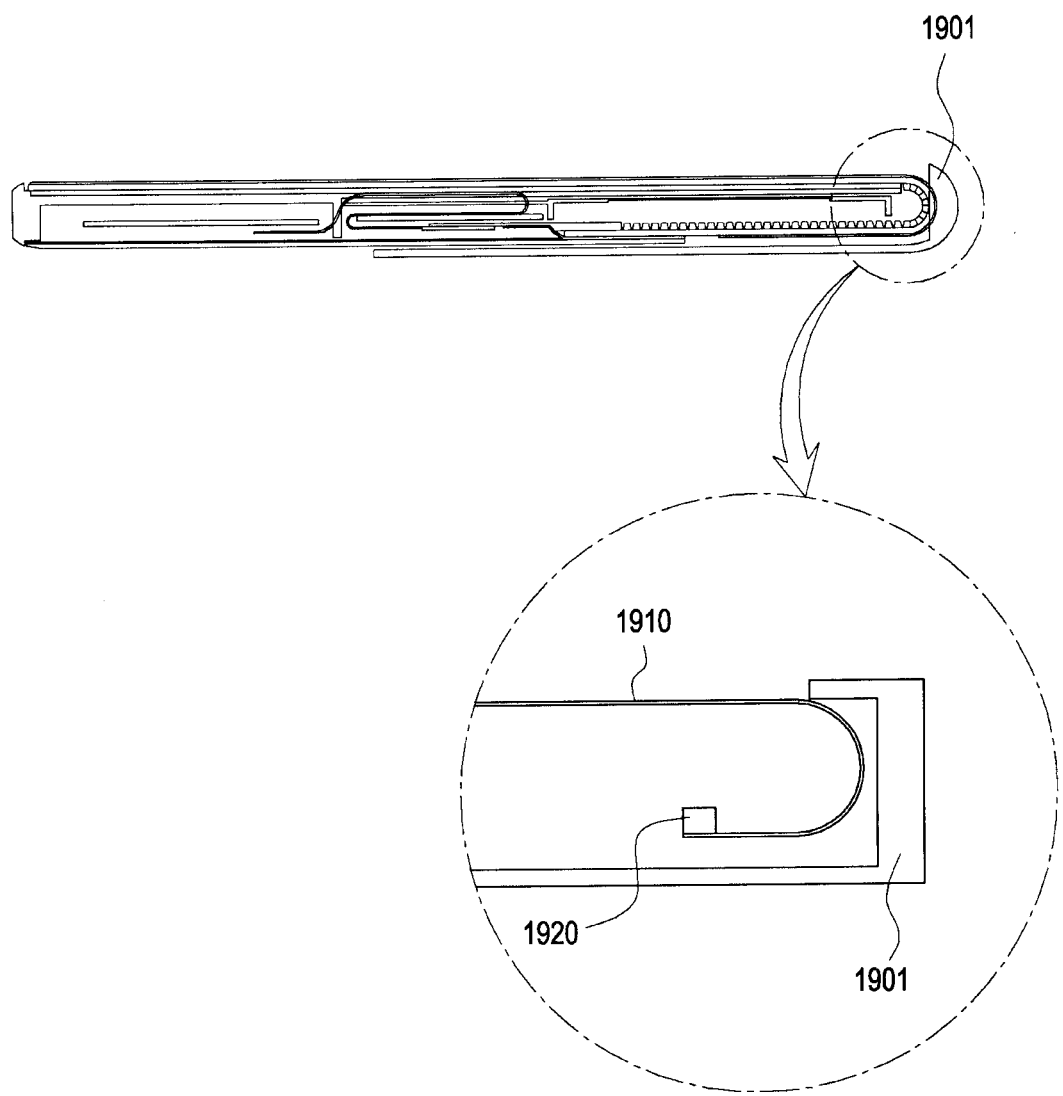
FIG. 19 is a view illustrating an example of a display driving circuit of an electronic device according to an embodiment.

FIG. 19 is a view illustrating an example of a configuration of a display driving circuit (e.g., a display driver integrated circuit (DDI)) of an electronic device according to an embodiment.

Referring to FIG. 19, an electronic device 1900 may include a first housing 1901, a flexible display 1910, or a display driving circuit (e.g., a DDI) 1920 to control the display of the flexible display 1910.

According to an embodiment, the flexible display 1910 may at least partially be moved along the curved surface on the front surface of the electronic device 1900 in the first housing 1901.

According to an embodiment, the DDI 1920 may be affixed to one end of the flexible display 1910. For example, as the flexible display 1910 slides in the first housing 1901, the DDI 1920 affixed to the flexible display 1910 may be moved along with the flexible display 1910 in the first housing 1901.

According to an embodiment, the DDI 1920 which is formed of, e.g., ceramic, glass, or other fragile material, may be easily broken by the movement of the flexible display 1910. Thus, the DDI may include a structure to restrict the movement of the flexible display 1910 to prevent damage. For example, the structure may be configured to allow the DDI 1920 to move from the rear surface of the electronic device 1900 up to the inflection point of the curved surface.

Figure 20:
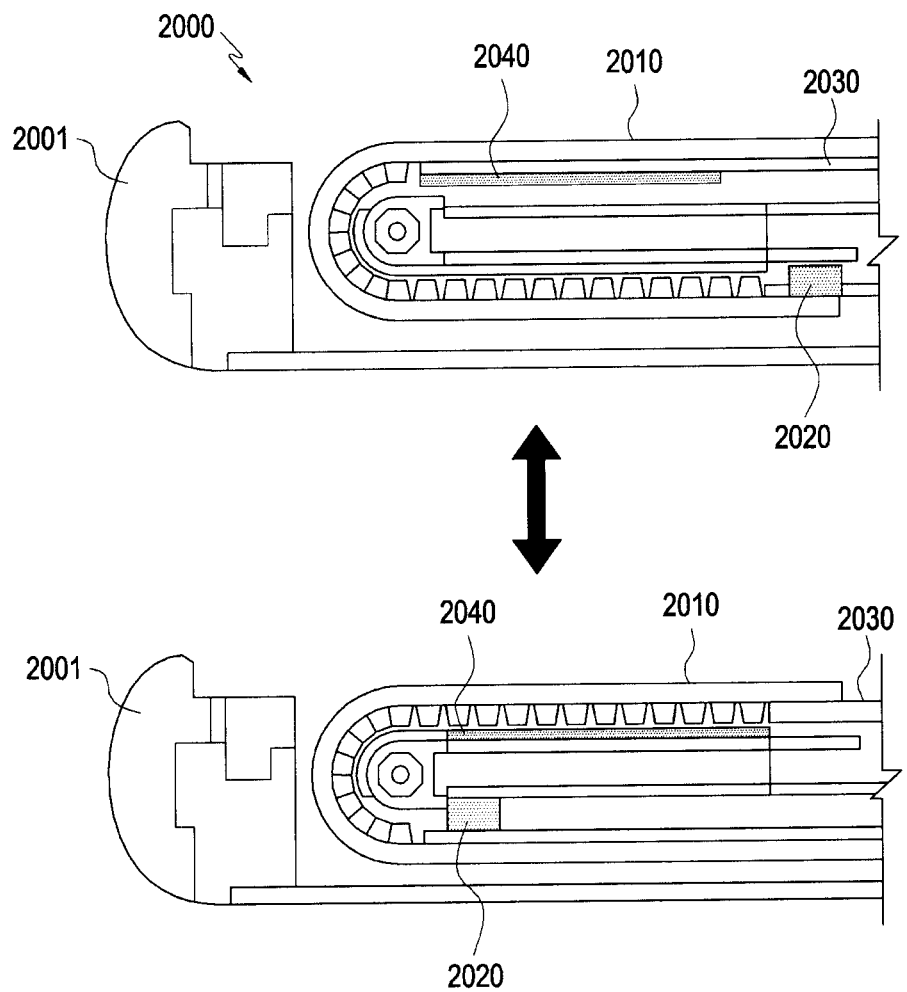
FIG. 20 is a view illustrating an example of a display driving circuit of an electronic device according to an embodiment.

FIG. 20 is a view illustrating an example of a configuration of a display driving circuit (e.g., a display driver integrated circuit (DDI)) of an electronic device according to an embodiment.

Referring to FIG. 20, an electronic device 2000 may include a first housing 2001, a second housing 2030, an upper supporting rail 2240, a flexible display 2010, or a display driving circuit (e.g., a DDI) 2020 to control the display of the flexible display 2010.

According to an embodiment, the DDI 2020 may be affixed to one end of the flexible display 2010. For example, as the flexible display 2010 slides in the first housing 2001, the DDI 2020 attached to the flexible display 2010 may be moved.

According to an embodiment, the flexible display 2010 may be configured to have its sliding distance restricted. For example, as the flexible display 2010 slides up to where it can, the DDI 2020 may be moved up to the inflection point of the curved surface of the main body of the electronic device 2000. According to an embodiment, the upper supporting rail 2040 may play a role to back up the second housing 2030 so that it does not sag when the second housing 2030 slides to expand along the upper supporting rail 2040.

Figure 21:
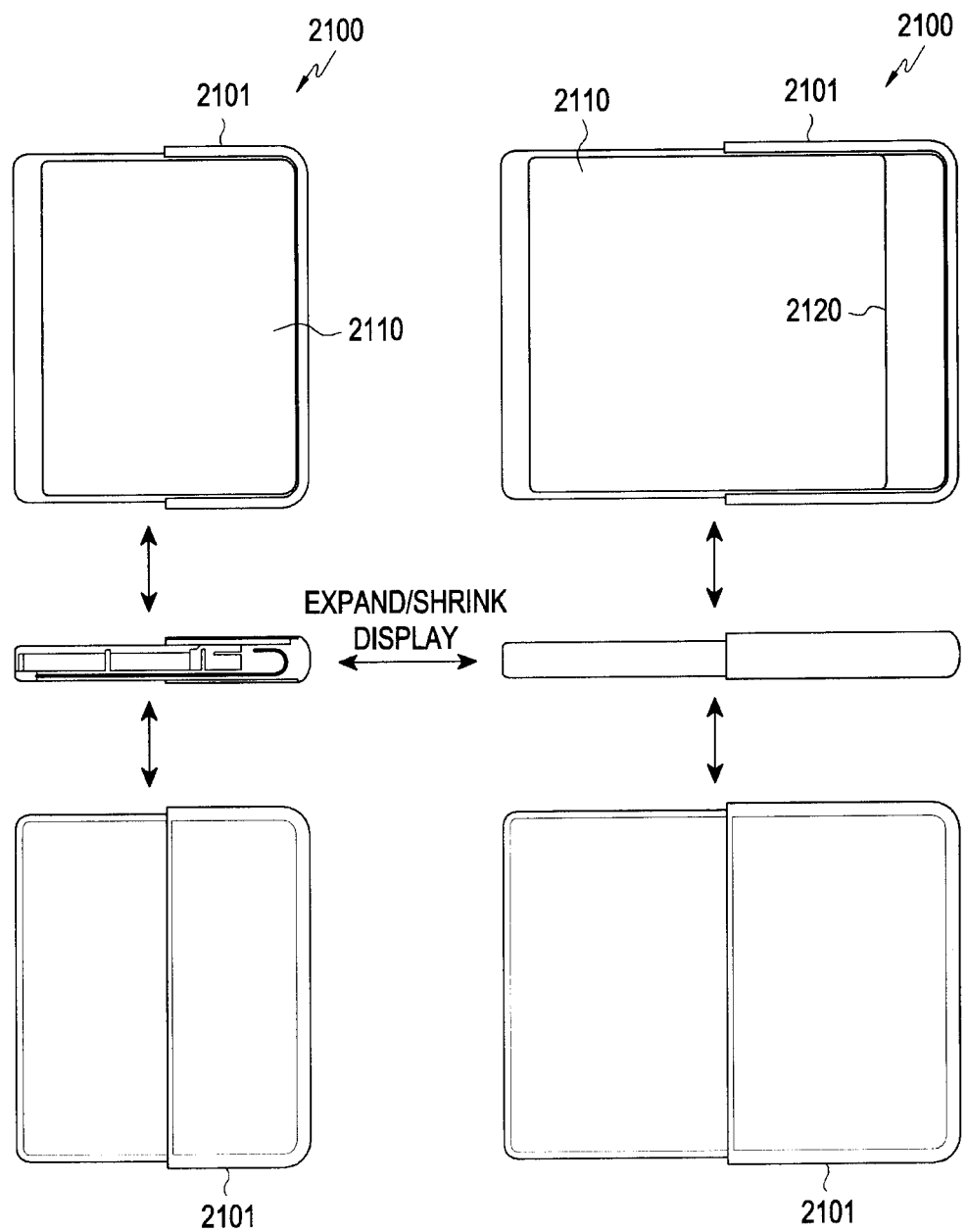
FIG. 21 is a view illustrating an example of an electronic device with a flexible display according to an embodiment.

FIG. 21 is a view illustrating an example of a configuration of an electronic device with a flexible display according to an embodiment.

Referring to FIG. 21, an electronic device 2100 may include a housing 2101 or a flexible display 2110.

According to an embodiment, the flexible display 2101 may slide over the housing 2101, and as the flexible display 2101 slides, its display area may be resized on the front surface of the electronic device 2100. According to an embodiment, when the flexible display 2110 expands, the expanded portion 2120 may be subject to image processing in various ways. As shown in FIG. 21, the first housing 2201 may be configured to partially cover the flexible display 2110 on the rear surface of the electronic device 2100.

According to an embodiment, the flexible display 2110 may be slid left or right along the curved surface of the main body while being supported by the housing 2101. For example, as the flexible display 2110 moves, at least a portion of the flexible display 2110 may be retracted into the main body of the housing 2101 or be expanded in the opposite direction.

Figure 22:
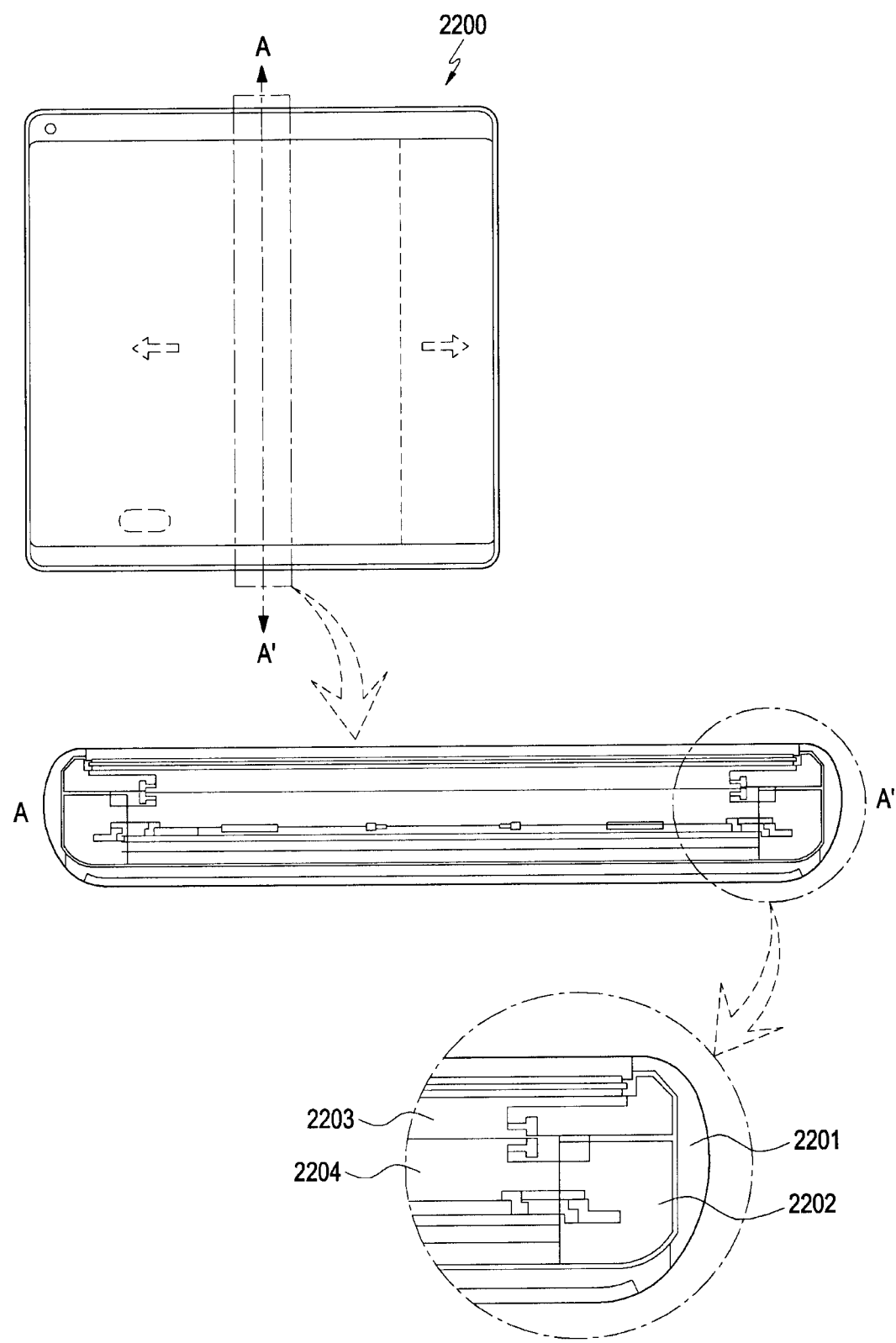
FIG. 22 is a view illustrating an example of an electronic device with a flexible display horizontally expanding, as viewed from above a side thereof, according to an embodiment.

FIG. 22 is a cross-sectional view illustrating an electronic device with a flexible display horizontally expanding, as viewed from above a side thereof, according to an embodiment. Referring to FIG. 22, an electronic device 2200 may include a flexible display and a housing. The flexible display may be retracted into the housing or be expanded from the housing. The cross section taken along line A-A' of the electronic device 2200 is shown on the right side.

When viewed in the cross-section view taken along A-A', the electronic device 2200 may include an upper flexible display window, an upper display panel, the main bracket 2202 (e.g., a second housing), an upper supporting rail 2203, a bracket (e.g., a first housing) 2201, a lower display panel, a lower flexible display window, a piezoelectric element, a rigid glass, and a lower supporting rail 2204. According to an embodiment, the main bracket 2202 may protect the upper supporting rail 2203 or the lower supporting rail 2204. The bracket 2201 may protect the main bracket 2202 and prevent the multi-hinge (or multi-bar) structure from being exposed.

The detailed structure of the housing shown in FIG. 22 is similar to that of the electronic device in the portrait orientation as described above and, thus, no detailed description thereof is given below.

Figure 23:
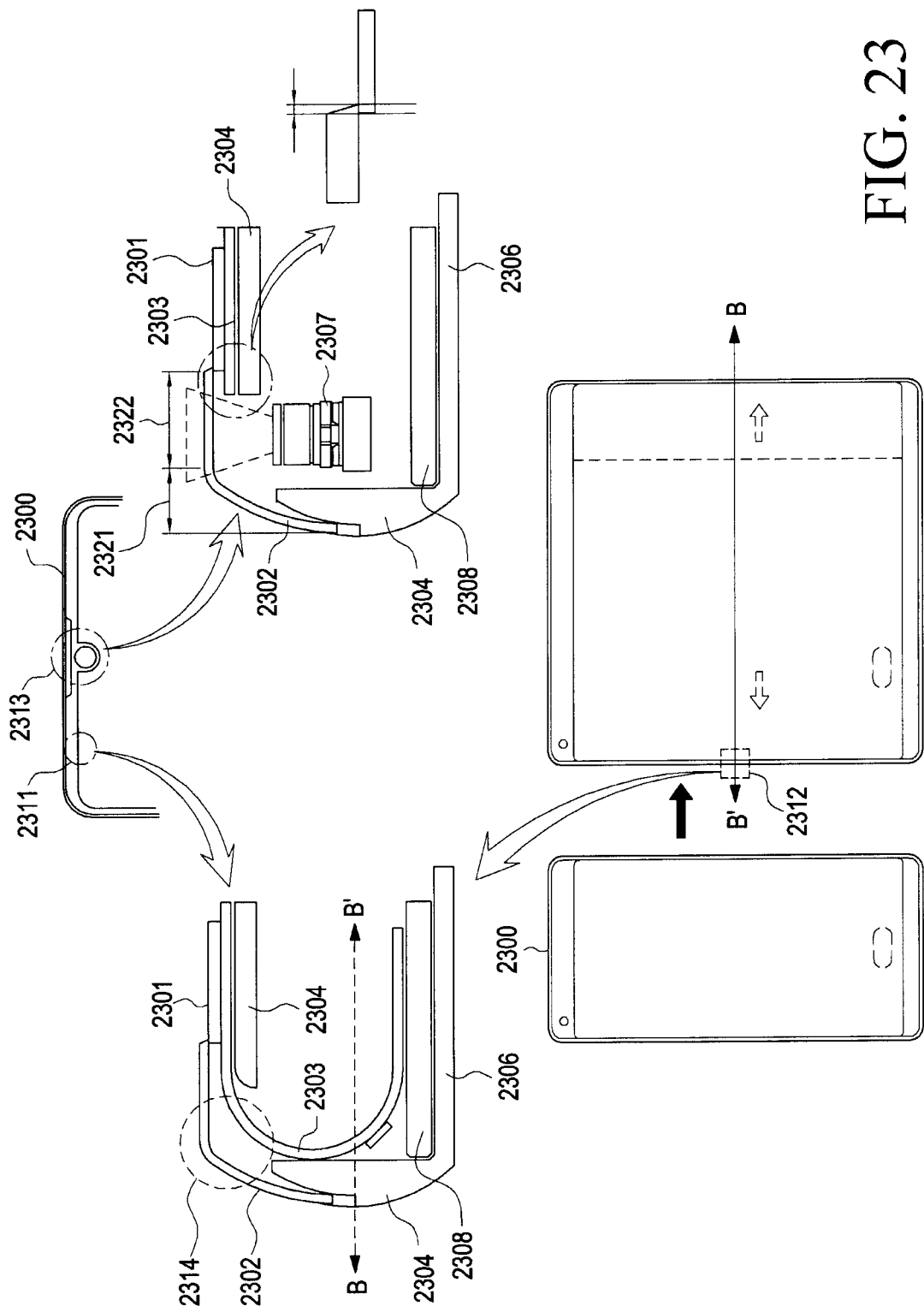
FIG. 23 is a side, cross-sectional view illustrating a configuration of a display with a curved area according to an embodiment.

FIG. 23 is a side, cross-sectional view illustrating a configuration of a display with a curved area according to an embodiment.

Referring to FIG. 23, a flexible display 2303, a transparent window 2302, a flexible window 2301 (e.g., a polyimide (PI) film), a second housing 2304, a rear window 2306, and a rear case 2308 may be provided in a top first area 2311 or at least one side surface of an electronic device 2300.

According to an embodiment, the transparent window 2302 may be disposed on the front surface of the flexible display 2303 to protect the flexible display 2303 and to reduce the bezel of the electronic device as described below and may include a curved portion 2321 bent, along with a portion of the flexible display 2303, in a first curvature from one surface and at the outer edge of the transparent window 2302.

According to an embodiment, the flexible display 2303 may be disposed between a plane portion 2322 of the transparent window 2302 and the rear surface of the curved portion 2321 while expanding up to the inner side of the transparent window 2302.

According to an embodiment, the transparent window 2302, the flexible window 2301, the second housing 2304, the rear window 2306, and the rear case 2308 are included in a top second portion 2313 of the electronic device 2300, and at least one or more various parts (e.g., hardware components) provided in the electronic device 2300 may be disposed in a space between the second housing 2304 and the rear case 2308. For example, various parts of the electronic device 2300 may include a flexible printed circuit board, a camera module 2307, a battery, and a universal serial bus (USB) connector.

According to an embodiment, the flexible window 2301 may be soft and be thus deformed by, e.g., an external force (e.g., exerted when the user touches or presses the screen with their finger). A support (e.g., the second housing 2304) is utilized to prevent such deformation. Since the flexible display 2303 may play an obstacle to receiving external light, such an optical electronic device as the camera module 2307 which utilizes external light may be placed where the flexible display 2303 has been punched or cut out in a U shape (e.g., the top second portion 2313). In this case, the support (e.g., the second housing 2304) need to be left out, and thus, the flexible window 2301 may be deformed by an external force. According to an embodiment, the transparent window 2302 may be formed of rigid glass to prevent deformation by an external force and be configured to cover the camera module 2307. When the transparent window 2302 has a first curvature, external light incident to the camera module 2307 may be subject to diffraction $$\left\{ \frac{\sin\theta_1}{\sin\theta_2} = \frac{v_1}{v_2} = \frac{\lambda_1}{\lambda_2} = \frac{n_2}{n_1} \text{ or } n_1 \sin\theta_1 = n_2 \sin\theta_2 \right\}$$

due to the first curvature, and since the camera module 2307 may be tilted due to a deviation that may arise during assembly, it may be impossible to predict a constant degree of diffraction for all products. Thus, the camera module 2307 may be placed on the plane portion 2322 of the transparent window 2302 which includes the plane portion 2322 and the curved portion 2321 to prevent distortion due to the deviation that arises when the camera module 2307.

According to an embodiment, the flexible display 2303 may expand in a second curvature up to the curved portion 2321 of the transparent window 2302 in the top first area 2311 or at least one side surface (e.g., a third area 2312). In this case, the expanded flexible display 2303 may be seated inside the second housing 2304 or may be placed inside the second housing 2304 through a space 2314 created by removing a portion of the second housing 2304 to connect various parts (e.g., hardware components) inside the second housing 2304 via a connector. An external force (e.g., the user's touch or pressure on the screen with their finger) applied to the space 2314 may deform the flexible window 2301. To prevent such deformation, the transparent window 2302 may be disposed with a space 2315 partially overlapping with the flexible window 2301 to cover at least the space 2314.

According to an embodiment, the transparent window 2302, which is disposed in the space 2314 where a portion of the second housing has been removed may be formed of rigid glass, plastic, or the same material as the second housing 2304. To reduce screen distortions that may arise as the flexible window 2301 and the transparent window 2302 have different refractive indexes in the space 2315 where the flexible window 2301 and the transparent window 2302 overlap with each other, an end of the transparent window 2302 where the flexible window 2301 and the transparent window 2302 overlap with each other may form a predetermined angle.

Figure 24:
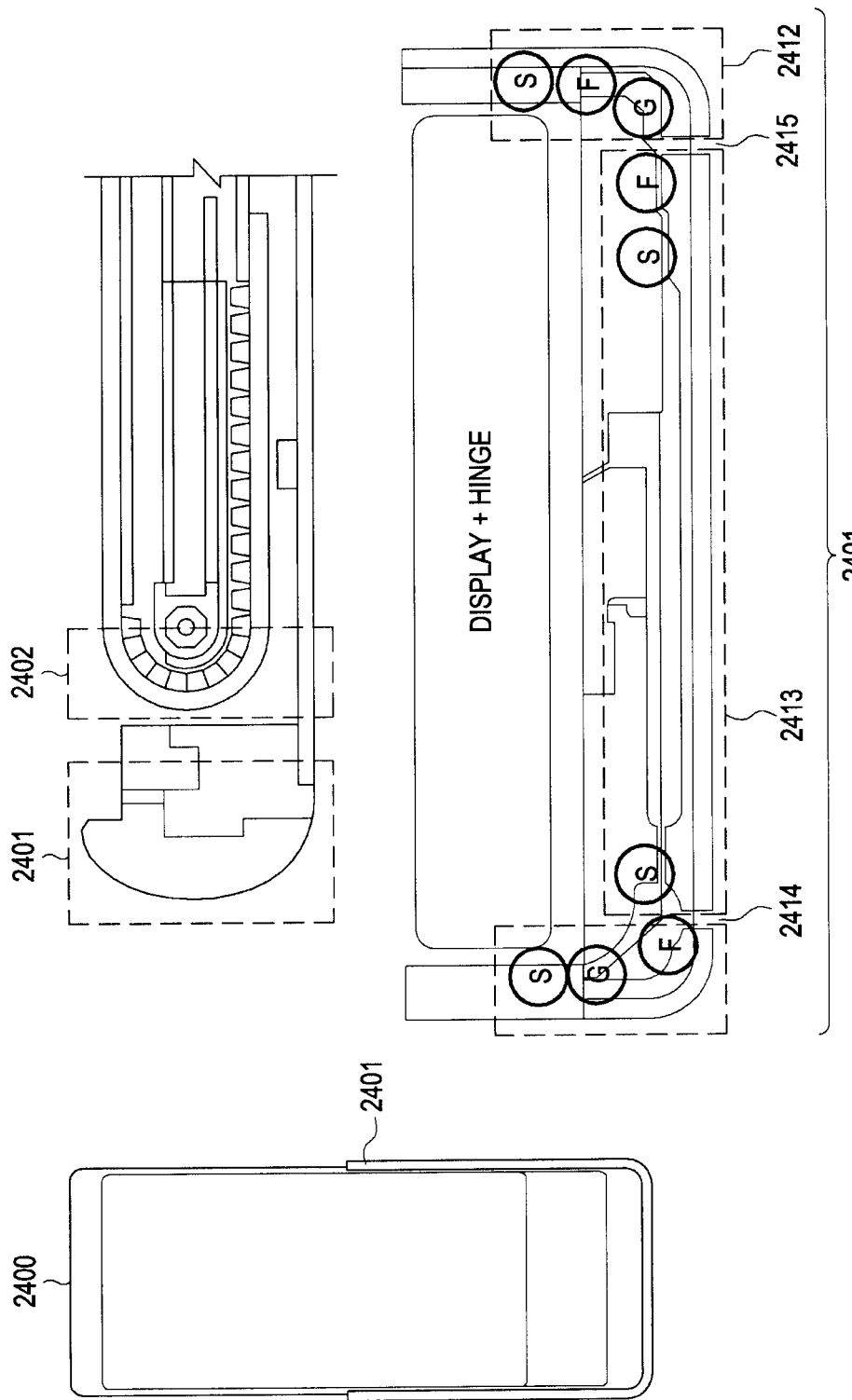
FIG. 24 is a side, cross-sectional view illustrating an antenna of an electronic device with a flexible display according to an embodiment.

FIG. 24 is a side, cross-sectional view illustrating an antenna configuration of an electronic device with a flexible display according to an embodiment. Referring to FIG. 24, an electronic device 2400 may include a housing 2401, a flexible display, or a hinge.

The edge of the flexible display at one side of the housing 2401 may be covered by a window 2403 or another member so as to be invisible. According to an embodiment, various parts may be mounted in the inner space of the housing 2401 hidden by the window 2403. For example, according to an embodiment, structures related to an antenna may be placed in the space.

According to an embodiment, first spaces 2414 and 2412 formed at both sides in the housing 2401 and second spaces 2413 and 2415 formed in the center may have at least one part mounted inside. According to an embodiment, structures related to an antenna may be placed in the spaces. For example, the antenna may be mounted along with such components as a feeding (denoted with 'F' in FIG. 24) for applying frequency signals and a GND (denoted with 'G' in FIG. 24) to which electric current returns, and a switch (denoted with 'S' in FIG. 24) having multiple matching values to compensate for the length resulting from the display rolling.

As a specific example, the housing surrounding the first spaces may be utilized as a high-frequency antenna, and the coupling value may be varied by mutual movement between the display (corresponding to a dielectric) and the hinge (corresponding to a metal) where the flexible display overlaps the hinge. Thus, a switching structure may be utilized to vary the matching value in order to adjust the coupling value for the open or closed state upon implementing an antenna in the first spaces.

A portion of the hinge 2402 in the housing 2401 may be connected to the GND (e.g., a system ground (GND)) or to the switch having multiple matching values to prevent an antenna coupling. For example, as the set of the display and the hinge which is metallic switches from closed to open, the length of the housing may vary and, where the hinge matches the electrical length of the expanded antenna, the drainage of radiation through the hinge may be corrected with the matching values of the switch.

Figure 25:
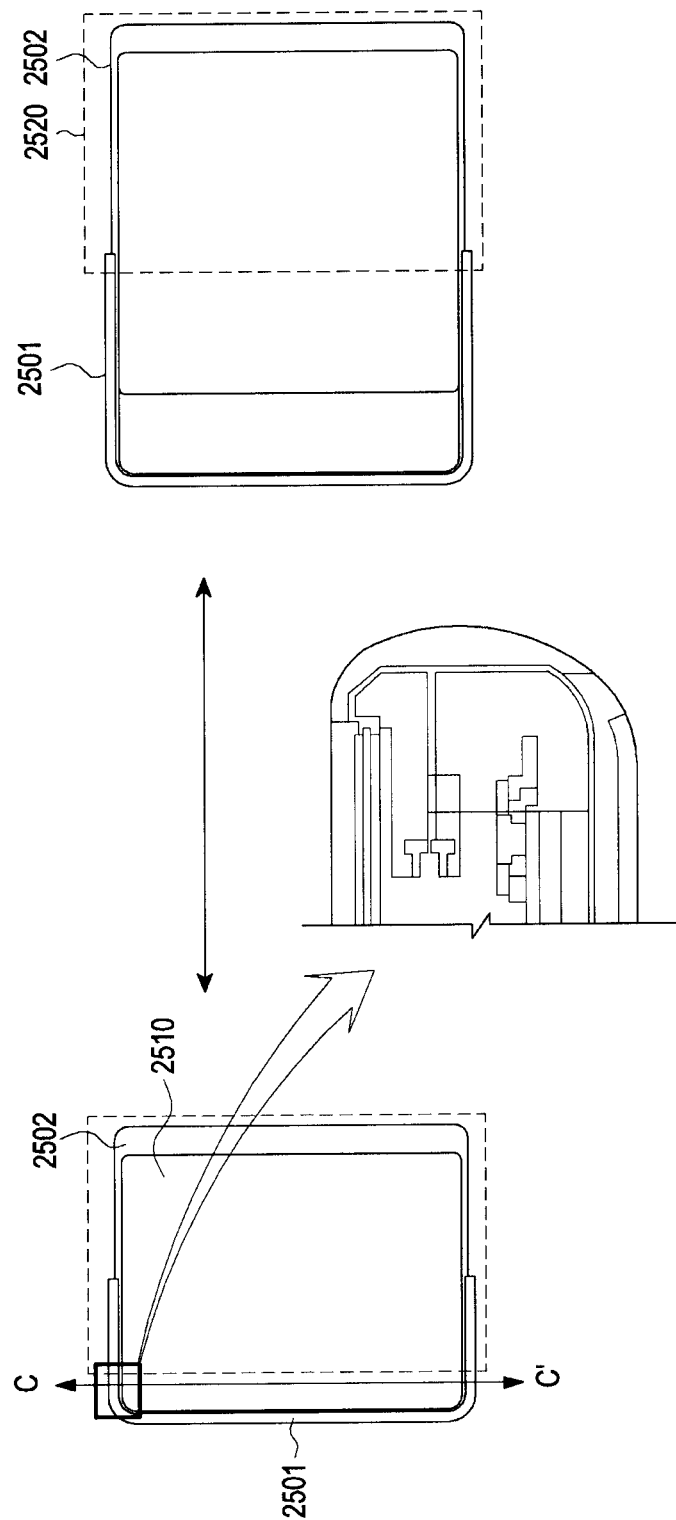
FIG. 25 is a side, cross-sectional view illustrating an antenna of an electronic device with a flexible display according to an embodiment.

FIG. 25 is a side, cross-sectional view illustrating an antenna configuration of an electronic device with a flexible display according to an embodiment. Referring to FIG. 25, when antenna-related structures are configured in area C of the first housing 2501 as described above in connection with FIG. 24, the flexible display 2510 attached to the second housing 2502 may slide to expand from the housing 2501 as indicated with 2520, with the result of a variation in the radiation performance of the antenna. As the flexible display 2510 slides, the above-described upper rail and lower rail may be moved alongside, causing a variation in the area of the metal bracket.

Figure 26:
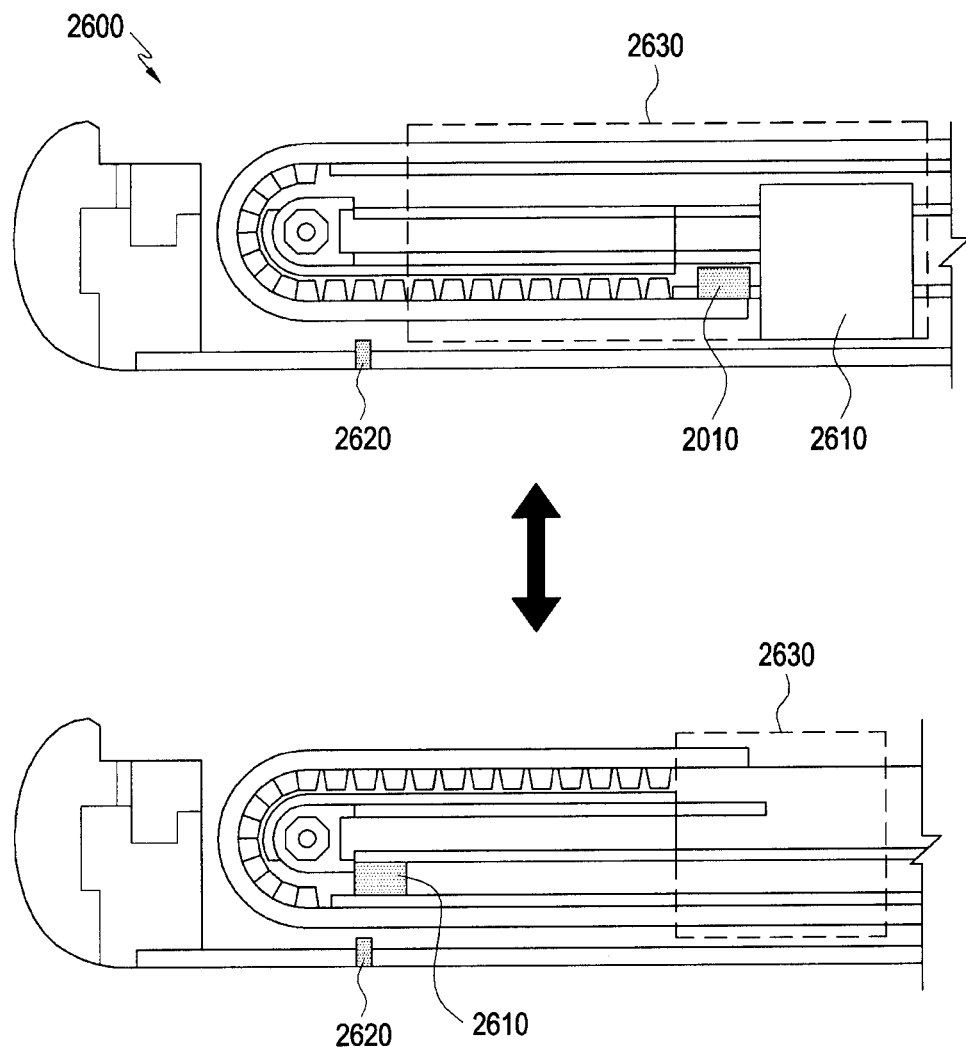
FIG. 26 is a side, cross-sectional view illustrating an antenna of an electronic device with a flexible display according to an embodiment.
Figure 27:
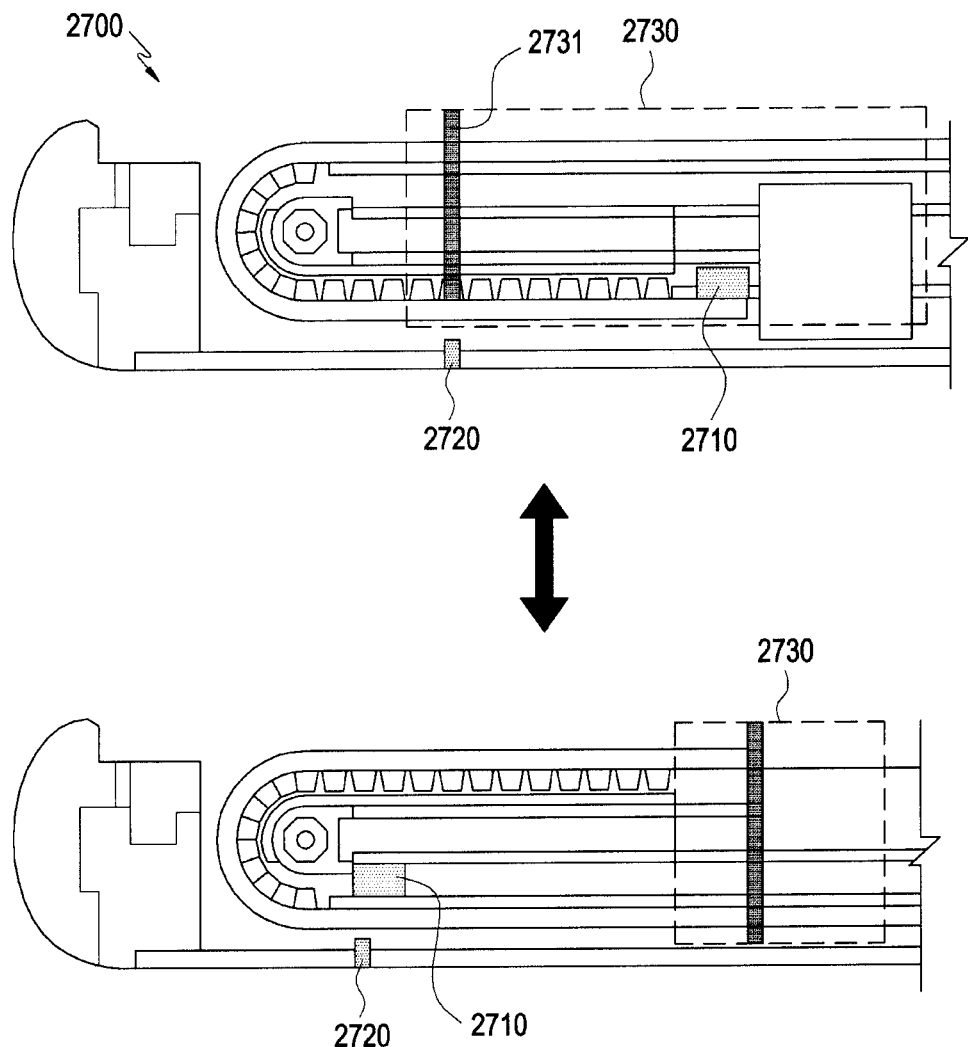
FIG. 27 is a side, cross-sectional view illustrating an antenna of an electronic device with a flexible display according to an embodiment.

FIGS. 26 and 27 are side, cross-sectional views illustrating an antenna configuration of an electronic device with a flexible display according to an embodiment. Referring to FIGS. 26 and 27, when the housing of an electronic device 2600 or 2700 is used as an antenna (e.g., a high-frequency band antenna), a separator 2620 or 2720 may be formed in at least a portion of the housing. According to an embodiment, the separator 2620 or 2720 may be formed to electrically separate metallic pieces using a material that is non-metallic or has a high permittivity or by extrusion.

According to an embodiment, a bracket 2630 or 2730 (e.g., the first housing 2501 of FIG. 25) may be configured not to overlap with the separator 2620 as shown in FIG. 26 or, if it overlaps as shown in FIG. 27, the separator 2720 of the housing may be configured to be aligned with the separator 2731 of the bracket 2730. The structures shown in FIGS. 26 and 27 may prevent such an occasion that the internal bracket 2630 or 2730 and housing used as an antenna happen to have different electrical lengths in some circumstances thus failing to deliver a constant performance.

According to an embodiment, since the antenna efficiency may be lowered by current leakage through the bracket 2630 or 2730, the housing and the bracket metallic piece are separated in the same position to prevent the hinge from blocking radiation at the separator where radiation primarily occurs. The separator 2620 or 2731 may be formed to electrically separate metallic pieces using a material that is non-metallic or has a high permittivity or by extrusion.

As described above, the DDI 2610 or 2710 may be affixed to the flexible display and be moved along with the flexible display. As shown, there may be provided to restrict the movement of the flexible display to prevent damage to the DDI 2610 or 2710 by the movement of the flexible display. For example, the structure may be configured to allow the DDI 2610 or 2710 to move from the rear surface of the electronic device 2600 up to the inflection point of the curved surface.

Figure 28:
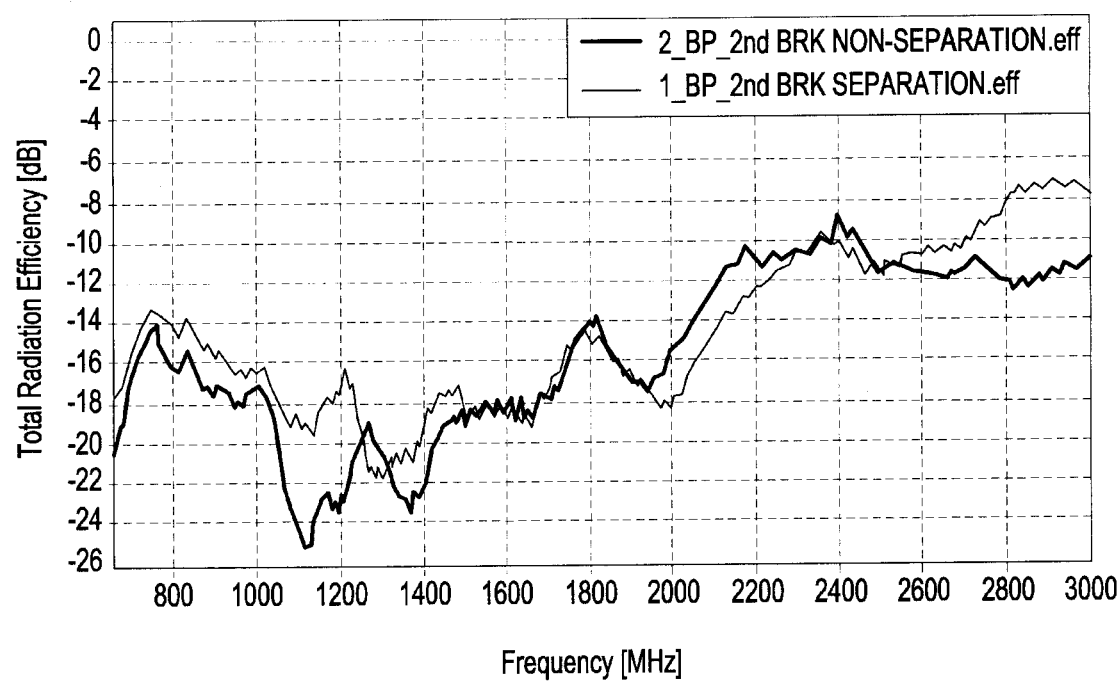
FIG. 28 is a graph illustrating the radiation efficiency of an antenna in an electronic device with a flexible display according to an embodiment.

FIG. 28 is a graph illustrating radiation efficiencies by an antenna separation structure in an electronic device with a flexible display according to an embodiment. Referring to FIG. 28, when the electronic device lacks a separator as shown in FIGS. 26 and 27, a performance lowering of 6 dB to 8 dB may occur, and when there are unaligned separators, a performance lowering of 3 dB to 4 dB may result. Conversely, the formation of separators aligned with each other may reduce the performance lowering down to about 1 dB to about 2 dB as compared with when they are opened.

It can be shown from FIG. 28 that separation and non-separation result in differences in performance in a particular frequency band (e.g., a 2 GHz or more high-frequency band).

Figure 29:
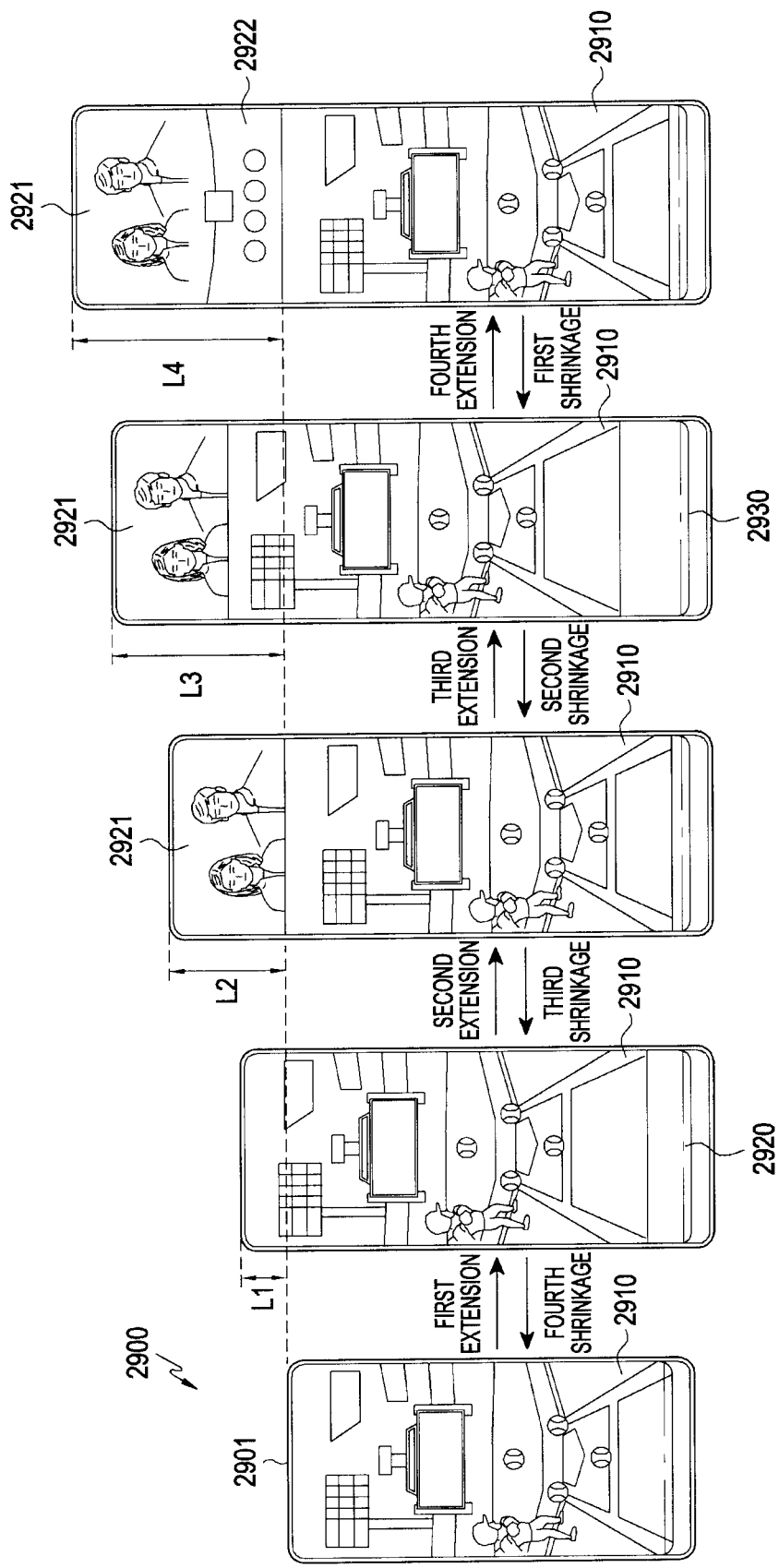
FIG. 29 is a view illustrating an example of a screen displayed on an electronic device with a flexible display according to an embodiment.

FIG. 29 is a view illustrating an example of a screen configuration displayed on an electronic device with a flexible display according to an embodiment.

Referring to FIG. 29, an electronic device may display a screen 2910 of a running first application through a display 2901. For example, the electronic device may display the first application screen 2910 to correspond to the size of the exposed front area of the flexible display 2901. According to an embodiment, although the screen resolution of the first application may be assumed to be fixed, embodiments of the disclosure are not limited thereto.

According to an embodiment, as the flexible display 2901 of the electronic device 2900 slides to expand, the rear surface portion of the flexible display 2901 may be pulled out to the front surface.

According to an embodiment, as a sliding part moves to a first length L1, the rear surface portion 2920 of the flexible display 2901 may be pulled out by the first length to the front surface. For example, the electronic device may identify the screen area corresponding to the rear surface portion, which has been moved to the front surface, of the execution screen of the first application.

According to an embodiment, when the first application is set to display the execution screen at a designated resolution, the electronic device may apply an image effect (e.g., gradation) to the added screen area corresponding to the portion 2920 of the first length L1 and display the result on at least part (e.g., top or bottom) of the exposed front surface. According to an embodiment, the image effect may include adjusting the color variation value of the mask layer for the added portion 2920. For example, the user may identify the expansion of display through the image effect-applied screen area.

According to an embodiment, as the sliding part moves to a second length L2, the rear surface portion of the flexible display 2901 may be pulled out by the second length to the front surface. For example, the electronic device may identify a screen to be displayed on the portion of the second length.

According to an embodiment, the electronic device may display content 2921 (e.g., an advertisement image) or an image effect related to the first application on the flexible display 2901 expanded to the second length. For example, the electronic device 2900 may display the designated content at the top of the flexible display 2901 expanded to the second length, the image effect-applied result at the bottom, and the first application screen 2910 between the designated content and the image effect-applied result.

According to an embodiment, as the sliding part moves to a third length L3, the rear surface portion of the flexible display 2901 may be pulled out by the third length to the front surface. For example, the electronic device may identify the screen area corresponding to the rear surface portion, which has been moved to the front surface, of the execution screen of the first application and the added content.

According to an embodiment, when the first application is set to display the execution screen at a designated resolution, the electronic device may apply an image effect (e.g., gradation) to the added screen area corresponding to the portion 2930 by the expansion from the second length L2 to the third length L3 and display the result on at least part (e.g., top or bottom) of the exposed front surface. According to an embodiment, the image effect may include adjusting the color variation value of the mask layer for the added portion 2930. For example, the user may identify the expansion of display through the image effect-applied screen area.

According to an embodiment, as the sliding part moves to a fourth length L4, the rear surface portion of the flexible display 2901 may be pulled out by the fourth length to the front surface. For example, the electronic device may identify a screen to be displayed on the portion of the fourth length.

According to an embodiment, when the designated content 2921 may be displayed at a varied resolution, the electronic device may change the resolution or screen configuration of the content corresponding to the size of a portion of the area of the fourth length and display the varied content 2922 at the top of the flexible display 2901. The first application screen 2910 may be displayed underneath the content.

According to an embodiment, the electronic device may determine whether the execution screen of a running application may be displayed at a varied resolution when the flexible display expands and control displaying various contents on the expanded area.

Figure 30:
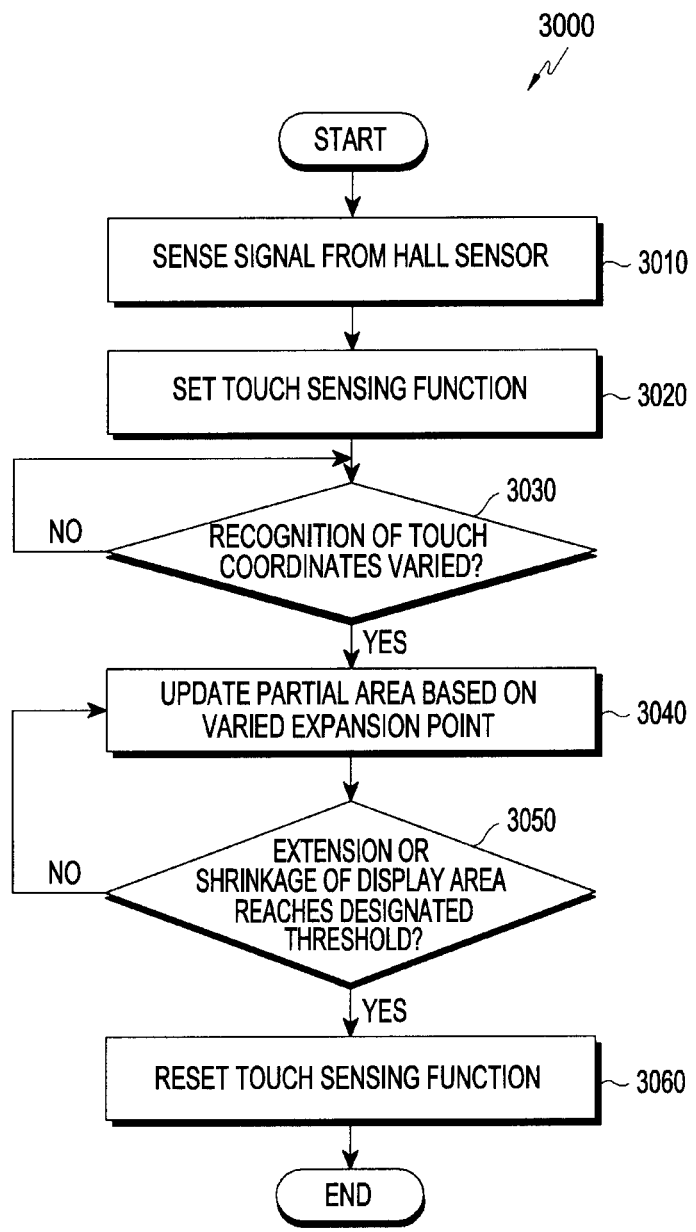
FIG. 30 is a flowchart illustrating an example of displaying a screen on an electronic device with a flexible display according to an embodiment.

FIG. 30 is a flowchart 3000 illustrating an example of displaying a screen on an electronic device with a flexible display according to an embodiment.

According to an embodiment, an electronic device may include a flexible display mounted from its front surface to the rear surface along the curved surface. At least a portion of the display area of the flexible display mounted on the rear surface may be moved to the front surface as a sliding part disposed on the rear surface is moved.

Referring to FIG. 30, in operation 3010, the electronic device (e.g., the electronic device 101 of FIG. 1 or the electronic device 301 of FIG. 3) (e.g., the processor 120 or 310 of the electronic device) may detect a signal from a hall sensor. The electronic device may include the hall sensor (e.g., the hall sensor may be mounted on a printed circuit board (PCB) inside the electronic device). The electronic device may determine a repositioning of the second housing from a signal sensed by the hall sensor and determine, e.g., the position or movement of the flexible display based on the repositioning of the second housing.

In operation 3020, the electronic device may set a touch sensing function. For example, when the touch sensing function is inactive, the electronic device may activate the touch sensing function, and when the touch sensing function is active and a touch input received is identified within a designated time, the electronic device may disregard the received touch input.

In operation 3030, the electronic device may identify whether recognition of coordinates of a touch is varied. For example, the electronic device may determine that the recognition of the coordinates of a touch is varied as the touch sensor is moved by the movement of the sliding part.

When the recognition of the coordinates of a touch is varied as a result of operation 3030, the electronic device may repetitively perform operation 3030. When the recognition of the coordinates of a touch is determined in operation 3030 to be varied, the electronic device may update the partial area based on the varied expansion point in operation 3040.

In operation 3050, the electronic device may determine whether the area of the flexible display expands or shrinks within a designated range.

When the area of the flexible display is determined in operation 3050 to be expanded or shrunken within the designated range, the electronic device may perform operation 3040. When the area of the flexible display reaches a predetermined threshold as a result of operation 3050, the electronic device may reset the touch sensing function in operation 3060. For example, when the touch sensing function is active and a touch input received is identified within a designated time, the electronic device may disregard the received touch input.

Figure 31:
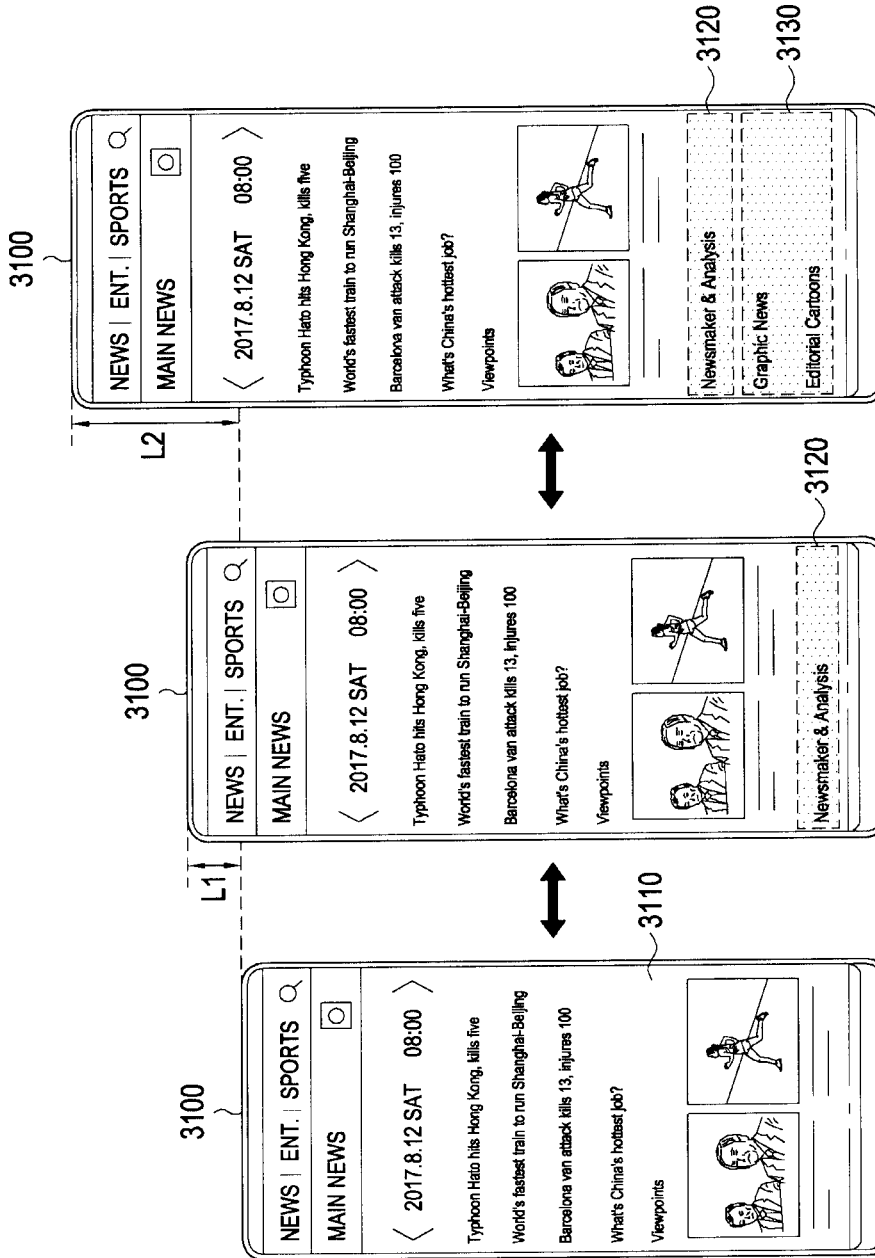
FIG. 31 is a view illustrating an example of a screen displayed on an electronic device with a flexible display according to an embodiment.

FIG. 31 is a view illustrating an example of a screen configuration displayed on an electronic device with a flexible display according to an embodiment.

Referring to FIG. 31, an electronic device 3100 may display a screen 3110 of a first application being executed through a flexible display. For example, the electronic device 3100 may display the first application screen 3110 to correspond to the size of the exposed front area of the flexible display.

According to an embodiment, the electronic device 3100 may include a sliding part that may slide-move to allow a rear surface portion of the flexible display to move out to the front surface.

According to an embodiment, as a sliding part moves to a first length L1, the rear surface portion (e.g., corresponding to the area 3120) of the flexible display may be pulled out by the first length to the front surface. For example, the electronic device 3100 may identify the screen area corresponding to the rear surface portion, which has been moved to the front surface, of the execution screen of the first application.

According to an embodiment, when the first application is set to display a screen at various resolutions, the electronic device 3100 may identify a screen to be displayed on a screen area corresponding to the portion (e.g., corresponding to the area 3120) of the first length in relation to the first application. For example, the electronic device 3100 may receive a screen of the first application corresponding to the full size of the flexible display upon executing the first application or send a request for, and receive, a partial screen of the first application corresponding to the length to which it has been moved by the movement of the sliding part.

According to an embodiment, the electronic device 3100 may apply a designated screen display effect to the image displayed on the area 3120 of the first length. For example, the electronic device 3100 may perform a screen display effect process on a bottom portion of the area 3120 of the first length.

According to an embodiment, the electronic device 3100 may calculate a color variation value (e.g., a value set to apply a gradation effect) designated for the screen data corresponding to the area 3120 of the first length among pieces of screen data of the first application and apply the calculated color variation value to the area 3120 of the first length.

According to an embodiment, as a sliding part moves to a second length L2, the rear surface portion 3130 of the flexible display may be pulled out by the second length to the front surface. For example, the electronic device 3100 may identify the screen data corresponding to the area 3130 of the second length except for the area 3120 of the first length among all the pieces of screen data of the first application.

According to an embodiment, the electronic device 3100 may calculate a color variation value (e.g., a value set to apply a gradation effect) designated for the screen data corresponding to the area 3130 of the second length and apply the calculated color variation value to the area 3130 of the second length.

According to an embodiment, as the flexible display slides out to the second length, the electronic device 3100 may display the designated color variation value-applied screen data on the area 3120 of the first length and the area 3130 of the second length continuously next to the first application screen displayed before the shift of the flexible display.

Figure 32:
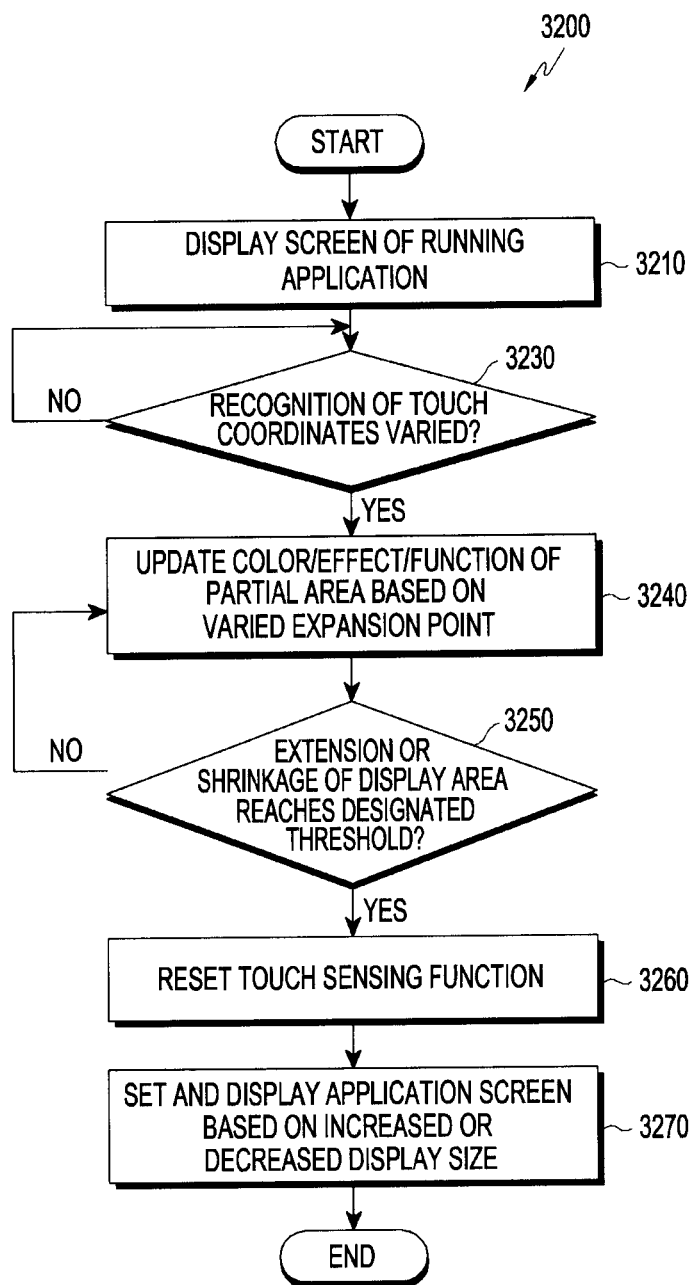
FIG. 32 is a flowchart illustrating an example of displaying a screen on an electronic device with a flexible display according to an embodiment.

FIG. 32 is a flowchart illustrating an example of displaying a screen on an electronic device with a flexible display according to an embodiment.

According to an embodiment, an electronic device may include a flexible display expanding from its front surface to the rear surface along the curved surface. At least a portion of the display area of the flexible display expanding to the rear surface may be moved to the front surface as the flexible display slides out.

Referring to FIG. 32, in operation 3210, the electronic device (e.g., the electronic device 101 of FIG. 1 or the electronic device 301 of FIG. 3) (e.g., the processor 120 or 310 of the electronic device) may display a screen of a running application. For example, the electronic device may set and display the screen to correspond to the size of the portion of the flexible display which has been moved to the front surface.

In operation 3230, the electronic device may identify whether recognition of coordinates of a touch is varied. For example, as the flexible display sliding out, a dielectric affixed to the housing of the electronic device may sense the flexible display, determining that the reference for the coordinates of a touch has been changed.

When the recognition of the coordinates of a touch is determined in operation 3230 not to be varied, the electronic device may repetitively perform operation 3230. When the recognition of the coordinates of a touch is determined in operation 3230 to be varied, the electronic device may update the color, effect, or function of the partial area based on the varied expansion point in operation 3240. For example, the electronic device may identify the area from the expansion point before the shift of the flexible display to the varied expansion point as the partial area of the entire area of the flexible display.

In operation 3250, the electronic device may determine whether the area of the flexible display expands or shrinks corresponding to a designated threshold. When the area of the flexible display expands or shrinks corresponding to the designated threshold as a result of operation 3250, the electronic device may reset the touch sensing function in operation 3260. For example, when the touch sensing function is active and a touch input received is identified within a designated time, the electronic device may disregard the received touch input. In operation 3270, the electronic device may set and display the screen of the application based on the expanded or shrunken screen size of the flexible display.

For example, according to an embodiment, the electronic device may set and display the screen of the application based on the expanded or shrunken display size in operation 3260. When the area of the flexible display expands corresponding to the designated threshold, the portion corresponding to the expanded display size of the entire execution screen of the application may further be displayed on the expanded flexible display area. When the flexible display shrinks corresponding to the designated, the electronic device may apply an image effect (e.g., darkening) to the portion corresponding to the shrunken display size of the execution screen of the application and display the same.

Figure 33:
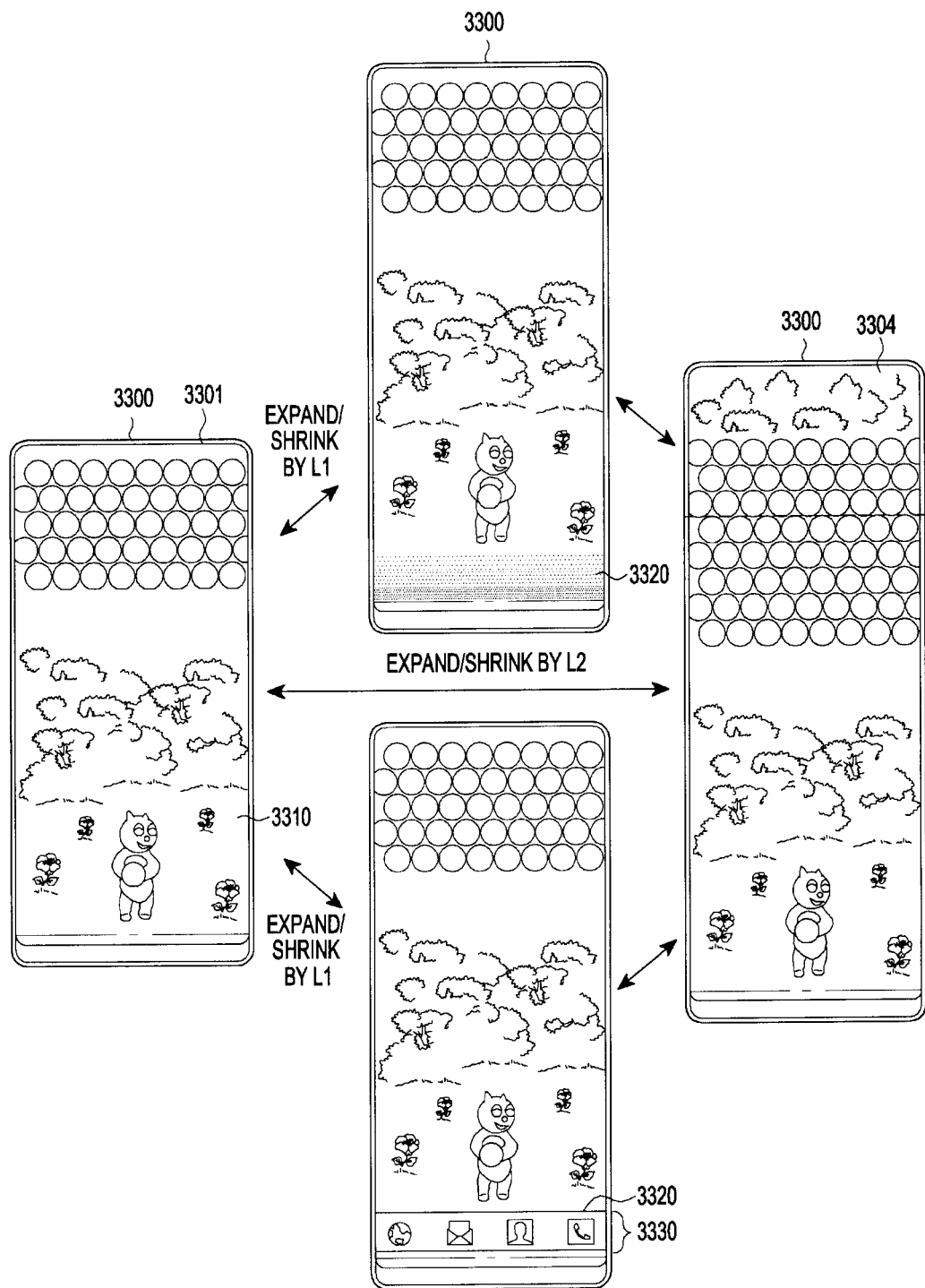
FIG. 33 is a view illustrating an example of a screen displayed on an electronic device with a flexible display according to an embodiment.

FIG. 33 is a view illustrating an example of a screen configuration displayed on an electronic device with a flexible display according to an embodiment.

Referring to FIG. 33, an electronic device 3300 may display a screen 3310 of a first application being executed through a flexible display 3301. For example, the electronic device 301 may display the first application screen 3310 at a designated resolution or aspect ratio (horizontal-to-vertical ratio) (e.g., 18.5:9) to correspond to the exposed front surface area of the screen of the flexible display 3301.

According to an embodiment, as the flexible display 3301 of the electronic device 3300 slides out, a portion of the rear surface area of the flexible display 3301 may be pulled out to the front surface. For example, the electronic device 3300 may display the first application screen 3310 in various manners depending on the size of the portion pulled out to the front surface.

According to an embodiment, as the flexible display 3301 moves to a first length L1, the rear surface portion 3320 of the flexible display 3301 may be pulled out by the first length to the front surface. For example, when the size (e.g., the aspect ratio or size in which a change in resolution is utilized) of the exposed display area on the front surface including the area of the first length is less than a designated size, the electronic device 3300 may identify display settings for the area of the first length. The display settings may include a setting for applying a designated image effect or displaying buttons 3330 to perform designated functions, a setting for displaying text or setting color values, or any other various settings to display the screen, e.g., applying a bounce-back effect. According to an embodiment, the electronic device may give a gradation effect by adjusting the branding value of the masking layer on the expanded area of the first length. According to an embodiment, the electronic device may implement the effect by fixing the window size of the masking layer and updating the branding start point to be equal to the area of exposure corresponding to the area of the first length. According to an embodiment, as the flexible display 3301 slides out to the second length L2, the rear surface area of the flexible display 3301 may be pulled out to the front surface by the second length. For example, when the exposed display area on the front surface including the area of the second length reaches a designated size (e.g., the aspect ratio or size in which a change in resolution is utilized), the electronic device 3300 may change the aspect ratio or resolution of the first application (e.g., changes the aspect ratio from 18.5:9 to 21:9) and display the screen 3304 as per the aspect ratio change or resolution change. For example, when the flexible display 3301 slides to expand up to a degree of resolution or aspect ratio supported by the electronic device (or firmware installed on the electronic device), the electronic device may update the data to be displayed and then gradually remove the branding value of the masking layer. For example, the electronic device may implement the expanded area in various manners (e.g., colors, effects, or functions) while maintaining the current aspect ratio or resolution until it reaches an aspect ratio or resolution that the electronic device or firmware supports.

Figure 34:
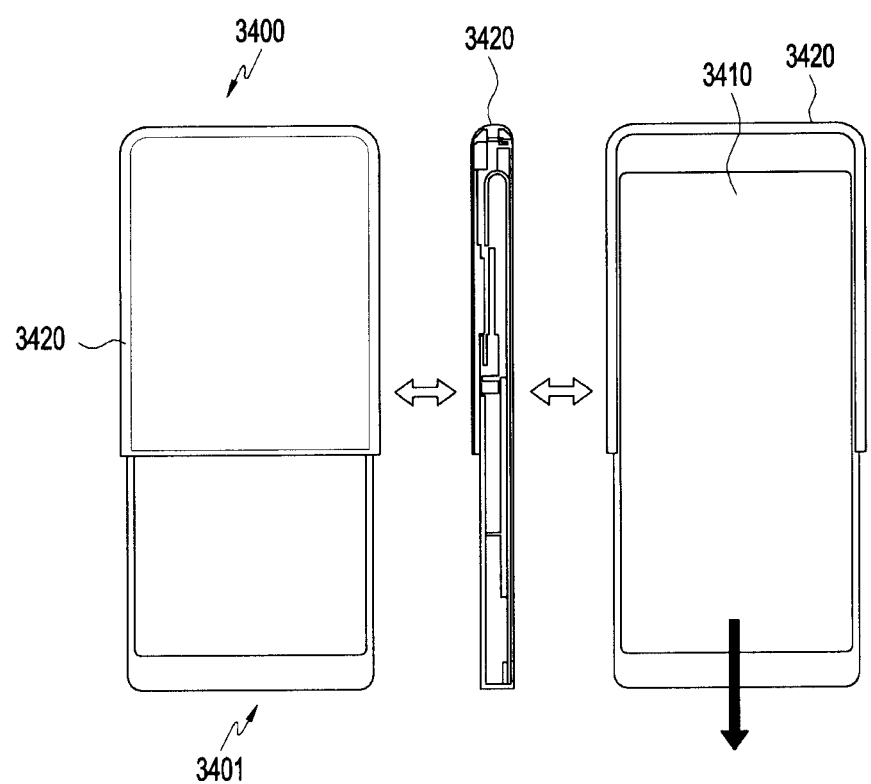
FIG. 34 is a view illustrating various examples of expansion of a flexible display of an electronic device according to an embodiment.

FIG. 34 is a view illustrating various examples of expansion of a flexible display of an electronic device according to an embodiment.

Referring to FIG. 34, an electronic device 3400 may include a first housing 3420, a second housing 3401, or a flexible display 3410. At least part of the second housing 3401 may overlap with the first housing 3420 and be slide-engaged with the first housing 3420. The flexible display 3410 may at least partially be attached to the second housing 3401. As the first housing 3420 and the second housing 3401 slide over each other to shrink, at least part of the flexible display 3410 may be retracted inside the first housing 3420.

According to an embodiment, as the first housing 3410 and the second housing 3401 slide over each other, a first surface of the flexible display 3410 which is exposed in a first direction (towards the front surface) may be resized.

According to an embodiment, the first housing 3420 may be disposed over the second housing 3401, and when the second housing 3401 is pulled down, the flexible display 3410 affixed to the second housing 3401 may be expanded downwards.

According to an embodiment, the flexible display 3410 may slide on the main body inside the first housing 3420 while being supported by the first housing 3420. By the movement, at least part of the flexible display 3410 may be retracted inside the first housing 3420 or be expanded out from the rear surface of the electronic device 3400 to the outside of the first housing 3420.

According to an embodiment, the first housing 3420 may include a transparent window in at least part thereof. The rear display area of the flexible display 3410 hidden inside the first housing 3420 may be exposed through the transparent window. For example, as the flexible display 3410 slides out along the curved surface, a portion of the rear display area may be pulled out from the first housing 3420, and the rest may be exposed through the transparent window.

Figure 35:
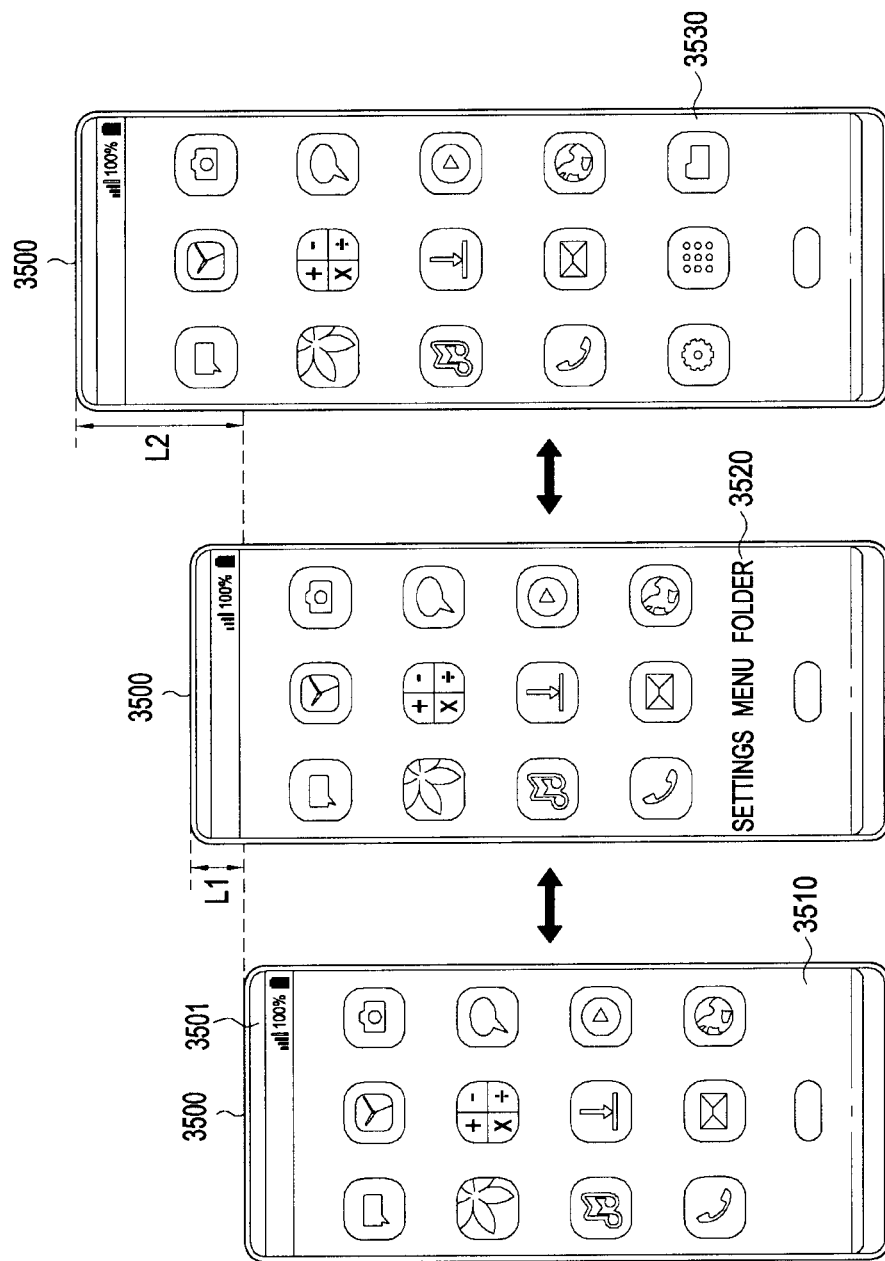
FIG. 35 is a view illustrating an example of a screen displayed on an electronic device with a flexible display according to an embodiment.

FIG. 35 is a view illustrating an example of a screen configuration displayed on an electronic device with a flexible display according to an embodiment.

Referring to FIG. 35, an electronic device 3500 may include a home screen 3510 including the respective icons of a plurality of applications through a flexible display 3501. For example, the electronic device 3500 may configure and display the home screen 3510 to correspond to the size of the exposed front area of the flexible display 3501.

According to an embodiment, as the flexible display 3501 of the electronic device 3500 slides out, a portion of the rear surface area of the flexible display 3501 may be pulled out to the front surface. For example, the electronic device 3500 may display the first application screen 3510 in various manners depending on the size of the portion pulled out to the front surface.

According to an embodiment, as the flexible display 3501 moves to a first length L1, the rear surface portion 3520 of the flexible display 3501 may be pulled out by the first length to the front surface. For example, when the size of the exposed display area on the front surface including the area of the first length is less than a designated size, the electronic device 3300 may identify display settings for the area of the first length. The display settings may include a setting for applying a designated image effect or displaying buttons 3530 to perform designated functions, a setting for displaying text or setting color values, or any other various settings to display the screen, e.g., applying a bounce-back effect.

According to an embodiment, as the flexible display 3501 moves to a second length L2, the rear surface portion of the flexible display 3501 may be pulled out by the second length to the front surface. For example, when the front exposed display area including the area of the second length reaches a designated size, the electronic device 3500 may identify the screen data 3530 corresponding to the area of the second length of the full screen data of the first application.

According to an embodiment, as the sliding part slides out to the second length, the electronic device 3500 may display the identified screen data corresponding to the area of the second length continuously next to the first application screen displayed before the movement of the sliding part.

According to an embodiment, referring to FIG. 35, when the flexible display expands to a length of L1 with the first application screen 3510 displayed, the expanded area may not be enough to display icons. Thus, text may be instead displayed on the expanded area. According to an embodiment, as further expanding from length L1 to length L2, the screen may present a space enough to display icons and may thus add and display new icons on the expanded area.

Figure 36:
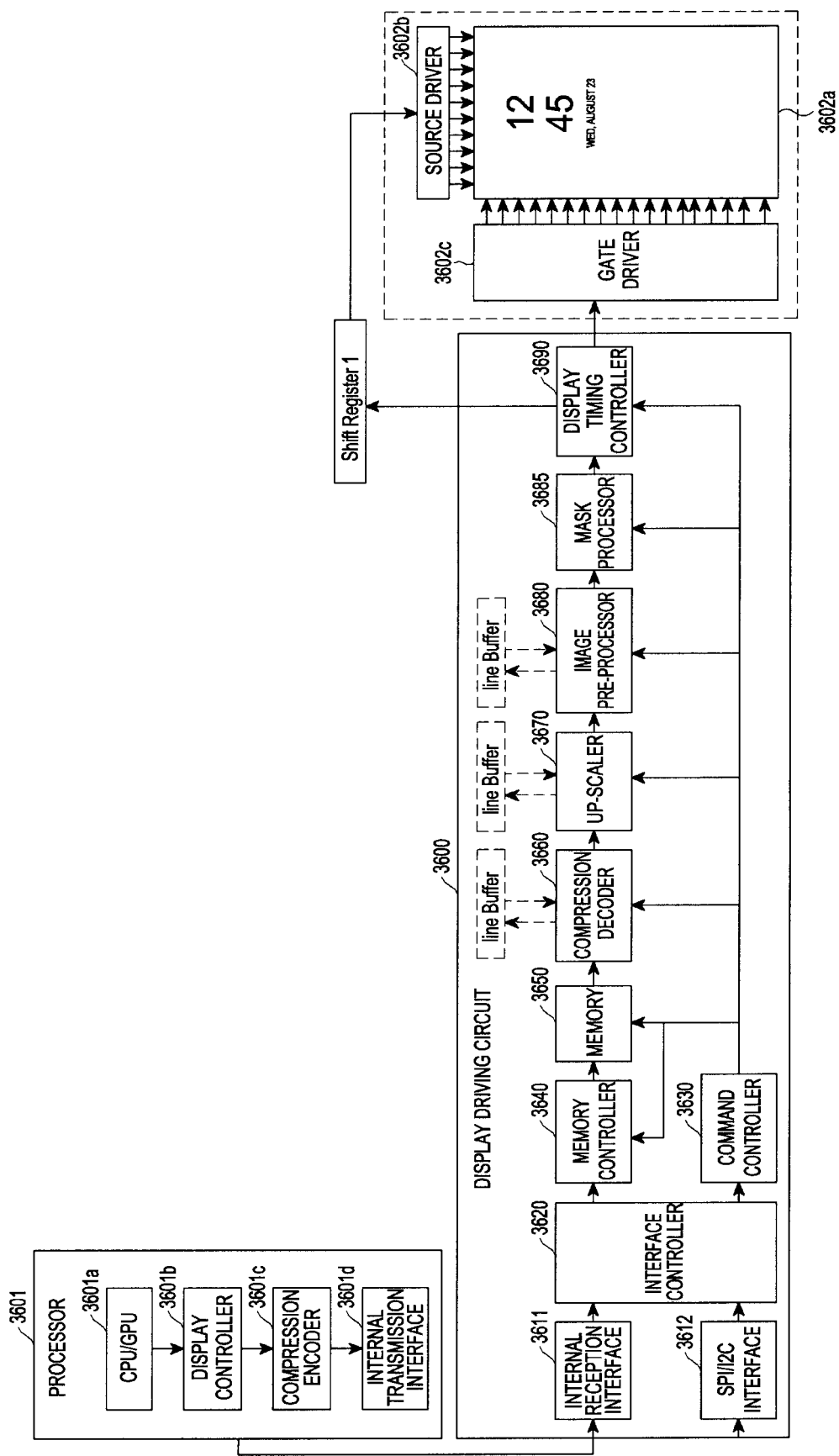
FIG. 36 is a block diagram illustrating a display structure according to an embodiment.

FIG. 36 is a block diagram illustrating an example of a configuration related to driving a display according to an embodiment.

Referring to FIG. 36, a display device may include a processor 3601 (e.g., an application processor, a communication processor, or a sensor hub), a display driving circuit 3600 (e.g., a DDI), and a display panel 3602a.

The processor 3601 may generate display data according to an embodiment and provide the generated display data to the display driving circuit 3600. For example, the processor 3601 may encode or compress the display data in a designated scheme and provide the encoded or compressed data to the display driving circuit 3600. The processor 3601 may transition to a sleep state according to, e.g., a preset schedule or corresponding to the user's manipulation. While the processor 3601 is in the sleep state, the display driving circuit 3600 may output at least partial display data stored in the memory to the display panel 3602a as per a designated operation scheme.

The processor 3601 may include a central processing unit (CPU)/graphics processing unit (GPU) 3601a, a display controller 3601b, a compression encoder 3601c, or an internal transmission interface 3601d (e.g., mobile industry processor interface (MIPI) Tx).

The CPU/GPU 3601a may perform computation processing on data to be output to the display 3602a corresponding to a user input or scheduled information. The CPU/GPU 3601a may transfer the processed data to the display controller 3601b.

The display controller 3601b may generate data to be transferred to the display driving circuit 3600 based on the data received from the CPU/GPU 3601a.

The compression encoder 3601c may encode the display data generated by the display controller 3601b in a designated scheme (e.g., video electronics standards association (VESA) display stream compression (DSC)). Thus, the display data generated by the display controller 3601b may be compressed into a smaller data size. For example, the display data generated by the display controller 3601b may be encoded and shrunken to 1/n by the compression encoder 3601c. According to an embodiment, the compression encoder 3601c may be omitted. In other words, the display data may be transferred to the display driving circuit 3600 without undergoing a compression process.

The internal transmission interface 3601d may transfer the display data encoded by the compression encoder 3601c to the display driving circuit 3600. The internal transmission interface 3601d may include, e.g., a mobile industry processor interface (MIPI).

The display driving circuit 3600 may calculate and apply the color variation value of the display data according to the settings and output the result to the display panel 3602a. For example, upon receiving the display data from the processor 310, the display driving circuit 3600 may calculate a color variation value to be applied to the display data based on the position where the display data is to be output, apply the calculated color variation value to the display data, and output the result to the display 3602a.

The display driving circuit 3600 may include an internal reception interface 3611 (e.g., MIPI Rx), a serial peripheral interface (SPI)/inter-integrated circuit (I2C) interface 3612, an interface controller 3620, a command controller 3630, a memory controller 3640, a memory 3650 (e.g., a graphics random access memory (GRAM)), a compression decoder 3660 (e.g., a compression decoder), an up-scaler 3670, an image pre-processor 3680, a mask processor 3685, and a display timing controller 3690. Although not shown, according to an embodiment, the display driving circuit 3600 may further include an oscillator, a frame number (or frame frequency) adjusting module, and a pixel power applying module.

The internal reception interface 3611 may communicate with the processor 310 to receive control information and display data from the processor 310. The internal reception interface 3611 may include, e.g., an MIPI receiving circuit. Upon receiving the control information and display data through the MIPI transmission circuit of the processor 310, the internal reception interface 3611 may transfer the control information and display data to the interface controller 3620.

The interface controller 3620 may receive display data and/or control information from the processor 310. The interface controller 3620 may transfer the received display data to the memory controller 3640. The interface controller 3620 may transfer the received control information to the command controller 3630.

The memory controller 3640 may record the display data received from the interface controller 3620 into the memory 3650. For example, the memory controller 3640 may record the display data into the memory 3650 according to the frame rate of the display data received from the processor 310.

The memory 3650 may include a graphics RAM (GRAM). The memory 3650 may store the display data received from the memory controller 3640. The stored display data may include display data compressed by the processor 310 or non-compressed display data. The memory 3650 may include a memory space corresponding to the resolution and/or the number of color gradations of the display panel 3602a. The memory 3650 may include a frame buffer or a line buffer. The memory 3650 may have a different update count or speed depending on the type of an image output to the display panel 3602a. For example, upon playing a video, the memory 3650 may record display data corresponding to the frames of the video at a designated speed. For still images, the memory 3650 may store the previous still image until an image update occurs. The display data stored in the memory 3650 may include coordinates for display on each display area of the display 160. The order of display data may correspond to the coordinates for display on the display 160.

The command controller 3630 may control the display timing controller 3690 to apply the color variation value corresponding to each piece of display data stored in the memory 3650 to be output on a designated area of the display panel 3602a. The command controller 3630 may be referred to as control logic.

When at least part of display data read out of the memory 3650 has been encoded, the compression decoder 3660 may decode the at least part in a designated scheme and transfer the display data to the display timing controller 3690. For example, when the display data has been compressed to the size of 1/n by the compression encoder 3601c, the compression decoder 3660 may decompress the at least partial display data back into the display data before compression.

The up-scaler 3670 and/or image pre-processor 3680 may be disposed between the compression decoder 3660 and the display timing controller 3690. According to an embodiment, when at least partial display data selected by the command controller 3630 has not been encoded, the compression decoder 3660 may be omitted or bypassed.

The up-scaler 3670 may up-scale the decompressed image to a designated magnification. According to an embodiment, the up-scaler 3670 may magnify display data when the display data needs to be magnified depending on the size of display data to be output to the display panel 3602*a* or user settings. The display data magnified by the up-scaler 3670 may be transferred to the display timing controller 3690. When at least part of the display data does not need to be magnified, the up-scaler 3670 may be omitted or bypassed.

The image pre-processor 3680 may enhance the quality of display data. The image pre-processor 3680 may include, e.g., a pixel data processing circuit, a pre-processing circuit, and a gating circuit.

The mask processor 3685 may perform processing on the margin area 161 and boundary area 162 of the display 160. For example, the mask processor 3685 may calculate a color variation value (e.g., a value set to display the screen in black) to be applied to the display device to be output to the margin area 161 and apply the calculated color variation value to the margin area 161. The mask processor 3685 may provide the calculated color variation value to the display timing controller 3690 so that the display timing controller 3690 may apply the color variation value to the display data.

According to an embodiment, the margin area 161 may be configured to output designated display data (e.g., data set to output a black screen). In this case, the mask processor 3685 may calculate a color variation value (e.g., the maximum alpha blending value) set to output the original color screen of display data to be output to the margin area 161 and apply the color variation value to the display data. When the maximum alpha blending value is set, the color indicated by the display data may be reproduced as the original color without deformation or distortion.

The mask processor 3685 may calculate and apply a color variation value for the boundary area 162. In relation, the mask processor 3685 may obtain information about the center point of the boundary area 162. This is described in connection with FIG. 2. The mask processor 3685 may obtain the information about the center point of the boundary area 162 and calculate information about the distance between the center point and positions where the pieces of display data are to be displayed. The mask processor 3685 may calculate a designated color variation value depending on the distance information. For example, the mask processor 3685 may calculate distances from the center point for the pieces of display data using Equation 1.

$$(x-a)^2+(y-b)^2=D \quad \text{[Equation 1]}$$

Here, x and y are the coordinates of the origin of the circle, and a and b may include two-dimensional coordinates at which the display data is to be output. D may include the distance between the center point and the display data. The mask processor 3685 may allocate a designated color variation value according to D. Accordingly, the mask processor 3685 may calculate color variation values for the pieces of display device for all the pixels of the display 160. In relation to allocating the color variation value, the mask processor 3685 may include a computation device or operator capable of processing the designated equation. For example, the mask processor 3685 may include a computation device or operator configured to calculate the color variation value in such a manner that the color variation value decreases as the distance decreases (or the value set to display a color close to the original display data color–maximum alpha blending value), and the color variation value increases as the distance increases (or the value set to display a color designated by distorting the original display data color–minimum alpha blending value). The computation device of the mask processor 3685 may be configured to process integer computation. In relation, the mask processor 3685 may delete out the digits to the right of the decimal point and process the calculation of color variation value with the digits to the left of the decimal point.

According to an embodiment, the mask processor 3685 may calculate and apply a color variation value using Equation 2 below.

$$D1<(x-a)^2+(y-b)^2<D2 \quad \text{[Equation 2]}$$

Here, x and y are the coordinates of the origin of the circle, and a and b may include two-dimensional coordinates at which the display data is to be output. D1 may mean a designated first distance from the center point, and D2 may mean a designated second distance from the center point. D2 may be larger than D1. The mask processor 3685 may calculate a per-distance color variation value for the display data in a range from the designated first distance to the designated second distance using Equation 2. For example, the mask processor 3685 may apply a relatively small color variation value (e.g., a value set to present a smaller color distortion for display data positioned close to the curved area 163) to display data close to the first distance. The mask processor 3685 may apply a relatively large color variation value (e.g., a value set to present a larger color distortion for display data positioned close to the margin area 161) to display data close to the second distance. The mask processor 3685 may apply a designated color variation value (e.g., a value set to represent the original display data color) to display data positioned within the first distance or display data positioned out of the second distance. Although the mask processor 3685 is disposed between the image pre-processor 3680 and the display timing controller 3690, embodiments of the disclosure are not limited thereto. For example, the mask processor 3685 may be disposed between the compression decoder 3660, the up-scaler 3670, and the image pre-processor 3680.

The display timing controller 3690 may control the timing of the components of the display driving circuit 3600. For example, the display timing controller 3690 may adjust the timing of storing display data received from the processor 310 in the memory 3650 and the timing of reading the display data stored in the memory 3650 not to overlap with each other. The display timing controller 3690 may control the timings of reading the display data stored in the memory 3650 at a designated frame rate and transferring the display data to the compression decoder 3660 and the up-scaler 3670 under the control of the command controller 3630.

The display timing controller 3690 may transfer display data received from the image pre-processor 3680 to a source driver 2602*b* under the control of the command controller 3630 and control a gate driver 3602*c* to output gate signals. According to an embodiment, the display timing controller 3690 may be included in the command controller 3630. The display timing controller 3690 may convert display data received from the memory 3650 through the compression decoder 3660, the up-scaler 3670, and/or the image pre-processor 3680 into image signals and transfer the image signals to the source driver 3602*b* and the gate driver 3602*c* of the display panel 3602*a*. When the mask processor 3685 is configured to calculate a color variation value, the display timing controller 3690 may apply the color variation value received from the mask processor 3685 to the display data. For example, the display timing controller 3690 may apply the color variation value calculated by the distance between the center point and a particular pixel to the display data which is to be output at the pixel and output the same to the display 160.

The display 160 may include the source driver 3602*b*, the gate driver 3602*c*, and the display panel 3602*a*. The display 160 may further include a touch panel and touch IC, a pressure sensor and pressure sensor IC, and a digitizer related to the user's entry.

The display panel 3602*a* may display various types of information (e.g., multimedia data or text data) to the user. The display panel 3602*a* may include, e.g., a liquid crystal display (LCD) panel or an active matrix-organic light emitting device (AM-OLED) panel. The display panel 3602*a* may be implemented to be flexible, transparent, or wearable. The display panel 3602*a* may be included in the cover of a case electrically coupled with the electronic device 101.

The display panel 3602*a* may receive image signals corresponding to display data from the display driving circuit 3600 and display a screen according to the display data. The display panel 3602*a* may include a plurality of data lines and a plurality of gate lines crossing the plurality of data lines. A plurality of pixels may be arranged at the intersections of the data lines and the gate lines. When the display panel 3602*a* is an OLED panel, each pixel may include at least one or more switching elements (e.g., field effect transistors (TFTs) and one OLED. Each pixel may receive, e.g., an image signal from the display driving circuit 3600 at a predetermined timing, emitting light. The display panel 3602*a* may have a resolution of, e.g., wide quad high definition (WQHD) (1440×2560).

The source driver 3602*b* and the gate driver 3602*c* may generate signals for supply to scan lines (not shown) and data lines (not shown) of the display panel 3602*a* based on source control signals and gate control signals received from the display timing controller 3690. The display driving circuit 3600 may include the internal reception interface 3611, the interface controller 3620, the command controller 3630, the memory controller 3640, the memory 3650, the compression decoder 3660, the up-scaler 3670, the image pre-processor 3680, the mask processor 3685, an auxiliary memory 3696, and the display timing controller 3690.

The auxiliary memory 3696 may store a color variation value (e.g., an alpha blending value or masking image) for application to a curved boundary area. The masking image may include an image including color variation values for application to at least one area of, e.g., the curved area, boundary area, and the margin area. The auxiliary memory 3696 may store various color variation values depending on the shape of the curved area (e.g., a curved display area 3930) of the display device 160. For example, when a boundary area and a curved display area are included as described below in connection with FIG. 39, a color variation value for the boundary area and a color variation value for the curved display area may be stored.

The mask processor 3685 may obtain the color variation values from the auxiliary memory 3696. The mask processor 3685 may apply the color variation value to display data received from the image pre-processor 3680 and transfer the color variation value-applied display data to the display timing controller 3690. When the mask processor 3685 is disposed ahead of the image pre-processor 3680, the mask processor 3685 may read the color variation value out of the auxiliary memory 3696 and apply the color variation value to the scaled display data received from the up-scaler 3670.

Although the mask processor 3685 is shown as independent from the display timing controller 3690, embodiments of the disclosure are not limited thereto. For example, the mask processor 3685 may be included in the display timing controller 3690. Alternatively, the display timing controller 3690 may replace the mask processor 3685 in light of functionality. When replaced by the display timing controller 3690, the mask processor 3685 may be omitted.

According to an embodiment, the display driving circuit 3600 may store color variation values for application to the curved area in the memory 3650. In this case, the auxiliary memory 3696 (e.g., a line buffer) may be omitted from the display driving circuit 3600, and the mask processor 3685 may be configured to access the memory 3650.

Figure 37:
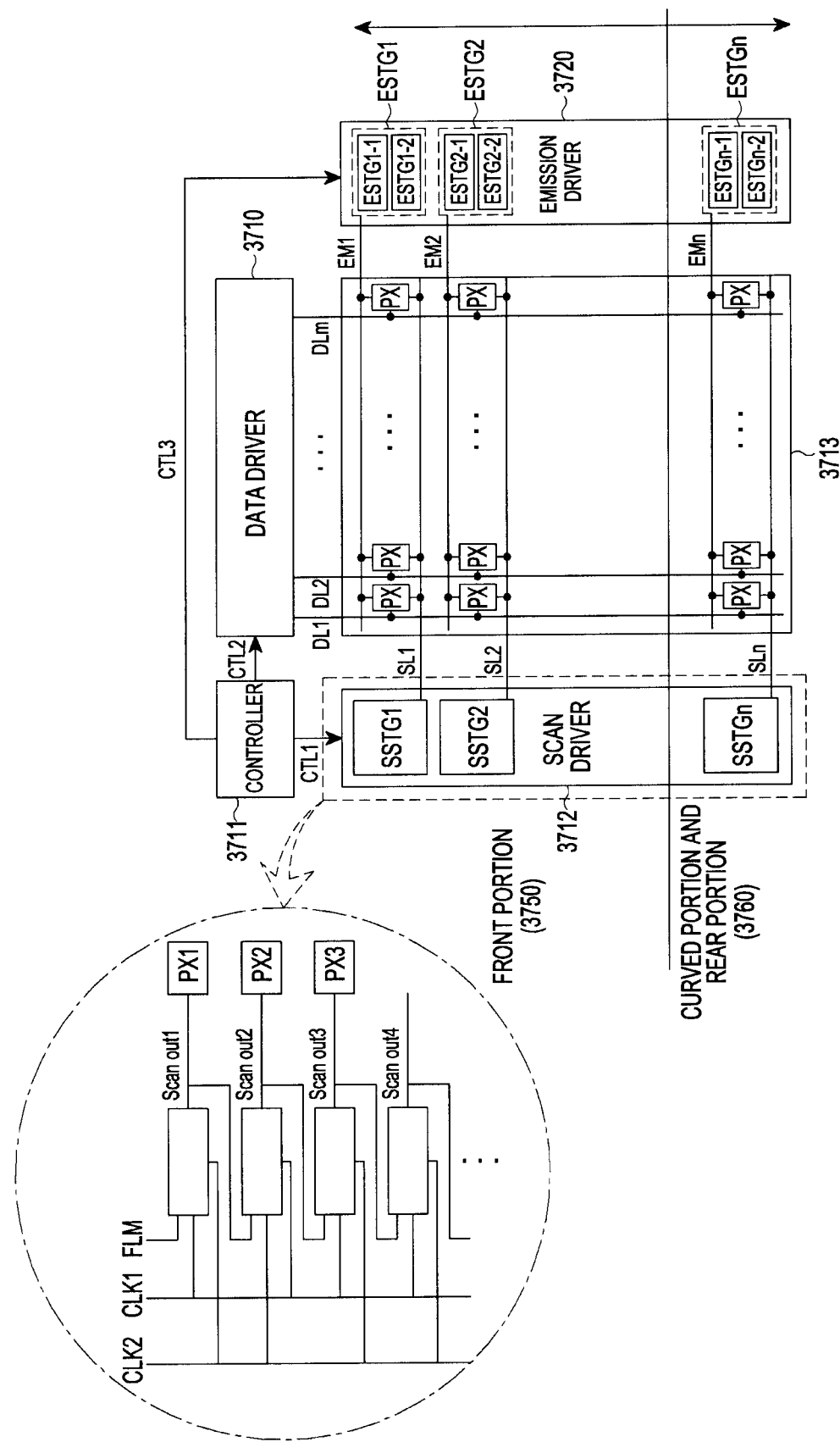
FIG. 37 is a view illustrating an example of a display device according to an embodiment.

FIG. 37 is a view illustrating an example of a display device according to an embodiment. Referring to FIG. 37, a display device may include a data driver 3710, an emission driver 3720, a controller 3711, a scan driver 3712, and a display unit 3713.

The data driver 3710 outputs data DL1 to DLm to determine the gray scale of the pixel. The controller 3711 may control the overall operation of the display device. The scan driver 3712 determines the positions of pixels in each row where data received from the data driver 3710 is to be displayed. The emission driver 3720 applies power to each pixel PX in the determined position. The scan driver 3712 and the emission driver 3720, respectively, may apply scan control signals SL1 to SLN and emission control signals EM1 to EMN, which are control signals (e.g., gate control signals) corresponding to the pixels PX in each row. The scan driver 3712 may apply gate control signals SL1 to SLN to control signal lines corresponding to the pixels PX in each row.

The light emitting device of each pixel PX may include a light emitting diode. In the instant embodiment, the light emitting diode is an OLED for illustration purposes. However, other various types of light emitting devices, elements, or diodes may be adopted without being limited to OLEDs.

The display unit 3713 includes a plurality of pixels PX. The pixels PX are arrayed in a matrix of N rows and M columns (when N and M are positive integers). The data driver 3710 or the scan driver 3712 may control each pixel PX.

Each SSTG of the scan driver 3712 may receive CLK1, CLK2, and FLM and output Scan out corresponding to each pixel as shown in Table 1 below.

TABLE 1

| CLK1 | CLK2 | FLM | Scan out |
|---|---|---|---|
| 1 | 0 | 0 | 0 |
| 1 | 0 | 1 | 1 |
| X | 1 | X | 0 |

Table 1 above represents an example operation for the scan driver 3712. The scan driver 3712 may have a flip-flop structure and sequentially transfer scan control signals SL1 to SLN to the pixels PX in each row of the display unit 3713 by CLK1, CLK2, and FLM received from the controller. For example, when data DL1 to DLm to be output from the data driver 3710 are prepared, the controller 3711 changes CLK2 from high to low and frame line mark (FLM) from low to high, and then, oscillates CLK1 to sequentially display the pixels PX in each row.

According to an embodiment, in the display unit 3713, as the second housing and the first housing of FIG. 25 expand or shrink to change the area of exposure of the front portion 3750 of the flexible display, the curved portion and rear portion 3760 of the flexible display may change in the area of exposure. However, the scan driver 3712 may sequentially control all of the pixels PX in each row in the display unit 3713 regardless of the area of exposure of the front portion 3750 so that although the curved portion and rear portion 3760 of the flexible display are partially unexposed to the outside by the first housing and the second housing of FIG. 25, the data driver 3710 may transfer data DL1 to DLm even to the unexposed area in the curved portion and rear portion 3760 of the flexible display. To reduce current consumption, the data driver 3710 may send Low signals, as data DL1 to DLm, to the unexposed curved portion and rear portion 3760 to stop the pixels PX from lighting on.

Figure 38A:
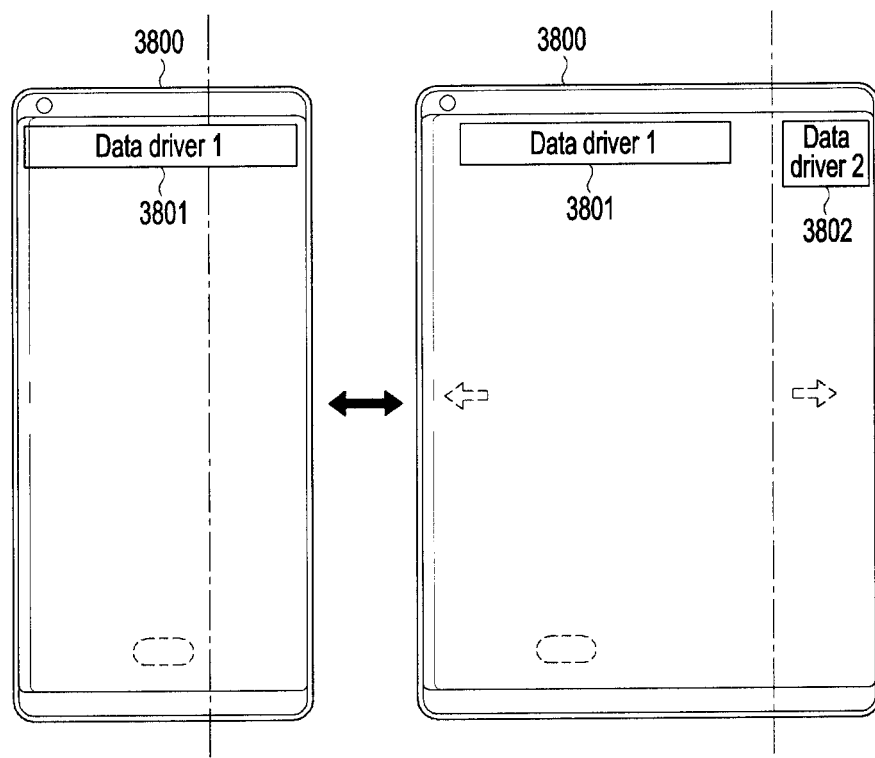
FIG. 38A is a view illustrating an example of a display device according to an embodiment.

FIG. 38A is a view illustrating an example of a display device according to an embodiment.

An electronic device 3800 may include a first data driver 3801 and a second data driver 3802. The first data driver 3801 and the second data driver 3802 may be separately positioned top to down or left to right with respect to the curved surface connecting the front and rear surface of the display. For example, the electronic device 3800 may include a flexible display expanding from the front to rear surface along the curved side surface, and when the flexible display expands from the front surface, the expanded area may be controlled by the second data driver 3802. According to an embodiment, the area controlled by the first data driver 3801 may even include a portion of the expanded area given the speed at which the screen is expanded by the user.

Figure 38B:
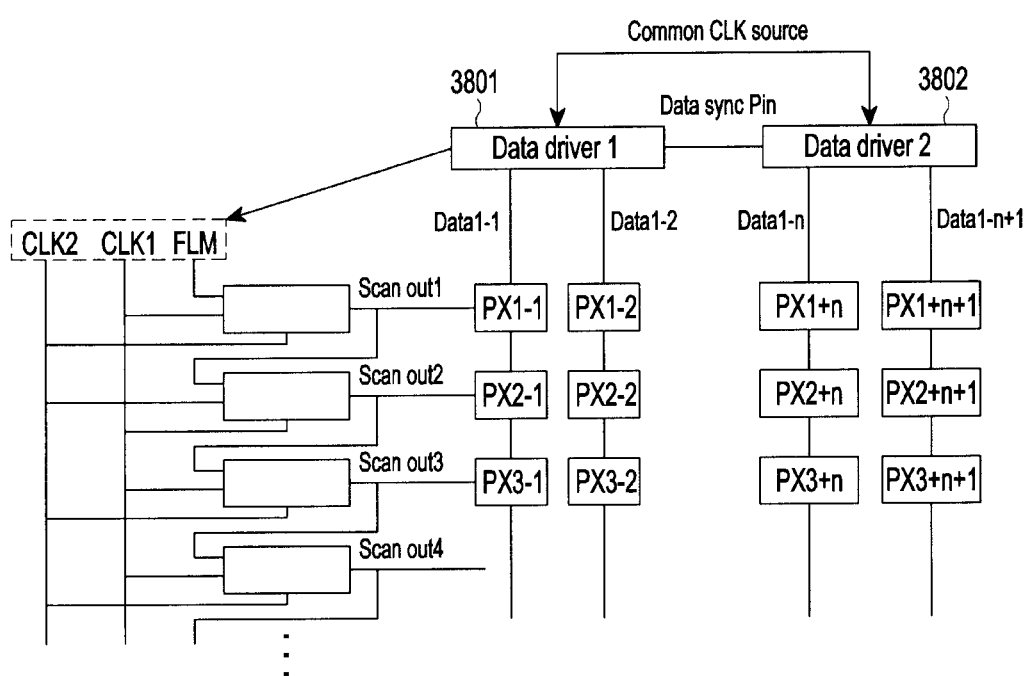
FIG. 38B is a view illustrating an example of a display device according to an embodiment.
Figure 38C:
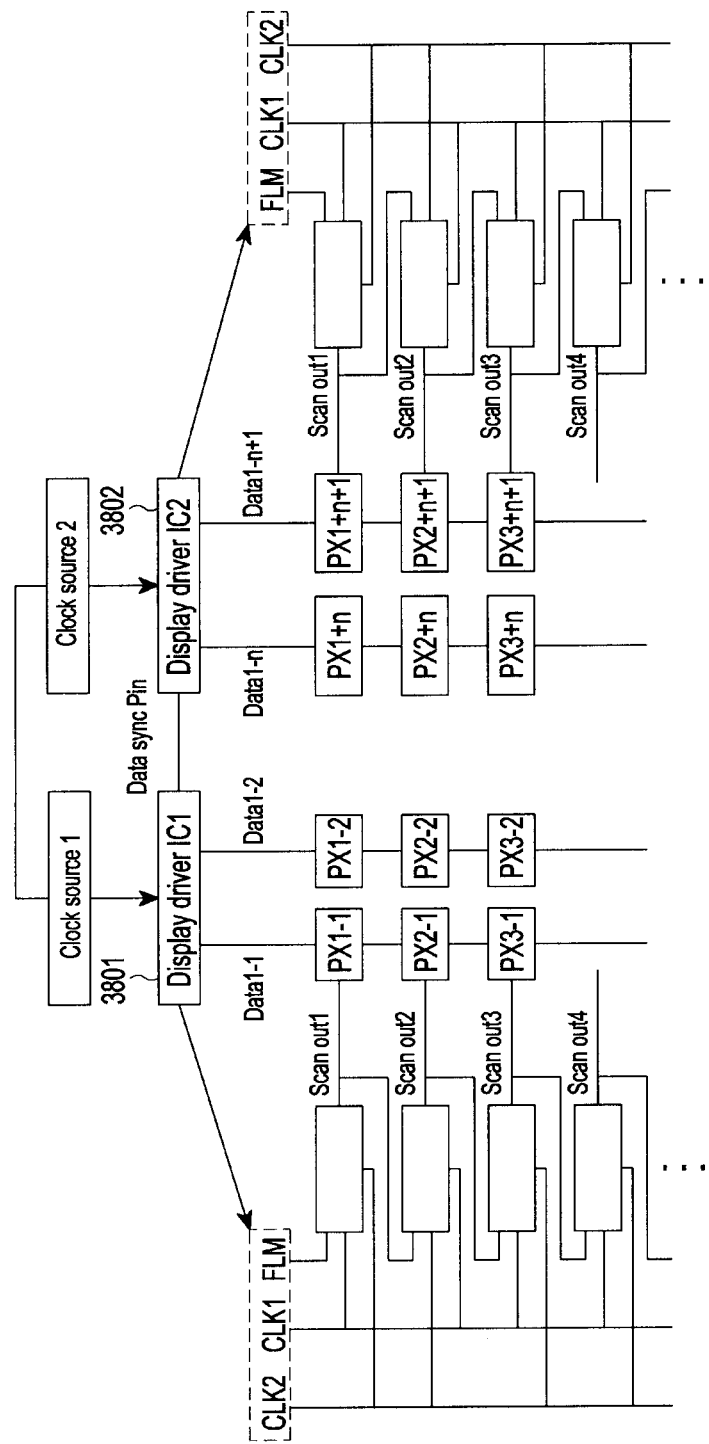
FIG. 38C is a view illustrating an example of a display device according to an embodiment.

According to an embodiment, the data drivers 3801 and 3802 may be configured as the first data driver 3801 and the second data driver 3802 in one display driving circuit 3600 (e.g., a DDI) as shown in FIG. 36 or may be separately configured as a first display driving circuit and a second display driving circuit independent from each other as shown in FIG. 38C. According to an embodiment, the scan driver and clock source controlled by the first display driving circuit and the second display driving circuit may also be independently provided, thus addressing such an problem as incapability of display at a high resolution or at a predetermined level or higher on the expanded display area due to the FET turn-on timing issue in terms of the nature of the scan driver sequentially controlling pixels PX.

FIG. 38B is a view illustrating an example of a display device according to an embodiment. Referring to FIG. 38B, screen display on the flexible display may be performed while being selectively controlled by the first data driver 3801 or the second data driver 3802 to reduce current consumption and to prevent external noise from flowing into the electronic device along a certain portion of the display (e.g., the unexposed curved portion or rear portion of the display) to affect the overall display (e.g., flickering) as shown in FIG. 38.

For example, the first data driver 3801 and the second data driver 3802 may receive a common CLK source and be data-synced with each other by the data sync pins.

According to an embodiment, while the flexible display remains shrunken as shown on the left side of FIG. 38A, the first data driver 3801 alone may be driven to display the screen, and when the flexible display expands as shown on the right side, the area before expansion may be screen-controlled by the first data driver 3801, and the expanded area may be screen-controlled by the second data driver 3802.

Figure 39:
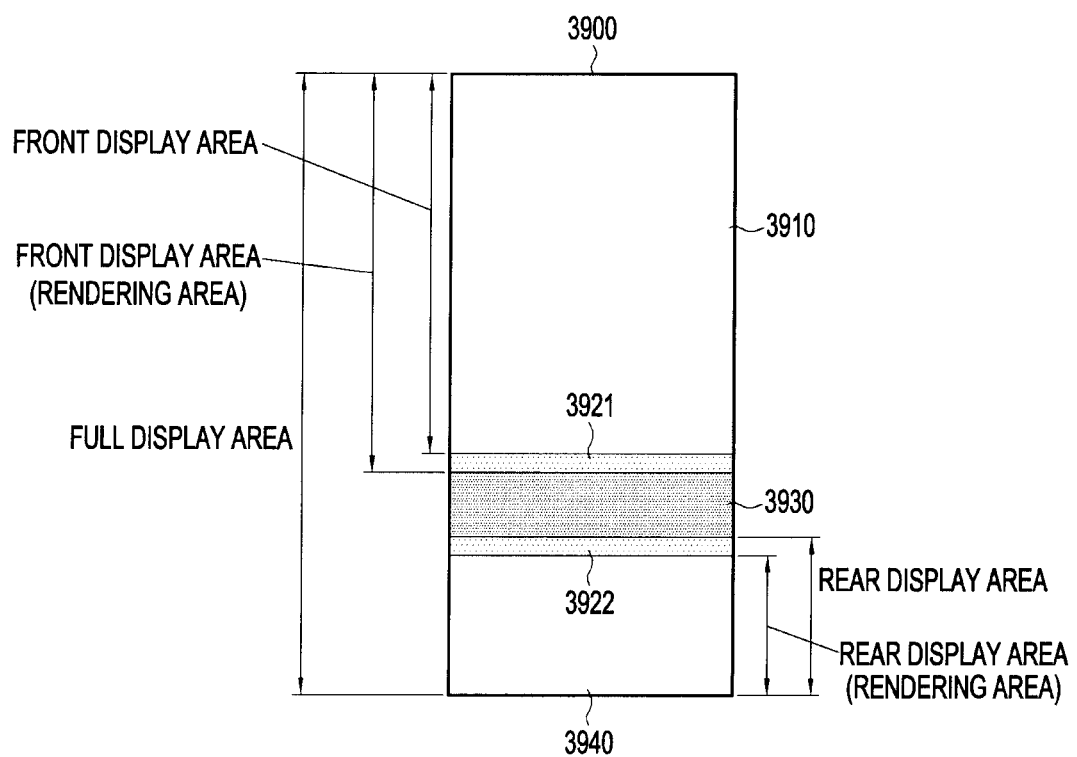
FIG. 39 is a view illustrating an example of a screen displayed on an electronic device with a flexible display according to an embodiment.

FIG. 39 is a view illustrating an example of a screen displayed on an electronic device with a flexible display according to an embodiment.

Referring to FIG. 39, the flexible display 3900 may include, e.g., a curved display area 3930. For example, the flexible display 3900 may include rectangular areas on the plane and at least a portion of the display area may be formed on the curved surface.

According to an embodiment, the flexible display 3900 may include a flat display area (e.g., a front display area 3910 or a rear display area 3940), a curved display area 3930 or a boundary area (e.g., a first boundary area 3921 or a second boundary area 3922). The first boundary area 3921 may include an area to display screens related to operating functions of the electronic device 101.

According to an embodiment, the front display area 3910 may be exposed through the front surface of the electronic device, and the second boundary area 3922 and the rear display area 3940 may at least partially be covered and hidden by the first housing. Since the rear display area 3940 is hidden by the first housing, the rear display area 3940 may have a screen state corresponding to a designated state (e.g., an off state or black screen) without displaying information.

According to an embodiment, the front display area 3910 may include an area to which a designated first color variation value (e.g., a maximum alpha blending value) is applied. When the maximum alpha blending value applies, the same colors may be displayed on the area According to an embodiment, the first boundary area 3921 may include an area to which a designated second color variation value (e.g., a designated alpha blending value) is applied. When the designated alpha blending value applies, the area may be displayed in some of the colors supposed to be displayed for the area or in varied colors.

According to an embodiment, the second boundary area 3922 and the curved display area 3930 may include an area to which a designated second color variation value (e.g., a minimum alpha blending value) is applied. As the minimum alpha blending value applies, the maximum alpha blending value may be applied to the second boundary area 3922 and the curved display area 3930 to display a designated color of the screen (e.g., a black screen) or the original image (e.g., a black screen) of display data regardless of display data displayed.

According to an embodiment, when the first housing has an opening in the rear surface, the electronic device may apply the first color variation value to the rear display area 3940 exposed through the opening and display.

Figure 40:
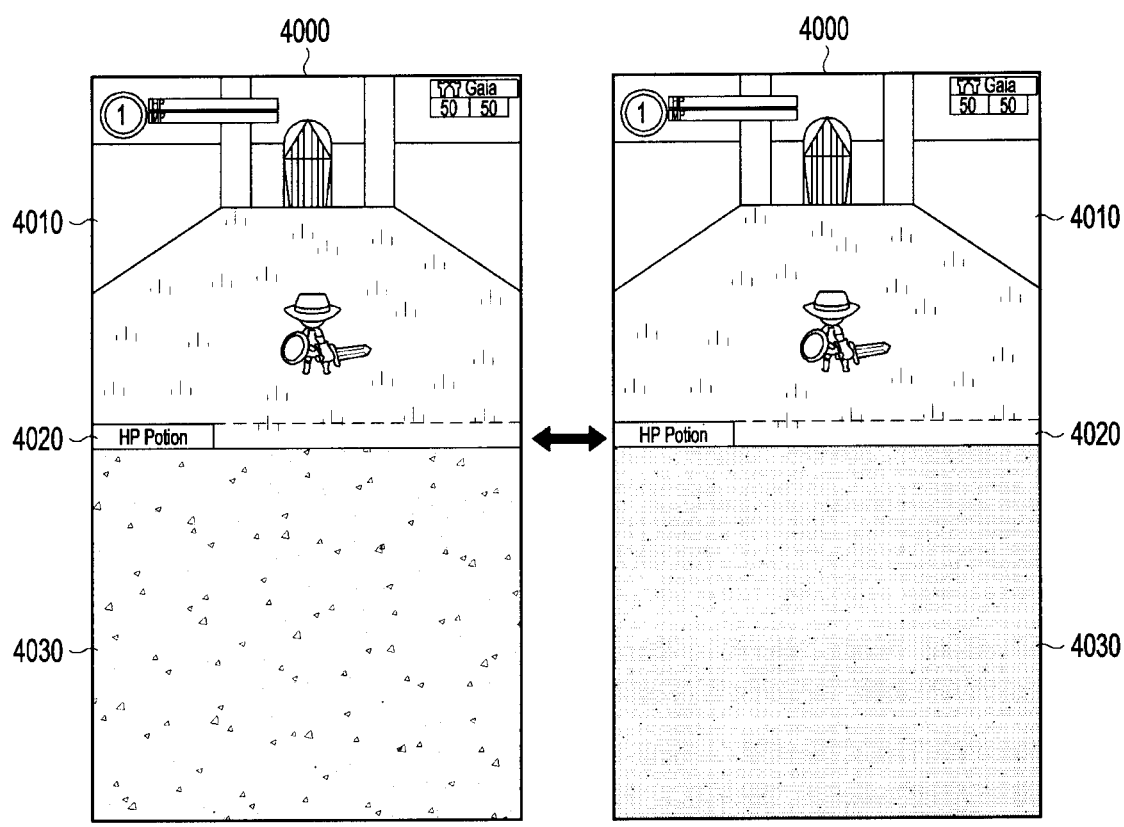
FIG. 40 is a view illustrating an example of a screen displayed on an electronic device with a flexible display according to an embodiment.

FIG. 40 is a view illustrating an example of a screen displayed on an electronic device with a flexible display according to an embodiment.

Referring to FIG. 40, a flexible display 4000 of an electronic device may display a screen of a first application running. For example, the electronic device may identify the size of a first area 4010 and a second area 4020 of areas of the flexible display 4000 exposed through the front surface and process and display the first application screen to correspond to the identified size of the first area 4010 and the second area 4020.

According to an embodiment, the electronic device may receive and display data corresponding to the first area 4010 and the second area 4020 among screen data of the first application. For example, the electronic device may apply a first color variation value (e.g., the maximum alpha blending value) to the data corresponding to the first area 4010 and display the result and apply a designated second color variation value (e.g., a designated alpha blending value) to data corresponding to the second area 4020 and display the result.

According to an embodiment, upon receiving the full screen data of the first application, the electronic device may apply a third color variation value (e.g., the minimum alpha blending value) to a third area 4030 except for the first area 4010 and the second area 4020 and display the result. As the minimum alpha blending value applies, the third area 4030 may display a designated color of the screen (e.g., a black screen) regardless of display data displayed.

Figure 41:
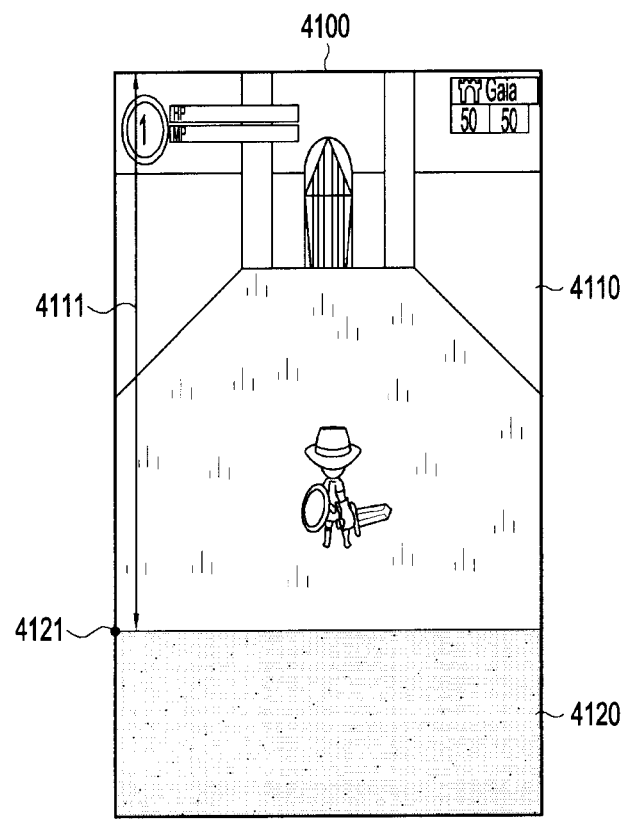
FIG. 41 is a view illustrating an example of a screen displayed on an electronic device with a flexible display according to an embodiment.

FIG. 41 is a view illustrating an example of a screen displayed on an electronic device with a flexible display according to an embodiment.

Referring to FIG. 41, a flexible display 4100 of an electronic device may display a screen of a first application running. For example, the electronic device may identify the size of a first area 4110 of areas of the flexible display 4100 exposed through the front surface and process and display the first application screen to correspond to the identified size of the first area 4110. According to an embodiment, upon receiving the full screen data of the first application, the electronic device may apply a first color variation value (e.g., the maximum alpha blending value) to screen data of the first area 4110 among the full screen data of the first application and display the same and apply a third color variation value (e.g., the minimum alpha blending value) to the second area 4120 except for the first area 4110 and display the result. As the minimum alpha blending value applies, the second area 4120 may display a designated color of the screen (e.g., a black screen) regardless of display data displayed. For example, the electronic device may perform GPU rendering on the area corresponding to the length denoted with 4111 and perform DDI partial window update from the point denoted with 4121.

Figure 42A:
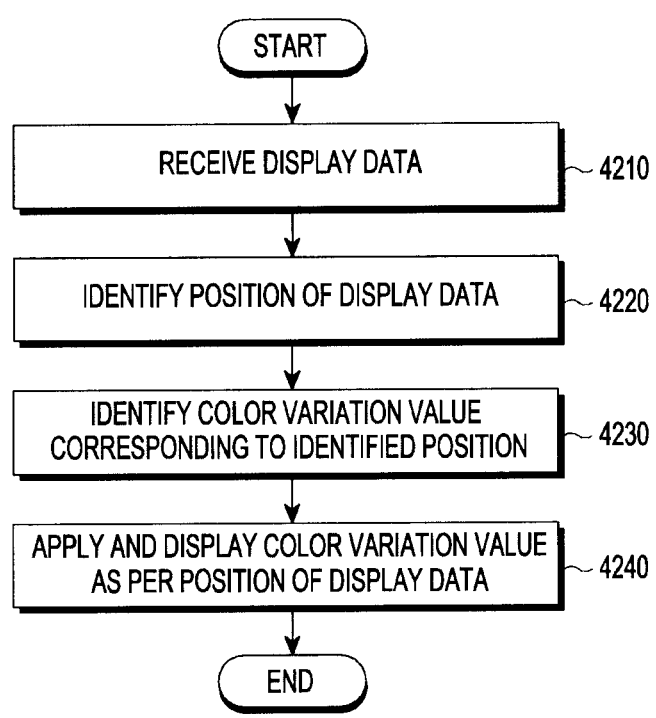
FIG. 42A is a flowchart illustrating an example of displaying a screen on an electronic device with a flexible display according to an embodiment.

FIG. 42A is a flowchart illustrating an example of displaying a screen on an electronic device with a flexible display according to an embodiment.

Referring to FIG. 42A, in operation 4210, an electronic device may receive display data about a running application.

In operation 4220, the electronic device may identify a display area disposed on the front surface of the electronic device among display areas of the flexible display and may identify the position of the display data displayed on the identified display area among the display data.

For example, a display driving circuit of the electronic device may identify the position on the display where the display data is output. The position of the display data may be previously determined as per the order of display data being to be supplied to the source driver of the display.

In operation 4230, the electronic device may identify the color variation value corresponding to the position of the display data depending on the position of the display data. For example, the electronic device may identify the color variation value corresponding to the data depending on whether the position is in the entire area of the flexible display, the area exposed through the front surface of the electronic device, the boundary display area, or the rear surface area. In operation 4240, the electronic device may apply the color variation value as per the position of the display data to the data and display the data.

Figure 42B:
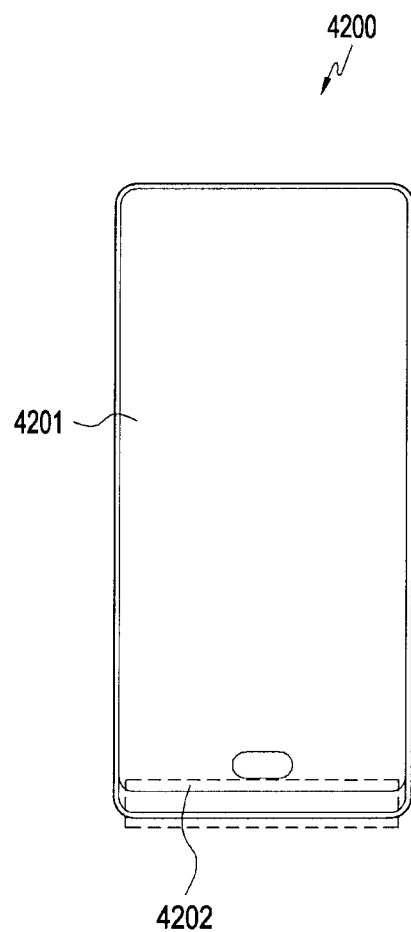
FIG. 42B is a front view illustrating an electronic device with a flexible display according to an embodiment.
Figure 42C:
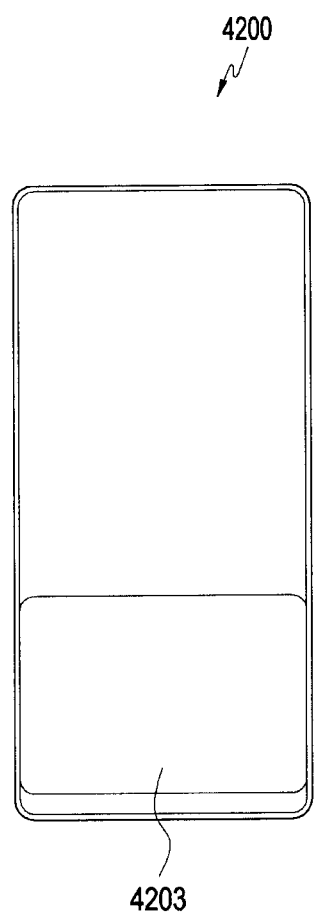
FIG. 42C is a rear view illustrating an electronic device with a flexible display according to an embodiment.

For example, referring to FIGS. 42B and 42C, the display driving circuit 3600 of the electronic device 4200 may be operated based on the position of display data like in operation 4230, calculating the color variation value as per the position of display data and applying the color variation value to the display data. The display driving circuit 3600 may identify the positions on each display area for all the received display data and calculate and apply the color variation value designated for each position. For example, when the position of display of the display data is included in the area 4201 where the display device is supposed to actually display the screen, the display driving circuit may apply a designated first color variation value (e.g., an alpha blending value set to cause no color distortion) to the display data and transfer the result to the display 4201 (e.g., the source driver).

According to an embodiment, when the position of the display is included in the margin area 4203, the display driving circuit may calculate a designated second color variation value (e.g., an alpha blending value set to display a black screen) and apply the color variation value to the display data.

Based on the above-described operations, the display driving circuit of the electronic device 4200 may more smoothly and naturally display on the boundary area 4202 upon displaying the screen including the area 4201 that is utilized to display the screen in real-time.

Figure 43:
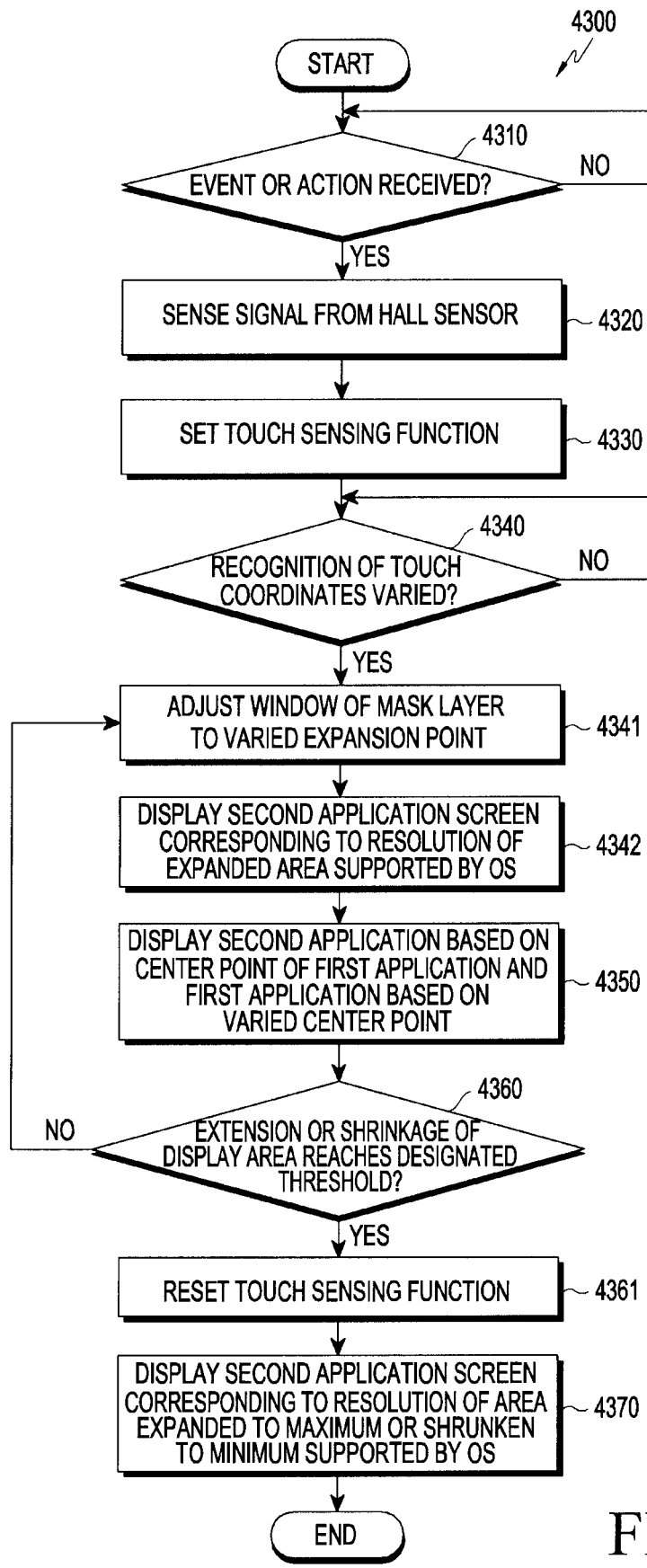
FIG. 43 is a flowchart illustrating an example of displaying a screen on an electronic device with a flexible display according to an embodiment.

FIG. 43 is a flowchart 4300 illustrating an example of displaying a screen on an electronic device with a flexible display according to an embodiment. According to an embodiment, an electronic device may display an execution screen of a first application running.

Referring to FIG. 43, in operation 4310, an electronic device (e.g., the electronic device 101 of FIG. 1 or the electronic device 301 of FIG. 3) (e.g., the processor 120 or 310 of the electronic device) may determine whether an event or action related to a second application is received while the first application is running.

When no event or action related to the second application is determined in operation 4310 to be received while the first application is running, the electronic device may repetitively perform operation 4310.

When an event or action related to the second application is determined in operation 4310 to be received while the first application is running, the electronic device may sense a signal from a hall sensor in operation 4320.

According to an embodiment, the electronic device may determine whether the flexible display moves, the direction or distance of the movement, and the current position based on the sensed hall sensor signal.

In operation 4330, the electronic device may set a touch sensing function.

According to an embodiment, when the function for sensing touch inputs is currently off, the electronic device may activate the touch sensing function, and upon identifying a touch input made within a pre-designated time, disable the function of the touch input and initialize the touch sensing function.

In operation 4340, the electronic device may identify whether recognition of coordinates of a touch is varied. When the recognition of the coordinates of a touch is determined in operation 4340 to not be varied, the electronic device may repetitively perform operation 4340.

When the recognition of the coordinates of a touch is determined in operation 4340 to be varied, the electronic device may adjust the mask layer window based on the varied expansion point in operation 4341. For example, as the flexible display area disposed on the rear surface moves to the front surface, the electronic device may determine that the moved flexible display area expands.

In operation 4342, the electronic device may display the screen of the second application corresponding to the resolution, supported by the operating system (OS), of the area where the first application screen has been displayed before and the expanded area.

In operation 4350, the electronic device may display the first application screen on the expanded area and the second application screen on the area where the first application screen has been displayed before.

In operation 4360, the electronic device may determine whether the flexible display expands or shrinks corresponding to a designated threshold.

When the area of the flexible display is determined in operation 4360 to be expanded or shrunken within a designated range, the electronic device may perform operation 4341.

When the area of the flexible display expands or shrinks corresponding to the designated threshold as a result of operation 4360, the electronic device may reset the touch sensing function in operation 4361.

In operation 4370, the electronic device may display the screen of the second application corresponding to the resolution, supported by the OS, of the expanded or shrunken area corresponding to the designated threshold.

Figure 44:
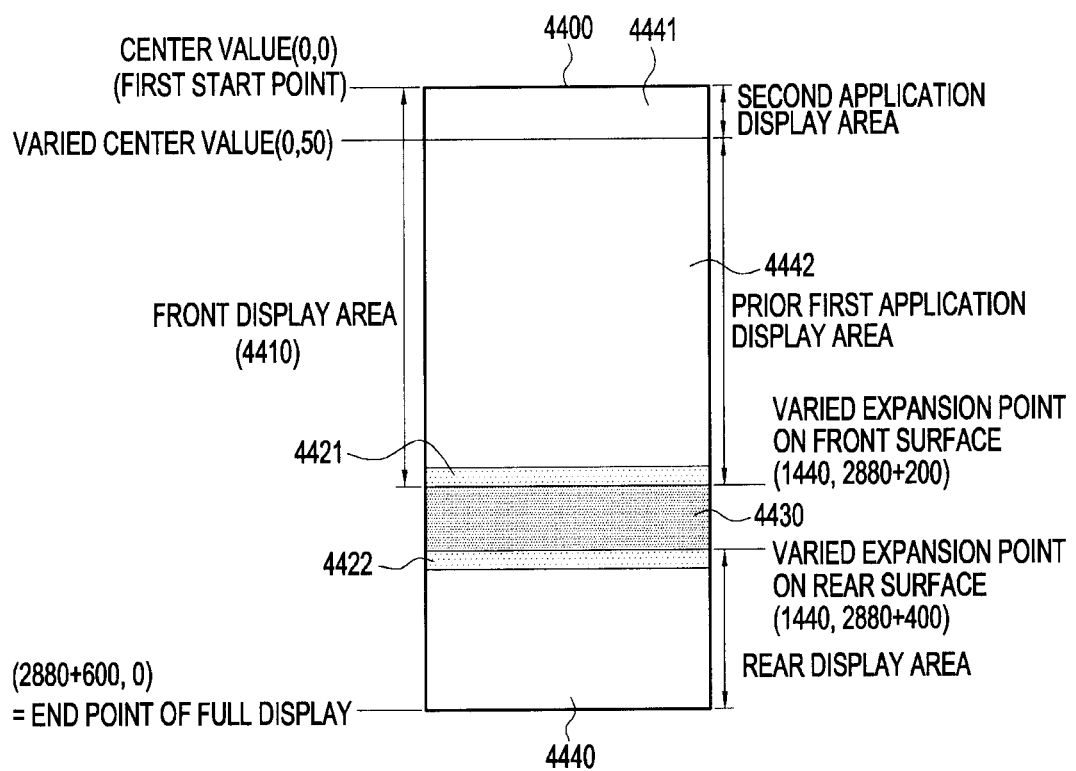
FIG. 44 is a view illustrating an example of a screen displayed on an electronic device with a flexible display according to an embodiment.

FIG. 44 is a view illustrating an example of a screen displayed on an electronic device with a flexible display according to an embodiment. Referring to FIG. 44, a flexible display 4400 of an electronic device may include flat display areas such as the front and rear display areas 4410 and 4440, a curved display area 4430, and boundary display areas 4421 and 4422.

According to an embodiment, while the first application is running, an event related to the second application may occur, and as per the movement of the flexible display 4400 of the electronic device, the rear display area of the flat display areas may partially be moved to the front display area 4410. For example, the electronic device may identify that the front display area is expanded as much as the moved area and reset the center value and expansion point of the front display area.

According to an embodiment, the expanded flexible display 4400 may include the flat display area (e.g., the front display area 4410 or the rear display area 4440), the curved display area 4430, and the boundary area (e.g., a first boundary area 4421 or a second boundary area 4422). For example, as per the movement of the flexible display 4400 of the electronic device, at least a portion of the prior display area of the first application may be moved to the first boundary area 4421.

According to an embodiment, since the second boundary area 4422 and the rear display area 4440 of the expanded flexible display 4400 are hidden by the rear housing, the second boundary area 4422 and the rear display area 4440 may have a screen state corresponding to a designated state (e.g., an off state or black screen) without displaying information.

According to an embodiment, a first area 4441 of the front display area 4410 may display the second application screen, and a second area 4442 of the front display area 4410, except for the first area 4441, may display the first application screen.

According to an embodiment, the electronic device may apply a first color variation value (e.g., a maximum alpha blending value) to the front display area 4410, a designated second color variation value (e.g., a designated alpha blending value) to the first boundary area 4421, and a designated third color variation value (e.g., a minimum alpha blending value) to the curved display area 4430. By the application of the minimum alpha blending value, the curved display area 4430 may display a designated color of the screen (e.g., a black screen) or the original image (e.g., a black screen) of display data regardless of the display data displayed.

According to an embodiment, when the first housing has an opening in the rear surface, the electronic device may apply the first color variation value to the rear display area 4440 exposed through the opening and display.

Various embodiments of multi-screen configurations are described below with reference to FIGS. 45 to 48. In FIGS. 45 to 48, App(A) may refer to a prior application executed and displayed, and App(B) may refer to a new application executed and displayed.

Figure 45:
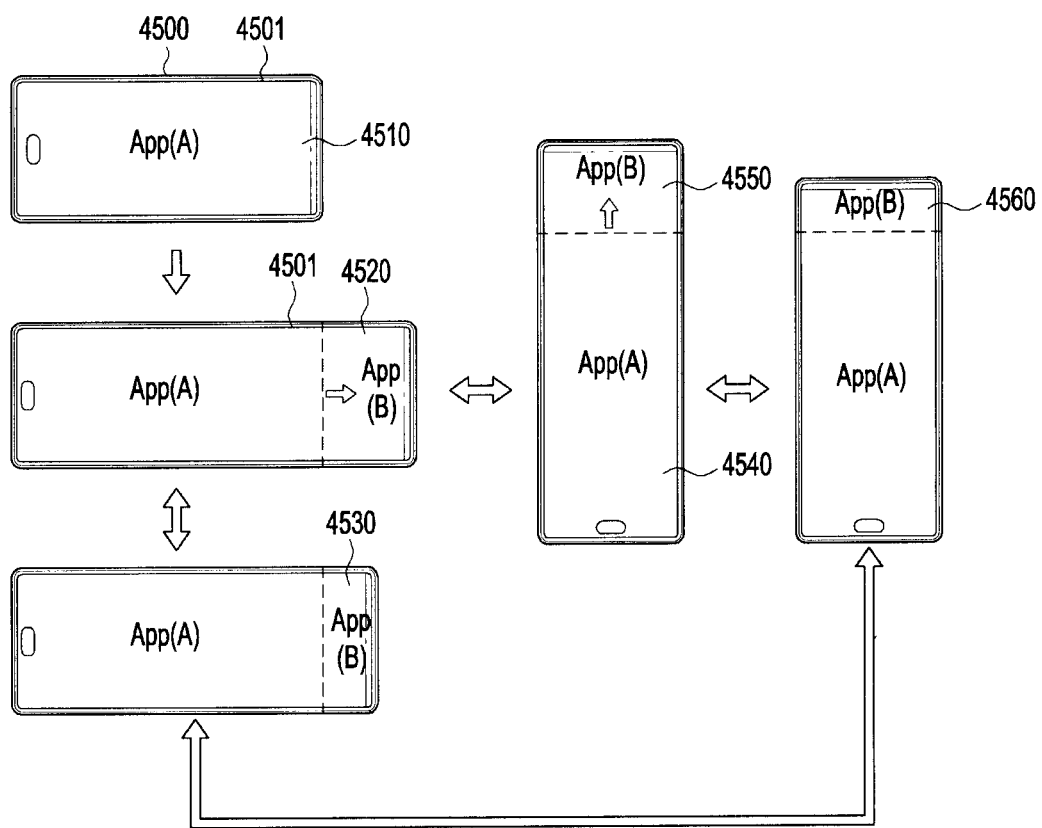
FIG. 45 is a view illustrating an example of a screen displayed on an electronic device with a flexible display according to an embodiment.
Figure 46:
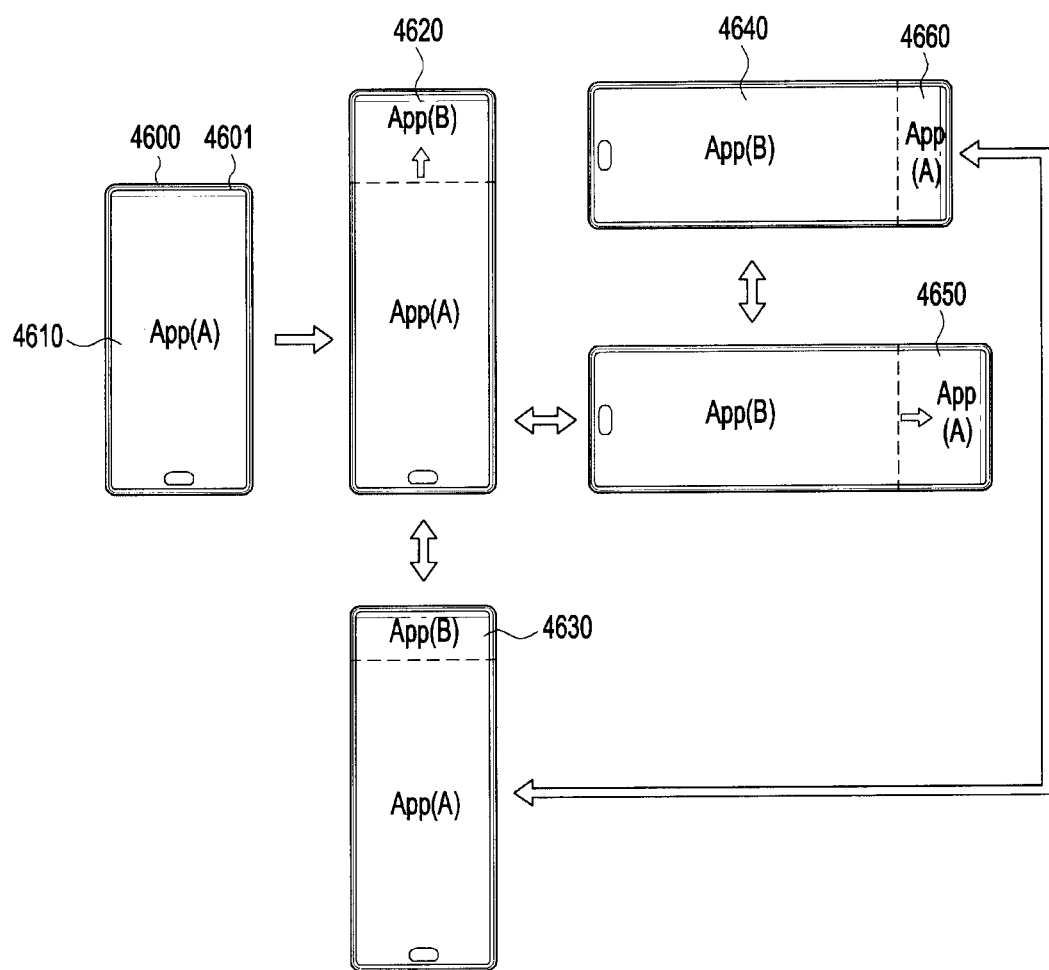
FIG. 46 is a view illustrating an example of a screen displayed on an electronic device with a flexible display according to an embodiment.

FIGS. 45 and 46 are views illustrating an example of a screen displayed on an electronic device with a flexible display according to an embodiment.

Referring to FIGS. 45 and 46, an electronic device 4500 or 4600 may display a screen of an application A running through a flexible display 4501 or 4601. For example, application A may be configured to provide a designated aspect (horizontal-vertical) ratio and detect the orientation (e.g., a landscape or portrait orientation) of the electronic device 4500 or 4600 at the time of the occurrence of such an event that at least a portion of the display area of the flexible display disposed on the rear surface is moved to the front surface to be set in the same view mode as the orientation of the electronic device 4500 or 4600.

According to an embodiment, the electronic device 4500 or 4600 may identify that an event related to application B occurs while application A is running, and within a designated time, the flexible display 4501 or 4601 of the electronic device 4500 or 4600 is moved. For example, at least a portion of the display area of the flexible display disposed on the rear surface may be moved to the front surface, expanding the screen area displayable on the front surface.

According to an embodiment, application B may have a designated resolution of a designated aspect ratio and provide both a landscape and portrait screen configuration according to the orientation (e.g., landscape or portrait orientation) of the electronic device 4500 or 4600.

Specifically, referring to FIG. 45, the electronic device 4500 may display a screen of application B on the right portion 4520 of the expanded display area. According to an embodiment, while both the screen of application A and the screen of application B are displayed, the electronic device may detect the movement of the flexible display.

According to an embodiment, as the flexible display moves, a portion of the flexible display disposed on the front surface may be moved to the rear surface. For example, the electronic device 4500 may set the screen of application B corresponding to the size of the expanded portion, except for the portion moved to the rear surface, of the front display area of the flexible display and display the screen on the expanded portion (or right portion, or third area 4530). According to an embodiment, when the expanded portion is a smaller size than a preset size, the electronic device may display, e.g., a taskbar to indicate the execution state of the application, on the expanded portion.

According to an embodiment, the electronic device 4500 may detect its rotating from the landscape to portrait orientation. For example, the electronic device 4500 may resize the screen into that of the portrait view while maintaining the horizontal-vertical correlation of screen (e.g., view mode, ratio, or size correlation) that used to in the landscape orientation.

According to an embodiment, the electronic device 4500 may resize and display the screens of application A and application B on the fourth area 4540 and the fifth area 4550 while maintaining the view mode of the first area 4510 and the second area 4520. For example, the screen of application A which used to be displayed on the first area 4510 in the landscape view mode may be resized and displayed on the fourth area 4540 while remaining in the landscape view mode, and the screen of application B which used to be displayed on the second area 4520 in the portrait view mode may be resized and displayed on the fifth area 4550 while remaining in the portrait view mode.

According to an embodiment, the electronic device 4500 in the portrait orientation may detect the movement of the flexible display while application A and application B are being displayed. For example, the electronic device 4500 may display the first application on the fourth area 4540 of the entire front area and the second application on the fifth area 4550.

According to an embodiment, while both the screen of application A and the screen of application B are displayed, the electronic device may detect the movement of the flexible display. According to an embodiment, as the flexible display moves, a portion of the flexible display disposed on the front surface may be moved to the rear surface. For example, the electronic device 4500 may set the screen of application B corresponding to the size of the expanded portion (a top portion, or sixth area 4560), except for the portion moved to the rear surface, of the front display area of the flexible display and display the screen on the expanded portion. According to an embodiment, when the expanded portion is a smaller size than a preset size, the electronic device may display, e.g., a taskbar to indicate the execution state of the application, on the expanded portion.

According to an embodiment, when the electronic device 4500 rotates while the flexible display shrunken into a designated size displays application B on the third area 4530 at a designated resolution or a taskbar of application B to indicate the execution state or displays application A on the expanded portion (e.g., a sixth area 4560) at a designated resolution or a taskbar of application A to indicate the execution state, application A and application B may provide screen configurations when changes have been made in position and display form due to the screen expansion or shrinkage while maintaining the current view mode depending on the orientation (e.g., landscape or portrait orientation) of the electronic device 4500. For example, when the electronic device 4500 is rotated while displaying application B or a taskbar to indicate the execution state thereof on the third area 4530, the screen of application B may be expanded and displayed on the fourth area 4540, and the screen of application A used to be displayed on the first area 4510 may be shrunken, and application A or a taskbar to indicate the execution state thereof may be displayed on the expanded portion.

FIG. 46 is a view illustrating an example of a screen displayed on an electronic device with a flexible display according to an embodiment.

Referring to FIG. 46, an electronic device 4600 may display a screen of an application A running through a flexible display 4601. For example, application A may provide a screen in a designated aspect ratio and detect the orientation (e.g., landscape or portrait orientation) of the electronic device 4600 to set its screen configuration in a landscape view or portrait view mode.

According to an embodiment, the electronic device 4600 may identify that an event related to application B occurs while application A is running, and within a designated time, the flexible display 4601 of the electronic device 4600 is moved. For example, at least a portion of the display area of the flexible display disposed on the rear surface may be moved to the front surface, expanding the screen area displayable on the front surface.

According to an embodiment, the electronic device 4600 may display a screen of application B on the top portion 4620 of the expanded display area. According to an embodiment, while both the screen of application A and the screen of application B are displayed, the electronic device may detect the movement of the flexible display.

According to an embodiment, as the flexible display moves, a portion of the flexible display disposed on the front surface may be moved to the rear surface. For example, the electronic device 4600 may set the screen of application B corresponding to the size of the expanded portion 4630, except for the portion moved to the rear surface, of the front display area of the flexible display and display the screen on the expanded portion (e.g., a top portion) 4630. According to an embodiment, when the expanded portion 4630 is a smaller size than a preset size, the electronic device may display, e.g., a taskbar or icon to indicate the execution state of the application, on the expanded portion 4630.

According to an embodiment, the electronic device 4600 may detect its rotating from the portrait to landscape orientation. For example, the electronic device 4600 may change the aspect ratio of the screen displayed in the portrait orientation to configure the screen in a landscape view mode.

According to an embodiment, the electronic device 4600 may configure and display the screens of application A and application B in the landscape view mode on the fourth area 4640 and the fifth area 4650 to which the first area 4610 and the top portion (e.g., a second area) 4620 have been changed in aspect ratio.

According to an embodiment, the electronic device 4600 in the landscape orientation may detect the movement of the flexible display while application A and application B are being displayed. For example, the electronic device 4600 may display application B on the fifth area 4660 of the entire front area and application A on the sixth area 4650 of the entire front area.

According to an embodiment, while both the screen of application A and the screen of application B are displayed, the electronic device may detect the movement of the flexible display. According to an embodiment, as the flexible display moves, a portion of the flexible display disposed on the front surface may be moved to the rear surface. For example, the electronic device 4600 may set the screen of application A corresponding to the size of the expanded portion (or right portion) 4660, except for the portion moved to the rear surface, of the front display area of the flexible display, and display the screen on the expanded portion 4660. According to an embodiment, when the right portion 4660 is a smaller size than a preset size, the electronic device may display, e.g., a taskbar or icon to indicate the execution state of the application, on the right portion 4660.

Figure 47:
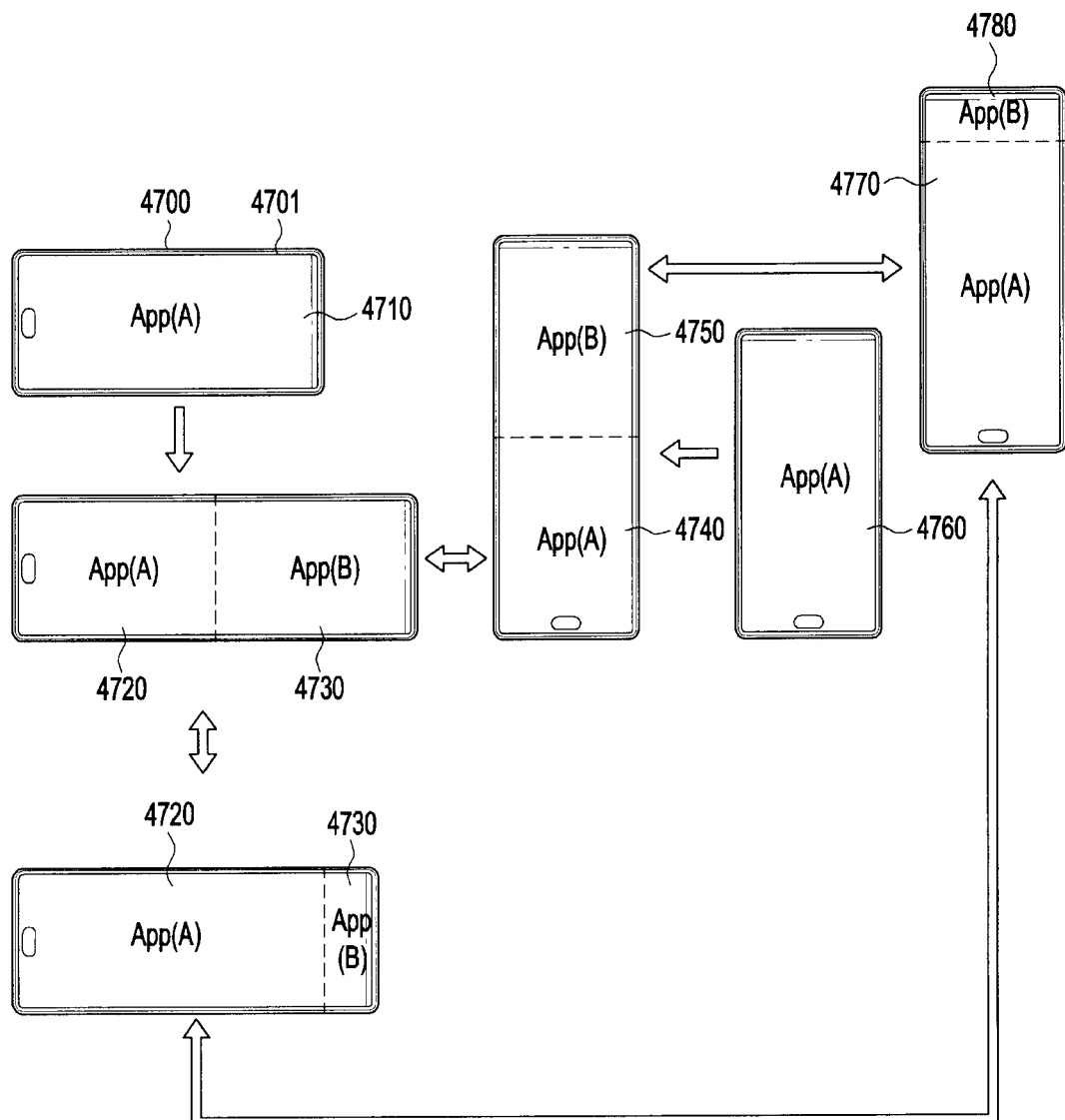
FIG. 47 is a view illustrating an example of a screen displayed on an electronic device with a flexible display according to an embodiment.

FIG. 47 is a view illustrating an example of a screen displayed on an electronic device with a flexible display according to an embodiment.

Referring to FIG. 47, an electronic device 4700 may display a screen of an application A running through a first area 4710 of a flexible display 4701. For example, application A may provide a screen configuration both in the landscape view mode and in the portrait view mode depending on the orientation (e.g., landscape or portrait orientation) of the electronic device 4700 or may detect the orientation (e.g., landscape or portrait orientation) of the electronic device 4700 to be set in the same view mode as the orientation of the electronic device 4700.

According to an embodiment, the electronic device 4700 in the landscape orientation may identify that an event related to application B occurs while application A is running, and within a designated time, the flexible display of the electronic device 4700 is moved. For example, a portion of the rear area of the flexible display may be moved to the front surface. Application B may provide a screen configuration both in the landscape view mode and in the portrait view mode depending on the orientation (e.g., landscape or portrait orientation) of the electronic device 4700 or may detect the orientation (e.g., landscape or portrait orientation) of the electronic device 4700 to be set in the same view mode as the orientation of the electronic device 4700.

According to an embodiment, the electronic device 4700 may display the screen of application A in the landscape view mode on the second screen area 4720 among the screen areas including the moved area and the screen of application B in the portrait view mode on the third screen area 4730. For example, in the landscape orientation, the electronic device 4700 may set the screen of applications A and B in the landscape view mode, change the resolution, and display them on the second screen area 4720 and the third screen area 4730.

According to an embodiment, in the portrait orientation or upon detecting the rotation from the landscape to portrait orientation, the electronic device 4700 may detect the movement of the flexible display and display the screen of application A in the portrait view mode on the fourth screen area 4740 among the screen areas including the moved area and the screen of application B in the portrait view mode on the fifth screen area 4750. For example, the electronic device 4700 may set the screen of application B in the portrait view mode, change the screen resolution of applications A and B, and display them on the fourth screen area 4740 and the fifth screen area 4750.

According to an embodiment, the electronic device 4700 in the portrait orientation may configure and display the screen of application A that is running, in the portrait view mode on the sixth area 4760 of the flexible display 4701. For example, the electronic device 4700 in the portrait orientation may identify that an event related to application B occurs while application A is running, and the flexible display of the electronic device 4700 is moved.

According to an embodiment, the electronic device 4500 in the portrait orientation may detect the movement of the sliding part while application A and application B are being displayed. For example, as the flexible display moves, a portion of the rear area of the flexible display may be moved to the front surface.

According to an embodiment, when the flexible display 4701 moves to expand in a designated size, the electronic device 4700 may display the screen of application B on a seventh area 4770 at a designated resolution. For example, the electronic device 4700 may set and display the screen of application A on an eighth area 4780, corresponding to the size of the eighth area 4780 except for the seventh area 4770 among the display areas including the expanded area. According to an embodiment, when the eighth portion 4780 is a smaller size than a preset size, the electronic device may display, e.g., a taskbar to indicate the execution state of the application, on the eighth area (or eighth portion) 4780.

According to an embodiment, when the electronic device 4700 rotates while the flexible display shrunken into a designated size displays application B on the third screen area 4730 at a designated resolution or a taskbar of application B to indicate the execution state, the electronic device 4700 may provide a landscape view screen configuration or portrait view screen configuration while maintaining the window size of application A and application B depending on the orientation (e.g., landscape or portrait orientation) of the electronic device 4700.

Figure 48:
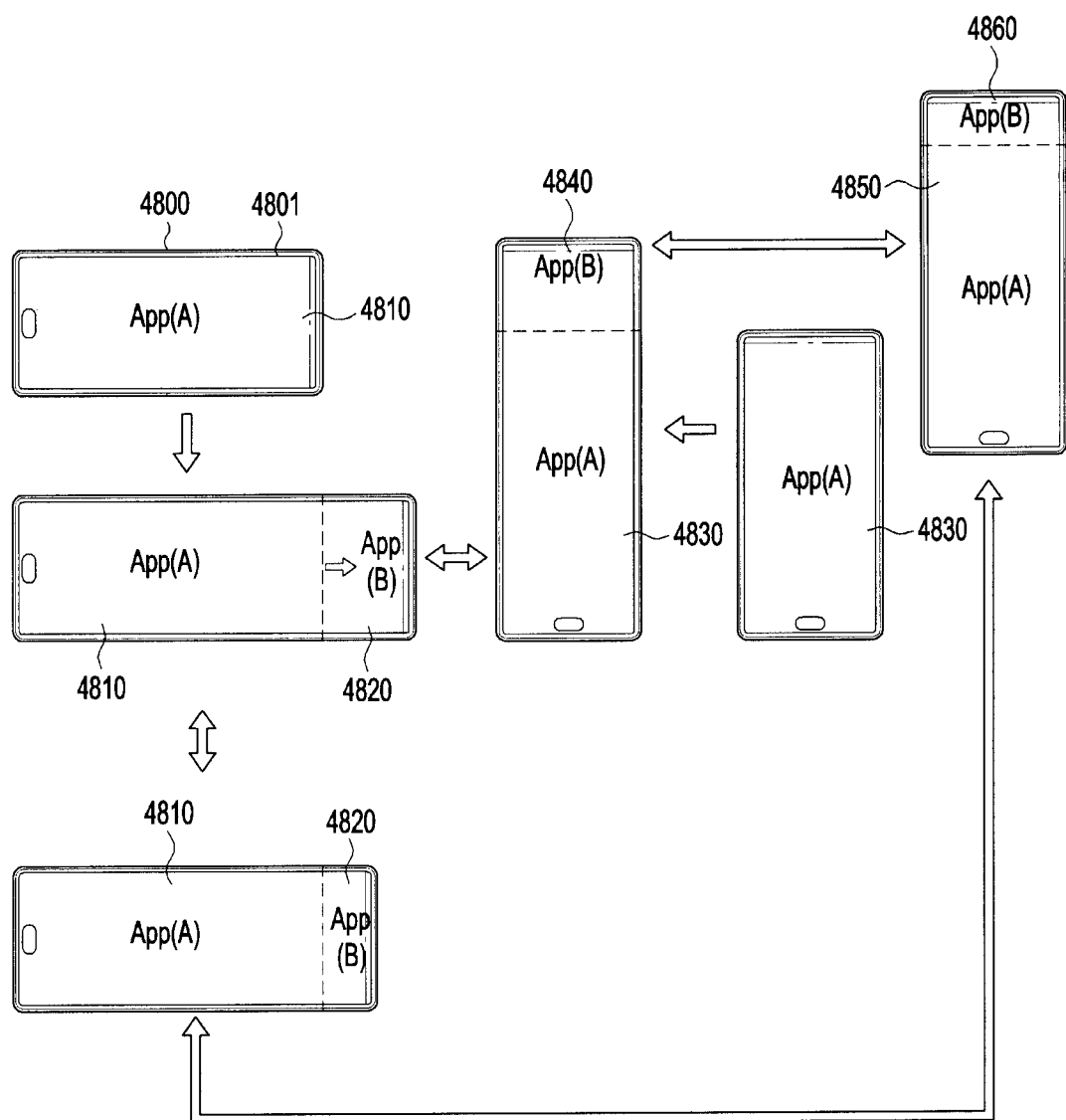
FIG. 48 is a view illustrating an example of a screen displayed on an electronic device with a flexible display according to an embodiment.

FIG. 48 is a view illustrating an example of a screen displayed on an electronic device with a flexible display according to an embodiment.

Referring to FIG. 48, an electronic device 4800 in the landscape orientation may display, in the portrait view mode, a screen of an application A running through a first area 4810 of a flexible display 4801. For example, application A may be set to a designated resolution of a designated aspect ratio and provide both a landscape and portrait screen configuration according to the orientation (e.g., landscape or portrait orientation) of the electronic device 4800.

According to an embodiment, the electronic device 4800 may identify that an event (e.g., an application push message notification or user input) related to application B occurs while application A is running, and within a designated time, the flexible display of the electronic device 4800 is moved. For example, at least a portion of the rear area of the flexible display may be moved to the front surface. Application B may have a designated resolution of a designated aspect ratio and provide both a landscape and portrait screen configuration according to the orientation (e.g., landscape or portrait orientation) of the electronic device 4800.

According to an embodiment, upon an occurrence of such an event that at least a portion of the rear area of the flexible display is moved to the front surface, when the user has previously made a setting or set an effect of application B to be displayed on the expanded area on the front surface, the electronic device 4800 may display application B, the setting or effect on the front expanded area even when the event related to application B does not occur while application A is running.

According to an embodiment, the electronic device 4800 may maintain the screen of application A displayed on the first area 4810 in the portrait view mode and set and display the screen of application B on the second area 4820 in the portrait view mode.

According to an embodiment, as the flexible display moves, a portion of the flexible display disposed on the front surface may be moved to the rear surface. For example, the electronic device 4800 may set the screen of application B corresponding to the size of the expanded portion (or third area) 4830, except for the portion moved to the rear surface, of the front display area of the flexible display and display the screen on the right portion. According to an embodiment, when the right portion is a smaller size than a preset size, the electronic device may display, e.g., a taskbar to indicate the execution state of the application, on the right portion.

According to an embodiment, upon detecting a rotating of the electronic device 4800 from the landscape to portrait orientation, the electronic device 4800 may display the screen of application A on the third area 4830, i.e., the first area 4810 in the portrait orientation and the screen of application B on the fourth area 4840, i.e., the second area 4820 in the landscape orientation.

According to an embodiment, the electronic device 4800 in the portrait orientation may detect the movement of the flexible display while displaying the screen of the running first application on the third area 4830 in the portrait orientation and may maintain the screen of application A displayed on the third area 4830 in the portrait view mode while displaying the screen of application B on the moved fourth area 4840 in the landscape view mode. For example, the electronic device 4800 in the portrait orientation may detect the movement of the flexible display while application A and application B are being displayed. For example, as the flexible display moves, a portion of the front area of the flexible display may be moved to the rear surface.

According to an embodiment, when the flexible display 4801 moves to shrink in a designated size, the electronic device 4800 may display the screen of application A on the fifth area 4850 at a designated resolution.

For example, the electronic device 4800 may set and display the screen of application B on the sixth area 4860, corresponding to the size of the sixth area 4860 except for the fifth area 4850 among the shrunken display areas. According to an embodiment, when the sixth area 4860 is a smaller size than a preset size, the electronic device may display, e.g., a taskbar to indicate the execution state of the application, on the sixth area 4860.

According to an embodiment, when the electronic device 4800 rotates while the flexible display shrunken into a designated size displays application B on the seventh area or sixth area 4860 at a designated resolution or a taskbar of application B to indicate the execution state, the electronic device 4800 may provide a landscape view screen configuration or portrait view screen configuration while maintaining the window size of application A and application B depending on the orientation (e.g., landscape or portrait orientation) of the electronic device 4800.

Figure 49A:
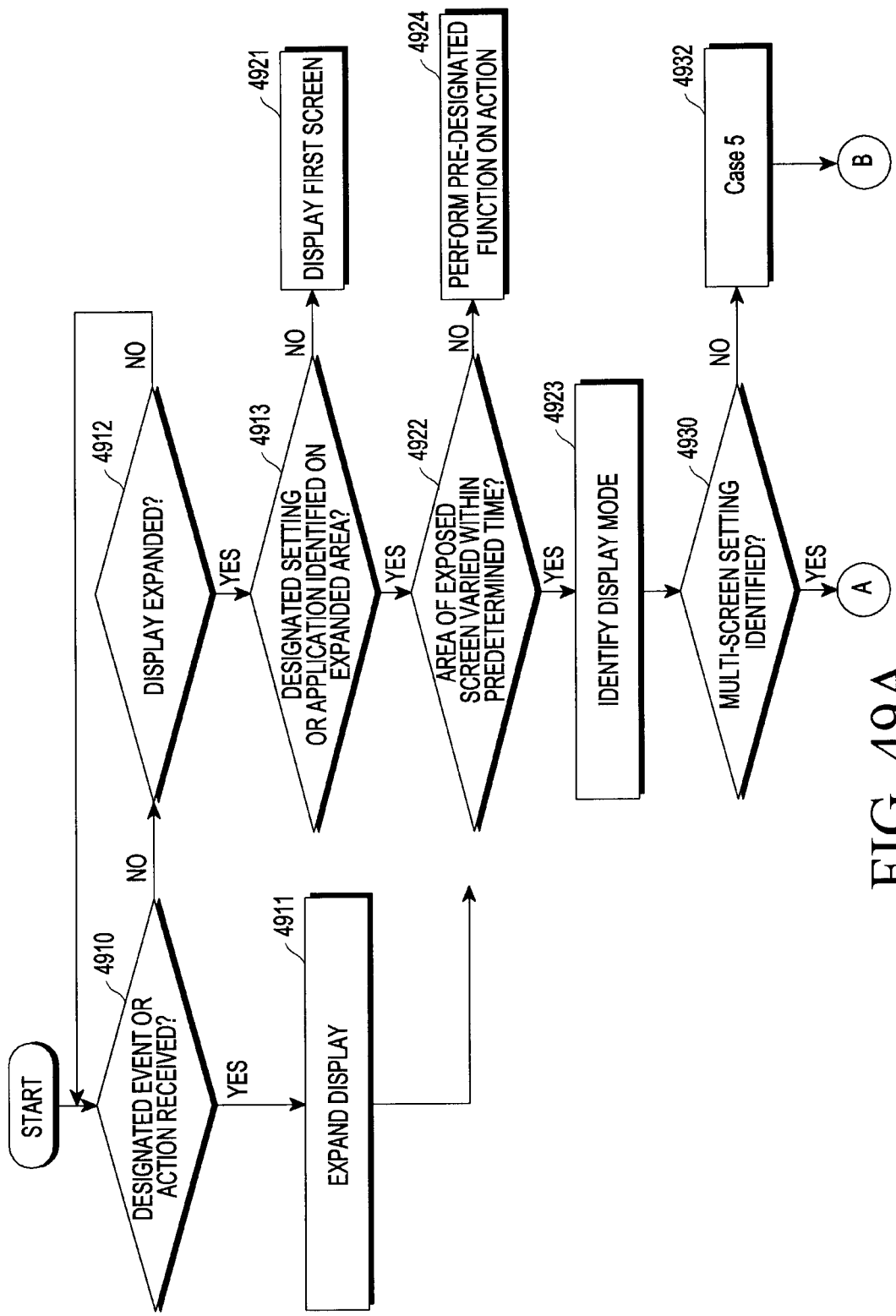
FIG. 49A is a flowchart illustrating various examples of displaying a screen on an electronic device with a flexible display according to an embodiment.
Figure 49B:
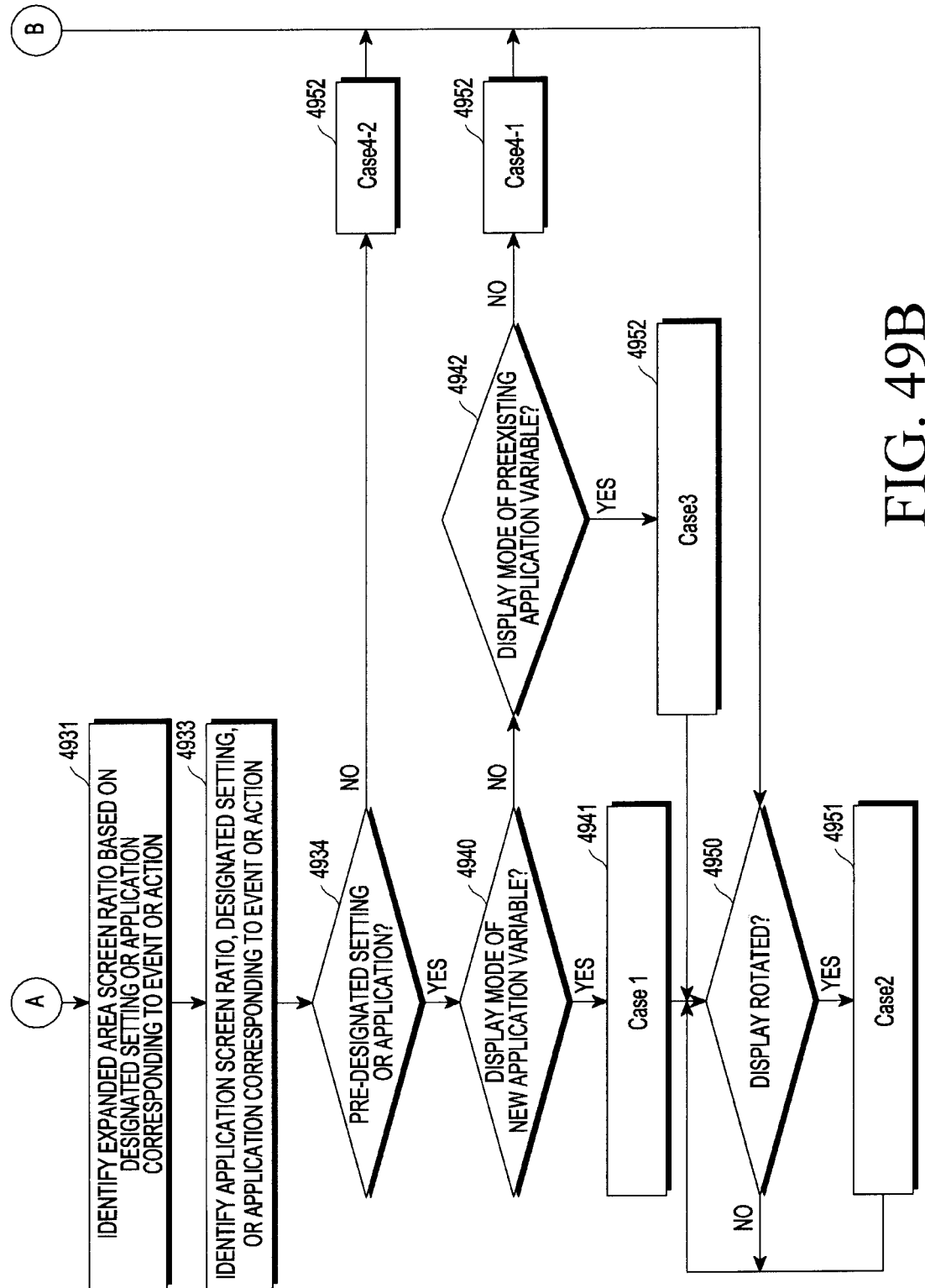
FIG. 49B is a flowchart illustrating various examples of displaying a screen on an electronic device with a flexible display according to an embodiment.

FIGS. 49A and 49B are flowcharts illustrating various examples of displaying a screen on an electronic device with a flexible display according to an embodiment.

Referring to FIG. 49A, in operation 4910, an electronic device (e.g., the electronic device 101 of FIG. 1 or the electronic device 301 of FIG. 3) (e.g., the processor 120 or 310 of the electronic device) may determine whether a designated event or action (e.g., an application push notification or user input) is received. Upon receiving the designated event or action, the display the screen may switch into a display mode to display the event or action in operation 4911. When the area of screen exposed is changed within a predetermined time in operation 4922, the electronic device may identify whether the display mode is a landscape view mode or portrait view mode in operation 4923. In operation 4930, upon identifying a multi-screen setting, the electronic device may proceed with branch A, and otherwise, perform Case 5 in operation 4932. In operation 4922, unless the area of screen exposed is changed within the predetermined time, the electronic device may perform a pre-designated function on the received action.

When the designated event or action is not received in operation 4910, and the display expands in operation 4912, the electronic device may identify a setting or application designated for the expanded area in operation 4913. Without the setting or application being identified, the electronic device may display a first screen in operation 4921. With the setting or application being identified, the electronic device may identify whether the area of screen exposed is changed with a predetermined time in operation 4922. When the area of screen exposed is changed within the predetermined time in operation 4922, the electronic device may identify whether the display mode is the landscape view mode or portrait view mode in operation 4923. In operation 4924, if the area of screen exposed is not changed within the predetermined time, the electronic device may perform a pre-designated function on the received action.

When the multi-screen setting is identified to proceed with branch A in operation 4930, the electronic device may identify a screen ratio for the expanded area based on the application or designated setting corresponding to the received event or action in operation 4931. In operation 4933, the electronic device may identify the application, designated setting, or the screen ratio for the application, corresponding to the event or action.

Unless identified to be a pre-designated setting or application in operation 4934, the electronic device may proceed with Case 4-2, and when identified to be the pre-designated setting or application, the electronic device may identify whether it may be changed into a new application display mode in operation 4940. Unless identified to be changed into the new application display mode in operation 4940, the electronic device may identify whether the existing application display mode may be changed in operation 4942. Upon determining in operation 4942 that the existing application display mode may be changed, the electronic device may perform Case 3, and otherwise, perform Case 4-1 in operation 4952.

In operation 4941, the electronic device may perform Case 1, and when the display rotates in operation 4950, the electronic device may perform Case 2 in operation 4951.

In the above-described flowcharts, each Case may be defined as follows:

Case 1 may be a default layout for an application in which the application may be executed on an expanded area by an event or action while maintaining the aspect ratio and application view mode for the existing screen. By the event or action, the application may be executed in an opposite mode of the existing screen view mode (hereinafter referred to as a 'set mode' for ease of description). For example, when the set mode is the landscape view mode, the new application may be positioned in the expanded area in the portrait view mode. According to an embodiment, when there is a preset application before the user expands or shrinks the flexible display in a way other than an event or action, the flexible display may be operated in a multi-screen mode when expanded.

Case 2 may refer to when the electronic device is rotated after the application is laid out in which case a change may be made to the screen for the expanded area and the prior area. For example, upon changing from the landscape to portrait view mode, a change may be made to the layout as described above in connection with FIG. 45, and upon changing from the portrait to landscape view mode, a change may be made to the layout as described above in connection with FIG. 46.

In Case 4-1 and Case 4-2, despite the rotation of the electronic device, the first application and the second application may not be repositioned as shown in FIGS. 45 and 46. According to an embodiment, the multi-screen policy for the rotation of the electronic device after the applications have been laid out may be varied by the user's settings, and when a default setting is made to the electronic device, Case 2 to Case 4 may all be disregarded.

Case 3 may be defined as when the first application and the second application switch their positions in FIGS. 45 and 46.

Case 5 may refer to when the user's policy for rotation has been set as default in which case the multi-screen policy may be changed to the user's default setting, and if so set, Case 2 to Case 4 may all be disregarded. When the electronic device is rotated regardless of whether the application supports the landscape view mode or portrait view mode in Case 5, the electronic device may operate not in Case 2 but in Case 5. Case 5 may be defined as described above in connection with FIGS. 47 and 48.

Figure 50A:
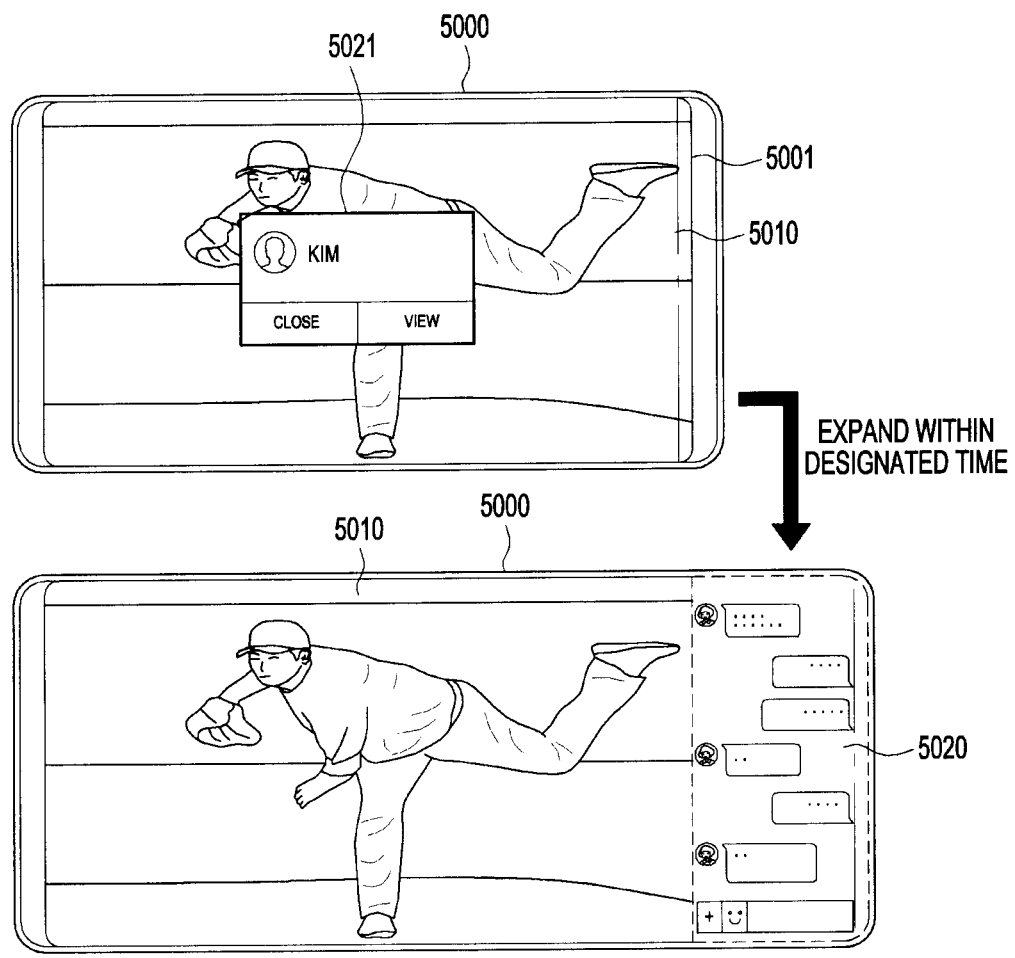
FIG. 50A is a view illustrating an example of a screen displayed on an electronic device with a flexible display according to an embodiment.

FIG. 50A is a view illustrating an example of a screen displayed on an electronic device with a flexible display according to an embodiment.

Referring to FIG. 50A, an electronic device 5000 in the landscape orientation may display a screen of a video playing application which is running through a first area 5010 of a flexible display 5001. For example, the video playing application may be an application to output video content set to be displayed at a designated resolution and in the landscape view mode.

According to an embodiment, the electronic device 5000 may identify that an event (e.g., displaying a notification message 5021) related to a messaging application occurs while the video playing application is running, and within a designated time, the flexible display moves to expand to allow a second area 5020 to be moved to the front surface.

According to an embodiment, the electronic device 5000 may display the notification message 5021 on the expanded second area 5020.

Figure 50B:
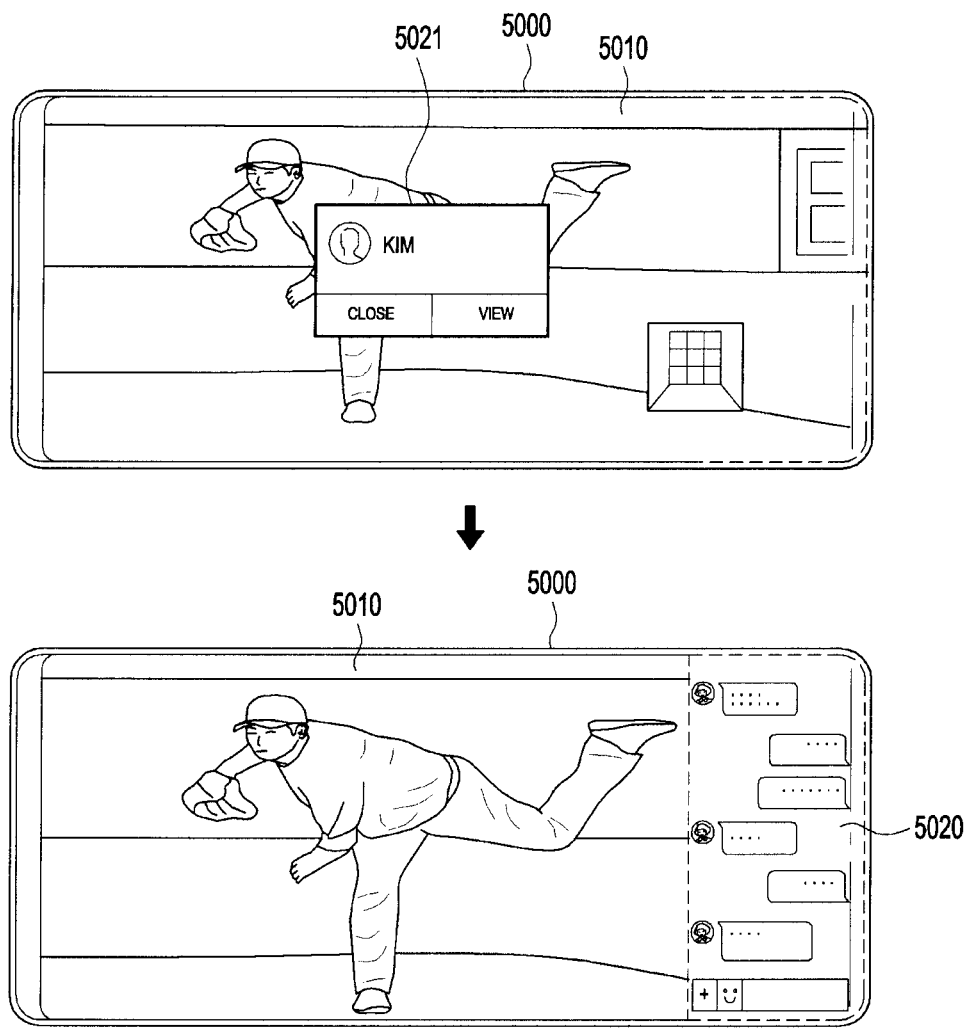
FIG. 50B is a view illustrating an example of a screen displayed on an electronic device with a flexible display according to an embodiment.

FIG. 50B is a view illustrating an example of a screen displayed on an electronic device with a flexible display according to an embodiment. Referring to FIG. 50B, an electronic device 5000 in the landscape orientation may display a screen of a video playing application which is running through a first area 5010 of a flexible display 5001. For example, the video playing application may be an application to output video content set to be displayed at a designated resolution and in the landscape view mode.

According to an embodiment, in the electronic device 5000, an event (e.g., displaying a notification message 5021) related to a messaging application may occur while the video playing application is running. According to an embodiment, when the event occurs with the screen of the flexible display 5001 already expanded, and the user directly enters an execution action for the event, the electronic device may be operated in the multi-screen mode considering the screen aspect ratio as shown in FIG. 50B.

Figure 51:
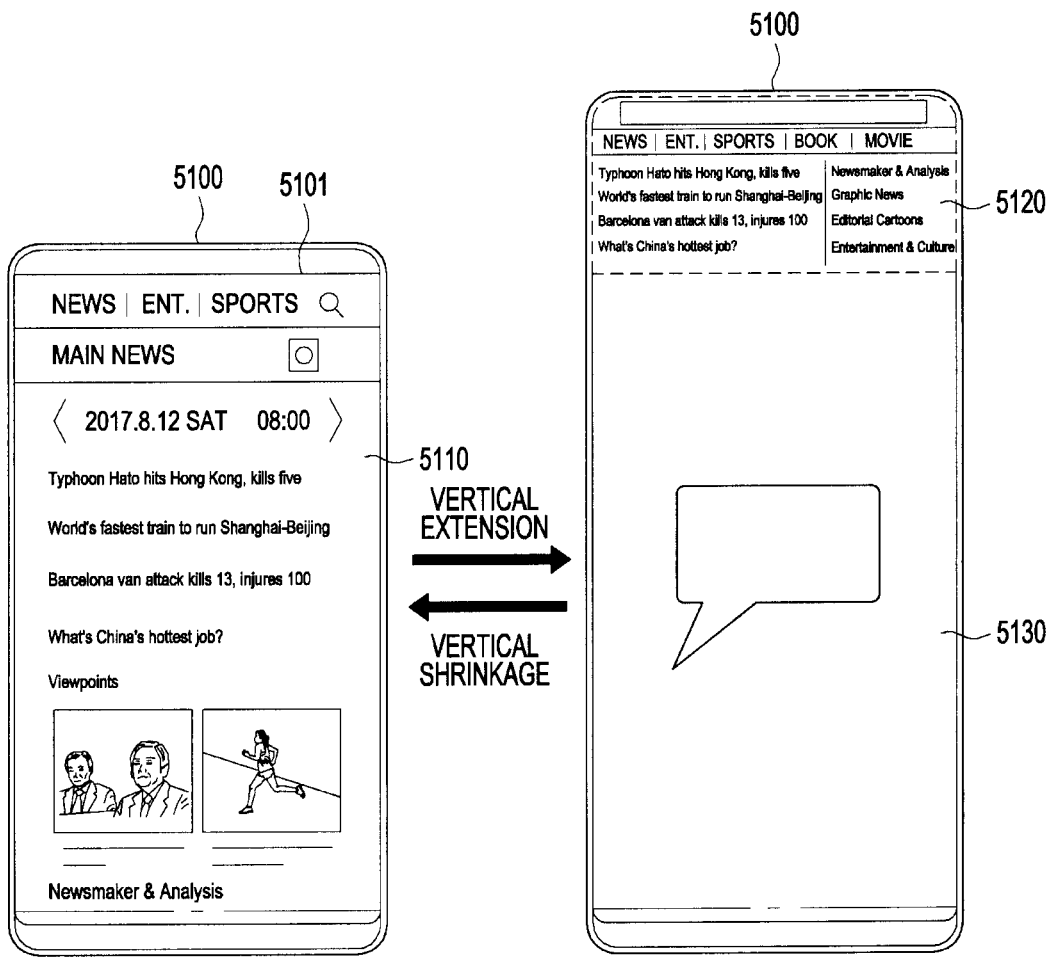
FIG. 51 is a view illustrating an example of a screen displayed on an electronic device with a flexible display according to an embodiment.

FIG. 51 is a view illustrating an example of a screen displayed on an electronic device with a flexible display according to an embodiment.

Referring to FIG. 51, an electronic device 5100 in the portrait orientation may display a screen of a web browser application which is running through a first area 5110 of a flexible display 5101. For example, the web browser application may be an application that is displayed at a resolution set depending on the screen area where it is displayed.

According to an embodiment, the electronic device 5100 may identify that an event (e.g., receiving a notification message) related to a messaging application occurs while the web browser application is running, and within a designated time, the flexible display moves to expand to allow a second area 5120 to be moved to the front surface.

According to an embodiment, as the messaging application is identified as supporting the portrait view mode and set to be display at a pre-designated resolution, the electronic device 5100 may display the screen of the messaging application on the first area 5130 corresponding to the resolution of the messaging application.

According to an embodiment, the electronic device 5100 may reset, and display on the second area 5120, the screen of the web browser application in the landscape view mode corresponding to the size of the second area 5120 moved and expanded to the front surface.

Figure 52:
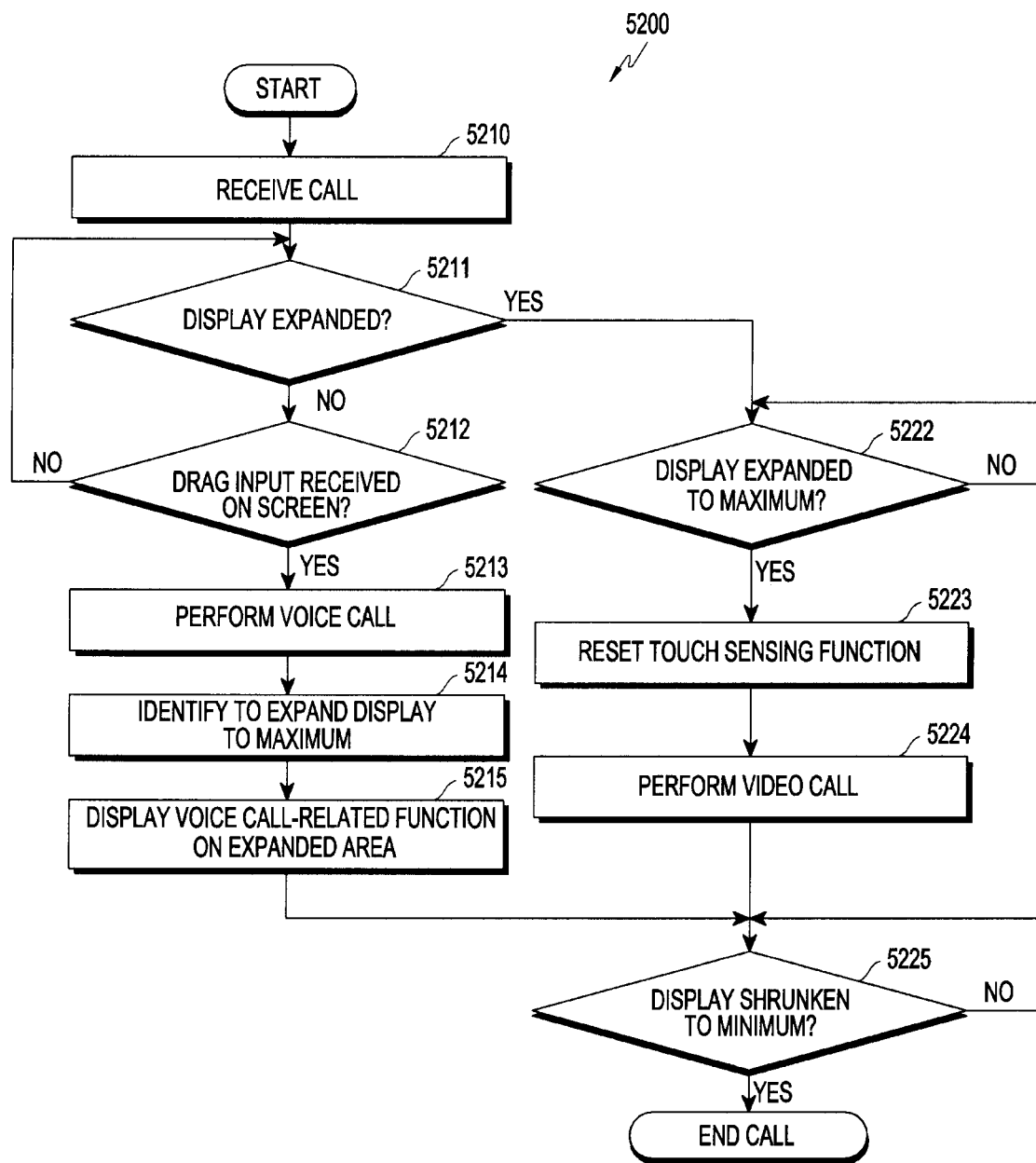
FIG. 52 is a flowchart illustrating an example of performing a designated function upon receiving an input from an electronic device with a flexible display according to an embodiment.

FIG. 52 is a flowchart 5200 illustrating an example of performing a designated function upon receiving an input from an electronic device with a flexible display according to an embodiment.

Referring to FIG. 52, an electronic device may identify that a call is received in operation 5210. For example, the electronic device may display a screen to indicate that the call is received. The screen may include a button for accepting the call or switching to a video call.

In operation 5211, the electronic device (e.g., the electronic device 101 of FIG. 1 or the electronic device 301 of FIG. 3) (e.g., the processor 120 or 310 of the electronic device) may determine whether the display of the electronic device is expanded. For example, the display may be a flexible display, and the flexible display may partially move to expand from the rear to front surface.

When the display of the electronic device is not determined to be expanded in operation 5211, the electronic device may determine whether a user input (e.g., a drag input) is received through the screen in operation 5212. When a user input (e.g., a drag input) is determined in operation 5212 to be received through the screen, the electronic device may receive a voice call for the received call in operation 5213.

In operation 5214, the electronic device may identify that the display of the electronic device has been expanded to the maximum size or a size larger than a designated threshold. In operation 5215, the electronic device may display an image (e.g., an icon or button) for performing a voice call-related function on the expanded area.

When the display of the electronic device is determined to be expanded in operation 5211, the electronic device may determine whether the expansion of the display exceeds a threshold (e.g., the display expands to the maximum) in operation 5222. When the display of the electronic device is determined in operation 5222 to be expanded less than the maximum value, the electronic device may repetitively perform operation 5222. When the display of the electronic device is determined in operation 5222 to be expanded to the maximum value, the electronic device may reset the touch sensing function in operation 5223.

In operation 5224, the electronic device may perform video call for the received call. After performing operation 5214 or operation 5224, the electronic device may determine whether the display of the electronic device is shrunken to the minimum in operation 5225. When the display of the electronic device is determined in operation 5225 to be shrunken in excess of a threshold (e.g., when shrunken to the minimum), the electronic device may repetitively perform operation 5225.

When the display of the electronic device is determined in operation 5225 to be shrunken less than the threshold (e.g., when shrunken to the minimum), the electronic device may end the voice call or video call being executed.

Figure 53:
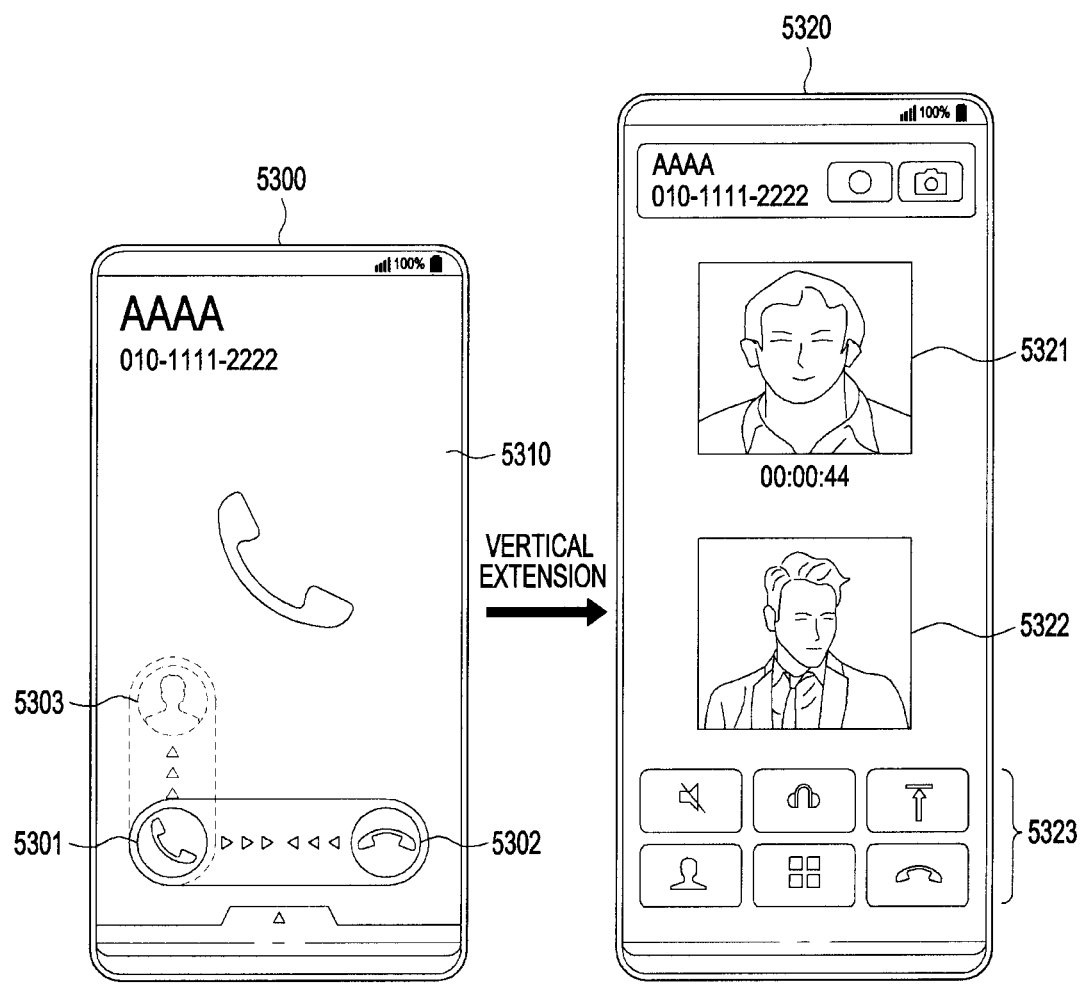
FIG. 53 is a view illustrating an example of a screen displayed on an electronic device with a flexible display according to an embodiment.

FIG. 53 is a view illustrating an example of a screen displayed on an electronic device with a flexible display according to an embodiment.

Referring to FIG. 53, upon receiving a call, an electronic device 5300 may display a screen 5310 to indicate that the call is received. The screen 5310 may include a first object 5301 that moves as per a designated gesture, a second object 5302 to perform a voice call, or a third object 5303 to perform a video call.

According to an embodiment, upon receiving a designated first gesture input while displaying the screen 5310, the electronic device 5300 may perform a voice call with the other party. For example, the designated first gesture input may be an input to move the first object 5301 in a horizontal direction to overlap with at least part of the second object 5302.

According to an embodiment, upon receiving a designated second gesture input while displaying the screen 5310, the electronic device 5300 may perform a video call with the other party. For example, the designated second gesture input may be an input to move a slide bar of the electronic device 5300 to enable a portion of the flexible display disposed on the rear surface of the electronic device 5300 to move to the front surface.

According to an embodiment, upon receiving the second gesture input, the electronic device 5300 may display a screen 5320 to provide a video call-related function. For example, the screen 5320 may include an area 5321 to display images captured by the electronic device, an area 5322 to display images captured by the electronic device 5300, and buttons 5323 to perform the video call-related function.

Figure 54:
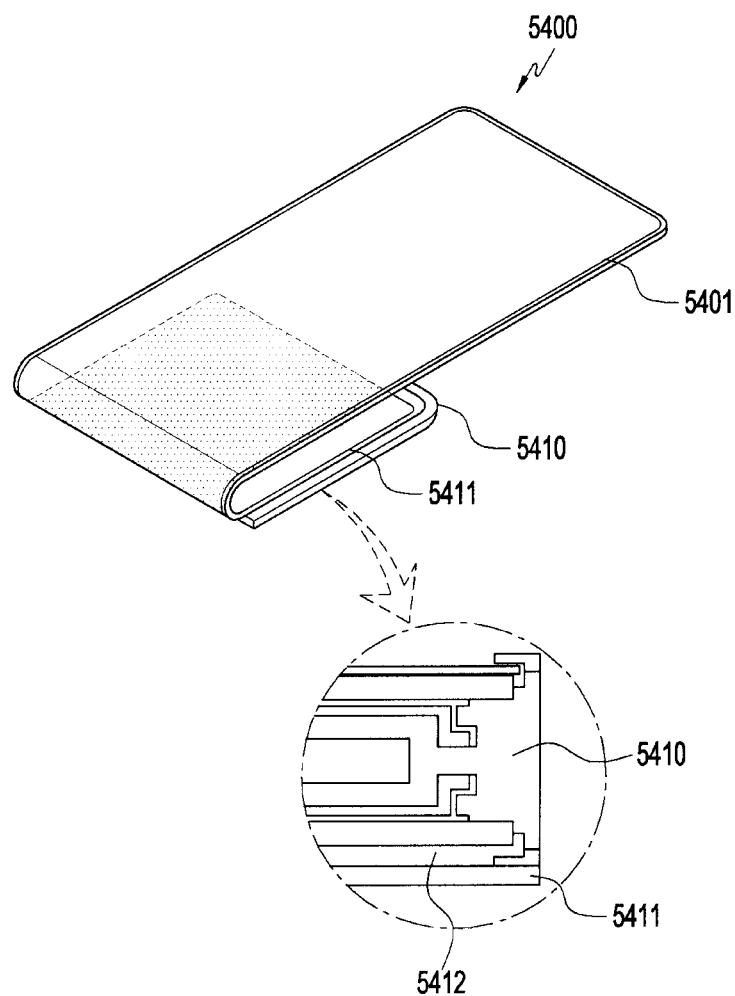
FIG. 54 is a view illustrating an example of a flexible display of an electronic device as viewed from above a side thereof, according to an embodiment.

FIG. 54 is a view illustrating an example of a flexible display of an electronic device as viewed from above a side thereof, according to an embodiment.

Referring to FIG. 54, an electronic device 5400 may include a flexible display 5401. For example, the flexible display 5401 may at least partially be bent in a U shape.

According to an embodiment, a first housing 5410 may be disposed on the rear surface of the electronic device 5400, and the flexible display 5401 may be fixed to at least part of a lower supporting rail to be moved along a curved line. The first housing 5410 may include an opening 5412, and a portion of the flexible display 5401 disposed on the rear surface may be exposed through the opening 5412.

According to an embodiment, when the electronic device 5400 is configured so that the first housing 5410 is fixed and the flexible display 501 is movable upwards or downwards, the area of the flexible display 5401 disposed on the rear surface may have a second color variation value (e.g., the minimum alpha blending value) applied thereto not to display the screen to the outside, thereby reducing current consumption.

According to an embodiment, when a portion of the flexible display 5401 disposed on the rear surface is exposed through the opening or rigid glass 5411 depending on the moving distance of the flexible display 5401, a first color variation value (e.g., the maximum alpha blending value) may be applied to the exposed area that may then be displayed.

Figure 55:
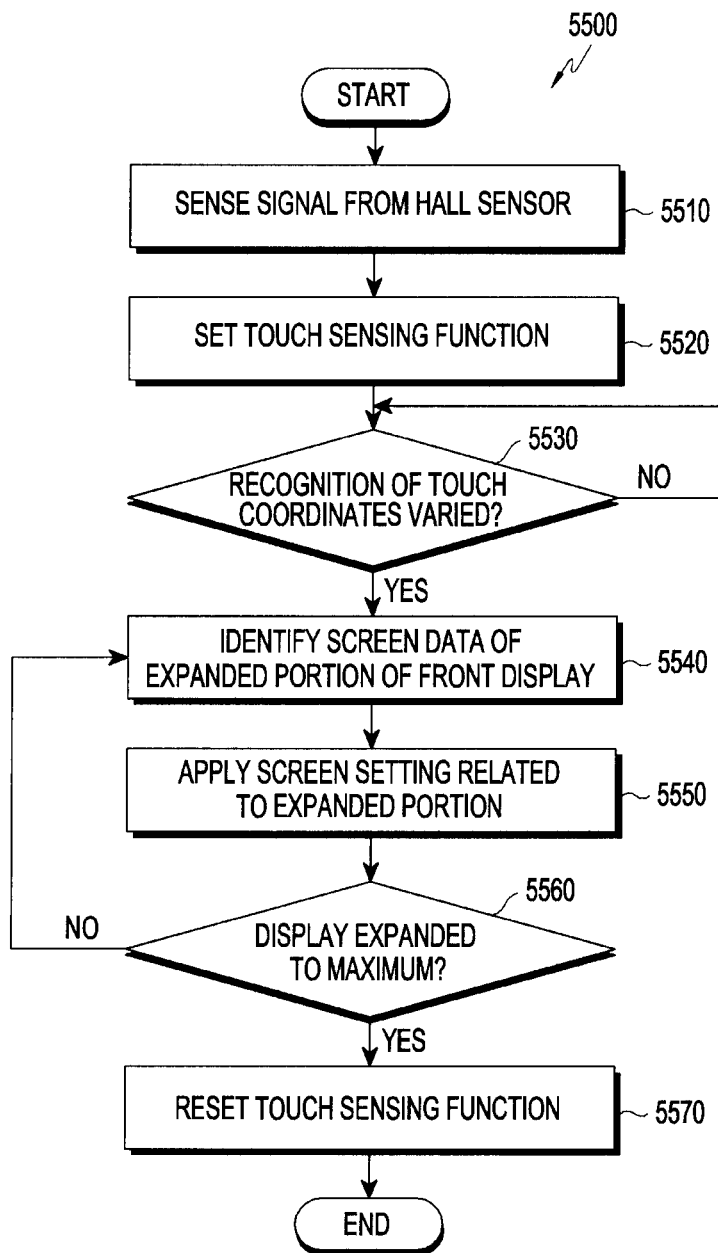
FIG. 55 is a flowchart illustrating an example of displaying a screen on an electronic device with a flexible display according to an embodiment.

FIG. 55 is a flowchart 5500 illustrating an example of displaying a screen on an electronic device with a flexible display according to an embodiment. According to an embodiment, an electronic device may display a screen of a running application on an area disposed on the front surface of the electronic device among display areas of the flexible display.

Referring to FIG. 55, the electronic device may sense a signal from a hall sensor in operation 5510. In operation 5520, the electronic device may set a touch sensing function of the flexible display. In operation 5530, the electronic device may determine whether recognition of coordinates of a touch is varied.

Unless the area of the flexible display disposed on the rear surface of the electronic device is determined in operation 5530 to be moved, the electronic device may identify that there is no variation in the recognition of coordinates of a touch and repetitively perform operation 5530.

When the area of the flexible display disposed on the rear surface of the electronic device is determined in operation 5530 to be moved to the front surface, the electronic device may identify that the moved area is an expanded display portion on the front surface in operation 5540 and identify screen data corresponding to the expanded portion among the screen data of the application.

In operation 5550, the electronic device may apply a designated setting to the screen data corresponding to the expanded portion. In operation 5560, the electronic device may determine whether the front area of the flexible display is expanded to a designated maximum value. When the flexible display is determined in operation 5560 to be expanded less than the designated value, the electronic device may perform operation 5540.

When the display of the electronic device is determined in operation 5560 to be expanded to the designated maximum value, the electronic device may reset the touch sensing function in operation 5570.

Figure 56:
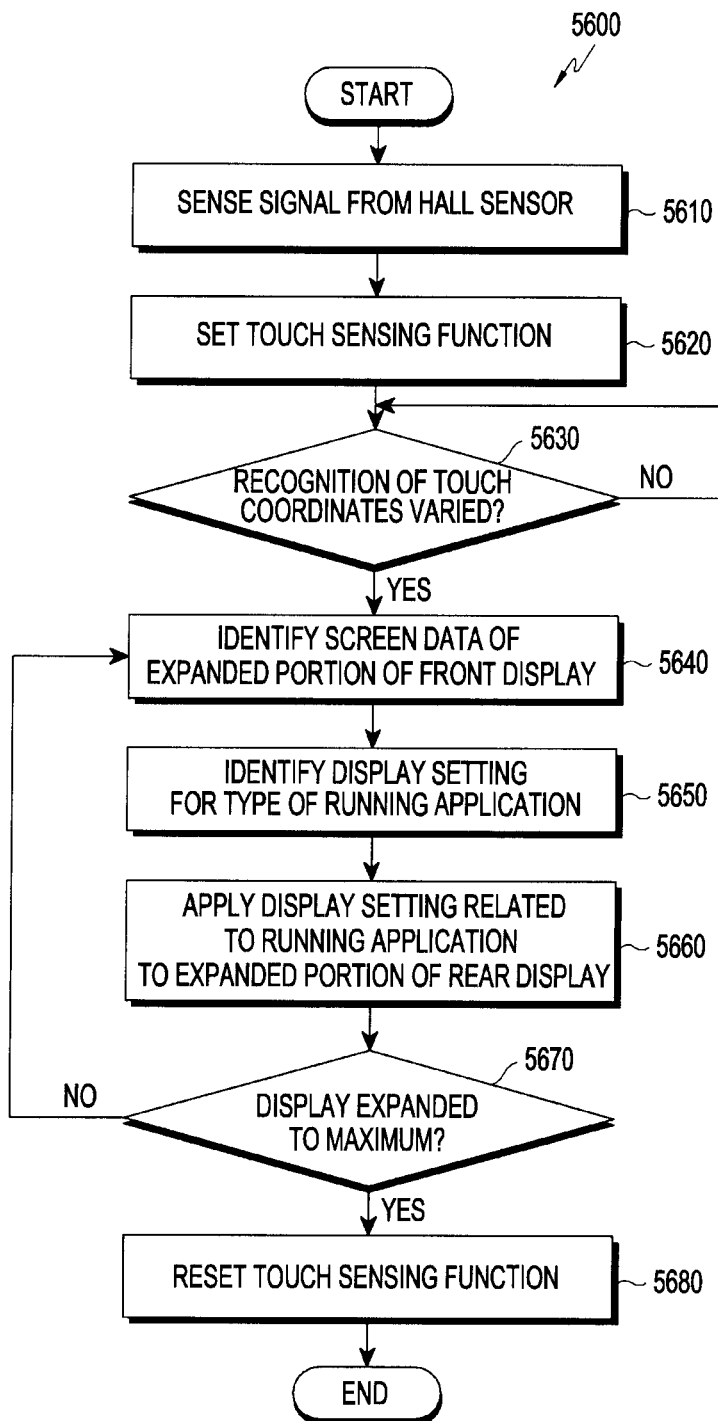
FIG. 56 is a flowchart illustrating an example of displaying a screen on an electronic device with a flexible display according to an embodiment.

FIG. 56 is a flowchart 5600 illustrating an example of displaying a screen on an electronic device with a flexible display according to an embodiment. According to an embodiment, an electronic device may display a screen of a running application on an area disposed on the front surface of the electronic device among display areas of the flexible display.

Referring to FIG. 56, in operation 5610, an electronic device (e.g., the electronic device 101 of FIG. 1 or the electronic device 301 of FIG. 3) (e.g., the processor 120 or 310 of the electronic device) may detect a signal from a hall sensor. In operation 5620, the electronic device may set a touch sensing function of the flexible display. In operation 5630, the electronic device may determine whether recognition of coordinates of a touch is varied.

Unless the area of the flexible display disposed on the rear surface of the electronic device is determined in operation 5630 to be moved, the electronic device may identify that there is no variation in the recognition of coordinates of a touch and repetitively perform operation 5630.

When the area of the flexible display disposed on the rear surface of the electronic device is determined in operation 5630 to be moved to the front surface, the electronic device may identify that the moved area is an expanded display portion on the front surface in operation 5640 and identify screen data corresponding to the expanded portion among the screen data of the application.

In operation 5650, the electronic device may identify the type of the running application and identify the display setting for the screen data corresponding to the expanded portion. In operation 5660, the electronic device may apply the identified display setting to the expanded and display. In operation 5670, the electronic device may determine whether the front area of the flexible display is expanded to a designated maximum value.

When the flexible display is determined in operation 5670 to be expanded less than the designated value, the electronic device may perform operation 5640. When the display of the electronic device is determined in operation 5670 to be expanded to the designated maximum value, the electronic device may reset the touch sensing function in operation 5680.

Figure 57A:
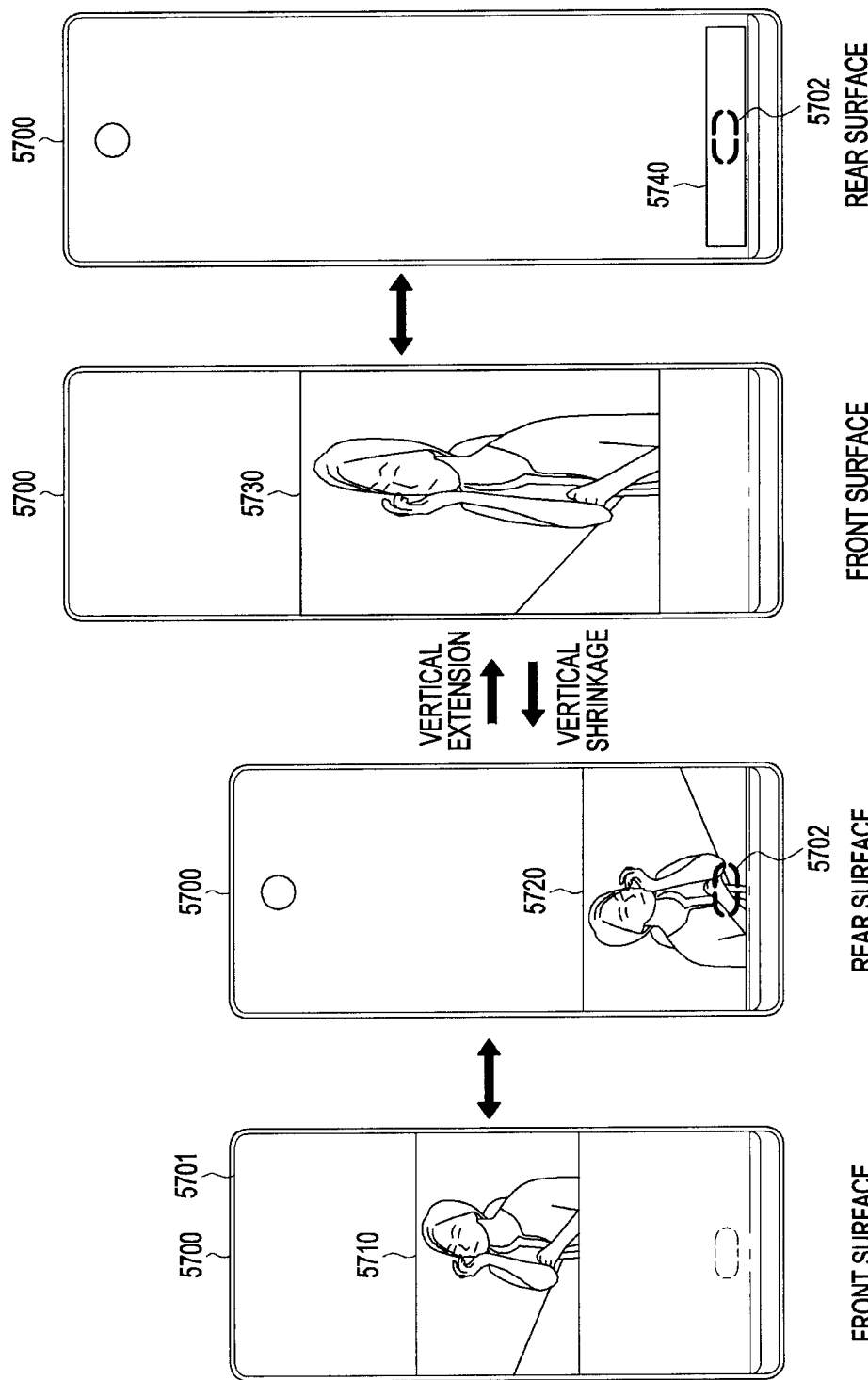
FIG. 57A is a view illustrating an example of a screen displayed when an image capturing function is performed on an electronic device with a flexible display according to an embodiment.

FIG. 57A is a view illustrating an example of a screen displayed when an image capturing function is performed on an electronic device with a flexible display according to an embodiment.

Referring to FIG. 57A, an electronic device 5700 may display an image received through a camera on a first area 5710 of a flexible display 5701 disposed on the front surface of the electronic device 5700 as a camera application runs.

According to an embodiment, an image corresponding to the image displayed on the first area 5710 and a capture button 5702 may be displayed on a second area 5720 of the flexible display 5701 disposed on the rear surface of the electronic device 5700. For example, the electronic device 5700 may display the same image as the image displayed on the first area 5710 on the second area 5720.

According to an embodiment, the image displayed on the second area 5720 may be the image displayed on the first area 5710 which is on the opposite surface of the second area 5720. When one flexible display is driven by one display driving circuit (or a data driver), the image displayed on the second area 5720 may be an image by adjusting the resolution of the image displayed on the first area 5710 to suit the size of the second area 5720 and rotating and left-to-right inverting the resolution-adjusted image.

According to an embodiment, as the flexible display disposed on the rear surface of the electronic device 5700 moves, at least a portion of the flexible display 5701 disposed on the rear surface may be moved to the front surface. For example, the electronic device 5700 may control displaying the image being captured on the third area 5730 including the area moved from the rear to front surface and the first area 5710.

According to an embodiment, as at least a portion of the flexible display 5701 disposed on the rear surface is moved to the front surface, the image being captured may be set to have the resolution of the third area 5730 and be displayed on the third area 5730. For example, when the image being captured, an image resulting from changing the resolution of the image being captured to fit the rear area may be displayed on the third area 5730, the rest 5740 of the rear area except for the portion moved to the front surface. When the third area 5730 is in the maximum screen size, not the image being captured but a pre-designated object (e.g., a capture button) may be displayed.

According to an embodiment, since the rear area of the flexible display 5701 is relatively smaller in size than the front area, the rear area may display various pieces of information depending on various use environments. For example, upon detecting the movement of an object through the camera disposed on the rear surface, the electronic device may switch into the camera preview mode and display. According to an embodiment, when the user faces the rear area, and a designated application is operated or a pre-defined event (e.g., a messenger notification event) occurs, the electronic device may display the corresponding screen on the rear area.

According to an embodiment, when the third area 5730 is in the maximum screen size, the image displayed on the third area 5730 may change its resolution into the resolution of the image displayed on the first area 5710. For example, as the rear area of the flexible display partially moves to the front surface, the image displayed on the second area 5720 may be replaced with a pre-designated object (e.g., a capture button or flash), and the image displayed on the first area 5710 may remain without a change in resolution despite the expansion of the front area of the flexible display, and when the third area 5730 turns to the maximum screen size, a change may simultaneously be made to the resolution, thereby reducing the current consumption of the display driving circuit.

Figure 57B:
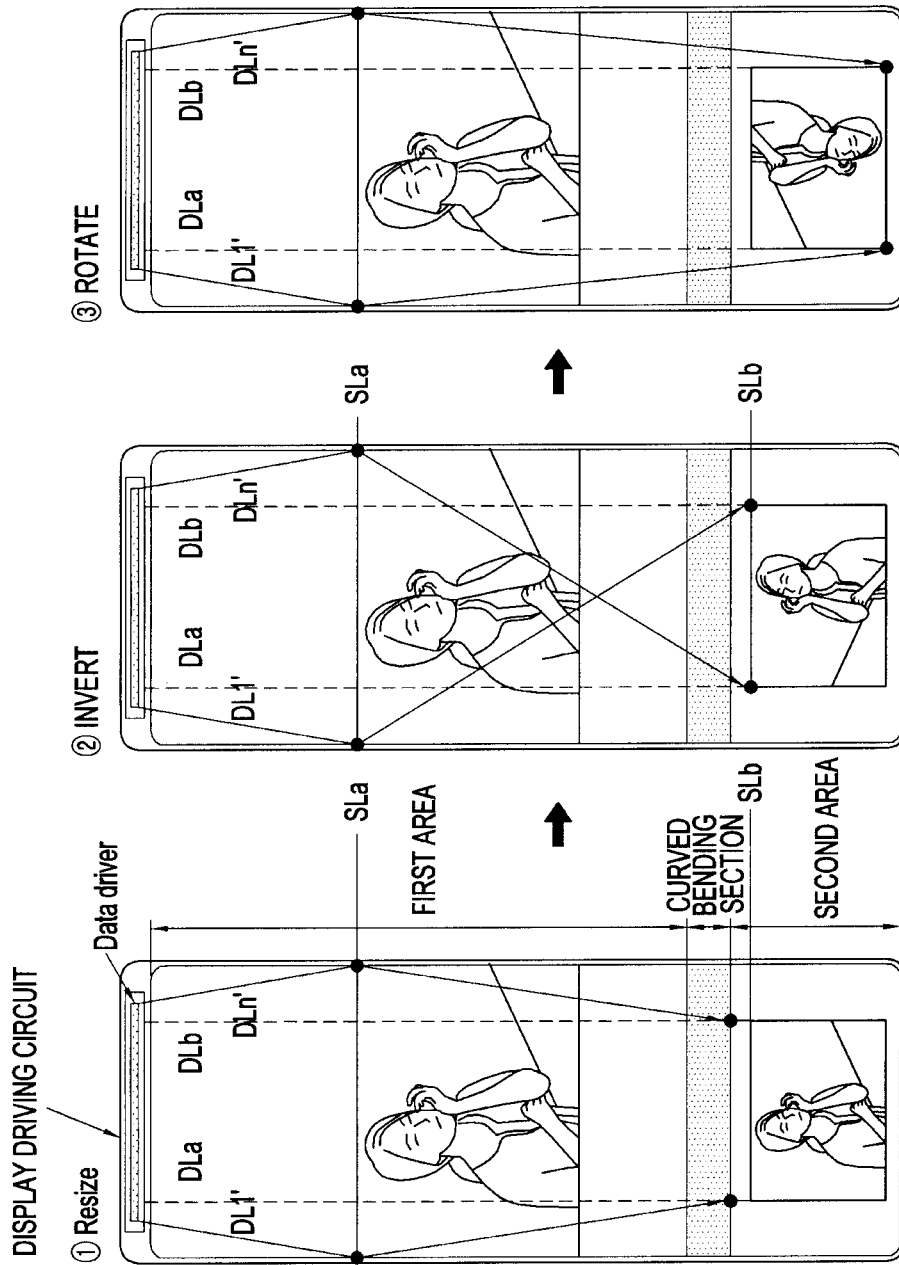
FIG. 57B is a view illustrating an example of a screen displayed when an image capturing function is performed on an electronic device with a flexible display according to an embodiment.
Figure 57C:
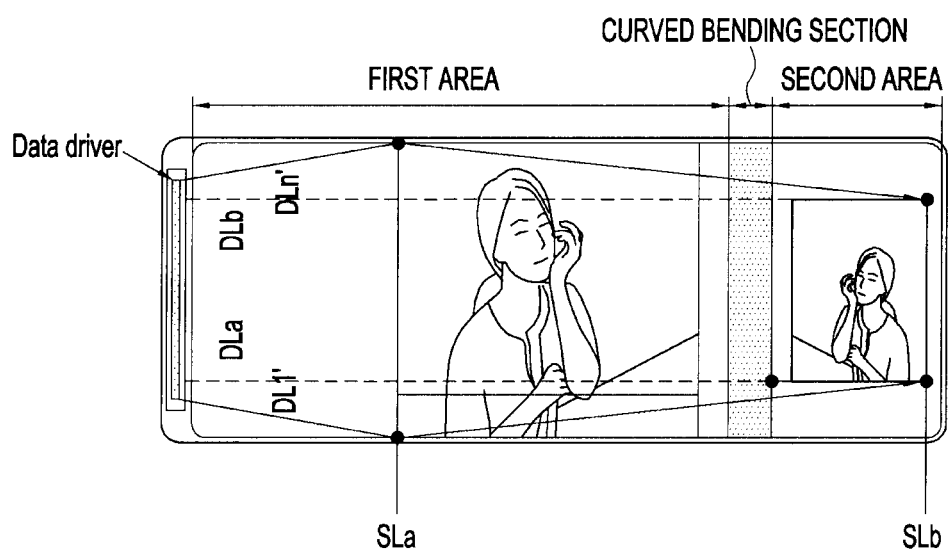
FIG. 57C is a view illustrating an example of a screen displayed when an image capturing function is performed on an electronic device with a flexible display according to an embodiment.

FIGS. 57B and 57C are views illustrating an example of a screen displayed when an image capturing function is performed on an electronic device with a flexible display according to an embodiment. Referring to FIGS. 57B and 57C, an electronic device 5700 may left-right invert an image displayed on a first area 5710 and display the inverted image on a second area 5720. For example, when one flexible display is controlled by one display driving circuit (or data driver), the inverted image may be an image resulting from adjusting the resolution of the image displayed on the first area 5710 to fit the size of the second area 5720, inverting the image data (such as in the landscape view mode), or invert-and-then-rotate the image data (such as in the portrait view mode). For example, the image displayed on the first area 5710 may be subject to a resolution change to be displayed on the second area 5720 which is different in size than the first area 5710. Data DL1 to DLn output from the flexible display data driver (or display driving circuit) may be connected via straight lines between the front surface and rear surface and be displayed separately between the front surface and the rear surface by separate scan data SL1 to SLn. To display an image on the second area 5720, DL1 data and DLn data which represent the image on the first area 5710 may be altered into DLa and DLb, respectively, the resolution is changed, and DL1 to DLn displayed by SLa may be changed to be displayed by SLb. For example, since the flexible display is bent in a U shape with the front surface (e.g., the first area 5710) connected with the rear surface (e.g., the second area 5720), the image displayed on the first area 5710 may be inverted and displayed on the second area 5720. DL1 data and DLn data for the image to be displayed on the first area 5710 may be altered into DLb and DLa, respectively, the resolution of the image to be displayed on the second area 5720 is changed, and DL1 to DLn displayed by SLa may be changed to be displayed by SLb. For example, when the current set is the portrait view mode, the image to be displayed on the second area may utilize image rotation further to resolution change and image inversion. DL1 data and DLn data for the image to be displayed on the first area 5710 may be altered into DLa and DLb, respectively, the resolution of the image to be displayed on the second area 5720 is changed, and DL1 to DLn displayed by SLa may be changed to be displayed by SLc.

All of the processes, including the image resolution change (or resizing), image inversion, and image rotation, may be performed by the display driving circuit before displayed on the second area 5720, and then, the final image, i.e., the image having undergone resizing, image inversion, and image rotation, may be represented on the flexible display by the data driver.

Figure 58:
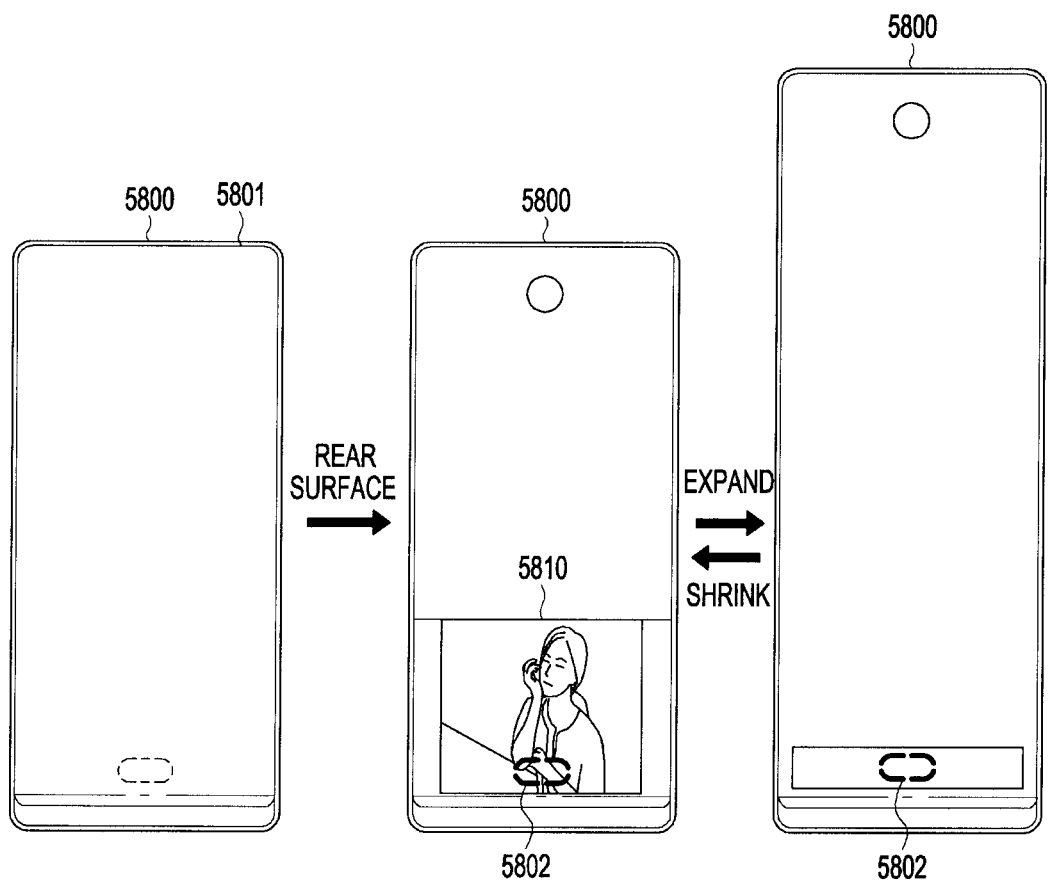
FIG. 58 is a view illustrating an example of a screen displayed when an image capturing function is performed on an electronic device with a flexible display according to an embodiment.

FIG. 58 is a view illustrating an example of a screen displayed when an image capturing function is performed on an electronic device with a flexible display according to an embodiment.

Referring to FIG. 58, an electronic device 5800 may display an image received through a camera and a capture button 5802 on a first area 5810 of a flexible display 5801 disposed on the rear surface of the electronic device 5800 as a camera application runs.

According to an embodiment, an image corresponding to the image displayed on the first area 5810 and a capture button 5802 may be displayed on a second area of the flexible display 5801 disposed on the rear surface of the electronic device 5800.

According to an embodiment, as the flexible display disposed on the rear surface of the electronic device 5800 moves, at least a portion of the flexible display 5801 disposed on the rear surface may be moved to the front surface. For example, the electronic device 5800 may display not the image being captured but a pre-designated object (e.g., the capture button 5802) on the remaining rear area except for the portion moved to the front surface.

According to an embodiment, in camera preview, the full screen may be displayed on the first area 5810, and when the flexible display 5801 expands, e.g., blinking may be displayed to indicate whether the object displayed on the screen is in a correct posture.

According to an embodiment, in camera preview, the full screen including the capture button 5802 may be displayed on the first area 5810, and when the area of exposure shrinks, the capture button 5802 may be displayed on the second area shrunken.

According to an embodiment, when the rear area of the electronic device is intended for a flashlight, if the front area of the flexible display 5801 shrinks to the minimum, then the rear area may expand to the maximum and function as a flashlight.

According to an embodiment, the electronic device 5800 may output first light using a light unit included in the flexible display 5801. For example, when the flexible display 5801 at least partially moves from the front to rear surface while the function is running, the electronic device 5800 may control a flash unit to output second light.

Figure 59:
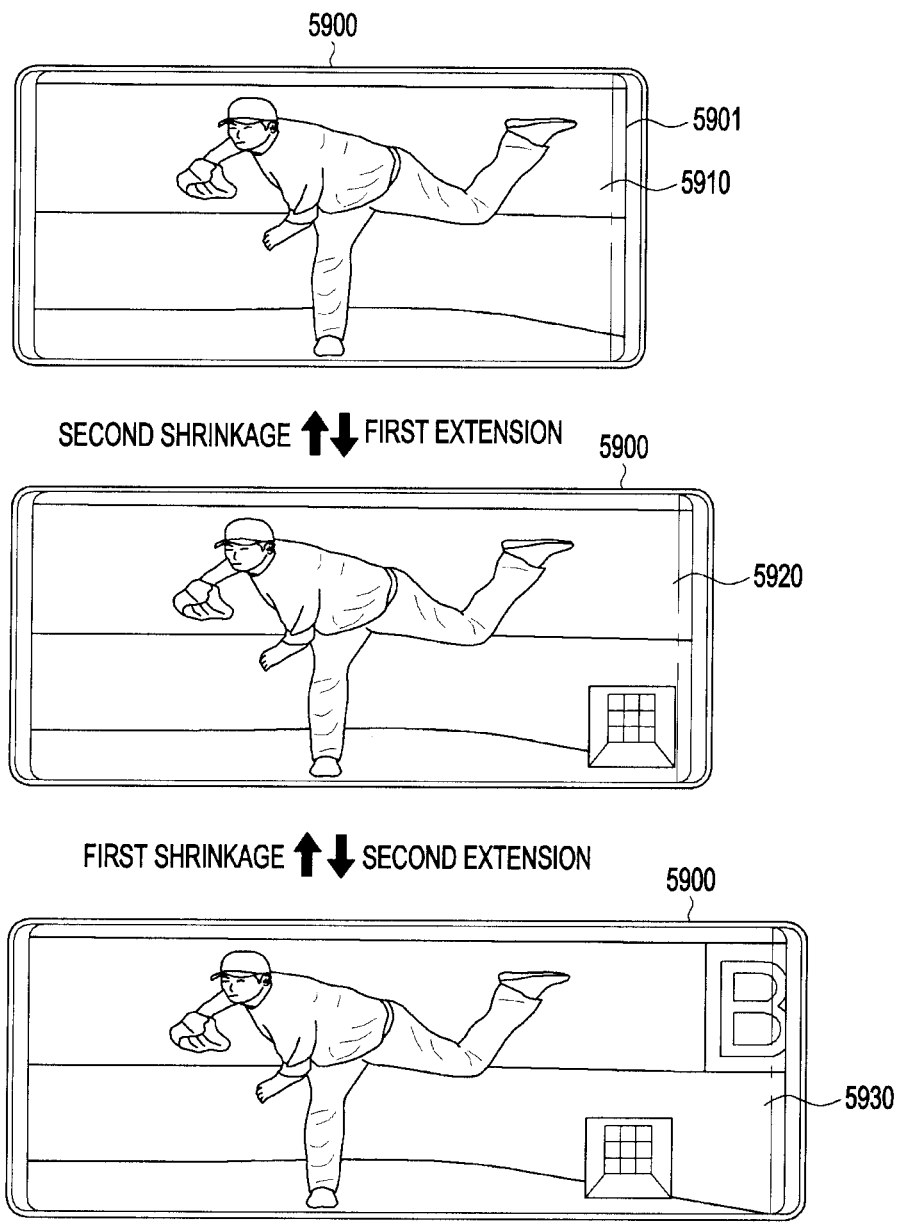
FIG. 59 is a view illustrating an example of a screen displayed as a flexible display of an electronic device resizes according to an embodiment.

FIG. 59 is a view illustrating an example of a screen displayed as a flexible display of an electronic device resizes according to an embodiment.

According to an embodiment, an electronic device 5900 in the landscape orientation may include a flexible display 5901. As a housing (e.g., the flexible display) of the electronic device 5900 moves, a portion of the flexible display 5901 may selectively be slid in or out from the side of the electronic device 5900.

Referring to FIG. 59, a screen of a video playing application being executed on the electronic device 5900 may be displayed on a first area 5910 of the flexible display 5901. The resolution of the application screen may correspond to the resolution of the first area 5910.

According to an embodiment, the user may move the flexible display to expand the exposed first area 5910 of the flexible display 5901. For example, the electronic device 5900 may display data corresponding to the expanded area of the first area 5910 on a second area 5920 including the expanded area.

According to an embodiment, the user may move the flexible display to the maximum to maximally expand the exposed first area 5910 of the flexible display 5901 to a third area 5930. For example, the electronic device 5900 may identify and display data corresponding to the expanded area of the first area 5910 on the third area 5930 including the expanded area.

Figure 60:
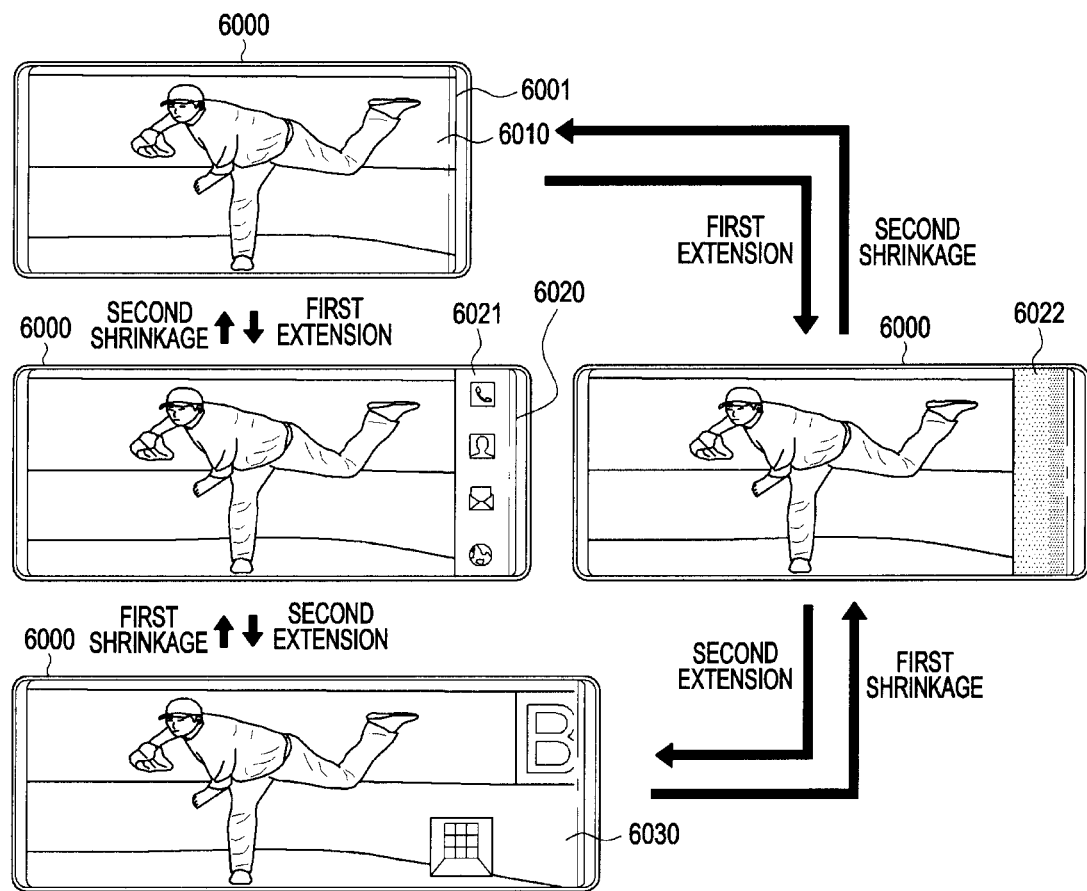
FIG. 60 is a view illustrating an example of a screen displayed as a flexible display of an electronic device resizes according to an embodiment.

FIG. 60 is a view illustrating an example of a screen displayed as a flexible display of an electronic device resizes according to an embodiment.

According to an embodiment, an electronic device 6000 in the landscape orientation may include a flexible display 6001. As a housing of the electronic device 6000 slides, a portion of the flexible display 6001 may selectively be slid in or out from the side of the electronic device 6000.

Referring to FIG. 60, a screen of a video playing application being executed on the electronic device 6000 may be displayed on a first area 6010 of the flexible display 6001. The resolution of the application screen may correspond to the resolution of the first area 6010.

According to an embodiment, the user may move the flexible display to expand the exposed first area 6010 of the flexible display 6001. For example, the electronic device 6000 may identify the size of the second area 6020 expanded from the first area 6010.

According to an embodiment, the electronic device 6000 may identify a screen configuration or image effect set corresponding to the identified size. For example, according to a designated setting, the electronic device 6000 may display a designated icon 6021 or a screen 6022 to which a designated color variation value has applied on the second area 6020.

According to an embodiment, the user may move the flexible display to the maximum to maximally expand the exposed first area 6010 of the flexible display 6001 to a third area 6030. For example, the electronic device 6000 may identify and display data corresponding to the expanded area of the first area 6010 on the third area 6030 including the expanded area.

Figure 61:
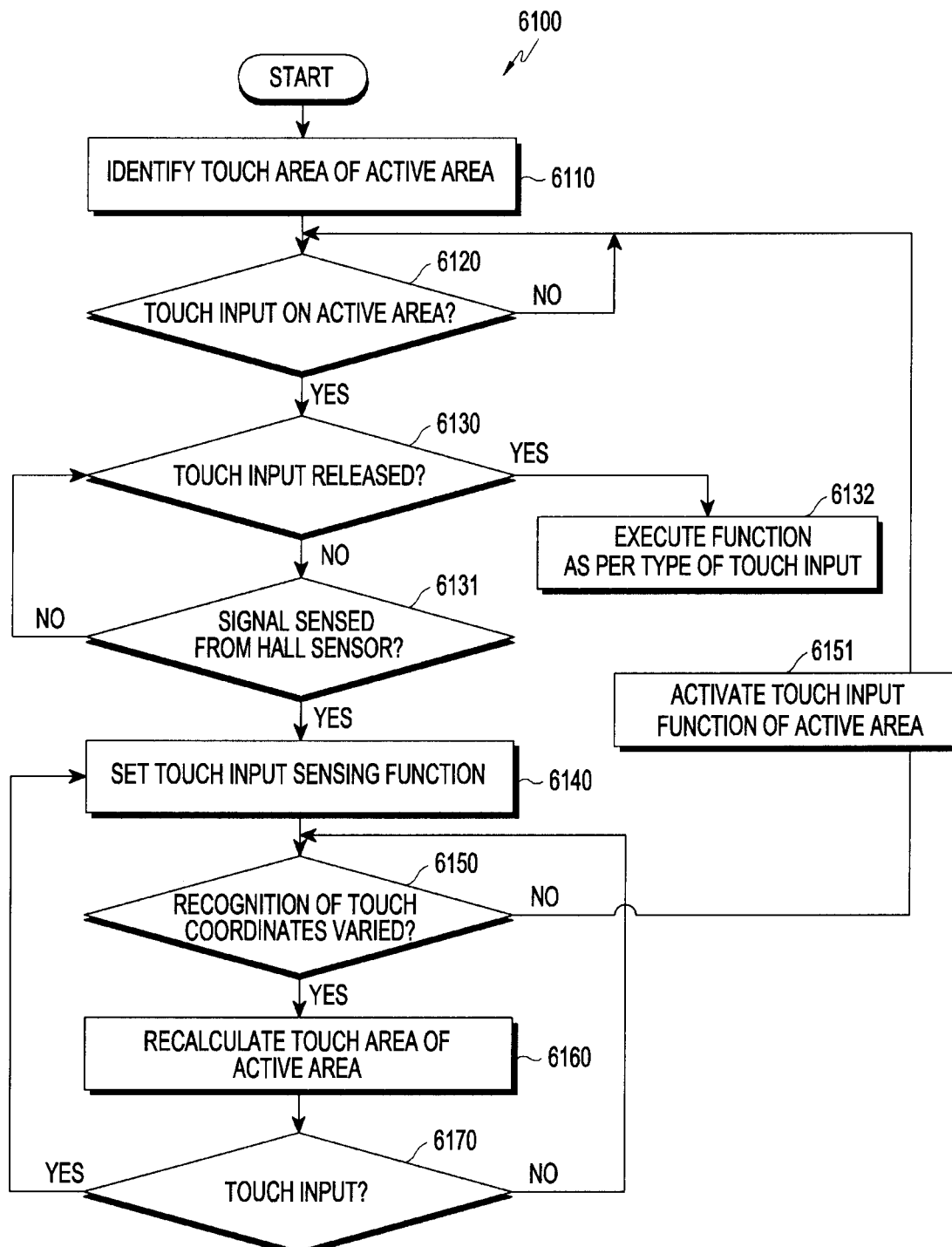
FIG. 61 is a view illustrating an example of displaying a screen as a flexible display of an electronic device resizes according to an embodiment.

FIG. 61 is a view 6100 illustrating an example of displaying a screen as a flexible display of an electronic device resizes according to an embodiment.

In operation 6110, an electronic device (e.g., the electronic device 101 of FIG. 1 or the electronic device 301 of FIG. 3) (e.g., the processor 120 or 310 of the electronic device) may identify a touch area of an active area. For example, the active area may be the flexible display area disposed on the front surface of the electronic device. In operation 6120, the electronic device may determine whether a touch input is received through the active area. Thus, the user may identify whether a touch is made on the active area or, to recognize a change in the size of the screen, whether a touch is made by the dielectric 1870 of FIG. 18.

When no touch input is identified in operation 6120 to be received through the active area, the electronic device may repetitively perform operation 6120.

When a touch input is identified in operation 6120 to be received through the active area, the electronic device may determine whether the touch input is released in operation 6130. When the touch input is determined in operation 6120 to be released (e.g., when the user touches the screen with their finger and stops touching), the electronic device may execute a function designated depending on the type of the received touch input in operation 6132. For example, when the touch input continues without release for a predetermined time or more, the electronic device may perform a long press input, and otherwise, a short press input. When the touch input is of a multi-input type, the electronic device may perform multiple inputs.

Unless the touch input is determined in operation 6120 to be released, the electronic device may determine whether a signal from a hall sensor (or a touch input variation outside the active area identified in operation 6110) is detected in operation 6231.

When no hall sensor signal is determined in operation 6131 to be detected, the electronic device may perform operation 6130.

When a hall sensor signal is determined in operation 6131 to be detected, the electronic device may reset the touch input sensing function in operation 6140. For example, while the flexible display slides, the electronic device may disregard touch inputs detected in the active area identified in operation 6110.

In operation 6150, the electronic device may determine whether there is a variation in recognition of coordinates of a touch outside the active area identified in operation 6110.

When there is determined in operation 6150 to be no variation in recognition of coordinates of a touch outside the active area identified in operation 6110, e.g., when there is no change in the size of the screen for a predetermined time, the electronic device may perform operation 6120. For example, there is no change in size for a predetermined time may mean that the screen expands to the maximum or shrinks to the minimum or stops expanding or shrinking in the middle. Before repeating operation 6120, the electronic device may reset the touch input sensing function in operation 6151, initialize the function (operation 6140) of disregarding touch inputs detected (in operation 6120) in the touch area of the active area identified in operation 6110 while sliding, receiving an input through a new active area identified, and performing operation 6120 to perform the function depending on the type of the touch input.

When the recognition of the coordinates of a touch is determined in operation 6150 to be varied, the electronic device may recalculate the touch area of the active area in operation 6160.

In operation 6170, the electronic device may determine whether a touch input made through the flexible display is received from the touch area of the new active area calculated in operation 6160.

When a touch input is determined in operation 6170 to be received, the electronic device may perform operation 6140, and if not, operation 6150.

Figure 62:
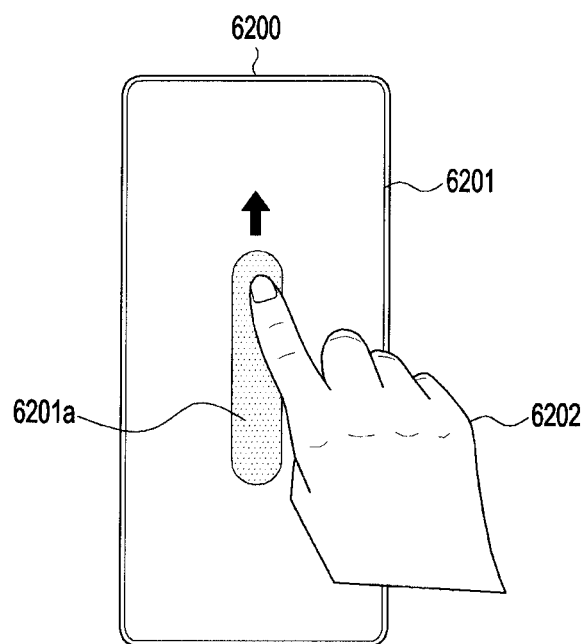
FIG. 62 is a view illustrating an example of an electronic device with a flexible display according to an embodiment.

FIG. 62 is a view illustrating an example of an electronic device with a flexible display according to an embodiment.

Referring to FIG. 62, upon performing the operations of FIG. 61, the user may expand the screen by pressing a portion of the active area 6201a of the flexible display area 6201 disposed on the front surface of the electronic device 6200 using their finger. With the finger press, a touch input may be created, in which case when the screen expands, the input may be disregarded as described above in connection with operation 6240 of FIG. 62. Conversely, when the user takes the finger off the screen while there is no screen slide, e.g., when the touch input is released as in operation 6230, the electronic device may determine the type of the touch input and perform the function.

According to an embodiment, the electronic device 6200 may determine whether a user input 6202 is received through the active area 6201a or released and set the touch sensing function on the active area 6201a. According to an embodiment, when there is a user input 6202 on the active area 6201a, the electronic device 6200 may update images displayed on the screen according to certain embodiments as described above. According to an embodiment, the electronic device 6200 may be configured to abstain from performing input processing on the flexible display upon updating the screen as per the user input 6202.

Figure 63A:
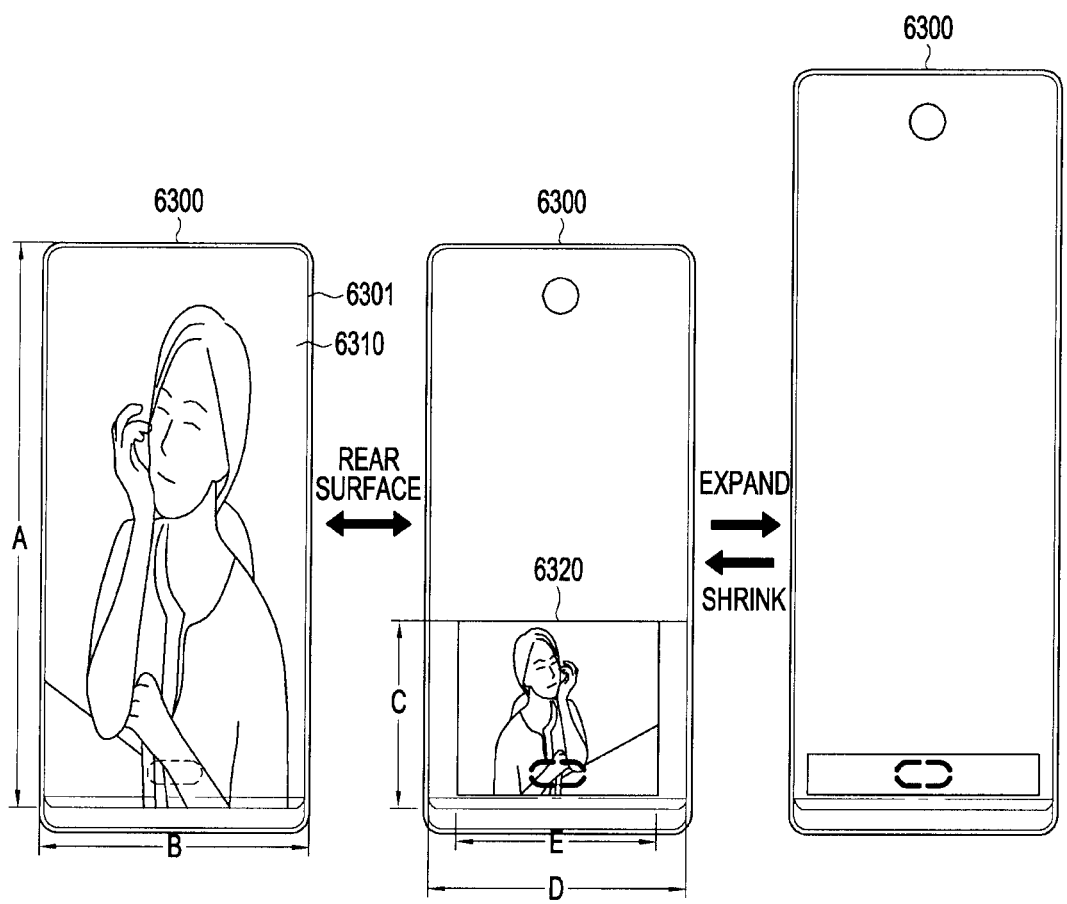
FIG. 63A is a view illustrating an example of a screen displayed when an image capturing function is performed on an electronic device with a flexible display according to an embodiment.
Figure 63B:
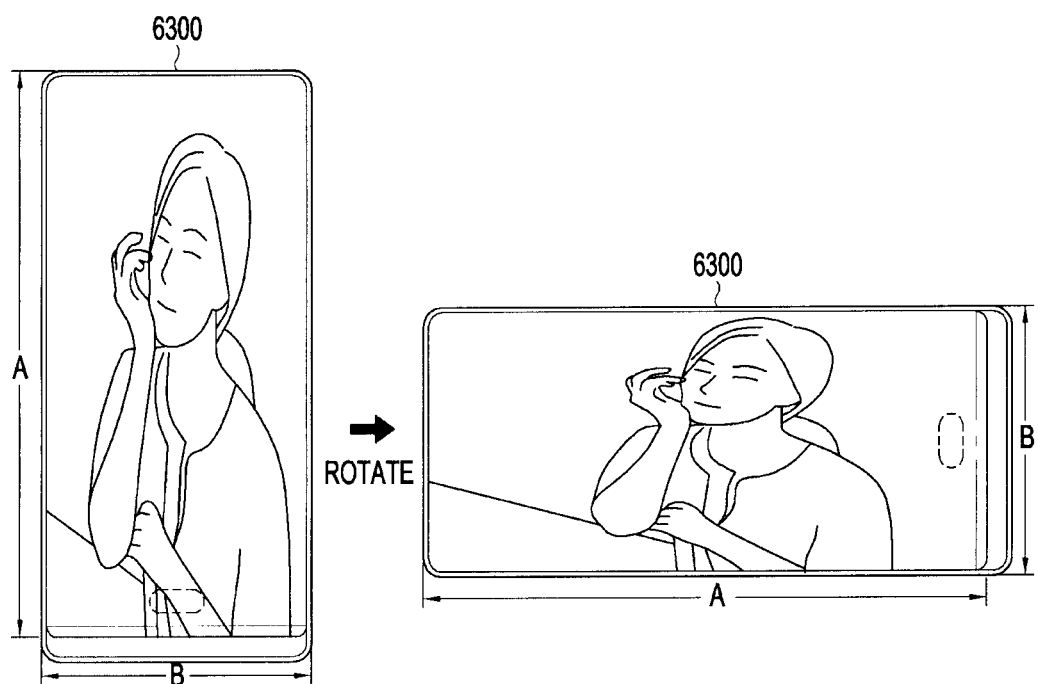
FIG. 63B is a view illustrating an example of a screen displayed when an image capturing function is performed on an electronic device with a flexible display according to an embodiment.
Figure 63C:
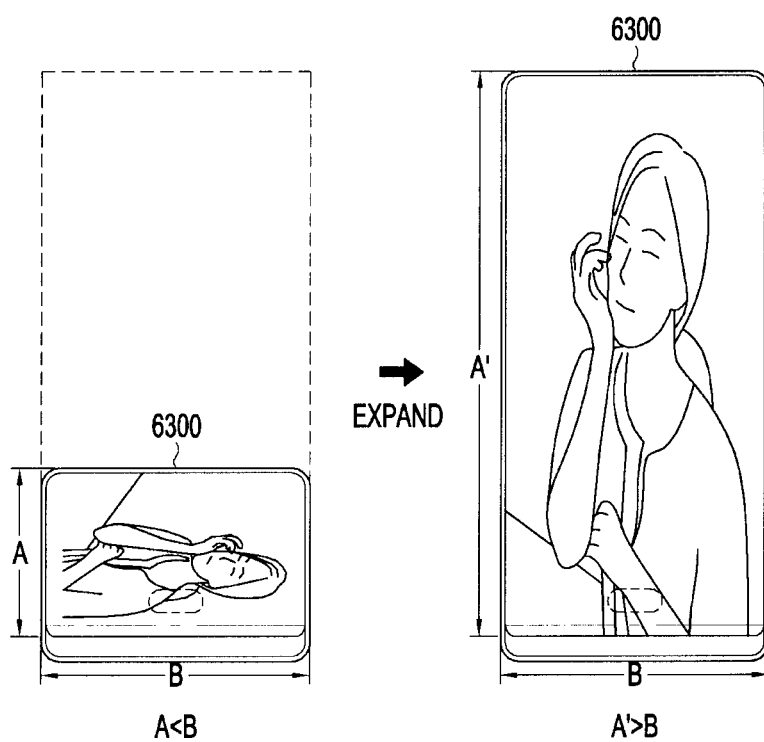
FIG. 63C is a view illustrating an example of a screen displayed when an image capturing function is performed on an electronic device with a flexible display according to an embodiment.

FIGS. 63A, 63B, and 63C are views illustrating an example of a screen displayed when an image capturing function is performed on an electronic device with a flexible display according to an embodiment.

According to an embodiment, an electronic device 6300 may include a flexible display disposed on the rear surface and a flexible display 6301 of which at least a portion is affixed to the flexible display along the curved side surface from the front surface of the electronic device 6300. For example, as the flexible display moves, at least a portion of the flexible display 6301 may be moved to the front top or bottom of the electronic device 6300.

FIG. 63A is a view illustrating an example of a screen displayed when an image capturing function is performed on an electronic device with a flexible display according to an embodiment.

Referring to FIG. 63A, when a camera application runs on the electronic device 6300, an image captured by the camera may be displayed on a first area 6310 disposed on the front surface of the electronic device 6300 among areas of the flexible display 6301. For example, the first area 6310 may have a vertical length (e.g., height) of A and a horizontal length (e.g., width) of B.

According to an embodiment, the housing may include an opening to expose a second area 6320 disposed on the rear surface of the electronic device 6300 among the areas of the flexible display 6301. For example, the second area 6320 may have a vertical length (e.g., height) of C and a horizontal length (e.g., width) of D.

According to an embodiment, the second area 6320 may display a capture button 6302 and an image corresponding to the vertical-to-horizontal ratio (A:B) of the image displayed on the first area 6310. For example, the image displayed on the second area 6320 may have a vertical length of C which is the maximum vertical length and a horizontal length of E which corresponds to the ratio of the first area 6310.

According to an embodiment, the electronic device 6300 may set the image on the first area 6310 to have a vertical length of C and a horizontal length of E and display the set image on the second area 6320. For example, as the flexible display 6301 displays different screens on the front surface and the rear surface, the image displayed on the second area 6320 may be an inverted image of the image displayed on the first area 6310.

According to an embodiment, when at least a portion of the flexible display 6301 disposed on the rear surface is moved to the front surface so that the area of the flexible display disposed on the rear surface is shrunken to the minimum, the electronic device 6300 may display not the image being captured but a pre-designated object (e.g., the capture button 6302) on the shrunken area.

According to an embodiment, the electronic device 6300 may include an edge display on the top and/or bottom or a dual display structure. According to an embodiment, as shown in FIGS. 63A, 63B, and 63C, the screen displayed on the second area 6320 on the rear surface of the electronic device 6300 may be changed in resolution or aspect ratio as the flexible display expands or shrinks. For example, the electronic device 6300 may include a DDI, and the area displayed may be a portion of the entire screen area. Since the screen displayed on the front surface of the electronic device 6300 is a portion of the entire display area, the second area 6320 on the rear surface, albeit not displayed, may be varied in resolution or aspect ratio as the flexible display moves.

According to an embodiment, the electronic device 6300 may have at least one part (e.g., a camera or antenna) mounted in the internal space at the top or bottom, and when the internal space at the bottom is small, an antenna may be provided on the side of the electronic device 6300.

FIG. 63B is a view illustrating an example of an electronic device with a flexible display according to an embodiment.

Referring to FIG. 63B, when the electronic device 6300 of which the screen expands in the vertical direction as shown in FIG. 63C on a third party application that lays out the default screen based on the axis with a smaller screen resolution and provides a screen rotation by the rotation of the set, the vertical-horizontal ratio or size is reversed as per expansion along the vertical direction, i.e., when the vertical-horizontal ratio or size is changed from a vertical length that is smaller than the horizontal length to a vertical length that is larger than the horizontal length (e.g., such an effect as if the vertical length increases when the electronic device 6300 of which the vertical length is larger than the horizontal length is rotated without screen extension), the 3rd party app displayed on the screen may perform the user's unintended action while rotating to the smaller-resolution axis changed regardless of the user's turning action to expand or shrink the screen. Accordingly, the vertical-horizontal ratio A:BB of the first area 6310 or size may remain the default without inversion despite a resolution change made as the screen expands or shrinks. For example, when the default screen ratio of the first area 6310 and the second area 6320 of the electronic device 6300 is 4:4 (vertical:horizontal), the first area 6310 and the second area 6320 may be expanded or shrunken in the direction along which the vertical length remains larger than the horizontal length (e.g., expands in the direction along which the vertical-horizontal ratio is 16:9 or shrinks vertically up to a vertical-horizontal screen ratio of 3:3).

According to an embodiment, the default screen ratio of the first area 6310 and the second area 6320 may also mean the active area to display a screen or the outer edge of the flexible display panel.

According to an embodiment, the second area 6320 may display a capture button 6302 and an image corresponding to the vertical-to-horizontal ratio (A:B) or size of the image displayed on the first area 6310. For example, when the vertical length of the image displayed on the second area 6320 is the maximum vertical length C, the horizontal length D of the image may be not the maximum horizontal length but E which corresponds to the ratio of the first area 6310. As another example, when the vertical length A of the first area 6310 is larger than the horizontal length B, the image displayed on the second area 6320 may have the vertical length C larger than the horizontal length E.

Figure 64:
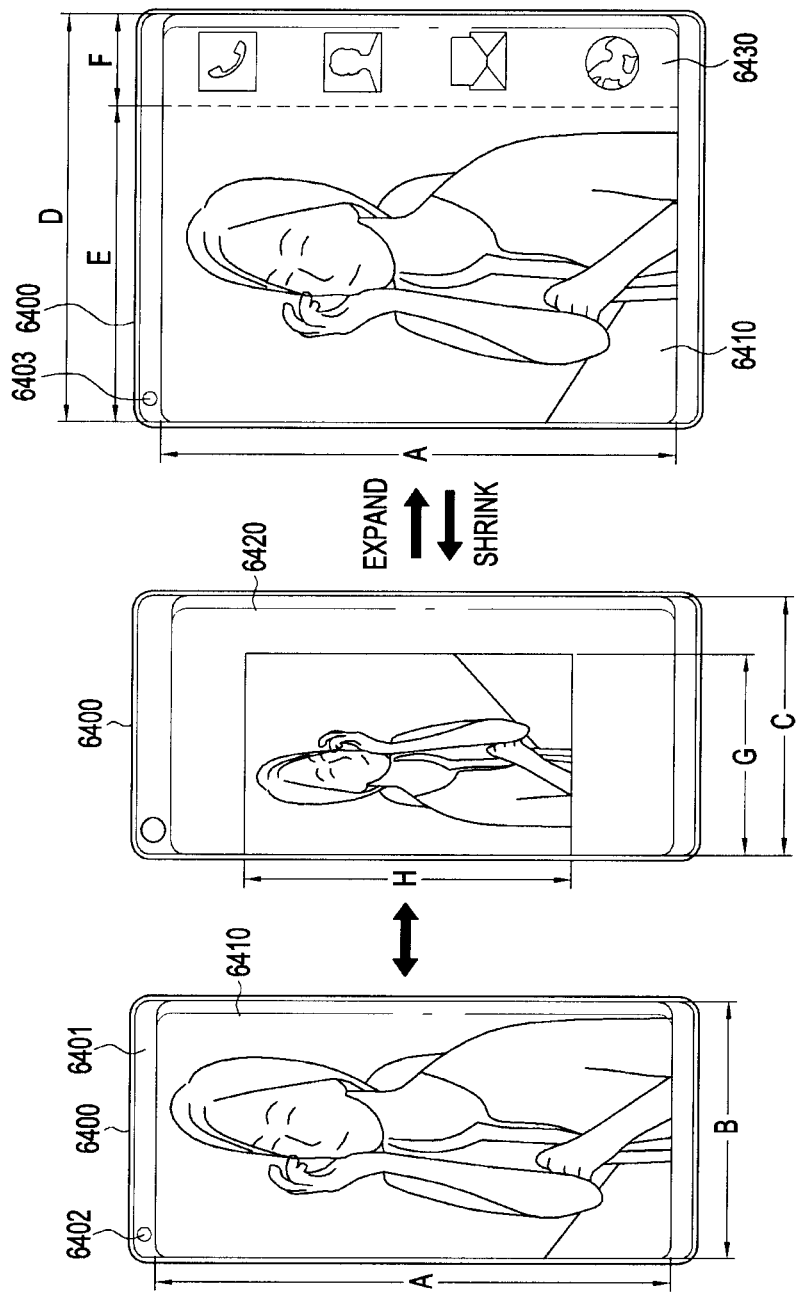
FIG. 64 is a view illustrating an example of a screen displayed when an image capturing function is performed on an electronic device with a flexible display according to an embodiment.

FIG. 64 is a view illustrating an example of a screen displayed when an image capturing function is performed on an electronic device with a flexible display according to an embodiment.

According to an embodiment, an electronic device 6400 may include a flexible display disposed on the rear surface and a flexible display 6401 of which at least a portion is affixed to the flexible display along the curved side surface from the front surface of the electronic device 6400. For example, as the flexible display moves, at least a portion of the flexible display 6401 may be moved along the side surface to the front surface of the electronic device 6400.

Referring to FIG. 64, when a camera application runs on the electronic device 6400, an image captured by the camera 6402 or 6403 may be displayed on a first area 6410 disposed on the front surface of the electronic device 6400 among areas of the flexible display 6401. For example, the electronic device 6400 may include a flexible display on the front surface, when at least a portion of the flexible display 6401 is fixed. For example, the first area 6410 may have a vertical length (e.g., height) of A and a horizontal length (e.g., width) of B.

According to an embodiment, the flexible display may include an opening to expose a second area 6420 disposed on the rear surface of the electronic device 6400 among the areas of the flexible display 6401. For example, the second area 6420 may display an image corresponding to the vertical-to-horizontal ratio (A:B) or size of the image displayed on the first area 6410.

According to an embodiment, the image displayed on the second area 6420 may have a vertical length of H and a horizontal length of G corresponding to the vertical-horizontal ratio of the image displayed on the first area 6410, although the entire horizontal length of the electronic device 6400 is C. For example, as the flexible display 6401 displays different screens on the front surface and the rear surface, the image displayed on the second area 6420 may be an inverted image of the image displayed on the first area 6410.

According to an embodiment, when at least a portion of the flexible display 6401 disposed on the rear surface is moved along the side surface to the front surface so that the front area of the flexible display is expanded to the maximum, the electronic device 6400 may display designated buttons on the expanded third area 6430. For example, the third area 6430 may display buttons to perform designated functions or capture-related operations in addition to the image displayed on the first area 6410.

According to an embodiment, when the electronic device 6400 expands horizontally, the image may be displayed based on the default vertical-horizontal screen ratio or size relation. When the horizontal length B of the first area 6410 of the electronic device 6400 is expanded to the maximum horizontal length D, the maximum vertical length D may be divided into a vertical length of E (e.g., the horizontal length of the expanded first area 6410) which is smaller than the vertical length A and the rest F (e.g., the horizontal length of the third area 6430) to partition the screen. This may prevent the 3rd party app from rotating when the electronic device 6400 expands horizontally as shown in FIG. 63B. For example, when the default vertical-horizontal screen ratio of the first area 6410 is 16:9 and the screen ratio becomes 4:4 or more as the screen expands horizontally, the screen may be partitioned to display an image resulting from changing the resolution of the image before expansion on the 4:less than 4 area (e.g., the first area 6410) and buttons for performing the capture-related operations or designated operations on the remaining area (e.g., the third area 6430).

Figure 65:
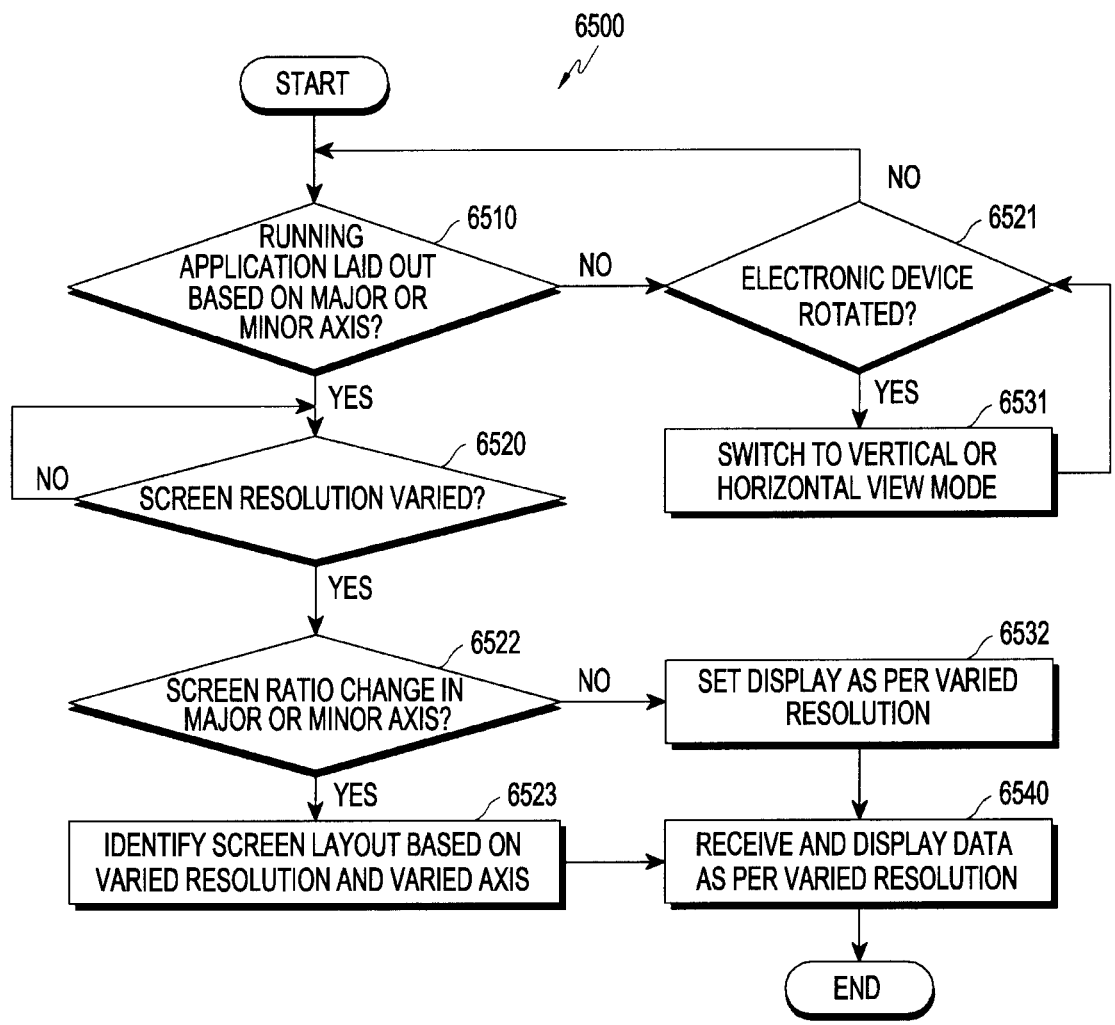
FIG. 65 is a flowchart illustrating an example of performing an image capturing function on an electronic device with a flexible display according to an embodiment.

FIG. 65 is a flowchart 6500 illustrating an example of performing an image capturing function on an electronic device with a flexible display according to an embodiment. FIG. 65 illustrates an example of performing a capturing function on an electronic device including a flexible display in relation to preventing the screen from rotating when a 3rd party app is subject to a change in the screen display area by a slide of the electronic device 6400.

Referring to FIG. 65, in operation 6510, an electronic device (e.g., the electronic device 101 of FIG. 1 or the electronic device 301 of FIG. 3) (e.g., the processor 120 or 310 of the electronic device) may identify whether the default screen displayed through a running application (e.g., a camera application) is laid out based on the minor axis or major axis.

When the default screen of the application is identified in operation 6510 to be laid out based on the minor or major axis, the electronic device may identify whether the screen display area is increased or decreased by a slide of the electronic device 6400 in operation 6520, and unless the screen display are increased or decreased, the electronic device may repeat operation 6510.

Unless the default screen of the application is identified in operation 6510 to be laid out based on the minor or major axis, the electronic device may perform operation 6521, and when there is no set rotation, the electronic device may repeat operation 6510. When there is a set rotation, the electronic device may switch to vertical or horizontal view mode (e.g., portrait or landscape mode) in operation 6531.

When the screen display area is increased or decreased resulting in a change in resolution in operation 6520, and the minor-major axis ratio or size of the increased or decreased screen display area is reversed in operation 6522, the electronic device may deliver a default screen layout reference change to the application and a resolution suited for the increased or decreased screen display area to the application in operation 6523, receive changed default screen layout reference and resolution data from the application and display in operation 6540.

If the minor-major axis ratio or size of the increased or decreased screen display area are not changed or reversed in operation 6522, the electronic device may perform operation 6532 to deliver a resolution suited for the increased or decreased screen display area to the application and perform operation 6540 to receive changed resolution data and display.

When there is a set rotation in operation 6521, the electronic device may change the application into the landscape view mode or portrait view mode fitting the rotating direction of the set and perform operation 6531.

Figure 66A:
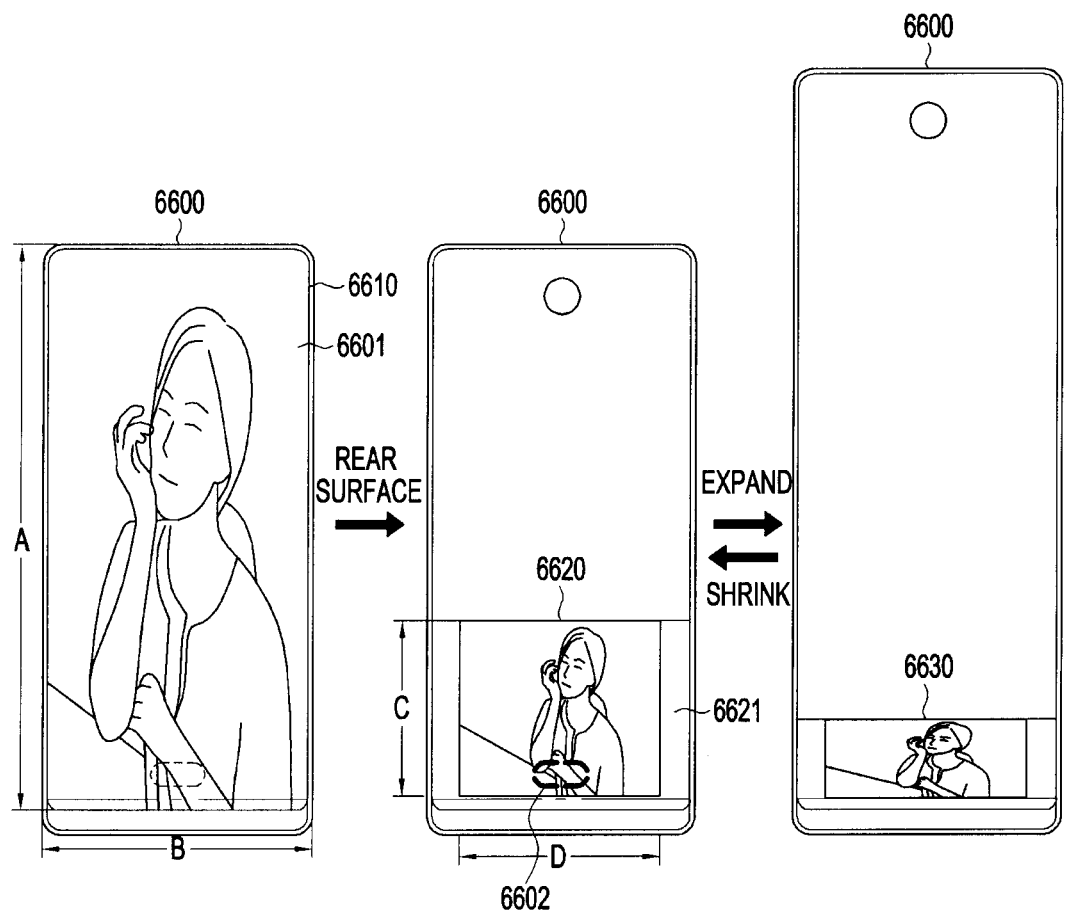
FIG. 66A is a view illustrating an example of a screen displayed when an image capturing function is performed on an electronic device with a flexible display according to an embodiment.
Figure 66B:
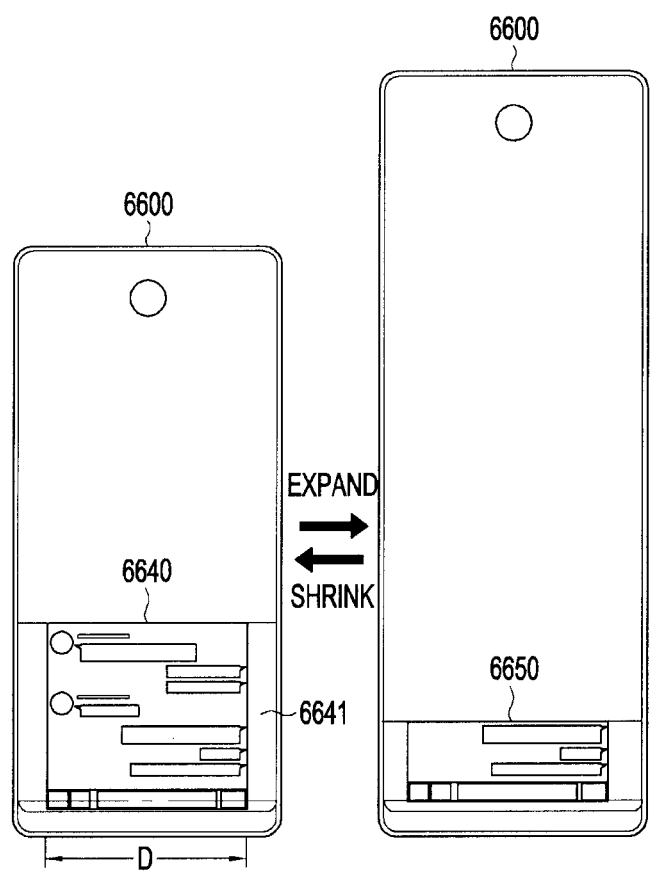
FIG. 66B is a view illustrating an example of a screen displayed when a messenger application is executed on an electronic device with a flexible display according to an embodiment.

FIG. 66A is a view illustrating an example of a screen displayed when an image capturing function is performed on an electronic device with a flexible display according to an embodiment. FIG. 66B is a view illustrating an example of a screen displayed when a messenger application is executed on an electronic device with a flexible display according to an embodiment.

Referring to FIGS. 66A and 66B, according to an embodiment, an electronic device 6600 including a flexible display may display a rear screen when the 3rd party app is one that lays out its default screen based on the minor axis B which is smaller in screen resolution and does not provide screen rotation by set rotation as shown in FIG. 63B. For example, as the front screen 6601 on the front surface 6610 of the display expands vertically, the rear surface 6620 on the rear surface 6621 of the display may shrink vertically, and the electronic device 6600 may decrease the vertical resolution of the pre-extension rear screen and display the resolution-changed screen 6630. A functional button 6602, such as a home key or camera capture button, may be displayed on the rear surface 6620 on the rear surface 6621.

According to an embodiment, an electronic device 6600 including a flexible display may display a rear screen when the 3rd party app is one that lays out its default screen based on the minor axis B which is smaller in screen resolution and does not provide screen rotation by set rotation as shown in FIG. 63B. For example, as the front screen 6601 on the front surface 6610 of the display expands vertically, the display rear screen 6640 on the rear surface 6641 of the display may shrink vertically, and the electronic device 6600 may decrease the vertical resolution of the pre-extension rear screen and display the resolution-changed screen 6650. For example, a messenger execution window may be displayed on the display rear screen 6640, and when the display rear screen 6640 is the messenger execution window and the display rear screen 6640 shrinks, a portion of the messenger conversation screen may be cut off without a change in resolution.

Figure 67:
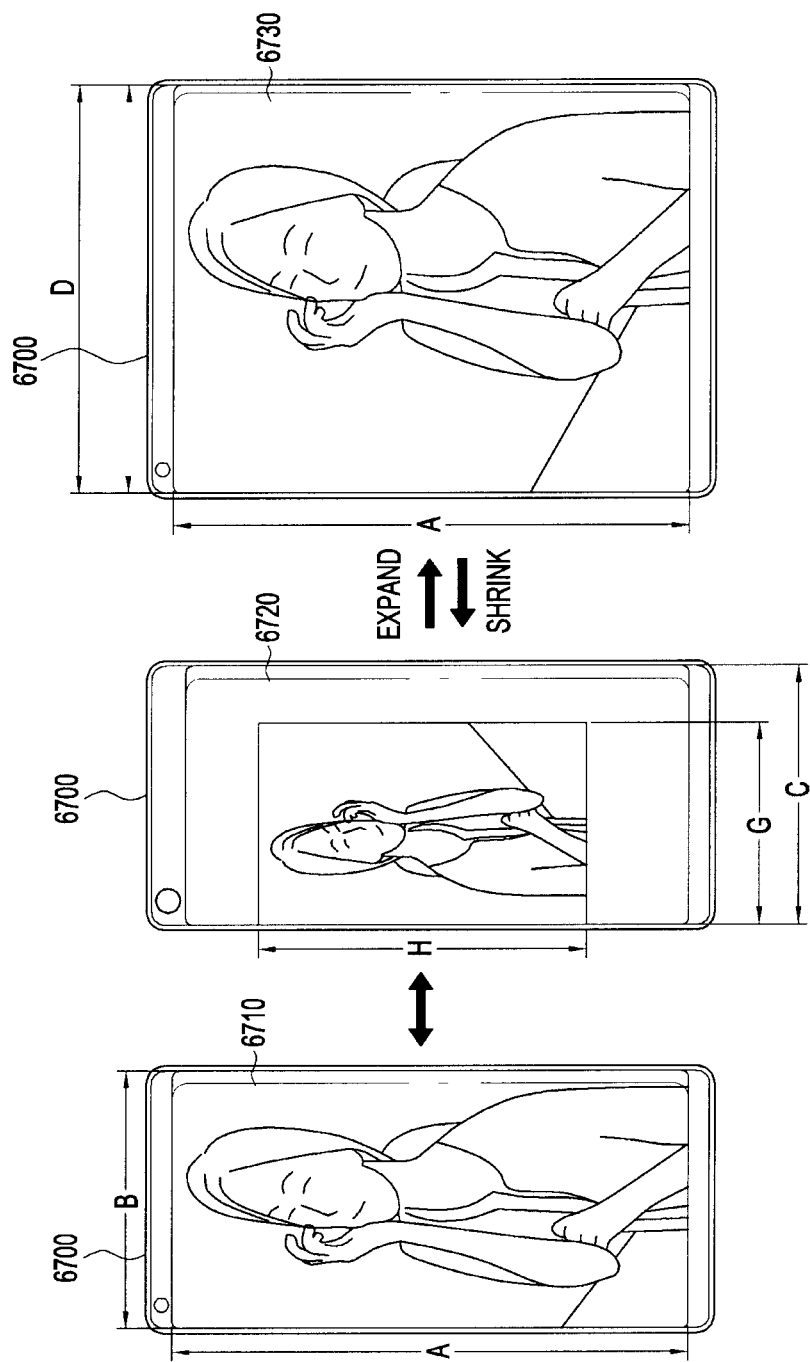
FIG. 67 is a view illustrating an example of a screen displayed when an image capturing function is performed on an electronic device with a flexible display according to an embodiment.

FIG. 67 is a view illustrating an example of a screen displayed when an image capturing function is performed on an electronic device with a flexible display according to an embodiment. Referring to FIG. 67, e.g., a camera application may be laid out based on the major axis of the set screen ratio.

According to an embodiment, a certain application of the electronic device 6700 (e.g., a camera preview application) may detect a variation in the major axis of the display resolution ratio and determine the screen view mode.

According to an embodiment, such an application may change the screen ratio. For example, the variable display resolution ratio (or screen display area ratio the application adopts) in the exposed area may be designed to have the Y axis resolution larger than the X axis resolution. According to an embodiment, when a change is made to the major axis (e.g., Y axis→X axis) due to a change in the exposed screen, a screen processing method may utilize association with the existing screen or change to another screen.

According to an embodiment, when the flexible display shrinks in screen 6720 from an original size shown in screen 6710, the settings or active area ratio may indicate that A (e.g., a height) is larger than B (e.g., a width) for the front surface. Similarly, when the flexible display expands, such as in screen 6720 to screen 6730, the settings or active area ratio may indicate A (height) is larger than D (e.g., a new width) for the front surface, and D (the new width) is larger than C (the previous width. When an application whose view mode is changed based on the screen ratio is used for the rear surface, the rear surface may remain H>G or C. When there is no application utilizing a view mode switch based on the ratio, the rear surface ratio is utilized to be more than the minimum one among resolutions supported by the application used.

Various embodiments of multi-screen configurations are described below with reference to FIGS. 68 to 71. In FIGS. 45 to 48, App(A) may refer to a prior application executed and displayed, and App(B) may refer to a new application executed and displayed.

Figure 68:
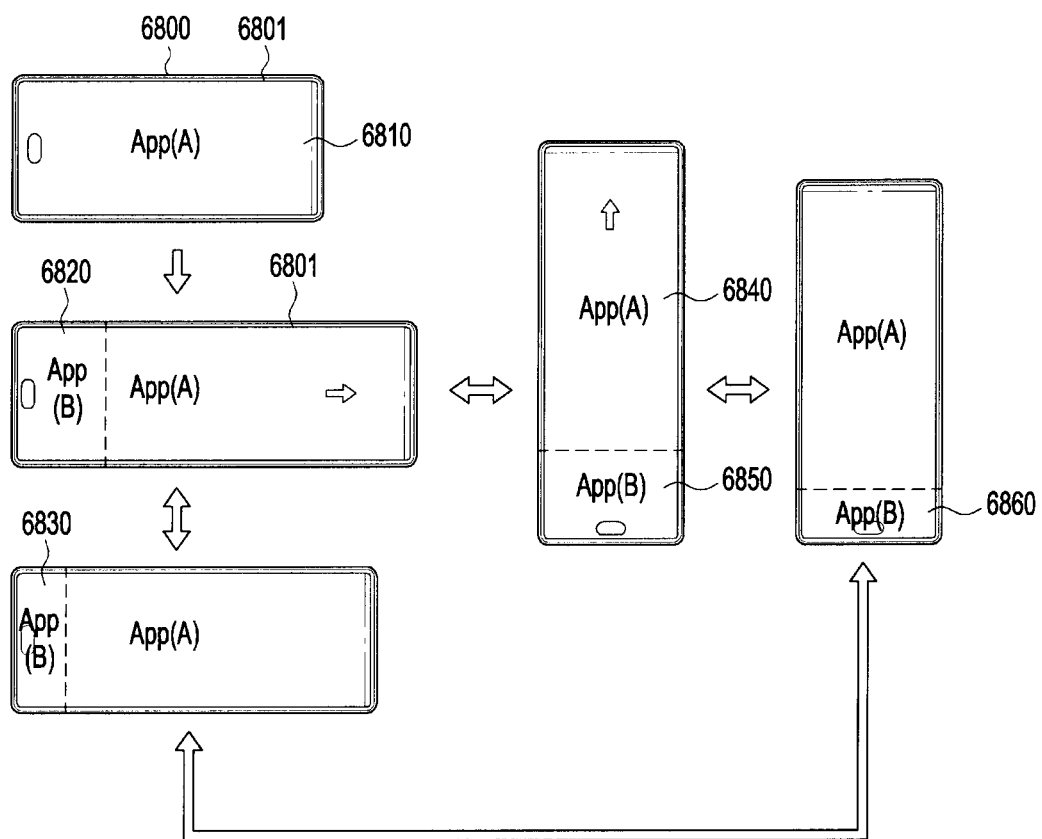
FIG. 68 is a view illustrating an example of a screen configuration displayed on an electronic device with a flexible display according to an embodiment.

FIG. 68 is a view illustrating an example of a screen displayed on an electronic device with a flexible display according to an embodiment.

Referring to FIG. 68, an electronic device 6800 may display a screen of an application A running through a first area 6810 of a flexible display 6801. For example, application A may provide a screen in a designated aspect ratio and detect the orientation (e.g., landscape or portrait orientation) of the electronic device 6800 to set its screen configuration in a landscape view or portrait view mode.

According to an embodiment, the electronic device 6800 may identify that an event related to application B occurs while application A is running, and within a designated time, the flexible display 6801 of the electronic device 6800 is moved. For example, at least a portion of the display area of the flexible display disposed on the rear surface may be moved to the front surface, expanding the screen area displayable on the front surface.

According to an embodiment, the electronic device 6800 may display a screen of application B on a left portion 6820 of the expanded display area. According to an embodiment, while both the screen of application A and the screen of application B are displayed, the electronic device may detect the movement of the flexible display.

According to an embodiment, as the flexible display moves, a portion of the flexible display disposed on the front surface may be moved to the rear surface. For example, the electronic device 6800 may set the screen of application B corresponding to the size of the expanded portion 6830, except for the portion moved to the rear surface, of the front display area of the flexible display and display the screen on the left portion 6830. According to an embodiment, when the left portion 6830 is a smaller size than a preset size, the electronic device may display, e.g., a taskbar to indicate the execution state of the application, on the left portion 6830.

According to an embodiment, the electronic device 6800 may detect its rotating from the landscape to portrait orientation. For example, the electronic device 6800 may change the aspect ratio of the screen displayed in the portrait orientation to configure the screen in a portrait view mode.

According to an embodiment, the electronic device 6800 may configure and display the screens of application A and application B in the portrait view mode on the fourth area

6840 and the fifth area 6850 to which the first area 6810 and the left portion (e.g., a second area) 6820 have been changed in aspect ratio.

According to an embodiment, the electronic device 6800 in the portrait orientation may detect the movement of the flexible display while application A and application B are being displayed. For example, the electronic device 6800 may display application A on the fourth area 6840 of the entire front area, and application B on the fifth area 6850 of the entire front area.

According to an embodiment, while both the screen of application A and the screen of application B are displayed, the electronic device may detect the movement of the flexible display. According to an embodiment, as the flexible display moves, a portion of the flexible display disposed on the front surface may be moved to the rear surface. For example, the electronic device 6800 may set the screen of application B corresponding to the size of the expanded portion (or bottom portion) 6860, except for the portion moved to the rear surface, of the front display area of the flexible display and display the screen on the bottom portion 6860. According to an embodiment, when the top portion is a smaller size than a preset size, the electronic device may display, e.g., a taskbar to indicate the execution state of the application, on the top portion.

Figure 69:
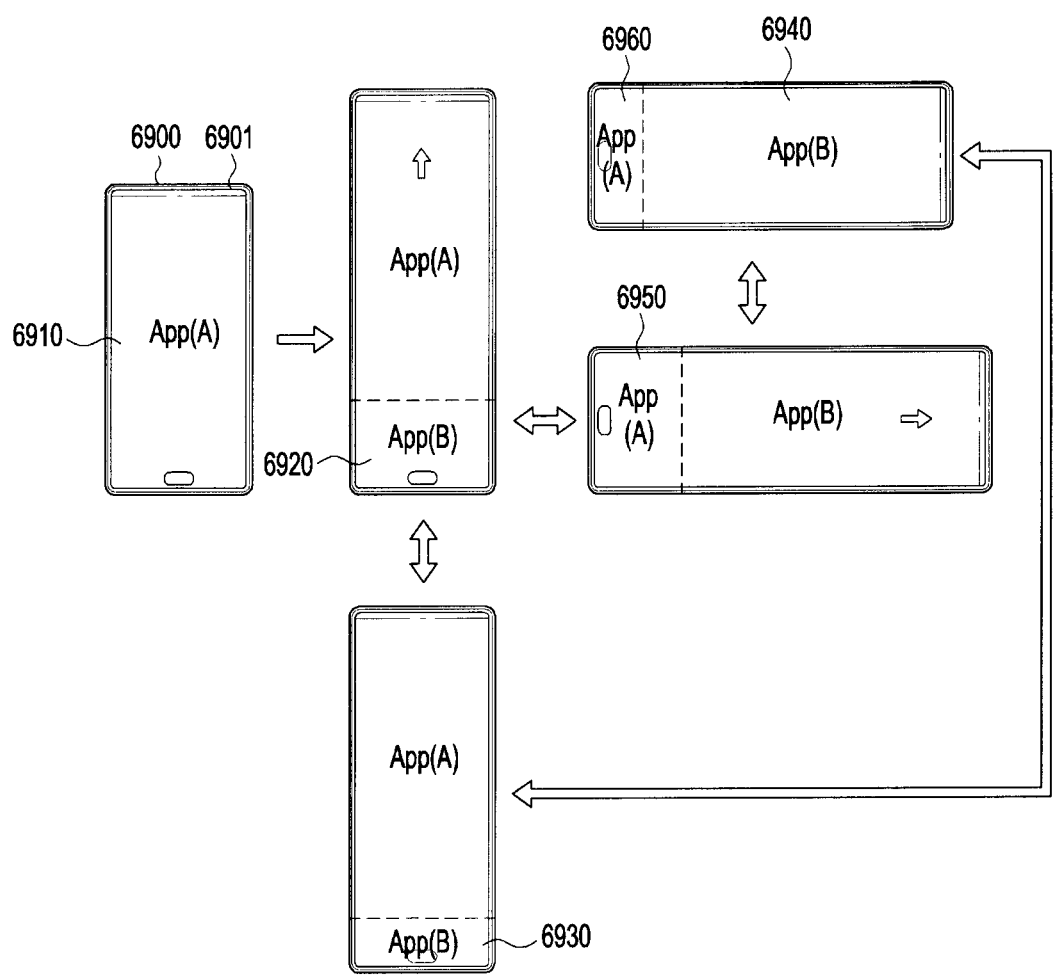
FIG. 69 is a view illustrating an example of a screen displayed on an electronic device with a flexible display according to an embodiment.

FIG. 69 is a view illustrating an example of a screen displayed on an electronic device with a flexible display according to an embodiment.

Referring to FIG. 69, an electronic device 6900 may display a screen of an application A running through a first area 6910 of a flexible display 6901. For example, application A may provide a screen in a designated aspect ratio and detect the orientation (e.g., landscape or portrait orientation) of the electronic device 6900 to set its screen configuration in a landscape view or portrait view mode.

According to an embodiment, the electronic device 6900 may identify that an event related to application B occurs while application A is running, and within a designated time, the flexible display 6901 of the electronic device 6900 is moved. For example, at least a portion of the display area of the flexible display disposed on the rear surface may be moved to the front surface, expanding the screen area displayable on the front surface.

According to an embodiment, the electronic device 6900 may display a screen of application B on the bottom portion 6920 of the expanded display area. According to an embodiment, while both the screen of application A and the screen of application B are displayed, the electronic device may detect the movement of the flexible display.

According to an embodiment, as the flexible display moves, a portion of the flexible display disposed on the front surface may be moved to the rear surface. For example, the electronic device 6900 may set the screen of application B corresponding to the size of the expanded area 6930, except for the portion moved to the rear surface, of the front display area of the flexible display and display the screen on the expanded area (e.g., a bottom portion) 6930. According to an embodiment, when the expanded area 6930 is a smaller size than a preset size, the electronic device may display, e.g., a taskbar to indicate the execution state of the application, on the expanded area 6930.

According to an embodiment, the electronic device 6900 may detect its rotating from the portrait to landscape orientation. For example, the electronic device 6900 may change the aspect ratio of the screen displayed in the portrait orientation to configure the screen in a landscape view mode.

According to an embodiment, the electronic device 6900 may configure and display the screens of application A and application B in the landscape view mode on the fourth area 6940 and the fifth area 6960 to which the first area 6910 and the second area (e.g., a bottom portion) 6920 have been changed in aspect ratio.

According to an embodiment, the electronic device 6900 in the landscape orientation may detect the movement of the flexible display while application A and application B are being displayed. For example, the electronic device 6900 may display the first application on the fifth area of the entire front area and the second application on the sixth area 6950.

According to an embodiment, while both the screen of application A and the screen of application B are displayed, the electronic device may detect the movement of the flexible display. According to an embodiment, as the flexible display moves, a portion of the flexible display disposed on the front surface may be moved to the rear surface. For example, the electronic device 6900 may set the screen of application B corresponding to the size of the expanded portion, except for the portion moved to the rear surface, on the front display area of the flexible display, and display the screen on the left portion 6960. According to an embodiment, when the right portion 6940 is a smaller size than a preset size, the electronic device may display, e.g., a taskbar to indicate the execution state of the application, on the left portion 6960.

Figure 70:
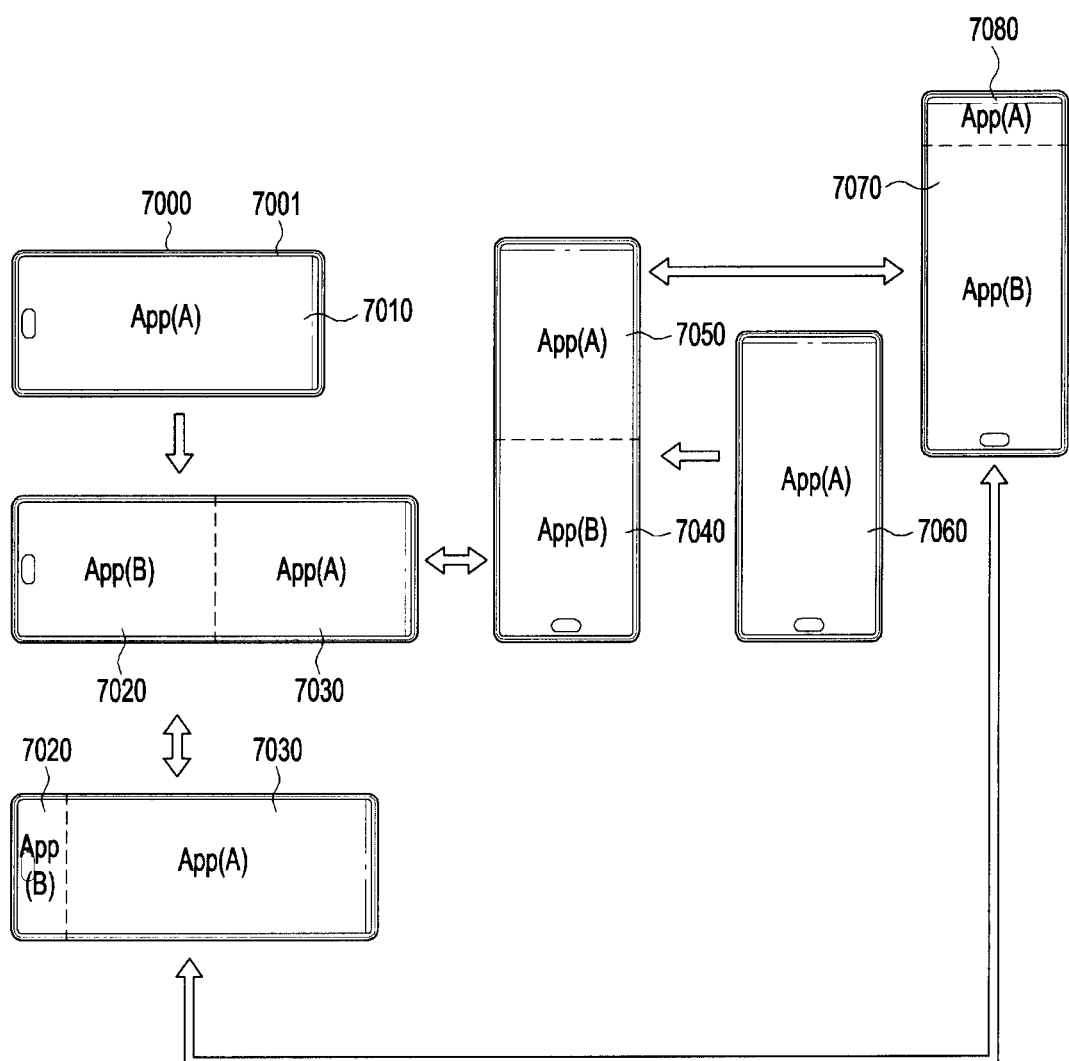
FIG. 70 is a view illustrating an example of a screen displayed on an electronic device with a flexible display according to an embodiment.

FIG. 70 is a view illustrating an example of a screen displayed on an electronic device with a flexible display according to an embodiment.

Referring to FIG. 70, an electronic device 7000 may display a screen of an application A running through a first area 7010 of a flexible display 7001. For example, application A may provide both a landscape and portrait screen configuration according to the orientation (e.g., landscape or portrait orientation) of the electronic device 7000.

According to an embodiment, the electronic device 7000 may identify that an event related to application B occurs while application A is running, and within a designated time, the flexible display of the electronic device 7000 is moved. For example, a portion of the rear area of the flexible display may be moved to the front surface. Application B may provide both a landscape and portrait screen configuration according to the orientation (e.g., landscape or portrait orientation) of the electronic device 7000.

According to an embodiment, the electronic device 7000 may display the screen of application B in the landscape view mode on the second screen area 7020 among the screen areas including the moved area and the screen of application A in the portrait view mode on the third screen area 7030. For example, in the landscape orientation, the electronic device 7000 may set the screen of applications B and A in the landscape view mode, change the resolution, and display them on the second screen area 7020 and the third screen area 7030.

According to an embodiment, in the portrait orientation or upon detecting the rotation from the landscape to portrait orientation, the electronic device 7000 may detect the movement of the flexible display and display the screen of application B in the portrait view mode on the fourth screen area 7040 among the screen areas including the moved area and the screen of application A in the portrait view mode on the fifth screen area 7050. For example, the electronic device 7000 may set the screen of application B in the portrait view mode, change the screen resolution of applications B and A, and display them on the fourth screen area 7040 and the fifth screen area 7050.

According to an embodiment, the electronic device 7000 in the portrait orientation may configure and display the screen of application A that is running, in the portrait view mode on the sixth area 7060 of the flexible display 7001. For example, the electronic device 7000 in the portrait orientation may identify that an event related to application B occurs while application A is running, and the flexible display of the electronic device 7000 is moved.

According to an embodiment, the electronic device 7000 in the portrait orientation may detect the movement of the sliding part while application A and application B are being displayed. For example, as the flexible display moves, a portion of the rear area of the flexible display may be moved to the front surface.

According to an embodiment, when the flexible display 7001 moves to expand in a designated size, the electronic device 7000 may display the screen of application B on a seventh area 7070 at a designated resolution. For example, the electronic device 7000 may set and display the screen of application A on an eighth area 7080, corresponding to the size of the eighth area 7080 except for the seventh area 7070 among the display areas including the expanded area. According to an embodiment, when the eighth area (e.g., an eighth portion) 7080 is a smaller size than a preset size, the electronic device may display, e.g., a taskbar to indicate the execution state of the application, on the eighth portion 7080.

Figure 71:
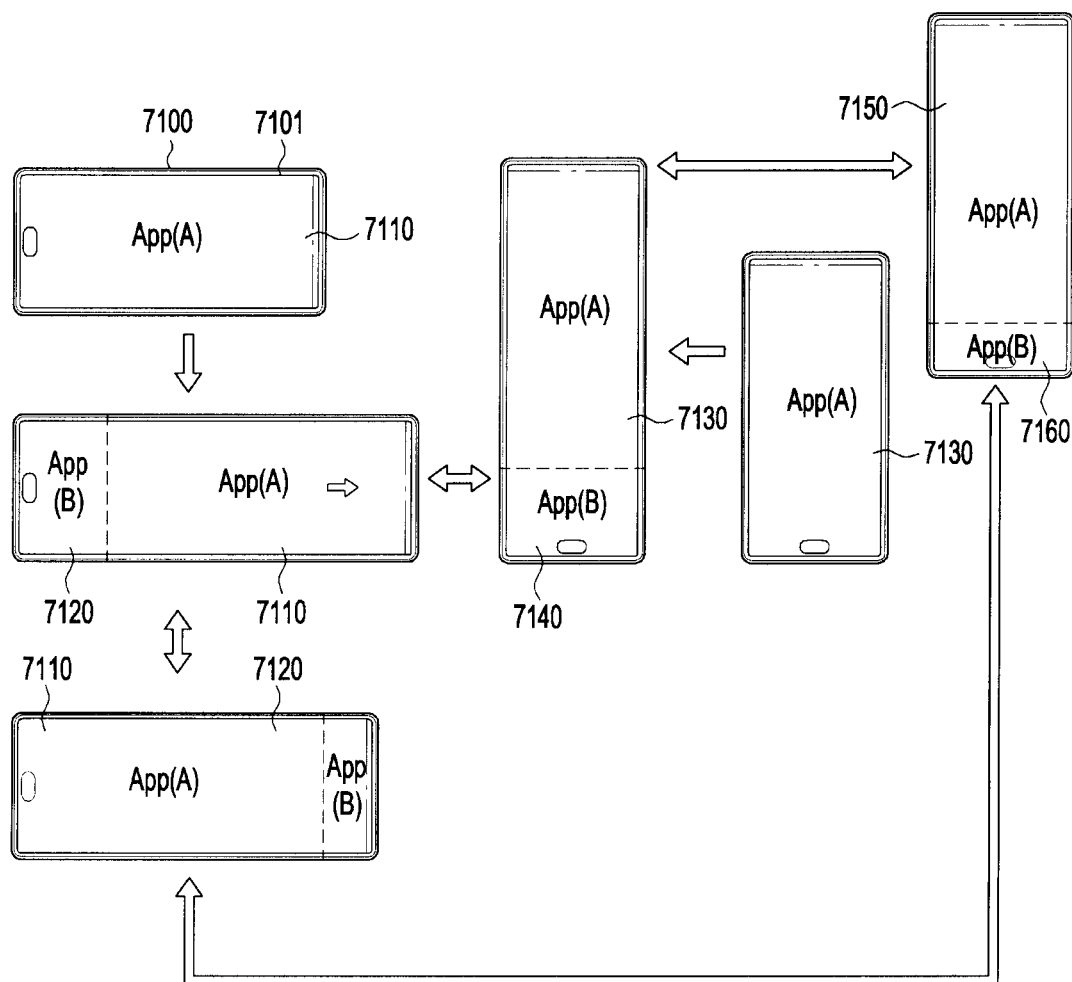
FIG. 71 is a view illustrating an example of a screen displayed on an electronic device with a flexible display according to an embodiment.

FIG. 71 is a view illustrating an example of a screen displayed on an electronic device with a flexible display according to an embodiment.

Referring to FIG. 71, an electronic device 7100 in the landscape orientation may display, in the portrait view mode, a screen of an application A running through a first area 7110 of a flexible display 7101. For example, application A may be set to a designated resolution of a designated aspect ratio and provide a landscape or portrait screen configuration according to the orientation (e.g., landscape or portrait orientation) of the electronic device 7100.

According to an embodiment, the electronic device 7100 may identify that an event related to application B occurs while application A is running, and within a designated time, the flexible display of the electronic device 7100 is moved. For example, at least a portion of the rear area of the flexible display may be moved to the front surface. Application B may have a designated resolution of a designated aspect ratio and provide a landscape or portrait screen configuration according to the orientation (e.g., landscape or portrait orientation) of the electronic device 7100.

According to an embodiment, the electronic device 7100 may maintain the screen of application A displayed on the first area 7110 in the portrait view mode and set and display the screen of application B on the second area 7120 in the portrait view mode.

According to an embodiment, upon detecting a rotating of the electronic device 7100 from the landscape to portrait orientation, the electronic device 7100 may display the screen of application A on the third area 7130, i.e., the first area 7110 in the portrait orientation and the screen of application B on the fourth area 7140, i.e., the second area 7120 in the landscape orientation.

According to an embodiment, the electronic device 7100 in the portrait orientation may detect the movement of the flexible display while displaying the screen of the running first application on the third area 7130 in the portrait orientation and may maintain the screen of application A displayed on the third area 7130 in the portrait view mode while displaying the screen of application B on the moved fourth area 7140 in the landscape view mode. For example, the electronic device 7100 in the portrait orientation may detect the movement of the flexible display while application A and application B are being displayed. For example, as the flexible display moves, a portion of the front area of the flexible display may be moved to the rear surface.

According to an embodiment, when the flexible display 7101 moves to shrink in a designated size, the electronic device 7100 may display the screen of application A on the fifth area 7150 at a designated resolution.

For example, the electronic device 7100 may set and display the screen of application B on the sixth area 7160, corresponding to the size of the sixth area 7160 except for the fifth area 7150 among the shrunken display areas. According to an embodiment, when the sixth area 7160 is a smaller size than a preset size, the electronic device may display, e.g., a taskbar to indicate the execution state of the application, on the sixth area 7160.

Figure 72:
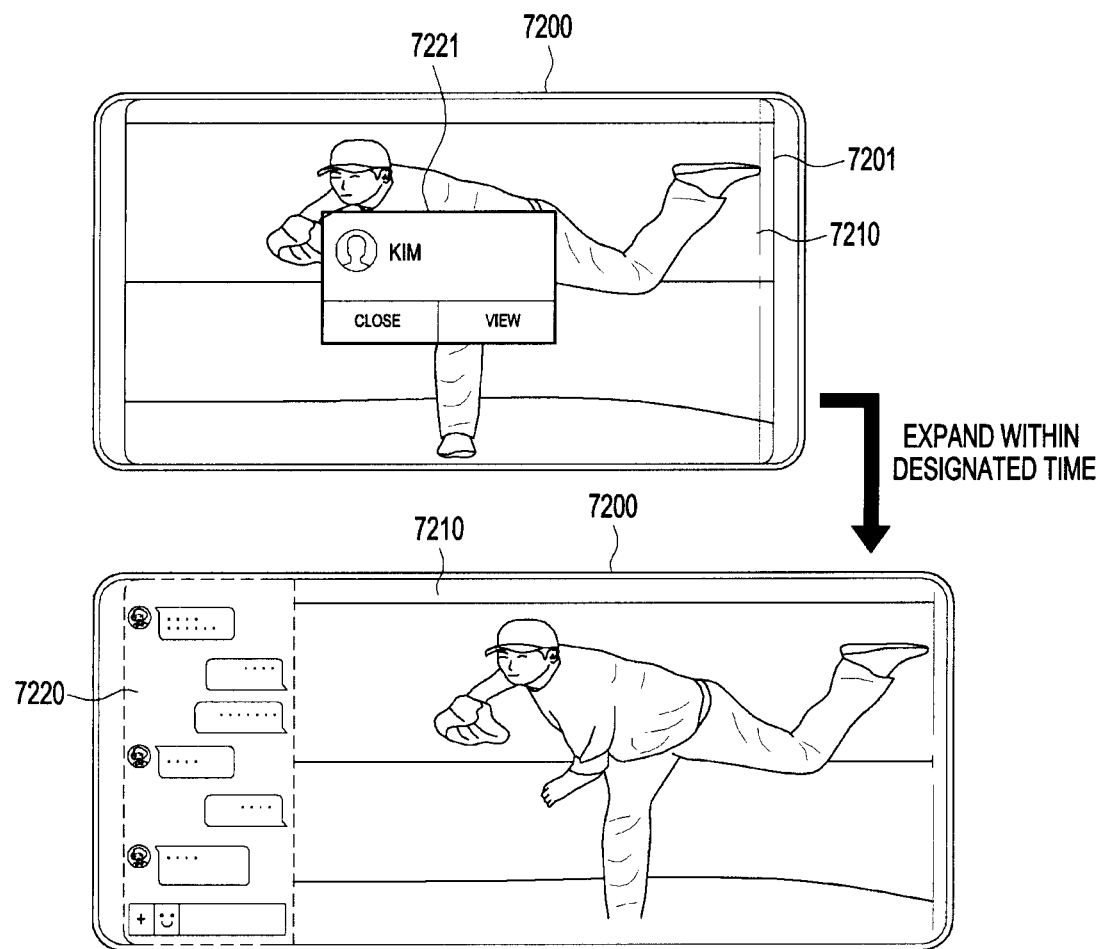
FIG. 72 is a view illustrating an example of a screen displayed on an electronic device with a flexible display according to an embodiment.

FIG. 72 is a view illustrating an example of a screen displayed on an electronic device with a flexible display according to an embodiment.

Referring to FIG. 72, an electronic device 7200 in the landscape orientation may display a screen of a video playing application which is running through a first area 7210 of a flexible display 7201. For example, the video playing application may be an application to output video content set to be displayed at a designated resolution and in the landscape view mode.

According to an embodiment, the electronic device 7200 may identify that an event (e.g., displaying a notification message 7221) related to a messaging application occurs while the video playing application is running, and within a designated time, the flexible display moves to expand to move to the front surface.

According to an embodiment, the electronic device 7200 may display the notification message 7221 on the second area 7220.

Figure 73:
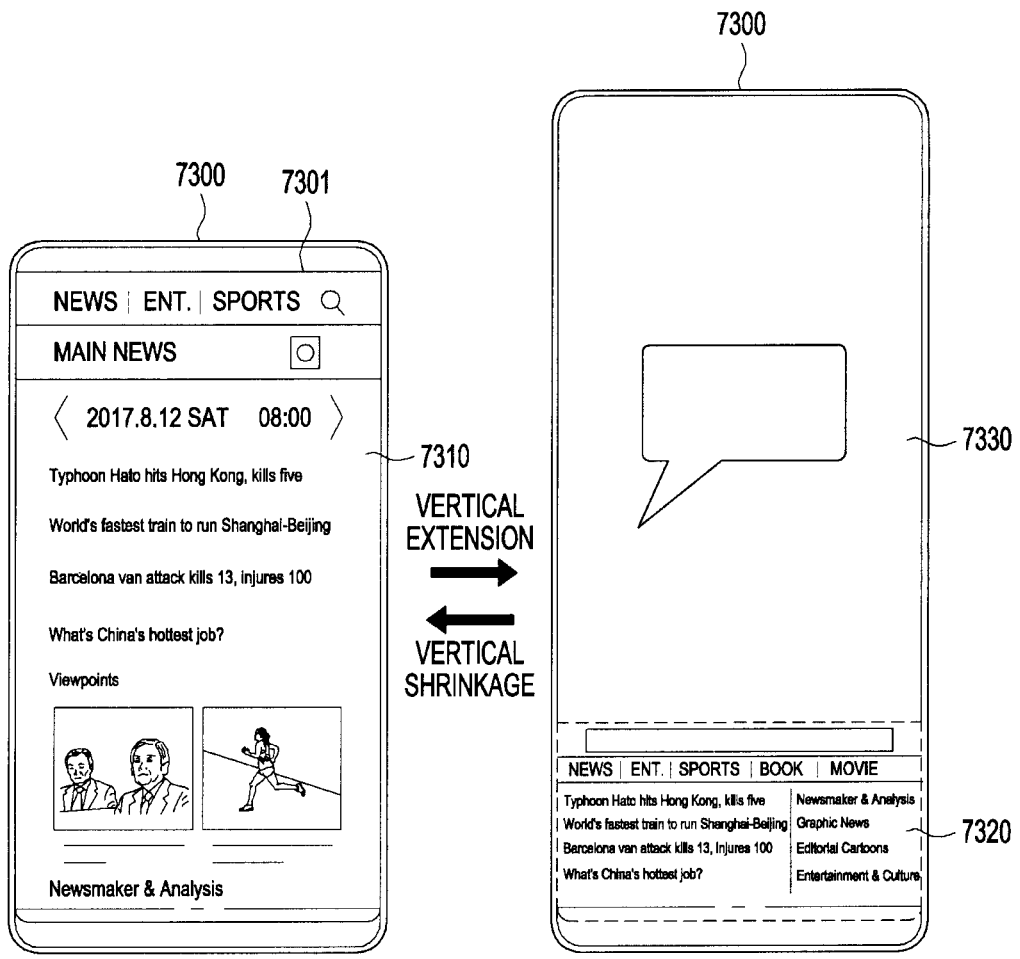
FIG. 73 is a view illustrating an example of a screen displayed on an electronic device with a flexible display according to an embodiment.

FIG. 73 is a view illustrating an example of a screen displayed on an electronic device with a flexible display according to an embodiment.

Referring to FIG. 73, an electronic device 7300 in the portrait orientation may display a screen of a web browser application which is running through a first area 7310 of a flexible display 7301. For example, the web browser application may be an application that is displayed at a resolution set depending on the screen area where it is displayed.

According to an embodiment, the electronic device 7300 may identify that an event (e.g., receiving a notification message) related to a messaging application occurs while the web browser application is running, and within a designated time, the flexible display moves to expand to allow a second area 7320 to be moved to the front surface.

According to an embodiment, as the messaging application is identified as supporting the portrait view mode and set to be displayed at a pre-designated resolution, the electronic device 7300 may display the screen of the messaging application on the first area 7330 corresponding to the resolution of the messaging application.

According to an embodiment, the electronic device 7300 may reset, and display on the second area 7320, the screen of the web browser application in the landscape view mode corresponding to the size of the second area 7320 moved and expanded to the front surface.

Figure 74:
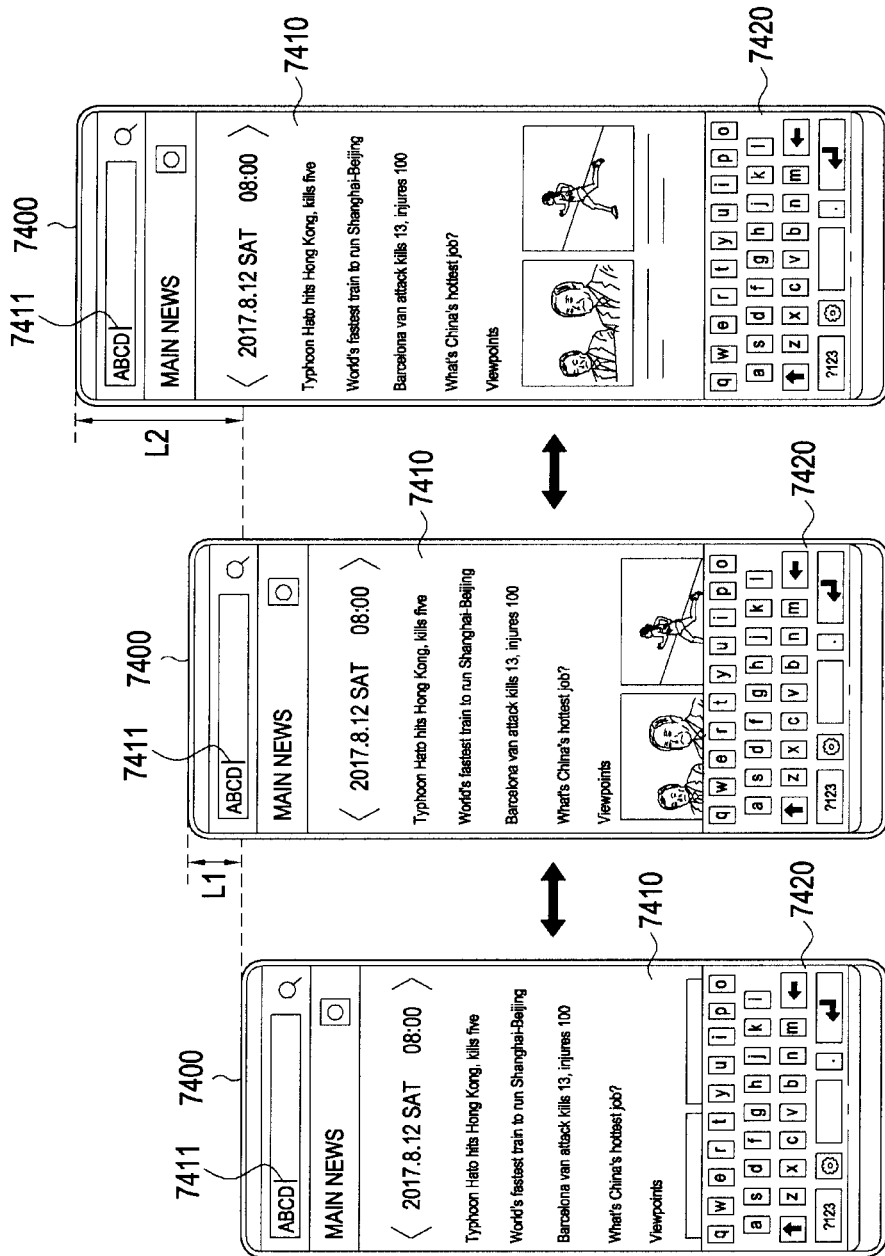
FIG. 74 is a view illustrating an example of a screen displayed on an electronic device with a flexible display according to an embodiment.

FIG. 74 is a view illustrating an example of a screen displayed on an electronic device with a flexible display according to an embodiment.

Referring to FIG. 74, an electronic device 7400 in the portrait orientation may display a screen of a web browser application which is running through a first area 7410 of a flexible display 7401. For example, the web browser application may be an application that is displayed at a resolution set depending on the screen area where it is displayed. According to an embodiment, a search window 7411 for text entry may be displayed on the screen of the web browser application.

According to an embodiment, the electronic device 7400 may identify that while the web browser application is running, the flexible display moves to expand to allow a second area 7420 to be moved to the front surface. According to an embodiment, when the user selects the search window 7411, a keypad for text entry may be displayed, and as the screen area varying, be displayed on the expanded second area 7420.

Since the keypad (as displayed in screen area 7420) may be easy to use when disposed at the bottom of the electronic device 7400, the keypad may remain in the fixed position although the flexible display is further expanded to change the position of display of the web browser application as shown on the right. For example, according to an embodiment, as the flexible display expands, a change may be made to the coordinates of the second area 7420. The position of display of the keypad may be updated to be displayed on the changed area of the entire area of the flexible display considering the movement of the flexible display.

Figure 75:
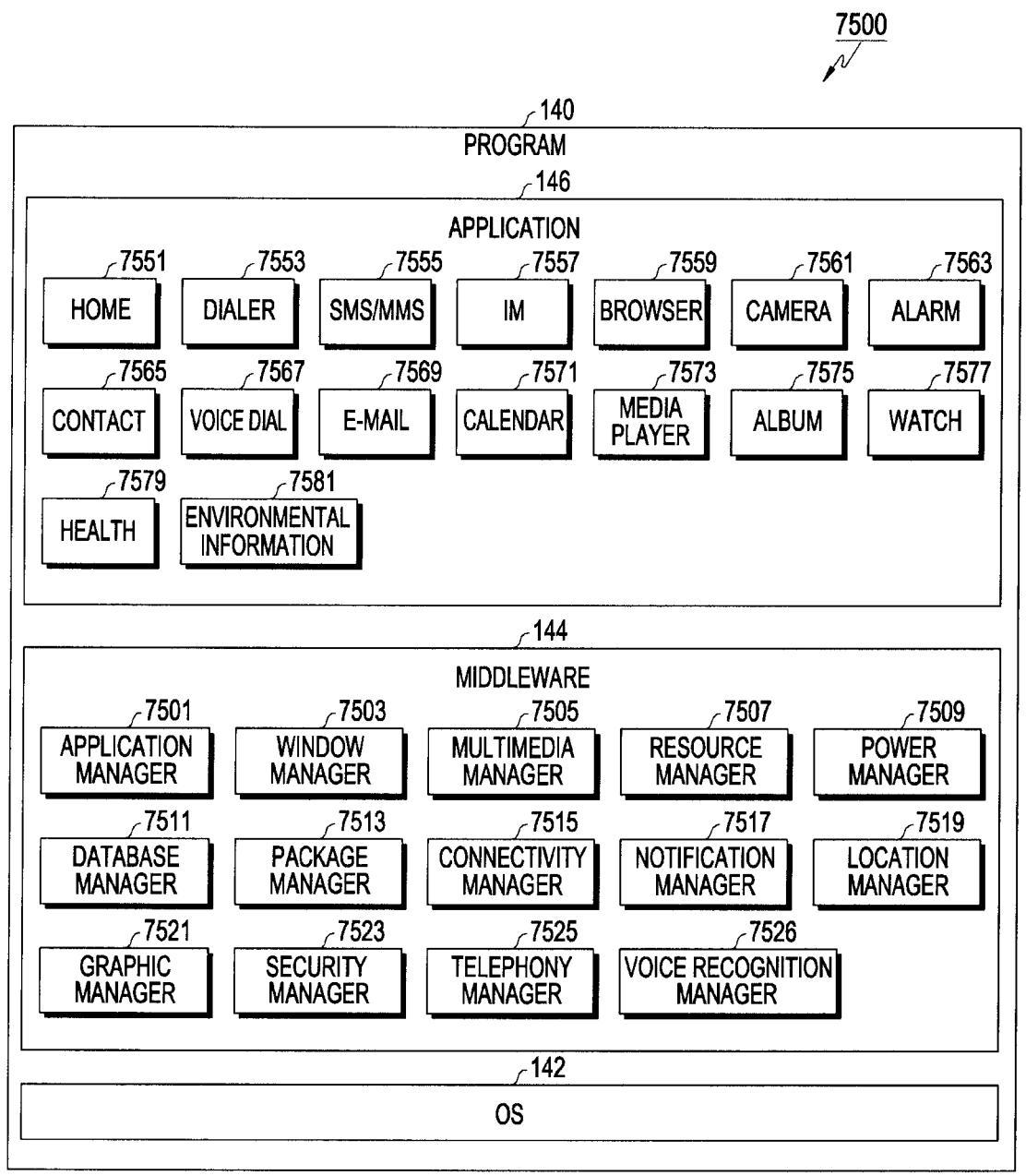
FIG. 75 is a block diagram illustrating program modules to control a flexible display according to an embodiment.

FIG. 75 is a block diagram 7500 illustrating a program 140 according to an embodiment. According to an embodiment, the program 140 may include an operating system (OS) 142 to control one or more resources of the electronic device 101, middleware 144, or an application 146 executable on the OS 142. The OS 142 may include, for example, Android™, iOS™, Windows™, Symbian™, Tizen™, or Bada™. At least part of the program 140 may be pre-loaded on the electronic device 101, e.g., upon manufacture, or may be downloaded or updated by an external electronic device (e.g., the electronic device 102 or 104 or the server 108) in a user's use environment.

The OS 142 may control (e.g., allocate or recover) system resources (e.g., the processor, memory, or power source) of the electronic device 101. The OS 142, additionally or alternatively, may include one or more driver programs to drive other hardware devices of the electronic device 101, for example, the input device 150, the sound output device 155, the display device 160, the audio module 170, the sensor module 176, the interface 177, the haptic module 179, the camera module 180, the power management module 188, the battery 189, the communication module 290, the subscriber identification module 296, or the antenna module 297.

The middleware 144 may provide various functions to the application 146 so that the application 146 may use functions or information provided from one or more resources of the electronic device 101. The middleware 144 may include, for example, an application manager 7501, a window manager 7503, a multimedia manager 7505, a resource manager 7507, a power manager 7509, a database manager 7511, a package manager 7513, a connectivity manager 7515, a notification manager 7517, a location manager 7519, a graphic manager 7521, a security manager 7523, a telephony manager 7525, or a voice recognition manager 7526. The application manager 7501 may manage the life cycle of, e.g., the applications 146. The window manager 7503 may manage, e.g., GUI resources used on the screen. The multimedia manager 7505 may grasp, e.g., formats necessary to play media files and use a codec appropriate for a format to perform encoding or decoding on media files. The resource manager 7507 may manage, e.g., the source code or memory space of the application 146. The power manager 7509 may manage, e.g., the capacity, temperature, or power of the battery and determine and provide power information necessary for the operation of the electronic device 101 using a corresponding piece of information of such. According to an embodiment of the disclosure, the power manager 7509 may interwork with a basic input/output system (BIOS).

The database manager 7511 may generate, search, or vary a database to be used in the applications 146. The package manager 7513 may manage, e.g., installation or update of an application that is distributed in the form of a package file. The connectivity manager 7515 may manage, e.g., wireless or wired connection between the electronic device 101 and an external electronic device. The notification manager 7517 may provide, e.g., a function for notifying a user of an event (e.g., a call, message, or alert) that occurs. The location manager 7519, for example, may manage locational information on the electronic device 101. The graphic manager 7521 may manage graphic effects to be offered to the user and their related user interface. The security manager 7523 may provide system security or user authentication, for example. The telephony manager 7525 may manage, e.g., a voice call or video call function of the electronic device 101. The voice recognition manager 7527 may transmit, e.g., a user's voice data to the server 108 and receive a command corresponding to a function to be executed on the electronic device 101 based on the voice data or text data converted based on the voice data. According to an embodiment, the middleware 7544 may dynamically delete some existing components or add new components. According to an embodiment, at least part of the middleware 144 may be included as part of the OS 142 or may be implemented in separate software from the OS 142.

The application 146 may include, e.g., an application, such as a home 7551, a dialer 7553, an SMS/MMS 7555, an instant message (IM) 7557, a browser 7559, a camera 7561, an alarm 7563, a contact 7565, a voice recognition 7567, an email 7569, a calendar 7571, a media player 7573, an album 7575, or a clock 7577, a health 7579 (e.g., measuring the degree of workout or blood sugar), or environmental information 7581 (e.g., air pressure, moisture, or temperature information). According to an embodiment, the application 146 may further include an information exchanging application (not shown) that is capable of supporting information exchange between the electronic device 101 and the external electronic device. The information exchange application may include, e.g., a notification relay application for transferring designated information (e.g., a call, message, or alert) to the external electronic device or a device management application for managing the external electronic device. The notification relay application may transfer notification information corresponding to an event (e.g., receipt of an email) that occurs at another application (e.g., the email application 7569) of the electronic device 101 to the external electronic device, or the notification relay application may receive notification information from the external electronic device and provide the notification information to a user of the electronic device 101. The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 76:
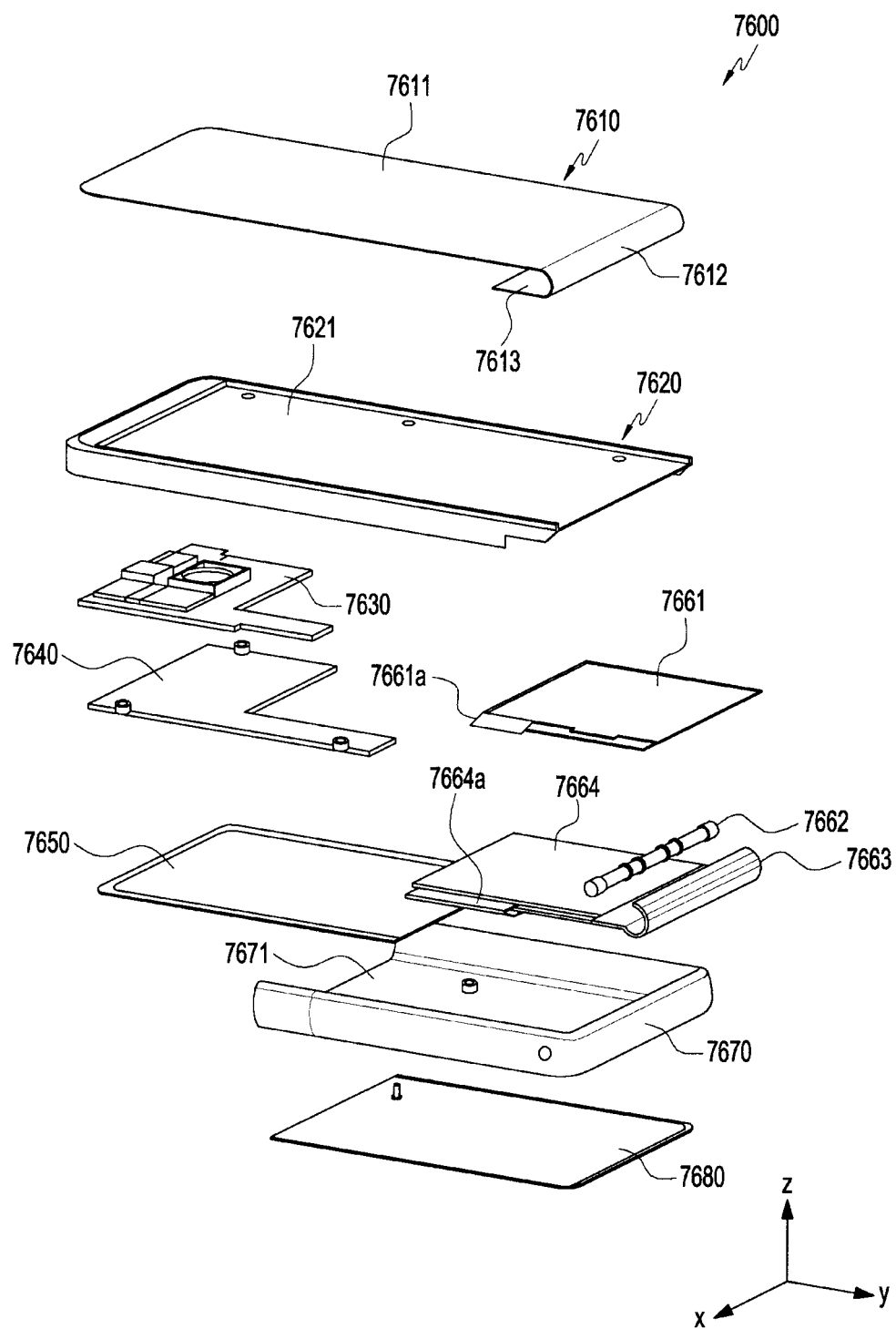
FIG. 76 is an exploded perspective view illustrating an electronic device according to an embodiment.

FIG. 76 is an exploded perspective view illustrating an electronic device according to an embodiment. Referring to FIG. 76, axes X, Y, and Z, respectively, may refer to the width, length, and height direction of the electronic device. The Z axis may also correspond to the thickness of the electronic device. Referring to FIG. 76, according to an embodiment, an electronic device 7600 (e.g., the electronic device 101 of FIG. 1, the electronic device 301 of FIG. 3, or the electronic device 1700 or 1800 of FIG. 17A or 17B, 18A, or 18B) may include a flexible display 7610, a main bracket 7620 (e.g., the second housing or main bracket 1714 of FIG. 17A or 17B, the main bracket 1810 of FIG. 18A or 18B, a printed circuit board 7630, a rear bracket 7640, a rear window 7650 (e.g., the rear window 1790 in the electronic device 1700 of FIG. 17A), an upper supporting rail 7661 (e.g., the upper supporting rail 1713 of FIG. 17A or the upper rail 1890 of FIG. 18A), an upper supporting rail fixing part 7661a (e.g., the upper supporting rail fixing part 1713a of FIG. 17A), a roller 7662 (e.g., the roller 1860 of FIG. 18A), a lower supporting rail 7664 (e.g., the lower supporting rail 1780 of FIG. 17A or the lower rail 1820 of FIG. 18A), a lower supporting rail fixing part 7664a (e.g., the lower supporting rail fixing part 1780a of FIG. 17A), a back bracket 7670 (e.g., the bracket of FIG. 17A or the first housing 1850 of FIG. 18), a roller 7662 (e.g., the roller 1860 of FIG. 18A), a multi-bar structure 7663 (e.g., the multi-hinge or multi-bar structure 1840 of FIG. 18A), and a back window 7680 (e.g., the rigid glass 1760 of FIG. 17A).

The flexible display 7610 may include a first surface 7611, a second surface 7612, and a third surface 7613. According to an embodiment, the screen display area may be varied based on the area of exposure. The first surface 7611 and the third surface 7613 may form flat surfaces, and the second surface 7612 may form a bent surface.

A portion of the first surface 7611 of the flexible display 7610 may be attached to the main bracket 7620, and the second surface 7612 may be attached to the multi-bar structure 7663, and a portion of the third surface may be attached to the lower supporting rail 7664. According to an embodiment, when the flexible display 7610 expands or shrinks, the main bracket 7620 may be guided and moved through the upper supporting rail 7661. The main bracket 7620 includes a first flat plate 7621 including a first surface and a second surface facing away from the first surface. According to an embodiment, the main bracket 7620 may be connected to a side of the multi-bar structure 7663 connected with at least the second surface 7612 of the flexible display 7610, and as the displayed screen expands or shrinks, the screen connected with the multi-bar structure 7663 may be exposed or shrunken.

The upper supporting rail 7661 may support the multi-bar structure 7663 when the flexible display 7610 expands, and the upper supporting rail 7661 and the upper supporting rail fixing part 7661a may be integrally formed with each other or be guided and slid by the upper supporting rail fixing part 7661a. The upper supporting rail fixing part 7661a may be connected and affixed to the lower supporting rail fixing part 7664a provided in the lower supporting rail 7664.

The roller 7662 may guide the multi-bar structure 7663 in a predetermined radius or support the multi-bar structure 7663 and may be connected to the upper supporting rail 7661. The multi-bar structure 7663 may include multiple straight bars and support at least the second surface 7612 of the flexible display 7610. One end of the multi-bar structure 7663 may be connected to the lower supporting rail 7664, and the opposite end may be connected to the main bracket 7620.

The lower supporting rail 7664 may support the third surface 7613 of the flexible display 7610 and, when the flexible display 7610 expands, be slid to allow the screen to be expanded by the multi-bar structure 7663. The lower supporting rail 7664 may be configured as a separate part from the lower supporting rail fixing part 7664a, and the lower supporting rail 7664 may be affixed to the main bracket 7620 to be slid.

The back bracket 7670 may be configured to surround the main bracket 7620, the lower supporting rail 7664, and the multi-bar structure 7663 and may have a space formed at the bottom to receive an antenna or other electrical parts in a space not overlapping with the multi-bar structure 7663. The back bracket 7670 includes a second flat plate 7671 facing the second surface of the first flat plate 7621 and forming a space towards the second surface. According to an embodiment, the back bracket 7670 may provide a support for the back window 7680 to protect the third surface 7613 of the flexible display 7610. The back window 7680 may be configured to protect the third surface 7613 of the flexible display 7610, and unless utilized to display information on the third surface 7613, be formed of a material that does not transmit light. The back window 7680 and the back bracket 7670 may be formed of a single part. According to an embodiment, when utilized to display information on the third surface 7613, the back window 7680 may be formed of a light-transmitting material.

The printed circuit board 7630 allows at least one part to be mounted thereon and may be disposed on the main bracket 7620. The rear bracket 7640 may protect the rear surface of the printed circuit board 7630 and provide a space to mount the rear window 7650. The rear window 7650 may protect the rear bracket 7640.

According to an embodiment, an electronic device may comprise a first structure including a first flat plate including a first surface and a second surface facing away from the first surface, a second structure including a second flat plate facing the second surface of the first flat plate, a first side wall perpendicular to the second flat plate, a second side wall perpendicular to the second flat plate, and a third side wall perpendicular to the first side wall and the second flat plate and parallel with the second side wall, and a flexible touchscreen display layer. The second flat plate, the first side wall, the second side wall, and the third side wall may together form a trough with a side opening to receive at least a portion of the first structure. The first structure may be movable between the closed position and the open position in relation to the second structure in a first direction parallel to the second flat plate and the second side wall. The first structure may be a first distance away from the first side wall in the closed position and be a second distance away from the first side wall in the open position, the second distance being larger than the first distance. The display layer may include a flat part mounted on the first surface and expanding across at least a portion of the first surface and a bend expanding from the flat part to the space between the first side wall and the first structure in the closed position. When the first structure moves from the closed position to the open state, at least a portion of the bend is pulled from the space to form a substantially flat surface between the flat part and the first side wall as viewed from above the first flat plate.

According to an embodiment, the electronic device may further include a shaft positioned in the trough, coupled with the second structure, and expanding away from the first side wall by a gap in a second direction perpendicular to the first direction and an expandable supporting structure positioned adjacent the first side wall, coupled with a surrounding of the first side wall, and bendingly expanded to the space around the shaft in the closed position, when the first structure moves from the closed position to the open state, at least a portion of the supporting structure may be pulled from the space to form a substantially flat surface between the first structure and the first side wall as viewed from above the first flat plate, and such that the bend of the display layer may be coupled with the supporting structure.

According to an embodiment, the supporting structure may include a plurality of bars coupled together in parallel with each other and expanding in the second direction.

According to an embodiment, the electronic device may further include a guiding structure attached to the second flat plate in the trough and configured to guide at least one guiding component coupled with the supporting structure.

According to an embodiment, the electronic device may further include a printed circuit board (PCB) coupled with the first structure, a processor affixed to the PCB and operatively connected with the display layer, and a memory affixed to the PCB and operatively connected with the processor.

According to an embodiment, the first flat plate may include a first area, and the second flat plate may include a second area smaller than the first area According to an embodiment, the electronic device may further include a third flat plate coupled with the first structure to position the PCB between the second surface and the third flat plate.

According to an embodiment, the electronic device may further include a piezoelectric speaker between the third flat plate and the second surface of the first structure.

According to an embodiment, the electronic device may further include a member coupled with the second structure in the trough and having a selected capacitance, such that the memory may store instructions executed to enable the processor to receive coordinates on the display layer, which are closest to the member from the display layer and determine the position of the first structure between the closed position and the open position at least partially based on the coordinates.

According to an embodiment, in the closed position, the bend of the display layer may be further expanded to a space between the second surface of the first structure and the second flat plate of the second structure.

According to an embodiment, the electronic device may further include a display drive integrated circuit (DDI) affixed to the bend of the display layer to be positioned between the first structure and the bend in the closed position.

Each of the aforementioned components of the electronic device may include one or more parts, and a name of the part may vary with a type of the electronic device. The electronic device in accordance with certain embodiments of the disclosure may include at least one of the aforementioned components, omit some of them, or include another additional component(s). Some of the components may be combined into an entity, but the entity may perform the same functions as the components may do.

Figure 77A:
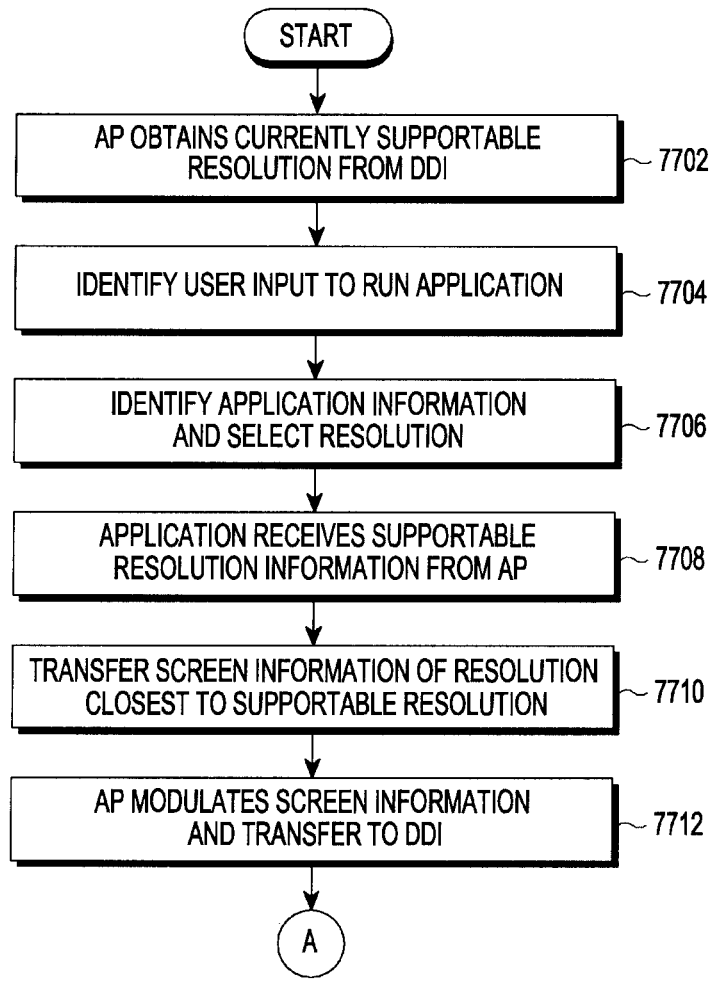
FIGS. 77A and 77B are views illustrating an example of a method for processing an image on a screen displayed on an electronic device with a flexible display according to an embodiment.
Figure 77B:
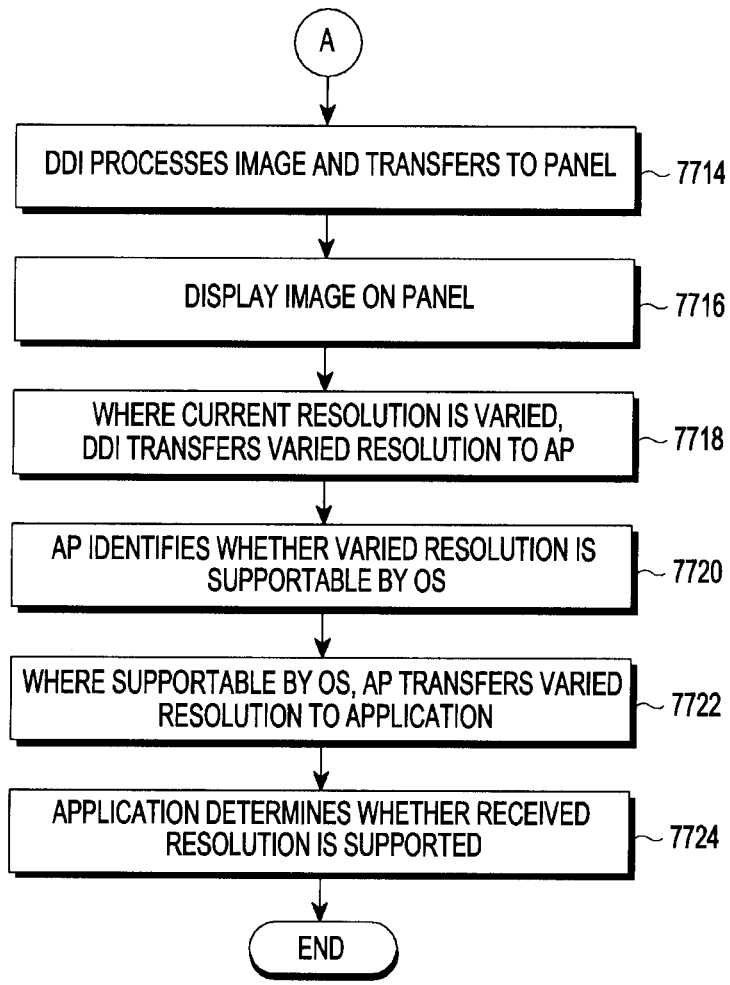

FIGS. 77A and 77B are views illustrating an example of a method for processing an image on a screen displayed on an electronic device with a flexible display according to an embodiment.

Referring to FIGS. 77A and 77B, to process and display images on the screen depending on the area of exposure of the flexible display 2901 or 3101 of the electronic device 2900 or 3100 as shown in FIGS. 29 and 31, the application processor (e.g., the processor 120 of FIG. 1) may obtain display resolutions currently supportable from the display driver IC (e.g., the display driver IC or DDI 230 of FIG. 2) in operation 7702. For example, the application processor may receive, e.g., the maximum resolution, minimum resolution, and current resolution from the display driver IC. In operation 7704, upon identifying a user input for running the application through an input device (e.g., the touch circuitry 250 of FIG. 2), the application processor may perform operation 7706. In operation 7706, the application processor may receive information about an application to be executed corresponding to the user input from a storage device (e.g., the memory 130 of FIG. 1) and execute the application. When the application is executed in operation 7706, the application may receive a resolution currently supported for the display from the application processor in operation 7708, and the application may deliver screen information of a supportable resolution closest to the obtained display-supported resolution to the application processor in operation 7710. Upon receiving the screen information in operation 7710, the application processor may perform modulation (e.g., conversion to fit the MIPI specifications) on the screen information and transfer the resultant information to the display driver IC in operation 7712. The display driver IC may perform image processing (e.g., what is shown in FIG. 42A) in operation 7714 and transfers the processed image to the panel (e.g., the display 210 of FIG. 2) to display the screen in operation 7716. Thereafter, when the screen resolution is changed after the screen display, the display driver IC may transfer the changed resolution to the application processor in operation 7718, and the application processor may perform operation 7720. In operation 7720, the application processor may identify whether the current operating system (OS, e.g., Android) may support the changed resolution received in operation 7718. When the currently running application supports the resolution, the application processor may transfer the changed resolution to the application currently running in operation 7722. In operation 7224, the application may determine whether the received resolution is supported. In some embodiments, when the resolution is supported, the image may be adjusted to utilize the changed resolution (e.g., operation 7712-7714). In some embodiments, when the resolution is not supported by the application, a closest supported resolution may be used (e.g., as related to operation 7710).

The term 'module' may refer to a unit including one of hardware, software, and firmware, or a combination thereof. The term 'module' may be interchangeably used with a unit, logic, logical block, component, or circuit. The module may be a minimum unit or part of an integrated component. The module may be a minimum unit or part of performing one or more functions. The module may be implemented mechanically or electronically. For example, the module may include at least one of application specific integrated circuit (ASIC) chips, field programmable gate arrays (FPGAs), or programmable logic arrays (PLAs) that perform some operations, which have already been known or will be developed in the future.

According to an embodiment of the disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

The computer-readable storage medium may include a hardware device, such as hard discs, floppy discs, and magnetic tapes (e.g., a magnetic tape), optical media such as compact disc ROMs (CD-ROMs) and digital versatile discs (DVDs), magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out example embodiments of the disclosure, and vice versa.

Modules or programming modules in accordance with certain embodiments of the disclosure may include at least one or more of the aforementioned components, omit some of them, or further include other additional components. Operations performed by modules, programming modules or other components in accordance with certain embodiments of the disclosure may be carried out sequentially, simultaneously, repeatedly, or heuristically. Furthermore, some of the operations may be performed in a different order, or omitted, or include other additional operation(s).

According to an embodiment of the disclosure, there is provided a storage medium storing instructions configured to be executed by at least one processor to enable the at least one processor to perform at least one operation that may include determining the resizing of a screen exposed in a first direction on a first surface of a flexible display at least partially affixed to a second housing as a first housing and the second housing slide over each other, determining whether the screen resizing meets a designated resolution change condition, and unless the screen resizing is determined to meet the designated resolution change condition, controlling to perform a designated image process on a screen area expanded or shrunken as per the resizing of the screen exposed in the first direction, such that the first housing and the second housing are slide-engaged with each other while at least partially overlapping with each other, and such that as the first housing and the second housing slide over each other to shrink, at least a portion of the flexible display is retracted inside the first housing.

As is apparent from the foregoing description, according to certain embodiments, an electronic device with a flexible display and a method for controlling the display on the electronic device may provide the user with easy-to-use UIs or UXs by performing predetermined image processing or rearrangement on the resized screen area in various circumstances where the flexible display screen is resized.

The embodiments disclosed herein are proposed for description and understanding of the disclosed technology and does not limit the disclosure. Accordingly, the disclosure should be interpreted as including all changes or certain embodiments based on the technical aspects of the disclosure.

What is claimed is:

1. An electronic device, comprising:
a first housing;
a second housing that is movable relative to and over the first housing and at least partially overlapping the first housing;
a flexible display at least partially mounted on the second housing and at least partially visually exposed to an exterior of the electronic device, wherein the flexible display is insertable into an interior of the first housing based on the second housing moving relative to the first housing in a first direction, and removable from the interior of the first housing based on the second housing moving relative to the first housing in a second direction;
a memory; and
at least one processor coupled to the flexible display and the memory,
wherein the memory stores instructions configured to, when executed, cause the at least one processor to:
display a first screen on a first display area of the flexible display,
detect movement of the second housing relative to the first housing in one of the first direction or the second direction,
based on the movement of the second housing being detected in the second direction,
initiate displaying a gradation effect on at least a portion of a second display area of a total display area that is resized based on the movement of the second housing while maintaining the displaying of the first screen on the first display area, such that at least the portion of the second display area is visually differentiated from the first display area, wherein the resized total display area includes the first display area and the second display area, and wherein the second display area corresponds to a moving distance of the second housing and corresponds to a portion of the flexible display moved from the interior of the first housing and exposed to the exterior of the first housing according to the movement of the second housing in the second direction, and
based on a size of the resized total display area being greater than or equal to a predetermined size, stop the displaying of the gradation effect, and display the first screen of which a resolution is changed on the resized total display area.

2. The electronic device of claim 1, wherein the instructions are further configured to, when executed, cause the at least one processor to overlay a designated masking layer onto at least a portion of the resized total display area.

3. The electronic device of claim 2, wherein the designated masking layer is generated by applying a first alpha blending value to a first area of the resized display area that is exposed to the exterior of the electronic device, and applying a second alpha blending value to a second area of the resized display area inserted into the interior of the first housing.

4. The electronic device of claim 1,
wherein the instructions are further configured to, when executed, cause the at least one processor to:
when the second housing moves in the second direction such that the total display area is expanded from an original size prior to moving the second housing:
identify the second display area corresponding to the moving distance of the second housing,
determine an information type to be displayed on the second display area, and
display particular information on the second display area based on the determined information type.

5. The electronic device of claim 4, wherein the information type includes at least one of a text or an icon.

6. The electronic device of claim 1, wherein the instructions are further configured to, when executed, cause the at least one processor to:
while displaying an execution screen of a first application on the display area of the flexible display, detect an event corresponding to a second application, display information related to the event, the displayed information overlapping at least a portion of the execution screen, determine an aspect ratio of the resized display area of the flexible display, and at least partially adjust at least one of the displayed information or the execution screen based on the determined aspect ratio.

7. The electronic device of claim 1, wherein the instructions are further configured to, when executed, cause the at least one processor to:

determine an aspect ratio for the resized display area based on whether the electronic device is operating in a landscape view mode or a portrait view mode.

8. An electronic device, comprising:

a first housing;

a second housing that is movable relative to the first housing and over the first housing and at least partially overlapping the first housing;

a flexible display at least partially mounted on second housing and at least partially visually exposed to an exterior of the electronic device, wherein the flexible display insertable into an interior of the first housing based on the second housing moving relative to the first housing in a first direction, and removable from the interior of the first housing based on the second housing moving relative to the first housing in a second direction;

at least one processor; and a memory, wherein the memory stores instructions configured to, when executed, cause the at least one processor to:

display a user interface on a first position of a first display area of the flexible display, based on a total display area of the flexible display being expanded according to a movement of the second housing in the second direction, initiate displaying a gradation effect on at least a portion of a second display area of the expanded total display area while maintaining the displaying of the user interface on the first position of the first display area, such that at least the portion of the second display area is visually differentiated from the first display area, wherein the expanded total display area includes the first display area and the second display area, and wherein the second display area corresponds to an amount by which the total display area expands, and corresponds to a portion of the flexible display moved from the interior of the first housing and exposed to the exterior of the first housing according to the movement of the second housing in the second direction, and based on the movement of the second housing in the second direction being terminated for a predetermined time, display the user interface on a second position different from the first position based on the amount by which the display area expands.

9. An electronic device, comprising:

a first housing;

a second housing that is movable relative to the first housing and at least partially overlapping the first housing;

a flexible display at least partially mounted on the second housing and at least partially visually exposed to an exterior of the electronic device, wherein the flexible display is insertable into an interior of the first housing based on the second housing moving relative to the first housing in a first direction, and is removable from the interior of the first housing based on the second housing moving relative to the first housing in a second direction;

at least one processor; and a memory, wherein the memory stores instructions configured to, when executed, cause the at least one processor to:

display a first execution screen of a first application on a first display area of the flexible display, detect movement of the second housing in one of the first direction or the second direction, based on the movement of the second housing being detected in the second direction, initiate displaying a gradation effect on at least a portion of a second display area of a total display area that is resized based on the movement of the second housing while maintaining the displaying of the first execution screen on the first display area, such that at least the portion of the second display area is visually differentiated from the first display area, wherein the resized total display area includes the first display area and the second display area, and wherein the second display area corresponds to a moving distance of the second housing and corresponds to a portion of the flexible display moved from the interior of the first housing and exposed to the exterior of the first housing according to the movement of the second housing in the second direction, display a second execution screen of a second application on the second display area of the flexible display, detect a change in orientation of the electronic device, and based on detecting the change in orientation, change a display arrangement of the first execution screen and the second execution screen based on at least one of an aspect ratio of the first execution screen or an aspect ratio of the second execution screen.

\* \* \* \* \*